United States Patent
Shen et al.

(10) Patent No.: US 7,549,105 B2
(45) Date of Patent: *Jun. 16, 2009

(54) CONSTRUCTION OF IRREGULAR LDPC (LOW DENSITY PARITY CHECK) CODES USING RS (REED-SOLOMON) CODES OR GRS (GENERALIZED REED-SOLOMON) CODE

(75) Inventors: Ba-Zhong Shen, Irvine, CA (US); Kelly Brian Cameron, Irvine, CA (US); Tak K. Lee, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 596 days.

This patent is subject to a terminal disclaimer.

(21) Appl. No.: 11/264,997

(22) Filed: Nov. 2, 2005

(65) Prior Publication Data

US 2006/0156168 A1 Jul. 13, 2006

Related U.S. Application Data

(60) Provisional application No. 60/675,346, filed on Apr. 27, 2005, provisional application No. 60/674,084, filed on Apr. 22, 2005, provisional application No. 60/642,689, filed on Jan. 10, 2005.

(51) Int. Cl.
*H03M 13/00* (2006.01)
(52) U.S. Cl. .................. 714/755; 714/786; 714/784; 714/756
(58) Field of Classification Search ............... 714/752, 714/755–756, 784, 786
See application file for complete search history.

(56) References Cited

U.S. PATENT DOCUMENTS

| 3,542,756 | A | 11/1970 | Gallager |
| 3,665,396 | A | 5/1972 | Forney, Jr. |
| 4,295,218 | A | 10/1981 | Tanner |
| 6,430,233 | B1 | 8/2002 | Dillon et al. |
| 6,473,010 | B1 | 10/2002 | Vityaev et al. |

(Continued)

OTHER PUBLICATIONS

J. Campello, D. S. Modha, and S. Rajagopalan, "Designing LDPC Codes Using Bit-Filling," ICC 2001, 2001 IEEE International Conference on Communications, vol. 1 of 10, Jun. 2001, pp. 55-59.

(Continued)

*Primary Examiner*—Guy J Lamarre
(74) *Attorney, Agent, or Firm*—Garlick Harrison & Markison; Shayne X. Short

(57) ABSTRACT

Construction of Irregular LDPC (Low Density Parity Check) codes using RS (Reed-Solomon) codes or GRS (Generalized Reed-Solomon) codes. As described herein, a wide variety of irregular LDPC codes may be generated using GRS or RS codes. The corresponding LDPC matrix of such an irregular LDPC code may be constructed by performing partial-matrix processing (including decomposition and partial-matrix replacement thereof) of a parity check matrix that corresponds to a GRS-based regular LDPC code. Such an irregular LDPC code may be appropriately designed using these principles thereby generating a code that is suitable for use in wireless communication systems including those that comply with the recommendation practices and standards being developed by the IEEE (Institute of Electrical & Electronics Engineers) 802.11n Task Group (i.e., the Task Group that is working to develop a standard for 802.11 TGn (High Throughput)).

26 Claims, 26 Drawing Sheets

U.S. PATENT DOCUMENTS

| | | | |
|---|---|---|---|
| 6,567,465 B2 | 5/2003 | Goldstein et al. | |
| 6,633,856 B2 | 10/2003 | Richardson et al. | |
| 2003/0104788 A1 | 6/2003 | Kim | |
| 2006/0156169 A1* | 7/2006 | Shen et al. | 714/752 |

OTHER PUBLICATIONS

T. J. Richardson, and R. L. Urbanka, "The Capacity of Low-Density Parity-Check Codes Under Message-Passing Decoding," IEEE Transactions on Information Theory, vol. 47, No. 2, Feb. 2001, pp. 599-618.

I. Djurdjevic, J. Xu, K. Abdel-Ghaffar, and S. Lin, "A Class of Low-Density Parity-Check Codes Constructed Based on Reed-Solomon Codes with Two Information Symbols," IEEE Communications Letters, vol. 7, No. 7, Jul. 2003, pp. 317-319.

F. J. MacWilliams, "The Theory of Error-Correcting Codes" 1997, North-Holland Mathematical Library, pp. 300-305.

Lei Chen, "Construction of Quasi-Cyclic LDPC Codes Based on the Minimum Weight Codewords of Reed-Solomon Codes" Internationsl Symposium, IEEE, Jun. 2004, pp. 239.

Shu Lin, "Structured Low-Density Parity-Check Codes: Algebraic Constructions" Jul. 2004, pp. 1-67.

Amin Shokrollahi, "LDPC Codes: An Introduction" Internet Article, Apr. 2003, pp. 1-34.

J. I. Hall, "Notes on Coding Theory," Dept. of Mathematics, Michigan State University, East Lansing, MI 48824 USA, Jan. 3, 2003—"Chapter 5: Generalized Reed-Solomon Codes" Internet Article, Jan. 3, 2003, pp. 63-76.

J. I. Hall, "Notes on Coding Theory," Dept. of Mathematics, Michigan State University, East Lansing, MI 48824 USA, Jan. 3, 2003—"Chapter 5: Generalized Reed-Solomon Codes" Internet Article, Jan. 3, 2003, pp. 63-76.

R. G. Gallager, "Low density parity check codes," IRE Trans. Info. Theory, vol. IT-8, pp. 21-28, Jan. 1962.

R. Gallager, Low-Density Parity-Check Codes, Cambridge, MA: MIT Press, 1963.

M. Luby, M. Mitzenmacher, M. A. Shokrollahi, D. A. Spielman, and V. Stemann, "Practical Loss-Resillient Codes", Proc. 29 th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

I. Djurdjevic, J. Xu, K. Abdel-Ghaffar and S. Lin, "A Class of Low-Density Parity-Check Codes Constructed Based on Reed-Solomon Codes With Two Informations Symbols," IEEE Communications Letters, vol. 7, No. 7, pp. 317-319, Jul. 2003.

Part 11: Wireless LAN Medium Access Control (MAC) and Physical Layer (PHY) specifications High-speed Physical Layer in the 5 GHz Band, IEEE Std 802.11a-1999.

LDPC code motion for Mon Feb. 28, 2005 Telecon, WWiSE consortium.

F. J. Macwilliams and N. J. A. Sloane, The Theory of Error-correcting Codes, North-Holland Mathematical Library, North-Holland, New York, 1998 (whole book).

Yan Li and William E. Ryan, "Bit-Reliability Mapping in LDPC-Coded Modulation Systems," IEEE Communications Letters, vol. 9, No. 1, Jan. 2005, pp. 1-3.

* cited by examiner

CONSTRUCTION OF IRREGULAR LDPC (LOW DENSITY PARITY CHECK) CODES USING RS (REED-SOLOMON) CODES OR GRS (GENERALIZED REED-SOLOMON) CODE

CROSS REFERENCE TO RELATED PATENTS/PATENT APPLICATIONS

Provisional Priority Claims

The present U.S. Utility patent application claims priority pursuant to 35 U.S.C. § 119(e) to the following U.S. Provisional Patent Applications which are hereby incorporated herein by reference in their entirety and made part of the present U.S. Utility patent application for all purposes:

1. U.S. Provisional Application Ser. No. 60/642,689, entitled "Construction of LDPC (Low Density Parity Check) codes using generalized RS (Reed-Solomon) code," filed Monday, Jan. 10, 2005 (Jan. 10, 2005), pending.

2. U.S. Provisional Application Ser. No. 60/674,084, entitled "Construction of Irregular LDPC (Low Density Parity Check) codes using RS (Reed-Solomon) codes or GRS (Generalized Reed-Solomon) code," filed Friday, Apr. 22, 2005 (Apr. 22, 2005), pending.

3. U.S. Provisional Application Ser. No. 60/675,346, entitled "Construction of Irregular LDPC (Low Density Parity Check) codes using RS (Reed-Solomon) codes or GRS (Generalized Reed-Solomon) code," filed Wednesday, Apr. 27, 2005 (Apr. 27, 2005), pending.

Incorporation by Reference

The following U.S. Utility patent application is hereby incorporated herein by reference in its entirety and made part of the present U.S. Utility patent application for all purposes:

1. U.S. Utility patent application Ser. No. 11/190,333, entitled "Construction of LDPC (Low Density Parity Check) codes using GRS (Generalized Reed-Solomon) code," filed Wednesday, Jul. 27, 2005 (Jul. 27, 2005), pending.

BACKGROUND OF THE INVENTION

1. Technical Field of the Invention

The invention relates generally to communication systems; and, more particularly, it relates to encoding and/or decoding of information within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. Theoretically, LDPC code has been shown to come within 0.004 dB (decibels) away from the Shannon limit. While this example was achieved using an irregular LDPC code of a length of one million, it nevertheless demonstrates the very promising application of LDPC codes within communication systems.

There appears continually to be a need in the art for some alternative coding types and modulation implementations that can provide near-capacity achieving error correction. LDPC codes offer such performance and are such possible candidates for this ongoing development.

There is no generally agreed "best" method to follow for the construction of LDPC codes with good performance. In the following reference [a], a regular LDPC code is constructed based on two codewords of an RS (Reed-Solomon) code.

[a] I. Djurdjevic, J. Xu, K. Abdel-Ghaffar and S. Lin, "A Class of Low-Density Parity-Check Codes Constructed Based on Reed-Solomon Codes With Two Information Symbols," IEEE Communications Letter, vol. 7, no. 7, pp. 317-319, July 2003.

However, this LDPC codes presented using the approach of this prior art reference are of a very narrow type and there is very little, if any, flexibility presented by this approach by which other types of LDPC codes may be designed. This lack of flexibility presents a significant challenge for any designed of such LDPC codes and/or communication devices to be implemented using such LDPC codes. Clearly, there seems to be a continual need for additional and better types of codes for use in various communication systems to provide for better means of error correction and better BER while operating at various amounts of SNR.

BRIEF SUMMARY OF THE INVENTION

A novel computer implemented method for constructing an LDPC matrix is presented. Such an LDPC matrix may be employed by any communication device that processes LDPC coded signals. The LDPC matrix may be employed directly by the communication device to perform LDPC decoding processing. It is also noted that once the LDPC matrix of any LDPC code is known, a corresponding generator matrix may also be constructed directly to allow encoding of at least one information bit thereby generating an LDPC codeword or code block (e.g., such as may be performed by an LDPC encoder).

In one embodiment, the method operates by choosing a plurality of possible bit degree distributions for an LDPC code block. Then, the method operates by selecting a bit degree distribution from among the plurality of possible bit degree distributions, wherein the selected bit degree distribution has a best performance threshold among the plurality of possible bit degree distributions. Once this is performed, the method operates by decomposing a parity check matrix that corresponds to a GRS-based regular LDPC code into a plurality of partial-matrices based on the selected bit degree distribution, wherein each partial-matrix of the plurality of partial-matrices has a corresponding bit degree and each partial-matrix of the plurality of partial-matrices has a corresponding plurality of permutation matrices. Thereafter, the method operates by replacing at least one permutation matrix within at least one partial-matrix of the plurality of partial-matrices with a zero matrix thereby generating a parity check matrix that corresponds to a GRS-based irregular LDPC code.

In another embodiment, multiple LDPC matrices may be constructed and compared to select one of the constructed LDPC matrices for use in processing LDPC coded signals. Moreover, in even another embodiment, an LDPC matrix may be decomposed into partial-matrices based on a bit degree distribution. At least one of these partial-matrices may be replaced with a zero matrix.

In addition, the present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel approach is presented that is operable to generate a wide variety of irregular LDPC (Low Density Parity Check) codes using RS (Reed-Solomon) code or GRS (Generalized Reed-Solomon) code. A designer is provided a great deal of latitude in generating many such irregular LDPC codes using these approaches. Certain of the inventors have invented means by which regular LDPC codes may be generated using GRS code. Using an RS code or GRS code to construct a regular LDPC code provides a good estimate of the minimum distance of the code. The error floor of this kind of regular LDPC code appears at a lower error rate. However, it is well known in the art that regular LDPC codes are not as good as irregular LDPC codes for achieving channel capacity (or Shannon limit) within a communication system.

In order to construct an LDPC code that performance good for both error floor and achieving capacity, a novel approach is presented by which irregular LDPC codes may be constructed based on RS codes or GRS code. Later in this disclosure, one possible embodiment shows that such one such irregular LDPC code gives 0.8 to 1 dB gain when compared to some known irregular LDPC codes in the application of recommendation practices and standards being developed by the IEEE (Institute of Electrical & Electronics Engineers) 802.11n Task Group (i.e., the Task Group that is working to develop a standard for 802.11 TGn (High Throughput)).

Before providing details into the construction of such LDPC codes, various descriptions of some of the communication systems and/or communication devices that may employ such LDPC codes are provided as well as some brief description of LDPC codes.

Figure 1:
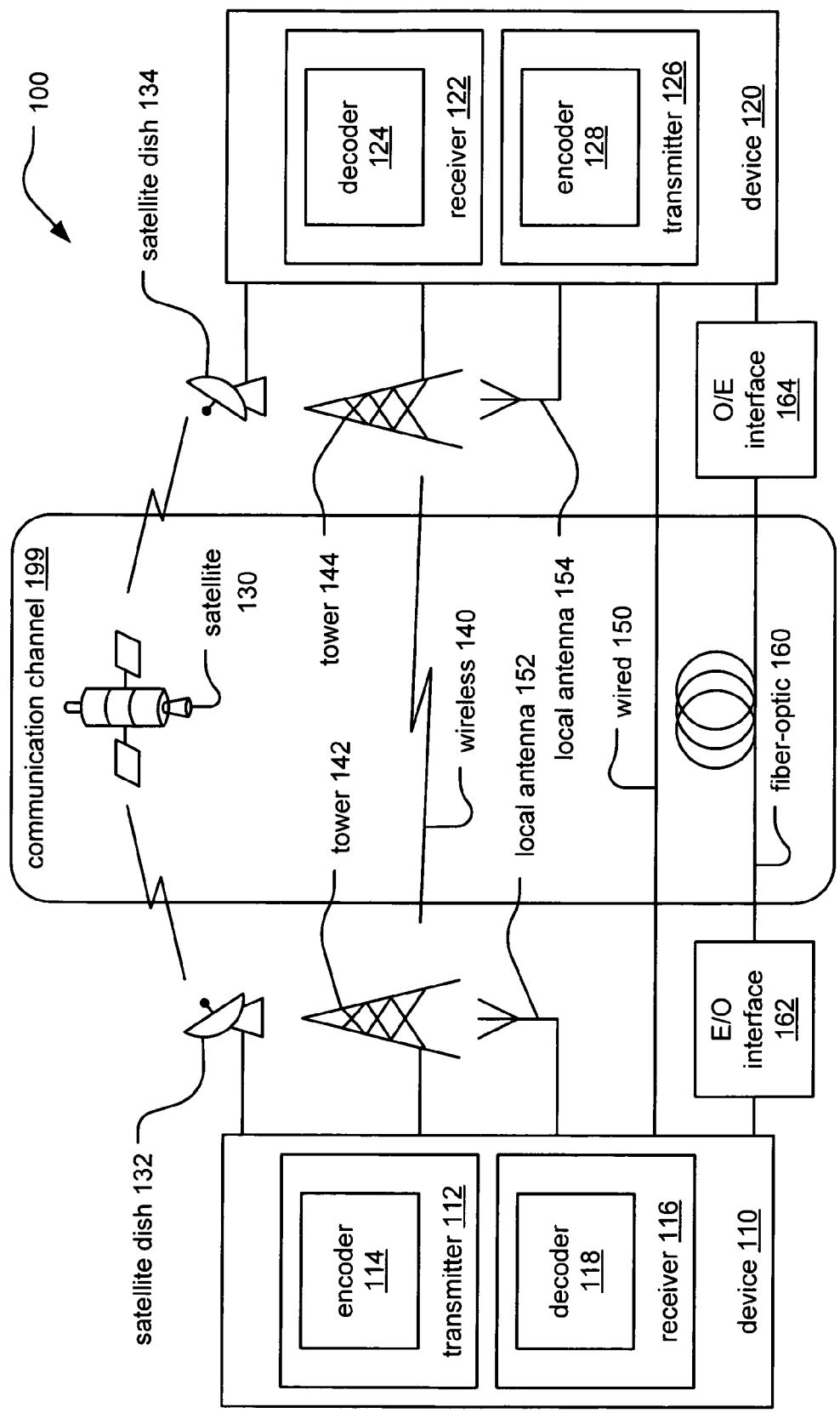
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
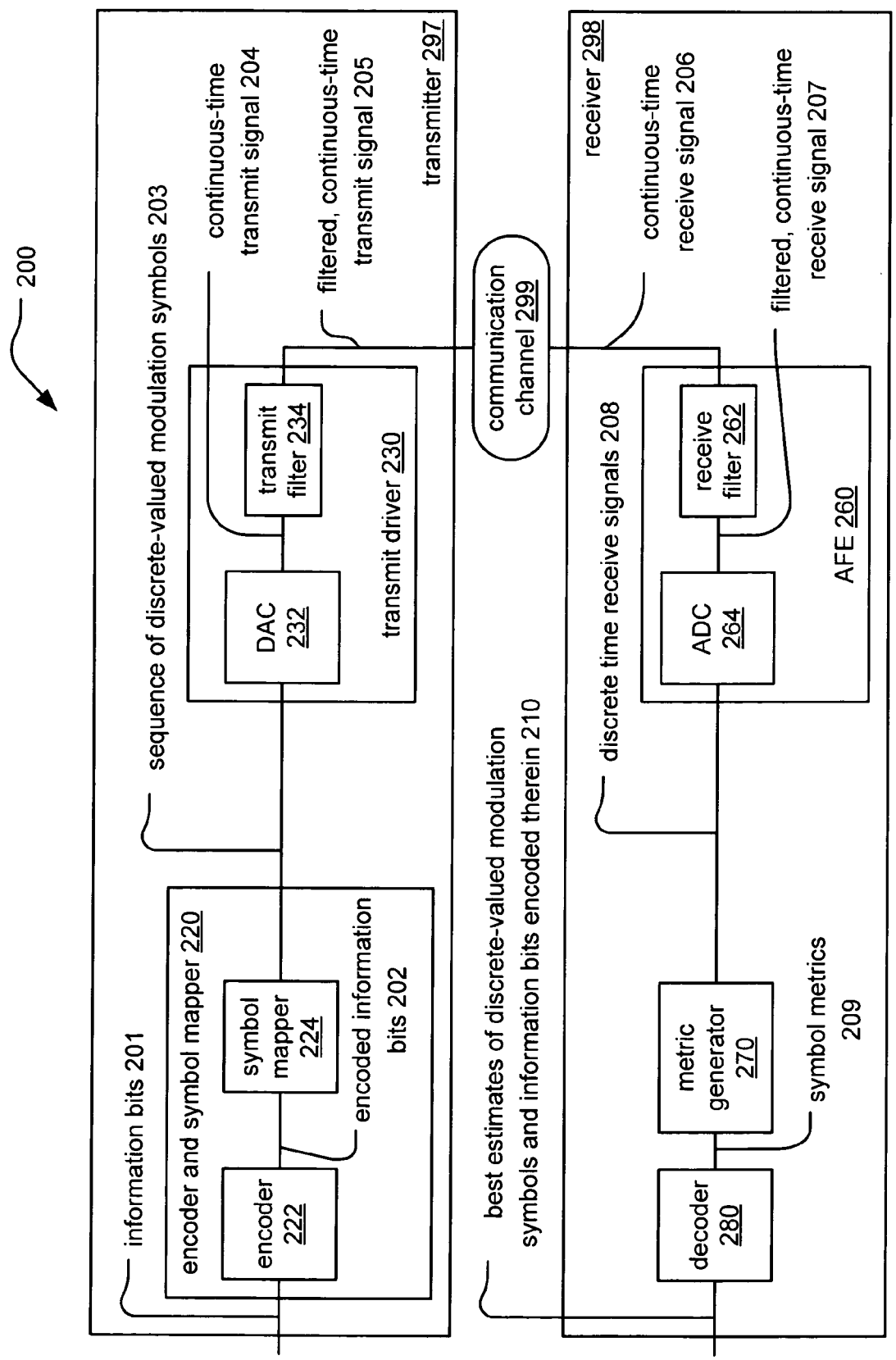

FIG. 1 and FIG. 2 are diagrams illustrating various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 tat is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The communication devices of either of the previous embodiments can be implemented to include various decoding aspects described herein. In addition, several of the following Figures describe other and particular embodiments (some in more detail) that may be used to support the devices, systems, functionality and/or methods that may be implemented to perform decoding of LDPC codes signals. Before more details are provided below, a general description of LDPC codes is provided.

Several of the following Figures describe other and particular embodiments (some in more detail) that may be used to support the devices, systems, functionality and/or methods that may be implemented to perform decoding of LDPC coded signals. Before more details are provided below, a general description of LDPC codes is provided.

Figure 3:
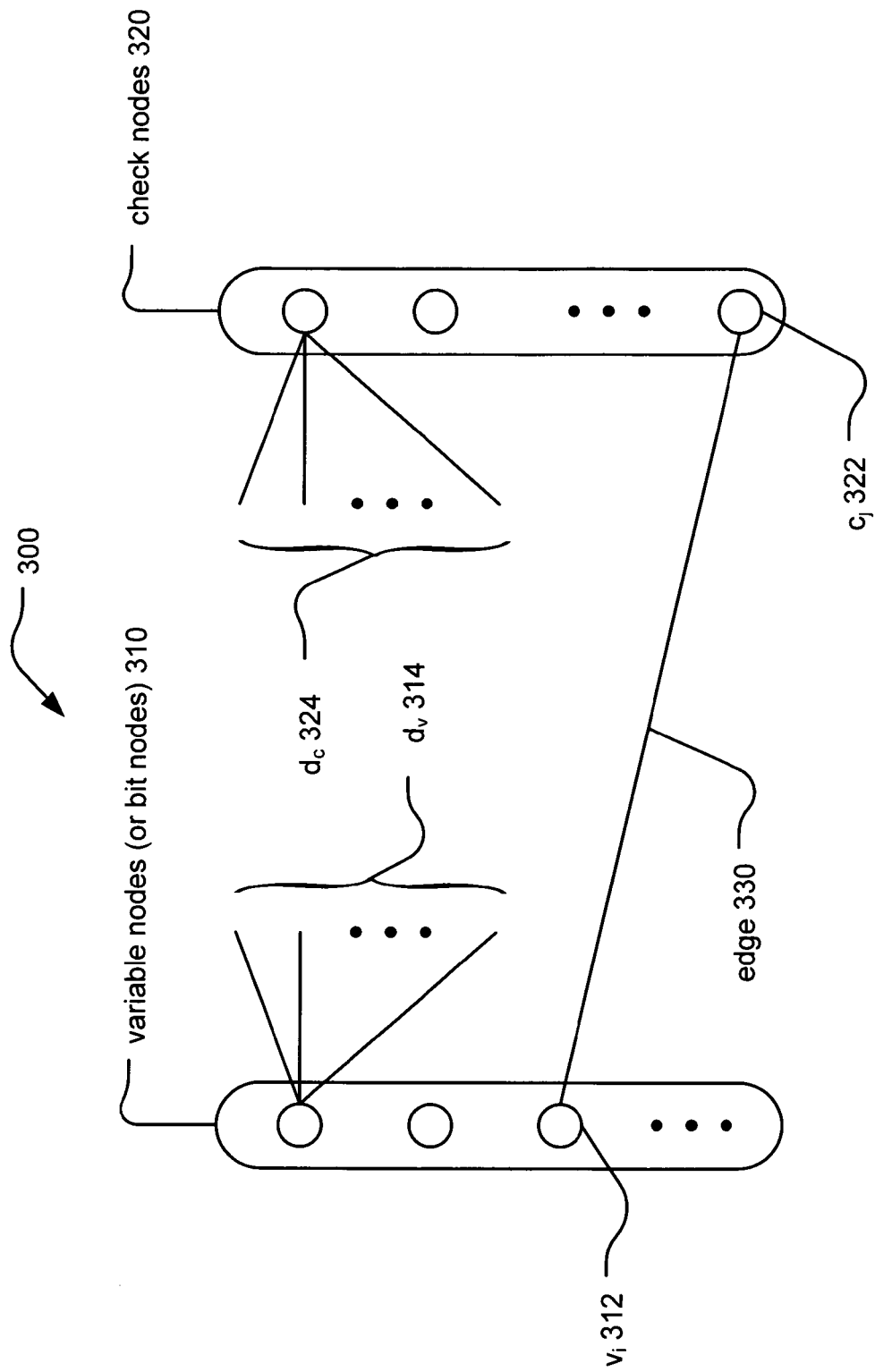
FIG. 3 illustrates an embodiment of an LDPC (Low Density Parity Check) code bipartite graph.

FIG. 3 is a diagram illustrating an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. Luby, M. Mitzenmacher, M. A. Shokrollahi, D. A. Spielman, and V. Stemann, "Practical Loss-Resilient Codes", *Proc. 29th Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i, j). However, on the other hand, given an edge e=(i, j), the nodes of the edge may alternatively be denoted as by e=(v(e),c(e)) (or e=(b(e), c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding,'" IEEE Trans. Inform. Theory, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and}$$

$$\rho(x) = \sum_{i=2}^{M_c} \rho_i x^{i-1},$$

where $M_v$ and $M_c$ represent the maximal degrees for variable nodes and check nodes, respectively.

Initially, some information regarding RS codes and GRS code is provided to assist in the reader in the understanding of the construction of irregular LDPC codes using RS codes or GRS codes in accordance with certain aspects of the invention.

Finite Field

Consider a finite field (Galois field) GF ($p^m$), where p is a prime number. Let $\alpha$ be a primitive element of this field. Then, $$GF(p^m) = \{0, \alpha, \ldots, \alpha^{p^m-1}\}. \quad (EQ\ 1)$$

Two Codewords Generated from Dimension Two (2-D) RS code

Let $\rho \leq p^m - 1$. Let C be a two dimensional (2-D) shortened RS code of length $\rho$. Then it is well known that the minimum distance of this RS code is $\rho - 2 + 1 = \rho - 1$. Moreover, there are codewords in this code having weight (i.e., the number of non-zero elements) of $\rho$ or $\rho - 1$. One possible way to construct such a code is given in the following reference [a] (also identified above), and whose methodology can be described below.

[a] I. Djurdjevic, J. Xu., K. Abdel-Ghaffar, and S. Lin, "A Class of Low-Density Parity-Check Codes Constructed Based on Reed-Solomon Codes with Two Information Symbols," IEEE Communications Letters, Vol. 7, No. 7, July 2003, pp. 317-319.

Define a polynomial $g(x) \in GF(p^m)[x]$ such that $$g(x) = (x - \alpha)(x - \alpha^2) \ldots (x - \alpha^{\rho-2}) = \sum_{i=0}^{\rho-2} g_i x^i \quad (EQ\ 2)$$

where $g_{\rho-2} = 1$. Then using this polynomial, a 2-D code may be generated with the following generator matrix.

$$G = \begin{bmatrix} g_0 & g_1 & \cdots & g_{\rho-3} & 1 & 0 \\ 0 & g_0 & \cdots & g_{\rho-4} & g_{\rho-3} & 1 \end{bmatrix} \quad (EQ\ 3)$$

Next, a weight $\rho$ codeword (e.g., $c_0$) and a weight $\rho - 1$ codeword (e.g., $c_1$), are taken from the 2-D code C.

Alternatively, the two codewords from generalized Reed-Solomon (GRS) code may be generated as described in the U.S. provisional and U.S. utility patent applications that have been incorporated by reference in full detail above and that are briefly referenced again here.

1. U.S. Provisional Application Ser. No. 60/642,689, entitled "Construction of LDPC (Low Density Parity Check) codes using generalized RS (Reed-Solomon) code," Jan. 10, 2005.

1. U.S. Utility patent application Ser. No. 11/190,333, entitled "Construction of LDPC (Low Density Parity Check) codes using GRS (Generalized Reed-Solomon) code," filed Jul. 27, 2005, pending.

This alternative approach of using 2 codewords from GRS code to generate the LDPC code is briefly described here.

With GRS code, the integer $\rho$ can be any number between 1 to $p^m$. Take a location set $L = \{\alpha^{i_0}, \ldots, \alpha^{i_{\rho-1}}\}$. Take $\rho$ non-zero elements $v_0, v_1, \ldots, v_{\rho-1}$ from the Galois field (i.e., $GF(p^m)$). Then one can generate a two dimensional (2-D) GRS code as follows:

$$C = \{(v_0 f(\alpha^{i_0}), v_1 f(\alpha^{i_1}), \ldots, v_{\rho-1} f(\alpha^{i_{\rho-1}})) | f \in GF(p^m)[x], \deg(f) < 2\} \quad (EQ\ 4)$$

where $GF(p^m)[x]$ is a polynomial ring over Galois field (i.e., $GF(p^m)$). Take degree 1 polynomial $f_0 = f_{0,1} x + f_{0,0}$ and $f_1 = f_{1,1} x + f_{1,0}$, where $f_{i,j} \in GF(p^m)$, such that $f_0(\lambda) \neq 0$ for all $\lambda \in L$, and $f_1(x) \neq \beta f_0(x)$ for all $\beta \in GF(p^m)$. Then the two codewords of C may be represented as follows:

$$c_0 = (v_0 f_0(\alpha^{i_0}), v_1 f_0(\alpha^{i_1}), \ldots, v_{\rho-1} f_0(\alpha^{i_{\rho-1}}))$$

$$c_1 = (v_0 f_1(\alpha^{i_0}), v_1 f_1(\alpha^{i_1}), \ldots, v_{\rho-1} f_1(\alpha^{i_{\rho-1}})). \quad (EQ\ 5)$$

Two Codewords Generated from Dimension Two (2-D) RS Code

With the two codewords of the code C, (i.e., $c_0, c_1$), one can generate a one dimensional (1-D) RS code and $p^m - 1$ cosets.

A first 1-D code may be generated as follows:

$$C_0 = \{\beta c_0 | \beta \in GF(p^m)\} = \{c_{0,0}, c_{0,1}, \ldots, c_{0,p^m-1}\} \quad (EQ\ 6)$$

Another $p^m - 1$ cosets may be generated as follows:

$$C_i = \alpha^{i-1} c_1 + C_0 = \{\alpha^{i-1} c_1 + x | x \in C_0\}, i = 1, \ldots, p^m - 1 \quad (EQ\ 7)$$

Every coset $C_i$ may be denotes $C_i = \{c_{i,0}, \ldots, c_{i,p^m-1}\}$ Moreover, every $\rho$-vector $c_{i,j}$ may be denoted by $c_{i,j} = (c_{i,j,0}, \ldots, c_{i,j,\rho-1})$ where $c_{i,j,k} \in GF(p^m)$.

Regular LDPC Codes Generated by Words of the Cosets

Define a location map $L: GF(p^m) \to \{0,1\}^{p^m}$ such that $L(\alpha^i)$ is a $p^m$-vector and such that the i+1 is 1 and all other positions are 0. For example, $L(0) = (10 \ldots 0)$, $L(\alpha) = (010 \ldots 0)$, and etc.

For every coset $C_i$, one can construct $\rho$ separate $p^m \times p^m$-permutation matrices as follows:

$$P_{i,k} = \begin{bmatrix} L(c_{i,0,k}) \\ L(c_{i,1,k}) \\ \cdots \\ L(c_{i,p^m-2,k}) \\ L(c_{i,p^m-1,k}) \end{bmatrix}, \quad k = 0, \ldots, \rho - 1 \quad (EQ\ 8)$$

Choose a set of $\gamma$ cosets, say $\{C_{i_1}, C_{i_2}, \ldots, C_{i_\gamma}\}$, a parity check matrix H can be constructed as follows:

$$H = \begin{bmatrix} P_{i_1,0} & P_{i_1,1} & \cdots & P_{i_1,\rho-1} \\ P_{i_2,0} & P_{i_2,1} & & P_{i_2,\rho-1} \\ \vdots & & \ddots & \\ P_{i_\gamma,0} & P_{i_\gamma,1} & & P_{i_\gamma,\rho-1} \end{bmatrix} \quad (EQ\ 9)$$

which is a low density matrix. Therefore, one can use this low density matrix to generate an LDPC code (having this low density matrix as a LDPC parity check matrix of the LDPC code). Clearly, such an LDPC code has a bipartite graph having bit degree γ and having check degree ρ. Also, such an LDPC code is a regular LDPC code.

In the Djurdjevic, et al. reference [a]identified above, it is shown that such an LDPC code has minimum distance at least γ+2 if γ is even, or γ+1 if γ is odd. In other words, the minimum distance, $d_{min}$, of such an LDPC code is provided as follows:

$$d_{min} \geq \begin{cases} \gamma+2 & \text{even } \gamma \\ \gamma+1 & \text{odd } \gamma \end{cases}$$

These kinds of LDPC codes may be referred to as RS-based LDPC codes or GRS-based regular LDPC codes. Since a RS code is a special case of the GRS code, the general term of GRS code is employed subsequently and may be viewed as including both any of the various RS codes as well as the GRS code.

Constructing GRS-Based Irregular LDPC Codes

In order to achieve both near capacity (or Shannon limit) and a lower error floor, a novel approach is presented herein to construct a GRS-based irregular LDPC code by modifying a GRS-based regular LDPC code that has been constructed according to the principles of H in (EQ 9) above. The generation of the parity check matrix that corresponds to this GRS-based irregular LDPC code is performed by replacing some permutation matrices of the parity check matrix that corresponds to the GRS-based regular LDPC code constructed according to (EQ 9) above within to all 0 matrices; this process of replacing a permutation matrix with an all zero-valued matrix can be referred to as "puncturing". That is to say, at least one permutation matrix within the parity check matrix is replaced with a zero matrix (i.e., a matrix having all 0 valued entries).

One design choice is which of the permutation matrices should be replaced by a zero matrix (i.e., a matrix having all 0 valued entries). There is wide latitude left to the designer to select which of the permutation matrices should be replaced by a zero matrix.

Figure 4:
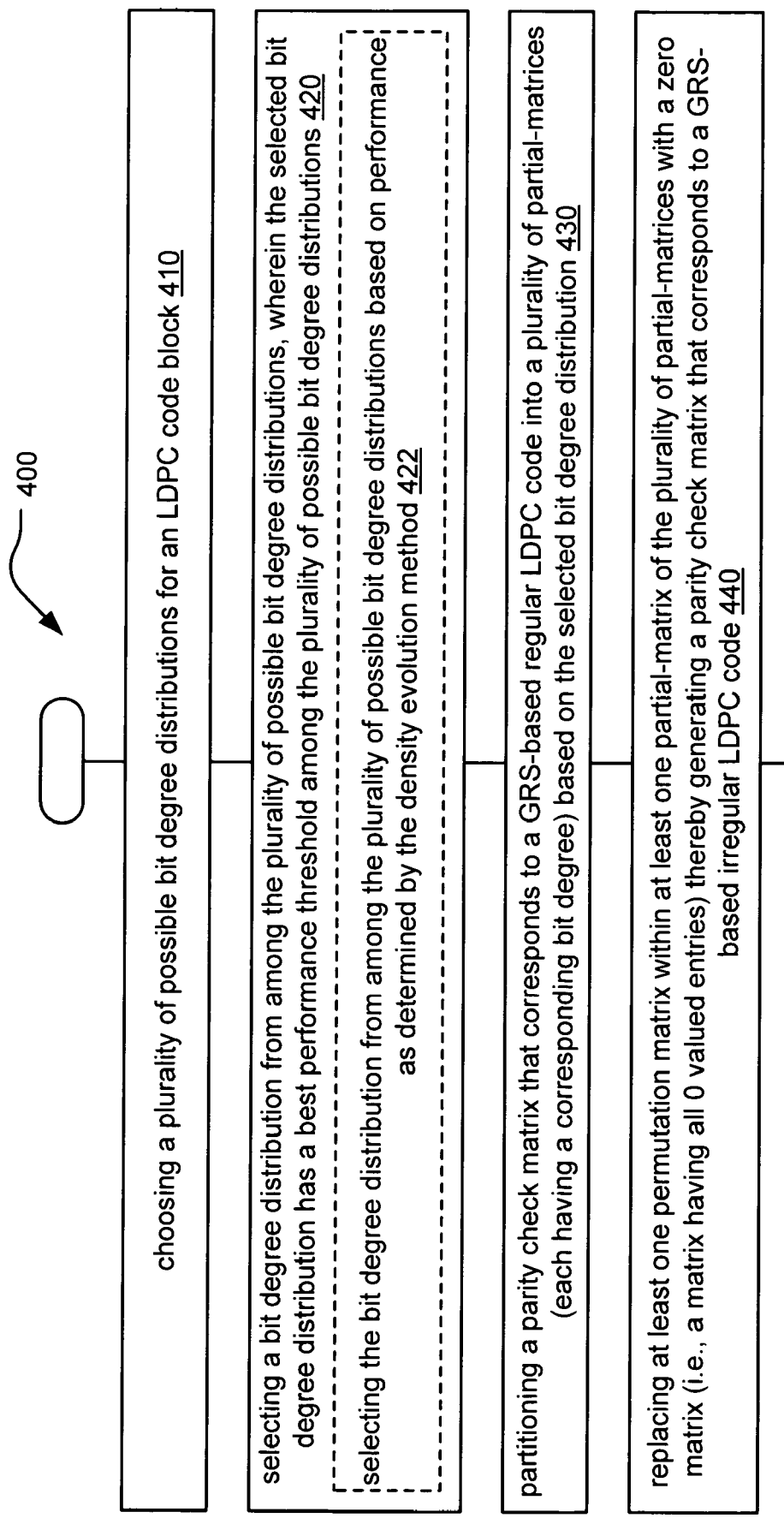
FIG. 4 illustrates an embodiment of a method for constructing a parity check matrix that corresponds to a GRS (Generalized Reed-Solomon)-based irregular LDPC (Low Density Parity Check) code.

FIG. 4 illustrates an embodiment of a method 400 for constructing a parity check matrix that corresponds to a GRS (Generalized Reed-Solomon)-based irregular LDPC (Low Density Parity Check) code.

As shown in a block 410, the method involves choosing a plurality of possible bit degree distributions for an LDPC code block. There is an understanding in the art that 3 different bit degrees in an LDPC code block (e.g., in the irregular LDPC code context) provides for best performance. However, it is noted that degree distributions that include other than 3 different types of bit degrees may also be employed without departing from the scope and spirit of the invention. Several of the embodiments described herein employ 3 different bit degree distributions The method then continues by selecting a bit degree distribution from among the plurality of possible bit degree distributions as shown in a block 420. It is noted that the selected bit degree distribution has a best performance threshold among the plurality of possible bit degree distributions. In some instances, the method may involve selecting the bit degree distribution from among the plurality of possible bit degree distributions based on performance as determined by the density evolution method, as shown in a block 422.

For example, the selection of which bit degree distribution to be employed may be performed using a theoretical method such as density evolution method to get the degree distribution. The density evolution method is described in detail in the following reference [3] (also identified above):

[3] T. J. Richardson and R. L. Urbanke, "The capacity of low-density parity-check code under message-passing decoding,'" IEEE Trans. Inform. Theory, Vol. 47, pp. 599-618, February 2001.

Given a code rate, one may first choose γ. Then, a parity check matrix, H, may be constructed to be a $\gamma p^m \times \rho p^m$ matrix of the form as described with respect to (EQ 9) above. The largest bit degree of the to-be-constructed GRS-based irregular LDPC code is then γ. A designed may also choose other degrees that are less than γ, as well as their corresponding bit degree distribution based on some other theoretical method. The number of bits within the block having the same bit degree will then be the multiple of $p^m$.

An example of the choosing of the plurality of possible bit degree distributions is provided below.

Example 1 Let p=3, m=4, ρ=24 and γ=8. Then a GRS-based regular LDPC code can be constructed by a 648×1944 H matrix containing 192 distinct 81×81 permutation matrices. It has bit degree 8 and check degree 24. As mentioned above, it is generally understood in the art that usually 3 different bit degrees provide for the best irregular LDPC codes. In this following example, the lowest degree is chosen as being a bit degree of 2. In general, the lowest bit degree within the bit degree distribution can be any number less than 8. Among all of the possible bit degree distributions for the LDPC code block, bit degree distributions including 3 distinct bit degree distributions are consider in this particular example. Specifically, 11 possible bit degree distributions are considered for the LDPC code block. The following table shows these 11 possible bit degree distributions:

TABLE 1

|     | deg = 8 | deg = 7 | deg = 6 | deg = 5 | deg = 4 | deg = 3 | deg = 2 |
|-----|---------|---------|---------|---------|---------|---------|---------|
| D1  | 648     |         |         |         |         | 648     | 648     |
| D2  | 648     |         |         |         | 648     |         | 648     |
| D3  | 324     |         |         |         | 972     |         | 648     |
| D4  | 162     |         |         |         | 1134    |         | 648     |
| D5  | 486     |         |         |         | 810     |         | 648     |
| D6  | 648     |         |         | 648     |         |         | 648     |
| D7  | 216     |         |         | 1080    |         |         | 648     |
| D8  | 432     |         |         | 864     |         |         | 648     |
| D9  | 648     |         | 648     |         |         |         | 648     |
| D10 | 324     |         | 972     |         |         |         | 648     |
| D11 | 648     | 648     |         |         |         |         | 648     |

Using the density evolution method that is described in the Richardson, et al. reference identified above, it is found that the bit degree distribution, D3, is one of the best candidates. In general, one can use any method to select the bit degree distribution from among a plurality of possible bit degree distributions. For example, one may use the criterion of the bit degree distribution having the best performance threshold among the among the plurality of possible bit degree distributions. Alternatively, the density evolution method may be employed to select the bit degree distribution to be used to construct the GRS-based irregular LDPC code.

The parity check matrix corresponding to the bit degree distribution, D3, may be denoted as H. This parity check matrix, H, then contains 8×24 separate and distinct 81×81 sub-matrices (referred to as permutation matrices when not replaced by a zero matrix). The parity check matrix, H, has 4 columns of 8 permutation matrices, 12 columns of 4 permutation matrices and 8 columns of 2 permutation matrices. The rest of the sub-matrices are all zero matrices (i.e., matrices having all 0 valued entries). Thus, only 4×8+12×4+8×2=96 sub-matrices are permutation matrices. 192−96=96 permutation matrices in the original regular LDPC code needs to be replaced by all zero matrices.

As mentioned above, the method then involves selecting a bit degree distribution from among the plurality of possible bit degree distributions as shown in a block 120. The selection of which permutation matrix or permutation matrices should be replaced by all zero matrices may include a wide variety of design considerations. For example, after constructing a number of different GRS-based irregular LDPC codes, consideration may be given to the performance of the various GRS-based irregular LDPC codes (e.g., selecting the one providing the best performance), the ease/difficulty of a decoder's implementation (e.g., the hardware implementation) to decode such a coded signal in a particular application, as well as other design considerations without departing from the scope and spirit of the invention. It is noted that determination of which GRS-based LDPC code provides the best performance may require a great deal of intensive simulations by a designer.

Example 1 (Continued)

The example provided above is continued here to show several possible selections of parity check matrices that correspond to a GRS-based irregular LDPC code. Subsequently and later in this disclosure, several performance comparisons are provides showing the improvement in performance provided by employing GRS-based irregular LDPC codes.

The method then continues by partitioning a parity check matrix that corresponds to a GRS-based regular LDPC code into a plurality of partial-matrices (each having a corresponding bit degree) based on the selected bit degree distribution, as shown in a block 430. The number of partial-matrices corresponds to the number of bit degrees within the selected bit degree distribution.

As an example of one possible embodiment, when the selected bit degree distribution includes 3 separate bit degrees, then the parity check matrix, H, may be decomposed into 3 separate partial-matrices. Continuing on with this example, this decomposed parity check matrix, H, may be denoted as follows:

$$H = [H_1, H_2, H_3] \quad (EQ\ 10)$$

When considering the bit degree distribution selected above, D3, then each of these partial-matrices has a corresponding bit degree. For example, according to the Table 1 provide above, the partial-matrix, $H_1$, has a bit degree of 8; the partial-matrix, $H_2$, has a bit degree of 4; and the partial-matrix, $H_3$, has a bit degree of 2. One possible design of the first partial-matrix, $H_1$, may be depicted as follows:

$$H_1 = \begin{bmatrix} P_{1,1} & P_{1,2} & P_{1,3} & P_{1,4} \\ P_{2,1} & P_{2,2} & P_{2,3} & P_{2,4} \\ P_{3,1} & P_{3,2} & P_{3,3} & P_{3,4} \\ P_{4,1} & P_{4,2} & P_{4,3} & P_{4,4} \\ P_{5,1} & P_{5,2} & P_{5,3} & P_{5,4} \\ P_{6,1} & P_{6,2} & P_{6,3} & P_{6,4} \\ P_{7,1} & P_{7,2} & P_{7,3} & P_{7,4} \\ P_{8,1} & P_{8,2} & P_{8,3} & P_{8,4} \end{bmatrix}.$$

This first partial-matrix, $H_1$, is a 648×423 matrix constructed by the individual permutation matrices, $P_{i,j}$, which are each 81×81 permutation matrices. It is noted that while many different values are employed in various examples within this disclosure, clearly many of these particular values described herein may be selected and modified by a designer of such a GRS-based irregular LDPC code to design an appropriate code for use in a particular application. In other words, these values are employed to assist the reader in understanding the various aspects of the invention, and a designer is free to employ other values to design a different GRS-based irregular LDPC code.

The method continues by replacing at least one permutation matrix within at least one partial-matrix of the plurality of partial-matrices with a zero matrix (i.e., a matrix having all 0 valued entries) thereby generating a parity check matrix that corresponds to a GRS-based irregular LDPC code, as shown in a block 440.

There are a wide variety of means by which certain one or more of the permutation matrices may be replaced by zero matrices.

One possible design of the second partial-matrix, $H_2$, (after modification being depicted as $H_2^1$), may be depicted as follows:

$$H_2^1 = \begin{bmatrix} P_{1,5} & & P_{1,8} & P_{1,9} & & & P_{1,12} & P_{1,13} & & & P_{1,16} \\ P_{2,5} & & P_{2,8} & P_{2,9} & & & P_{2,12} & P_{2,13} & & & P_{2,16} \\ P_{3,5} & P_{3,6} & & P_{3,9} & P_{3,10} & & P_{3,13} & P_{4,13} & & & \\ P_{4,5} & P_{4,6} & & P_{4,9} & P_{4,10} & & P_{4,13} & P_{4,14} & & & \\ & P_{5,6} & P_{5,7} & & P_{5,10} & P_{5,11} & & & P_{5,14} & P_{5,15} & \\ & P_{6,6} & P_{6,7} & & P_{6,10} & P_{6,11} & & & P_{6,14} & P_{6,15} & \\ & & P_{7,7} & P_{7,8} & & P_{7,11} & P_{7,12} & & & P_{7,15} & P_{7,16} \\ & & P_{8,7} & P_{8,8} & & P_{8,11} & P_{8,12} & & & P_{8,15} & P_{8,16} \end{bmatrix}$$

This second modified partial-matrix, $H_2^1$, is a 648×972 matrix such that the each of the empty positions of the matrix represents an 81×81 zero matrix (e.g., all 81×81 entries therein being 0) and the remaining matrices, $P_{i,j}$, are all corresponding permutation matrices.

An alternative possible design of the second partial-matrix, $H_2$, (after modification being depicted as $H_2^2$), may be depicted as follows:

$$H_2^2 = \begin{bmatrix} P_{1,5} & & P_{1,7} & & P_{1,6} & & P_{1,9} & & P_{1,11} & & P_{1,13} & \\ & P_{2,6} & & P_{2,5} & & P_{2,8} & & P_{2,10} & & P_{2,12} & & P_{2,14} \\ P_{2,5} & & P_{3,7} & & P_{3,6} & & P_{3,9} & & P_{3,11} & & P_{3,13} & \\ & P_{4,6} & & P_{4,5} & & P_{4,8} & & P_{4,10} & & P_{4,12} & & P_{4,14} \\ P_{5,5} & & P_{5,7} & & P_{5,6} & & P_{5,9} & & P_{5,11} & & P_{5,13} & \\ & P_{6,6} & & P_{6,5} & & P_{6,8} & & P_{6,10} & & P_{6,12} & & P_{6,14} \\ P_{7,5} & & P_{7,7} & & P_{7,6} & & P_{7,9} & & P_{7,11} & & P_{7,13} & \\ & P_{8,6} & & P_{8,5} & & P_{8,8} & & P_{8,10} & & P_{7,12} & & P_{8,14} \end{bmatrix}$$

This alternative embodiment of the modified second partial-matrix, $H_2^2$, is a 648×972 matrix such that the each of the empty positions of the matrix represents an 81×81 zero matrix (e.g., all 81×81 entries therein being 0) and the remaining matrices, $P_{i,j}$, are all corresponding permutation matrices.

One possible design of the third partial-matrix, $H_3$, (after modification being depicted as $H_3^1$), may be depicted as follows:

$$H_3^1 = \begin{bmatrix} P_{1,17} & P_{1,18} & & & & & & \\ & P_{2,18} & P_{2,19} & & & & & \\ & & P_{3,19} & P_{3,20} & & & & \\ & & & P_{4,20} & P_{4,21} & & & \\ & & & & P_{5,21} & P_{5,22} & & \\ & & & & & P_{6,22} & P_{6,23} & \\ & & & & & & P_{7,23} & P_{7,24} \\ P_{8,17} & & & & & & & P_{8,24} \end{bmatrix}$$

This first embodiment of the modified third partial-matrix, $H_3^1$, is a 648×648 matrix such that the each of the empty positions of the matrix represents an 81×81 zero matrix (e.g., all 81×81 entries therein being 0) and the remaining matrices, $P_{i,j}$, are all corresponding permutation matrices.

An alternative possible design of the third partial-matrix, $H_3$, (after modification being depicted as $H_3^2$), may be depicted as follows:

$$H_3^2 = \begin{bmatrix} P_{1,17} & & & & & & & P_{1,24} \\ P_{2,17} & P_{2,18} & & & & & & \\ & P_{3,18} & P_{3,19} & & & & & \\ & & P_{4,19} & P_{4,20} & & & & \\ & & & P_{5,20} & P_{5,21} & & & \\ & & & & P_{6,21} & P_{6,22} & & \\ & & & & & P_{7,22} & P_{7,23} & \\ & & & & & & P_{8,23} & P_{8,24} \end{bmatrix}$$

This alternative embodiment of the modified third partial-matrix, $H_3^2$, is also a 648×648 matrix such that the each of the empty positions of the matrix represents an 81×81 zero matrix (e.g., all 81×81 entries therein being 0) and the remaining matrices, $P_{i,j}$, are all corresponding permutation matrices.

There is a wide variety of means by which each of these partial matrices may modified thereby generating a parity check matrix that corresponds to a GRS-based irregular LDPC code. A designer has great latitude to select which of the permutation matrices are to be replaced by zero matrices. These various embodiments of modified partial-matrices illustrate just some possible examples by which the parity check matrix may be generated.

Using just this small number of modified partial-matrices, a number of different parity check matrices may be generated as indicated below.

$$H(1) = [H_1, H_2^1, H_3^1]$$

$$H(2) = [H_1, H_2^1, H_3^2]$$

$$H(3) = [H_1, H_2^2, H_3^1]$$

$$H(4) = [H_1, H_2^1, H_3^1]$$

Two of these possible parity check matrices are looked at in closer detail below.

Now, a GRS-based regular LDPC code (LDPC$_0$) may be constructed according to the constraints and design of the (EQ 9) as shown above. The same values of p=3, m=4, ρ=24 and γ=8 may be employed as was given above with respect to the Example 1. This GRS-based regular LDPC code (LDPC$_0$) code has rate 0.67.

Then, a parity check matrix that corresponds to a GRS-based irregular LDPC code (LDPC$_1$) may be constructed using the modified partial-matrices depicted as follows:

$$H(1) = [H_1, H_2^1, H_3^1] \tag{EQ 11}$$

This GRS-based irregular LDPC code (LDPC$_1$) has code rate 0.667.

Then, a parity check matrix that corresponds to another GRS-based irregular LDPC code (LDPC$_2$) may be constructed using the modified partial-matrices depicted as follows:

$$H(3) = [H_1, H_2^2, H_3^1] \tag{EQ 12}$$

This GRS-based irregular LDPC code (LDPC$_2$) also has code rate 0.667.

The following diagram shows an embodiment of how one GRS-based irregular LDPC code may be selected during a design approach from among a plurality of GRS-based irregular LDPC codes.

Figure 5:
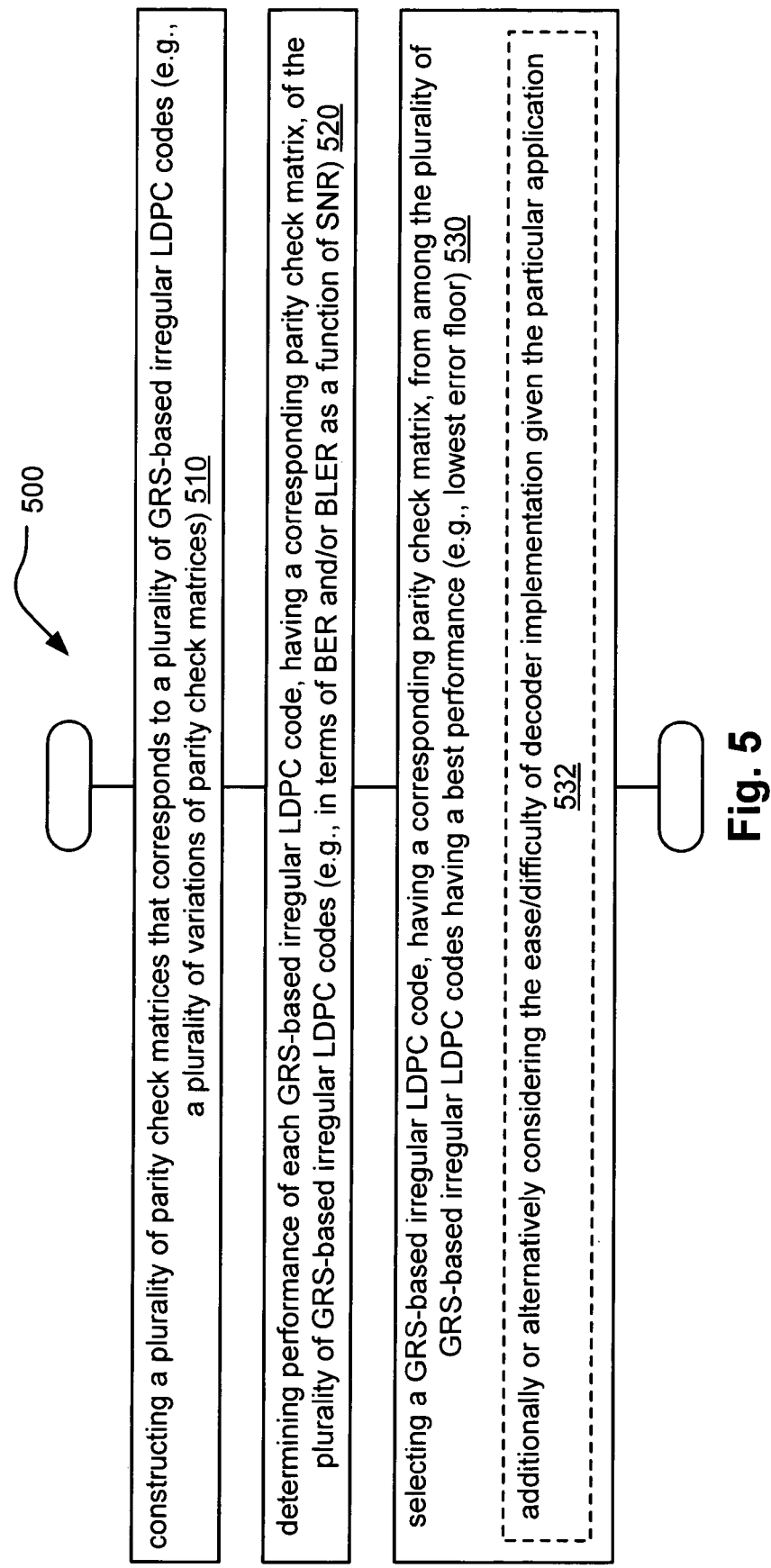
FIG. 5 illustrates an embodiment of a method for selecting a GRS-based irregular LDPC code.

FIG. 5 illustrates an embodiment of a method 500 for selecting a GRS-based irregular LDPC code. This method involves generating a plurality of parity check matrices that corresponds to a plurality of GRS-based irregular LDPC codes (e.g., a plurality of variations of parity check matrices), as shown in a block 510. The various embodiments described above may be employed to generate the plurality of parity check matrices that corresponds to a plurality of GRS-based irregular LDPC codes. Then, as shown in a block 520, the method involves determining the performance of each GRS-based irregular LDPC code, having a corresponding parity check matrix, of the plurality of GRS-based irregular LDPC codes (e.g., in terms of BER and/or BLER as a function of SNR). The method then involves selecting a GRS-based irregular LDPC code, having a corresponding parity check matrix, from among the plurality of GRS-based irregular LDPC codes having a best performance, as shown in a block 530. In some instances, this best performance may be viewed in terms of which GRS-based irregular LDPC code has the lowest error floor in terms of BER/BLER as a function of SNR. The selection of which of the GRS-based irregular LDPC codes should be selected may include additionally or alternatively considering the ease/difficulty of decoder implementation given the particular application, as shown in a block 532.

Figure 6:
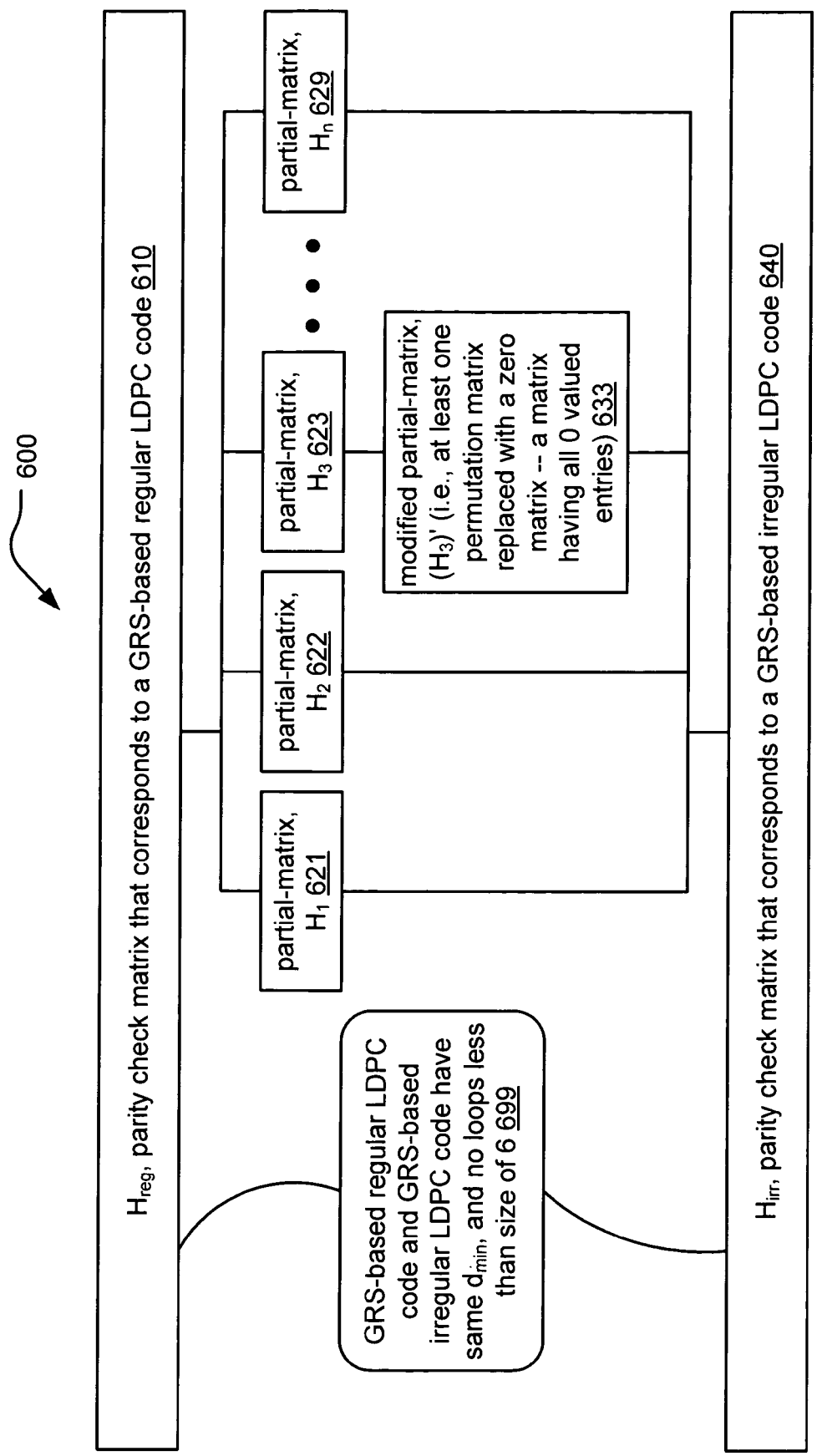
FIG. 6 illustrates an embodiment of generation of a parity check matrix that corresponds to a GRS-based irregular LDPC code using a parity check matrix that corresponds to a GRS-based regular LDPC code.

FIG. 6 illustrates an embodiment 600 of generation of a parity check matrix that corresponds to a GRS-based irregular LDPC code using a parity check matrix that corresponds to a GRS-based regular LDPC code. This diagram may assist the reader in understanding the manner by which the parity check matrix is constructed.

As can be seen, a parity check matrix, $H_{reg}$, that corresponds to a GRS-based regular LDPC code, as indicated by reference numeral 610, is decomposed into a plurality of partial-matrices (shown as partial matrix, $H_1$ 621, partial matrix, $H_2$ 622, partial matrix, $H_3$ 623, and ... partial matrix, $H_n$ 629). The number of partial-matrices into which the parity check matrix, $H_{reg}$, that corresponds to a GRS-based regular LDPC code is decomposed may be selected by the designer of the GRS-based irregular LDPC code.

Then, at least one of these partial-matrices (e.g., partial matrix, $H_3$ 623) is modified by replacing at least one of the permutation matrices therein with a zero matrix (i.e., a matrix having all 0 valued entries); this modified partial-matrix is referred to as partial-matrix, $(H_3)'$ 633. Also, any one of the partial-matrices may be modified; the partial-matrix, $H_3$ 623 being modified into the partial-matrix, $(H_3)'$ 633 is shown in this diagram just as one possible design choice. Clearly, other of the partial-matrices may alternatively be modified. In addition, more than one of the partial-matrices may be modified without departing from the scope and spirit of the invention.

Thereafter, these partial-matrices are then employed to generate a parity check matrix, $H_{irr}$, that corresponds to a GRS-based irregular LDPC code, as indicated by reference numeral 640.

The minimum distance, $d_{min}$, of such a GRS-based irregular LDPC code is provided as follows:

$$d_{min} \geq \begin{cases} \gamma + 2 & \text{even } \gamma \\ \gamma + 1 & \text{odd } \gamma \end{cases}$$

It is also noted, as indicated by reference numeral 699, that the minimum distance, $d_{min}$, of such the GRS-based irregular LDPC code is the same minimum distance, $d_{min}$, of the GRS-based regular LDPC code that is used to generate the GRS-based irregular LDPC code. In other words, both of the GRS-based irregular LDPC code and the GRS-based regular LDPC code has the same minimum distance, $d_{min}$. Also, as indicated by the reference numeral 699, each of the GRS-based irregular LDPC code and the GRS-based regular LDPC code has no loops less than size of 6. There are no size 4 loops in either of the LDPC bipartite graphs that correspond to either of the GRS-based irregular LDPC code and the GRS-based regular LDPC code.

Also, the corresponding LDPC bipartite graph for such a GRS-based irregular LDPC code will have no cycle (or loop) that is less than or equal to 4. The minimum cycle (or loop) of the corresponding LDPC bipartite graph would then be 6. That is to say, each loop of an LDPC bipartite graph that corresponds to the GRS-based irregular LDPC code is at least a size of 6; the code should have no size 4 loops.

Moreover, given the fact that the GRS-based irregular LDPC code is in fact an "irregular" LDPC code, it will provide for better performance than that of a "regular" LDPC code.

In this disclosure, various performance diagrams are described in the context of BLER (Block Error Rate) versus $E_b/N_o$ (ratio of energy per bit $E_b$ to the Spectral Noise Density $N_0$). BLER is oftentimes used in the context of wireless communications where if any one bit in a block is determined to be in error, then the entire block is determined to be in error. In some other communication system application, performance may be viewed in terms of BER (Bit Error Rate) vs. $E_b/N_o$. This term $E_b/N_o$ is the measure of SNR (Signal to Noise Ratio) for a digital communication system. When looking at these performance curves, the BLER may be determined for any given $E_b/N_o$ (or SNR) thereby providing a relatively concise representation of the performance of the decoding approach.

Several different performance comparisons are provided below that show the improved performance provided by a GRS-based irregular LDPC code when compared to some other codes.

Figure 7:
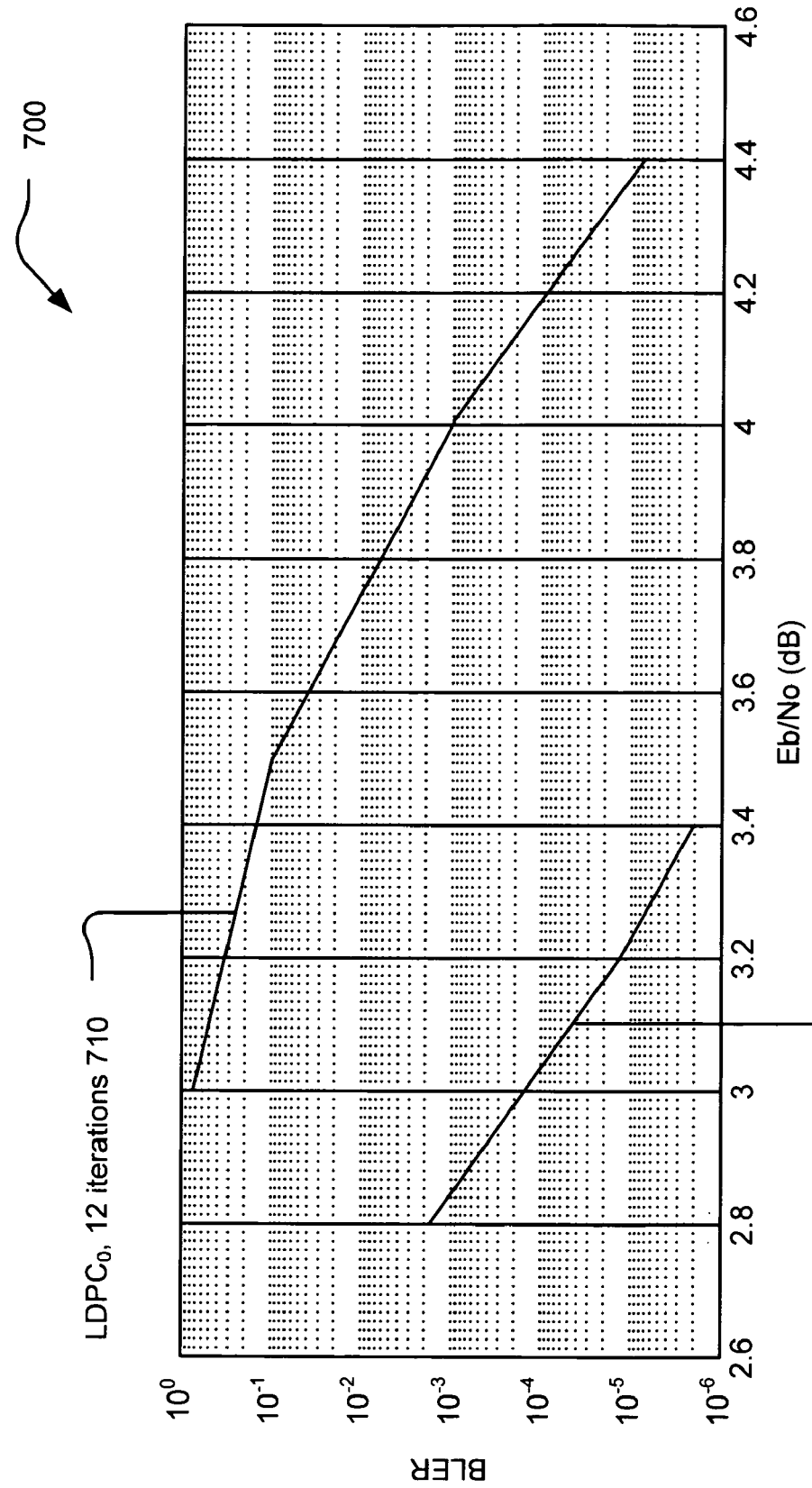
FIG. 7 illustrates an embodiment of a performance comparison between a GRS-based regular LDPC code ($LDPC_0$) and a second GRS-based irregular LDPC code ($LDPC_2$) on an AWGN (Additive White Gaussian Noise) communication channel.

FIG. 7 illustrates an embodiment of a performance comparison 700 between a GRS-based regular LDPC code ($LDPC_0$) (shown by reference numeral 710) and a second GRS-based irregular LDPC code ($LDPC_2$) (shown by reference numeral 720) on an AWGN (Additive White Gaussian Noise) communication channel.

This first example considers BPSK (Binary Phase Shift Key) modulation and an AWGN (Additive White Gaussian Noise) communication channel. These performance curves shows that at BLER=1.5×10−5, $LDPC_2$ over-performing $LDPC_0$ by 1.2 dB.

Figure 8:
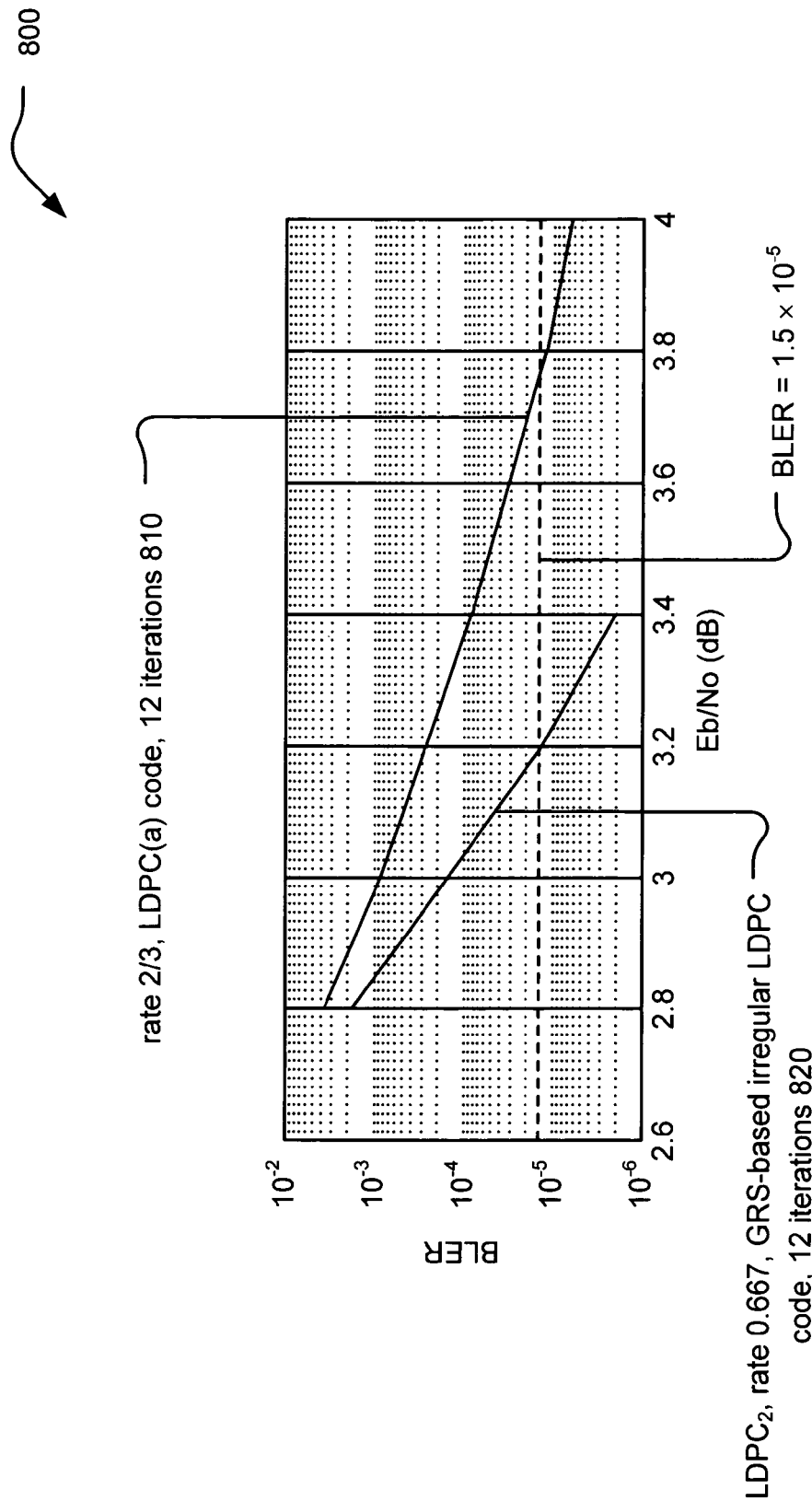
FIG. 8 illustrates an embodiment of a performance comparison between a GRS-based irregular LDPC code ($LDPC_2$) and an alternative LDPC code, LDPC(a), on an AWGN communication channel.

FIG. 8 illustrates an embodiment of a performance comparison 800 between a GRS-based irregular LDPC code ($LDPC_2$) (shown by reference numeral 820) and an alternative LDPC code, LDPC(a) (shown using reference numeral 810), on an AWGN communication channel.

The LDPC code, $LDPC_2$, depicted in each of FIG. 7 and FIG. 8 has the corresponding parity check matrix of EQ (12) as provided above. Again, this GRS-based irregular LDPC code ($LDPC_2$) has code rate 0.667.

This diagram compares codes $LDPC_2$ to a rate 2/3 code that is depicted by LDPC(a). This rate 2/3 code (LDPC(a)) is provided by the reference [4] cited below.

[4] LDPC code motion for Mon 28 Feb. 2005 Telecon, WWiSE consortium.

The WWiSE (World Wide Spectrum Efficiency) is an alliance of companies and entities developing a proposal for the IEEE 802.11n Wireless LAN Standard. More information related to the WWiSE may be found publicly on the WWiSE's maintained Internet site.

The following performance curves shows that at BLER=1.5×10−5, $LDPC_2$ over-performing the alternative LDPC code, LDPC(a), by 0.55 dB.

In the IEEE 802.11n application, the Rayleigh fading communication channel is considered and the modulation is 64

QAM (Quadrature Amplitude Modulation) with the mapping given in IEEE 802.11a standard as referenced below in [5]:

[5] Part 11: Wireless LAN Medium Access Control (MAC) and Physical Layer (PHY) specifications: High-speed Physical Layer in the 5 GHZ Band, *IEEE Std* 802.11a-1999.

The entirety of this document is publicly available and may be downloaded from the IEEE's maintained Internet site.

Figure 9:
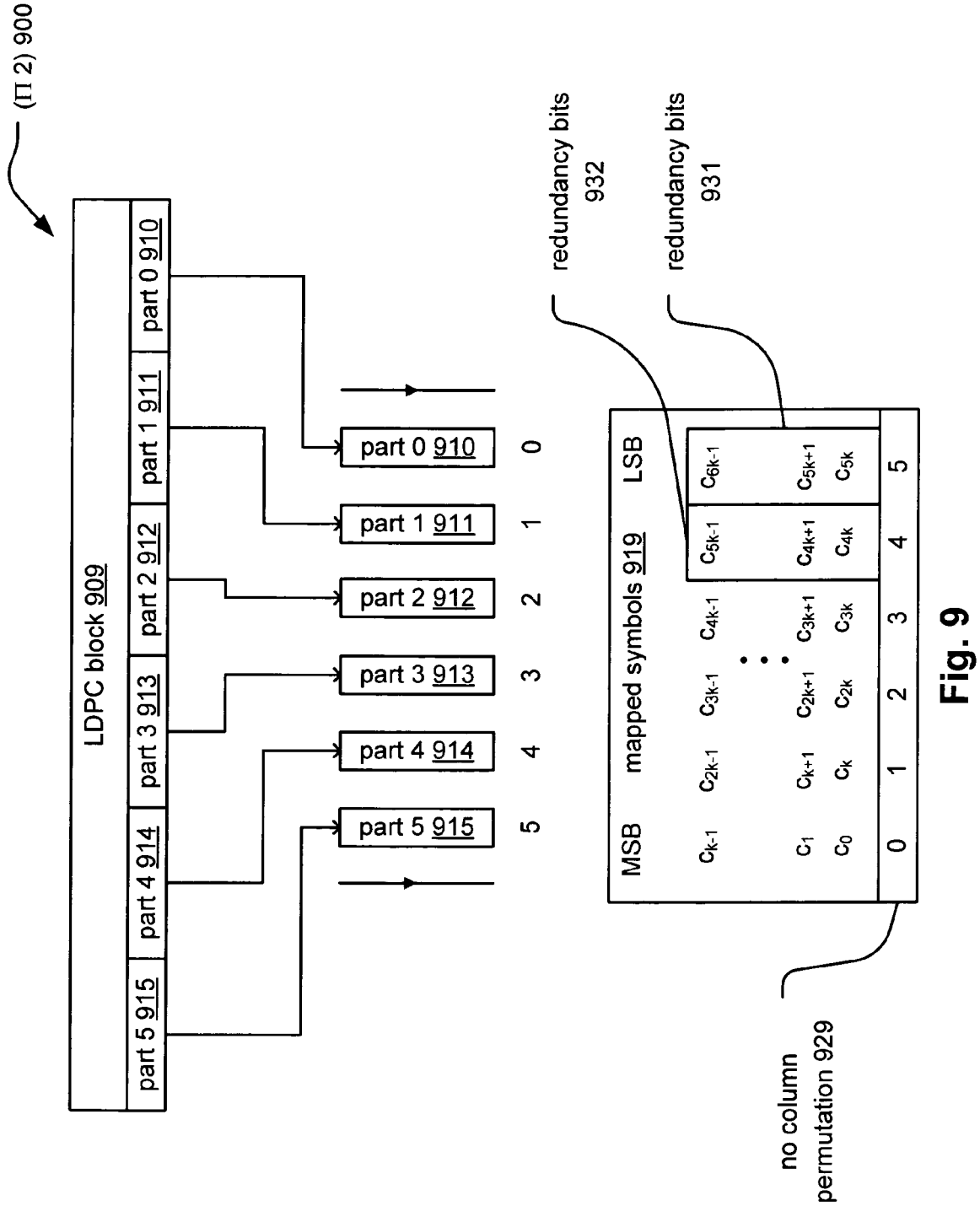
FIG. 9, FIG. 10, FIG. 11, FIG. 12, and FIG. 13 illustrate embodiments of bit to symbol interleaving.
Figure 10:
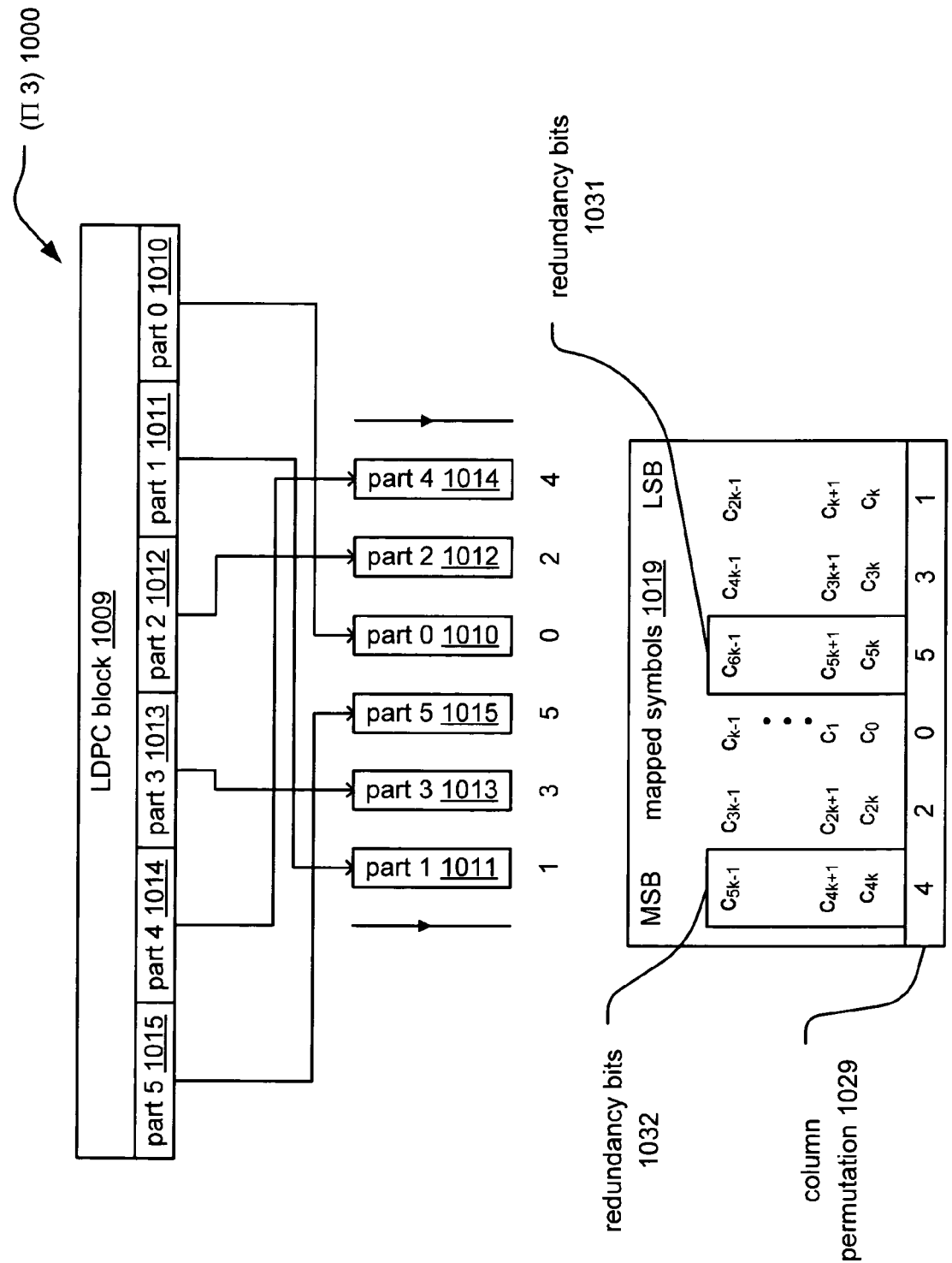
Figure 11:
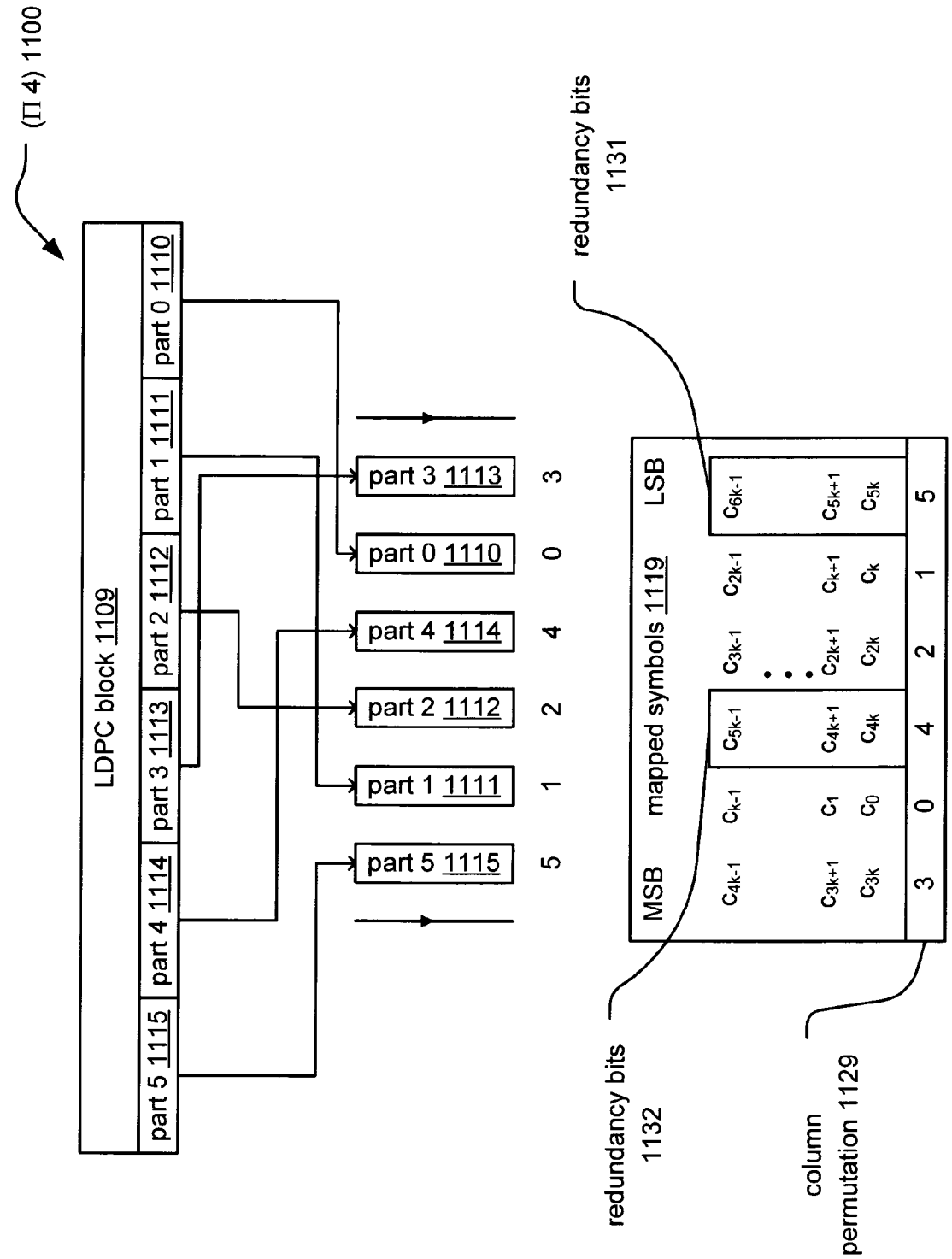
Figure 12:
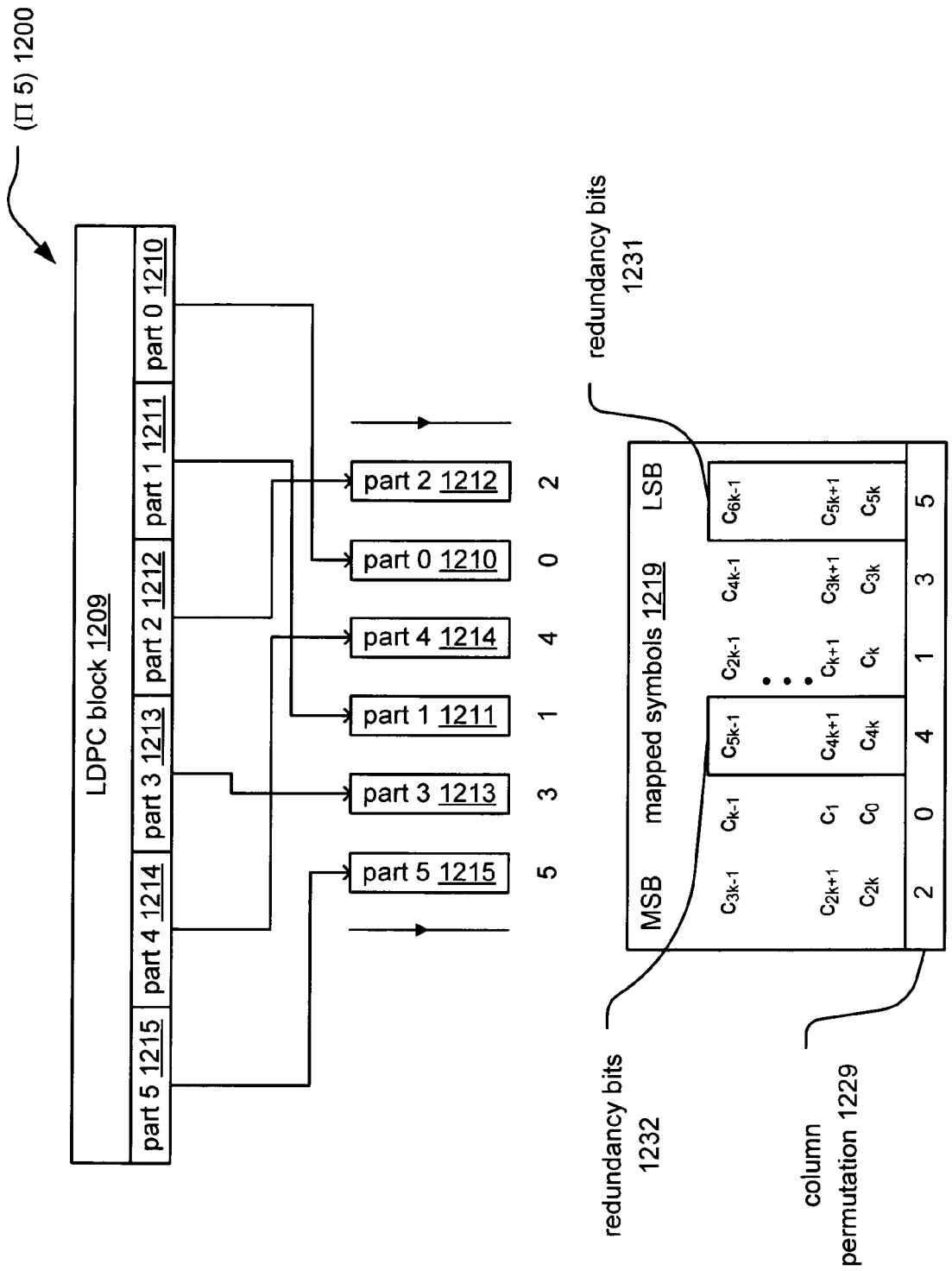
Figure 13:
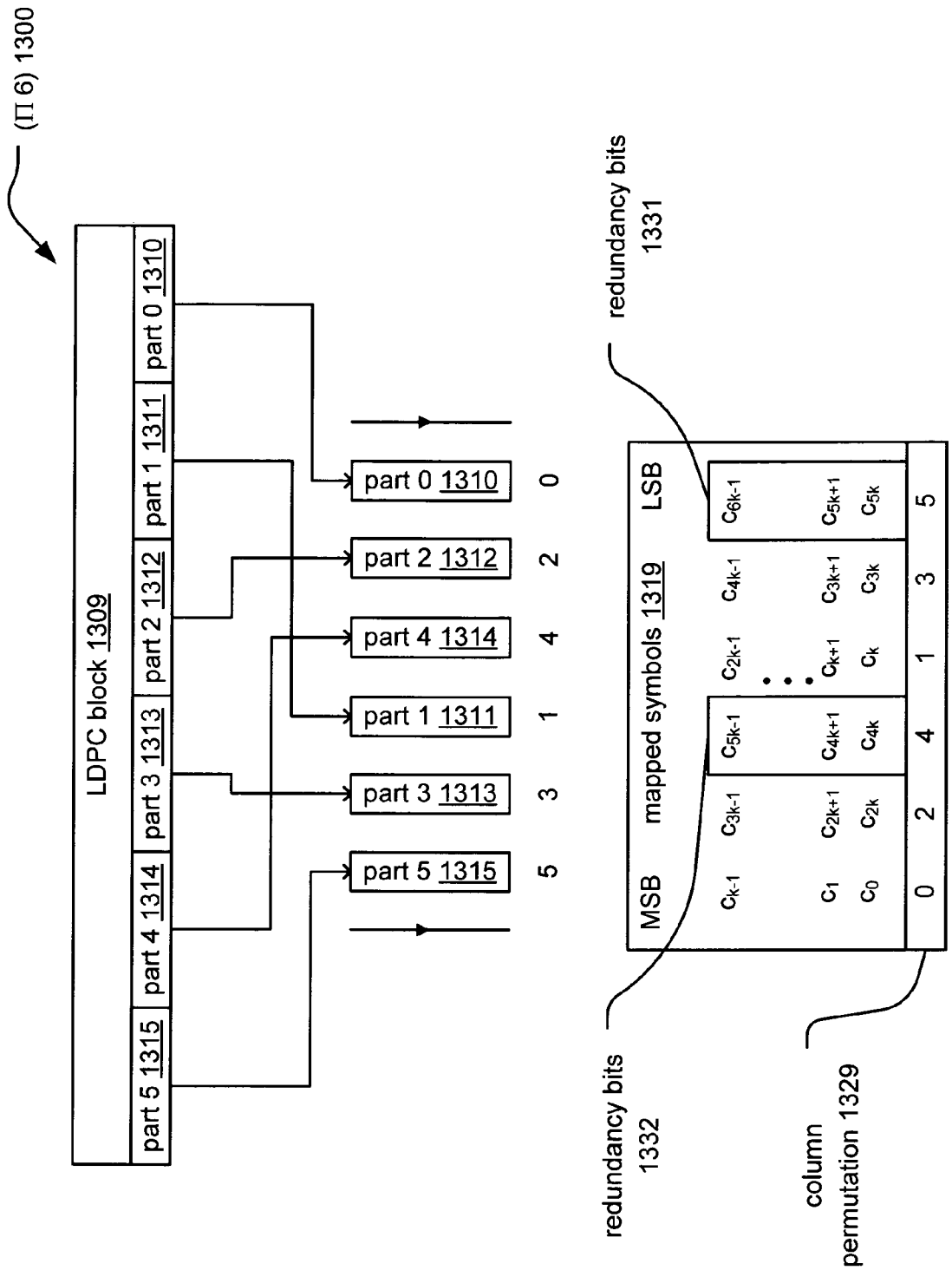

FIG. 9, FIG. 10, FIG. 11, FIG. 12, and FIG. 13 illustrate embodiments of bit to symbol interleaving. Specifically, FIG. 9 shows embodiment 900 (interleave 2, shown as (Π 2)); FIG. 10 shows embodiment 1000 (interleave 3, shown as (Π 3)); FIG. 11 shows embodiment 1100 (interleave 4, shown as (Π 4)); FIG. 12 shows embodiment 1200 (interleave 5, shown as (Π 4)); and FIG. 13 shows embodiment 1300 (interleave 6, shown as (Π 6); respectively, of various embodiments of bit to symbol interleaving. Each of these is shown as being a 6-bit symbol interleave that operates on an LDPC block of encoded bits (e.g., an LDPC codeword). Clearly, any other number (i.e., n) of columns may be employed to perform a bit to n-bit interleave as well without departing from the scope and spirit of the invention.

Referring to the embodiment 900 (interleave 2, shown as (Π 2)) of the FIG. 9, an LDPC block 909 is received and may be viewed as being partitioned or divided into a plurality of parts. For example, the LDPC block 909 is divided into part 0 910, part 1 911, part 2 912, part 3 913, part 4 914, and part 5 915. Each of these parts is provided to a corresponding column.

Each of the parts is provided to a plurality of column as indicated in the diagram. The 6 bit labels to be symbol mapped (as indicated by reference numeral 919) that are pulled out from the columns are as follows (MSB (Most Significant Bit) on left . . . LSB (Least Significant Bit) on right):

$1^{st}$ 6 bit label: $c_0 c_k c_{2k} c_{3k} c_{4k} c_{5k}$ $2^{nd}$ 6 bit label: $c_1 c_{k+1} c_{2k+1} c_{3k+1} c_{4k+1} c_{5k+1}$

. . .

nth 6 bit label: $c_{k-1} c_{2k-1} c_{3k-1} c_{4k-1} c_{5k-1} c_{6k-1}$

Each of the parts that is provided to each of the corresponding columns has k bits. The total number of bits of the LDPC block 909 is 6k.

As can be seen with respect to the LSB and MSB of the bits that are pulled out from the rows, there is no column permutation with respect to the columns into which the parts are partitioned as indicated by the reference numeral 929. The bits ($c_{5k-1}, \ldots, c_{4k+1}, c_{4k}$) and the LSB bits ($c_{6k-1}, \ldots, c_{5k+1}, c_{5k}$) are redundancy bits as selected from the LDPC block 909 as indicated by the reference numerals 932 and 931, respectively.

Referring to the embodiment 1000 (interleave 3, shown as (Π 3)) of the FIG. 10, an LDPC block 1009 is received and may be viewed as being partitioned or divided into a plurality of parts. For example, the LDPC block 1009 is divided into part 0 1010, part 1 1011, part 2 1012, part 3 1013, part 4 1014, and part 5 1015. Each of these parts is provided to a corresponding column.

Each of the parts is provided to a plurality of columns in an analogous fashion as the previous embodiment. However, the columns are permuted as indicated in the diagram.

The 6 bit labels to be symbol mapped (as indicated by reference numeral 1019) that are pulled out from the columns are as follows (MSB on left . . . LSB on right):

$1^{st}$ 6 bit label: $c_{4k} c_{2k} c_0 c_{5k} c_{3k} c_k$ $2^{nd}$ 6 bit label: $c_{4k+1} c_{2k+1} c_1 c_{5k+1} c_{3k+1} c_{k+1}$

. . .

nth 6 bit label: $c_{5k-1} c_{3k-1} c_{k-1} c_{6k-1} c_{4k-1} c_{2k-1}$

Each of the parts that is provided to each of the corresponding columns has k bits. The total number of bits of the LDPC block 1009 is 6k.

As can be seen with respect to the LSB (Least Significant Bit) and MSB of the bits that are pulled out from the rows, there is a column permutation with respect to the columns into which the parts are partitioned as indicated by the reference numeral 1029. The MSB bits ($c_{5k-1}, \ldots, c_{4k+1}, c_{4k}$) and the bits ($c_{6k-1}, \ldots, c_{5k+1}, c_{5k}$) are redundancy bits as selected from the LDPC block 1009 as indicated by the reference numerals 1032 and 1031, respectively.

Referring to the embodiment 1100 (interleave 4, shown as (Π 4)) of the FIG. 11, an LDPC block 1109 is received and may be viewed as being partitioned or divided into a plurality of parts. For example, the LDPC block 1109 is divided into part 0 1110, part 1 1111, part 2 1112, part 3 1113, part 4 1114, and part 5 1115. Each of these parts is provided to a corresponding column.

Each of the parts is provided to a plurality of columns in an analogous fashion as the previous embodiment. However, the columns are permuted as indicated in the diagram.

The 6 bit labels to be symbol mapped (as indicated by reference numeral 1119) that are pulled out from the columns are as follows (MSB on left . . . LSB on right):

$1^{st}$ 6 bit label: $c_{3k} c_0 c_{4k} c_{2k} c_k c_{5k}$ $2^{nd}$ 6 bit label: $c_{3k+1} c_1 c_{4k+1} c_{2k+1} c_{k+1} c_{5k+1}$

. . .

nth 6 bit label: $c_{4k-1} c_{k-1} c_{5k-1} c_{3k-1} c_{2k-1} c_{6k-1}$

Each of the parts that is provided to each of the corresponding columns has k bits. The total number of bits of the LDPC block 1109 is 6k.

As can be seen with respect to the LSB (Least Significant Bit) and MSB of the bits that are pulled out from the rows, there is a column permutation with respect to the columns into which the parts are partitioned as indicated by the reference numeral 1129. The bits ($c_{5k-1}, \ldots, c_{4k+1}, c_{4k}$) and the LSB bits ($c_{6k-1}, \ldots, c_{5k+1}, c_{5k}$) are redundancy bits as selected from the LDPC block 1109 as indicated by the reference numerals 1132 and 1131, respectively.

Referring to the embodiment 1200 (interleave 5, shown as (Π 5)) of the FIG. 12, an LDPC block 1209 is received and may be viewed as being partitioned or divided into a plurality of parts. For example, the LDPC block 1209 is divided into part 0 1210, part 1 1211, part 2 1212, part 3 1213, part 4 1214, and part 5 1215. Each of these parts is provided to a corresponding column.

Each of the parts is provided to a plurality of columns in an analogous fashion as the previous embodiment. However, the columns are permuted as indicated in the diagram.

The 6 bit labels to be symbol mapped (as indicated by reference numeral 1219) that are pulled out from the columns are as follows (MSB on left . . . LSB on right):

$1^{st}$ 6 bit label: $c_{2k} c_0 c_{4k} c_k c_{3k} c_{5k}$ $2^{nd}$ 6 bit label: $c_{2k+1} c_1 c_{4k+1} c_{k+1} c_{3k+1} c_{5k+1}$

. . .

nth 6 bit label: $c_{3k-1} c_{k-1} c_{5k-1} c_{2k-1} c_{4k-1} c_{6k-1}$

Each of the parts that is provided to each of the corresponding columns has k bits. The total number of bits of the LDPC block 1209 is 6k.

As can be seen with respect to the LSB (Least Significant Bit) and MSB of the bits that are pulled out from the rows, there is a column permutation with respect to the columns into which the parts are partitioned as indicated by the reference numeral 1229. The bits ($c_{5k-1}, \ldots, c_{4k+1}, c_{4k}$) and the LSB bits ($c_{6k-1}, \ldots, c_{5k+1}, c_{5k}$) are redundancy bits as selected from the LDPC block 1209 as indicated by the reference numerals 1232 and 1231, respectively.

Referring to the embodiment 1300 (interleave 6, shown as (Π 6)) of the FIG. 13, an LDPC block 1309 is received and may be viewed as being partitioned or divided into a plurality of parts. For example, the LDPC block 1309 is divided into part 0 1310, part 1 1311, part 2 1312, part 3 1313, part 4 1314, and part 5 1315. Each of these parts is provided to a corresponding column.

Each of the parts is provided to a plurality of columns in an analogous fashion as the previous embodiment. However, the columns are permuted as indicated in the diagram.

The 6 bit labels to be symbol mapped (as indicated by reference numeral 1319) that are pulled out from the columns are as follows (MSB on left . . . LSB on right):

$1^{st}$ 6 bit label: $c_0 c_{2k} c_{4k} c_k c_k c_{5k}$ $2^{nd}$ 6 bit label: $c_1 c_{2k+1} c_{4k+1} c_{k+1} c_{3k+1} c_{5k+1}$

. . .

nth 6 bit label: $c_{k-1} c_{3k-1} c_{5k-1} c_{2k-1} c_{4k-1} c_{6k-1}$

Each of the parts that is provided to each of the corresponding columns has k bits. The total number of bits of the LDPC block 1309 is 6k.

As can be seen with respect to the LSB (Least Significant Bit) and MSB of the bits that are pulled out from the rows, there is a column permutation with respect to the columns into which the parts are partitioned as indicated by the reference numeral 1329. The bits ($c_{5k-1}, \ldots, c_{4k+1}, c_{4k}$) and the LSB bits ($c_{6k-1}, \ldots, c_{5k+1}, c_{5k}$) are redundancy bits as selected from the LDPC block 1309 as indicated by the reference numerals 1332 and 1331, respectively.

Figure 14:
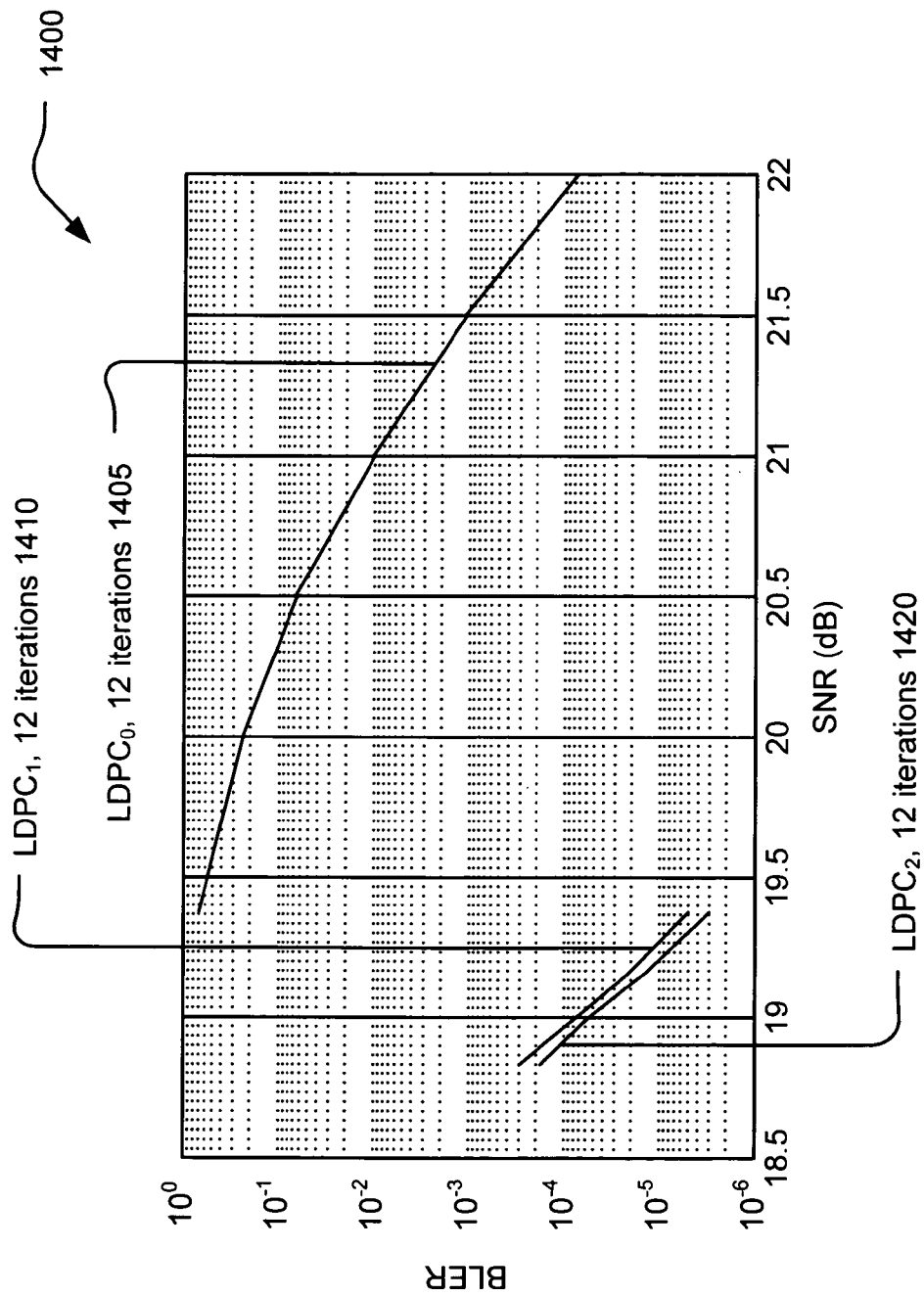
FIG. 14 illustrates an embodiment of a performance comparison between a GRS-based regular LDPC code ($LDPC_0$), a first GRS-based irregular LDPC code ($LDPC_1$), and a second GRS-based irregular LDPC code ($LDPC_2$) on a Rayleigh fading communication channel.

FIG. 14 illustrates an embodiment of a performance comparison 1400 between a GRS-based regular LDPC code ($LDPC_0$) (shown by reference numeral 1405), a first GRS-based irregular LDPC code ($LDPC_1$) (shown by reference numeral 1410), and a second GRS-based irregular LDPC code ($LDPC_2$) (shown by reference numeral 1420) on a Rayleigh fading communication channel. This embodiment shows that both irregular $LDPC_1$ and $LDPC_2$ out performing $LDPC_0$ by at least 3 dB with BLER (block error rate).

The GRS-based regular LDPC code ($LDPC_0$) is constructed according to the constraints and design of the (EQ 9) as shown above. The same values of p=3, m=4, ρ=24 and γ=8 can be employed as was given above with respect to the Example 1. This GRS-based regular LDPC code ($LDPC_0$) code has rate 0.67.

The parity check matrix that corresponds to the GRS-based irregular LDPC code ($LDPC_1$) is constructed using the modified partial-matrices as also provided above with respect to EQ (11) (which is provided again here for ease of the reader):

$$H(1) = [H_1, H_2^1, H_3^1]$$ (EQ 11)

This GRS-based irregular LDPC code ($LDPC_1$) has code rate 0.667.

The parity check matrix that corresponds to the GRS-based irregular LDPC code ($LDPC_2$) is constructed using the modified partial-matrices as also provided above with respect to EQ (12) (which is provided again here for ease of the reader):

$$H(3) = [H_1, H_2^2, H_3^1]$$ (EQ 12)

This GRS-based irregular LDPC code ($LDPC_2$) also has code rate 0.667.

Figure 15:
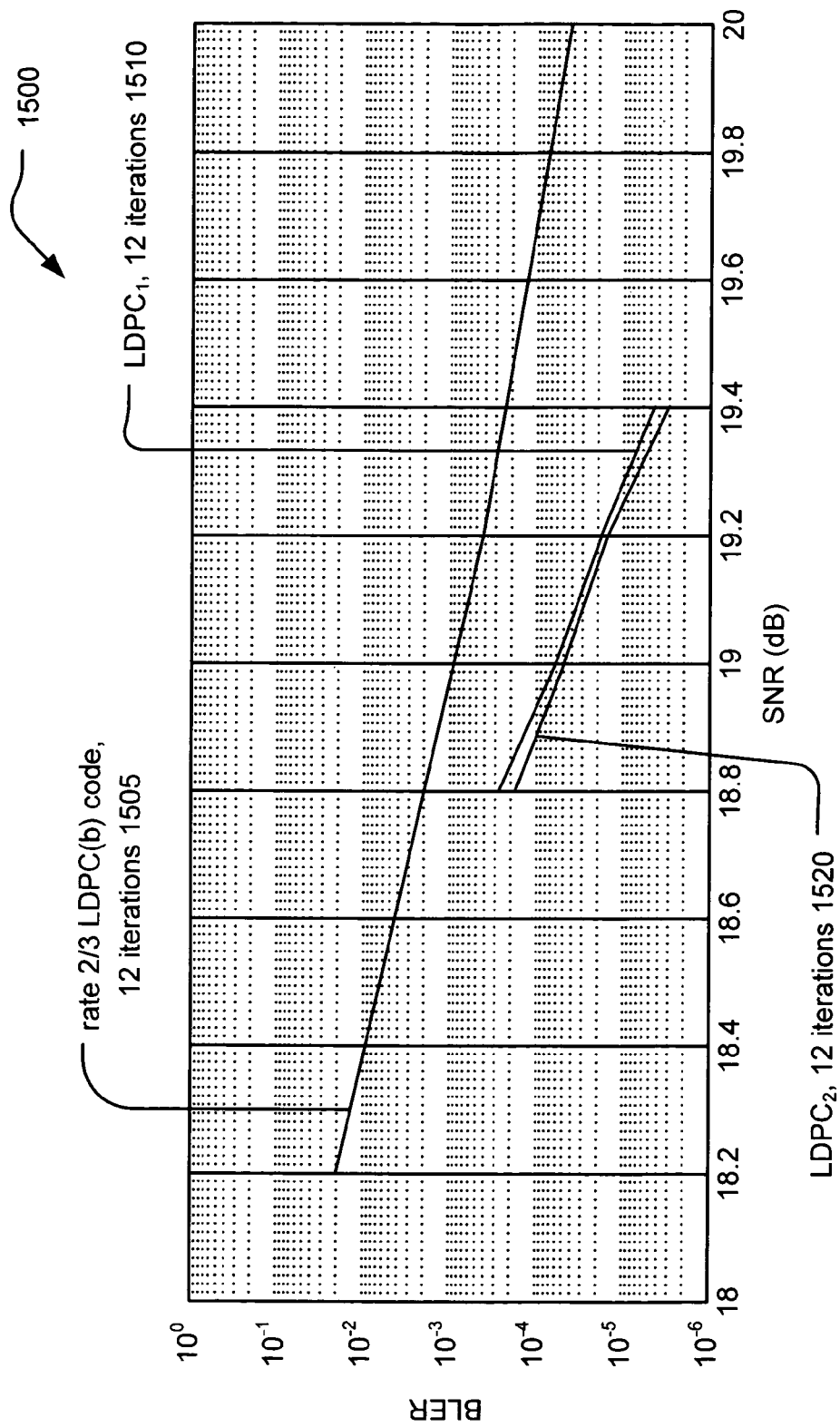
FIG. 15 illustrates an embodiment of a performance comparison between a first GRS-based irregular LDPC code ($LDPC_1$), a second GRS-based irregular LDPC code ($LDPC_2$), and an alternative LDPC code, LDPC(b), on a communication channel.

FIG. 15 illustrates an embodiment of a performance comparison 1500 between a first GRS-based irregular LDPC code ($LDPC_1$) (shown using reference numeral 1510), a second GRS-based irregular LDPC code ($LDPC_2$) (shown using reference numeral 1520), and an alternative LDPC code, LDPC (b) (shown using reference numeral 1505), on a communication channel.

This embodiment compares the codes $LDPC_1$ 1510 and $LDPC_2$ 1520 to the rate 2/3 code, LDPC(b) 1505. That code, LDPC(b) 1505, has the same code length as 1944 and is also irregular. With the bit to symbol interleave that is provided in FIG. 9, the corresponding performances are given in FIG. 15. The GRS-based irregular codes constructed herein give 1 dB performance improvement.

Figure 16:
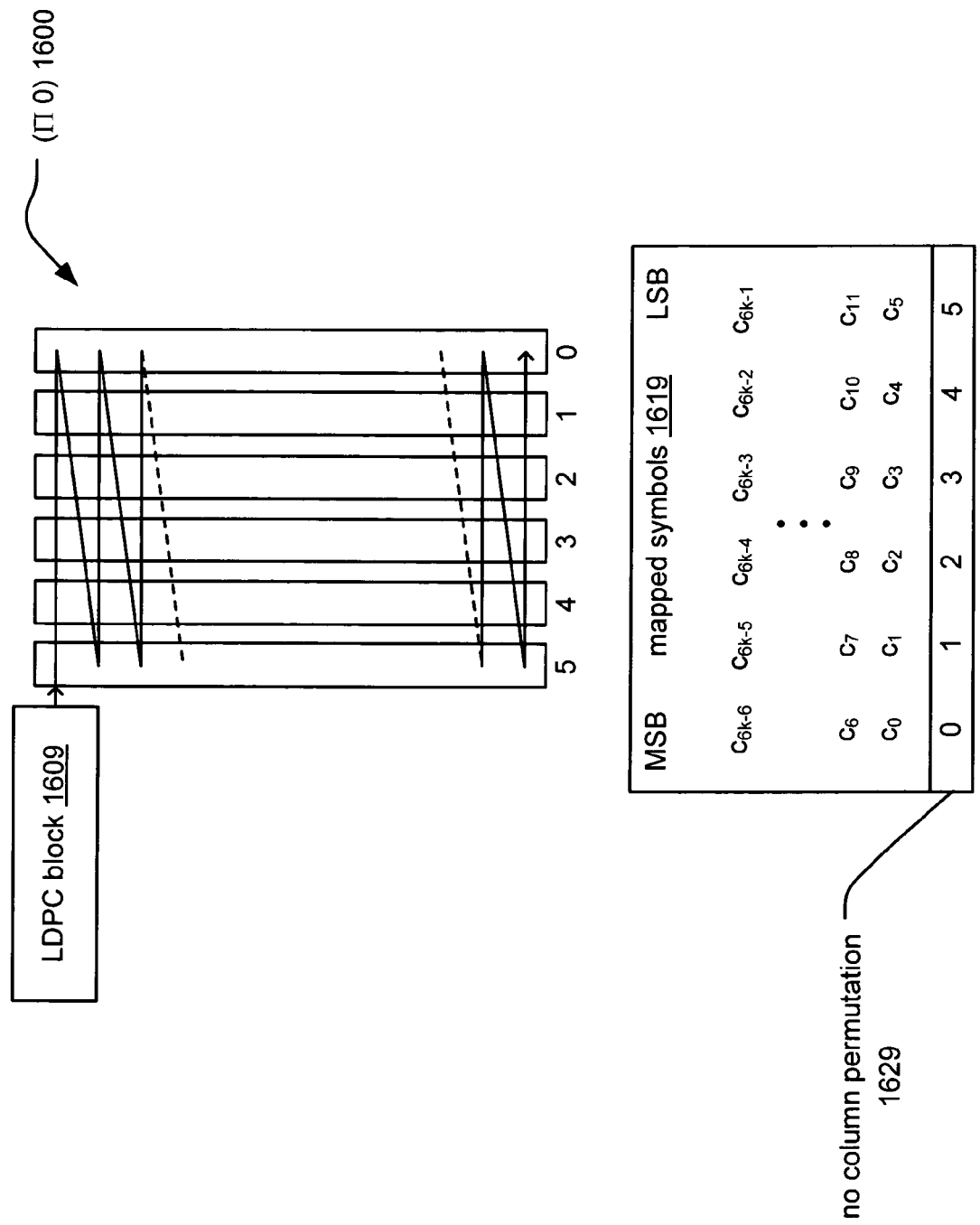
FIG. 16 and FIG. 17 illustrate alternative embodiments of bit to symbol interleaving.
Figure 17:
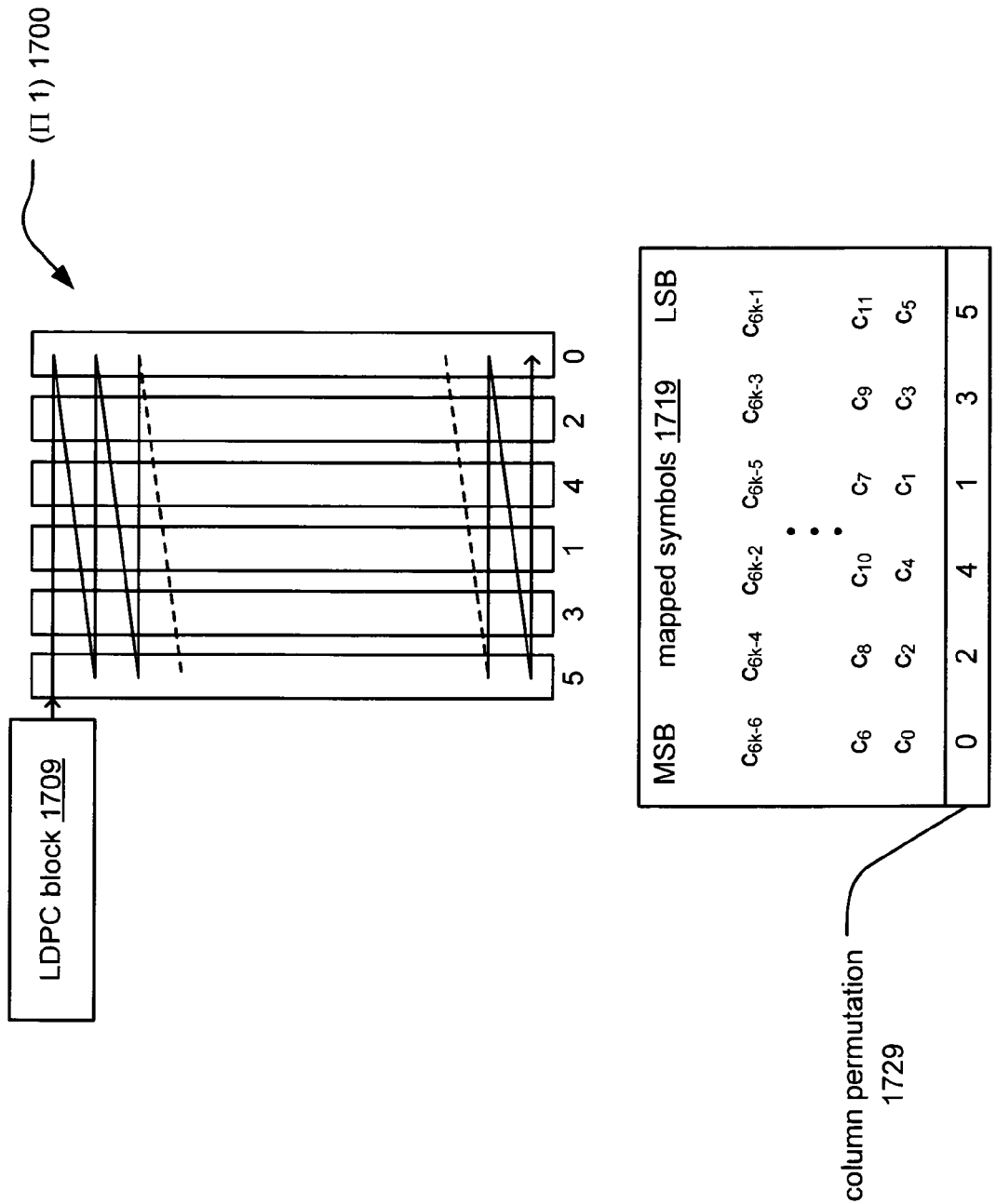

FIG. 16 and FIG. 17 illustrate alternative embodiments of bit to symbol interleaving. Specifically, FIG. 16 and FIG. 17 illustrate embodiment 1600 (interleave 0, shown as (Π 0)), and embodiment 1700 (interleave 1, shown as (Π 1)), respectively, of bit to symbol interleaving. As with previous embodiments, each of these is shown as being a 6-bit symbol interleave that operates on an LDPC block of encoded bits (e.g., an LDPC codeword). Clearly, any other number (i.e., n) of columns may be employed to perform a bit to n-bit interleave as well without departing from the scope and spirit of the invention.

In the embodiment 1600, an LDPC block 1609 is provided directly to each of a plurality of columns. Rather than put each of a plurality of parts of the LDPC block 1609 into corresponding columns (as done in some of the previous embodiments), a first bit of the LDPC block 1609 is provided to a first column, a second bit of the LDPC block is provided to a second column, a third bit of the LDPC block is provided to a third column, and so on. As can be seen, the order of the columns is not permuted (0 1 2 3 4 5), as indicated by the reference numeral 1629. Depending on the symbol size employed (e.g., n bit symbol size), then the n+1 symbol is provided to the first column in a wrapping around procedure as depicted in the diagram.

The 6 bit labels to be symbol mapped (as indicated by reference numeral 1619) that are pulled out from the columns are as follows (MSB on left . . . LSB on right):

$1^{st}$ 6 bit label: $c_0 c_1 c_2 c_3 c_4 c_5$ $2^{nd}$ 6 bit label: $c_6 c_7 c_8 c_9 c_{10} c_{11}$

. . .

nth 6 bit label: $c_{6k-6} c_{6k-5} c_{6k-4} c_{6k-3} c_{6k-2} c_{6k-1}$

The total number of bits of the LDPC block 1609 is 6k. As can be seen with respect to the LSB and MSB of the bits that are of the mapped pulled out from the rows, there is no column permutation with respect to the columns into which the parts are partitioned as indicated by the reference numeral 1629.

In the embodiment 1700, an LDPC block 1709 is provided directly to each of a plurality of columns. Rather than put each of a plurality of parts of the LDPC block 1609 into corresponding columns (as done in some of the previous embodiments), a first bit of the LDPC block 1609 is provided to a first column, a second bit of the LDPC block is provided to a second column, a third bit of the LDPC block is provided to a third column, and so on. As can be seen, the order of the columns is in fact permuted (0 2 4 1 3 5), as indicated by the reference numeral 1729. Depending on the symbol size employed (e.g., n bit symbol size), then the n+1 symbol is provided to the first column in a wrapping around procedure as depicted in the diagram.

The 6 bit labels to be symbol mapped (as indicated by reference numeral 1719) that are pulled out from the columns are as follows (MSB on left . . . LSB on right):

$1^{st}$ 6 bit label: $c_0 c_2 c_4 c_1 c_3 c_5$ $2^{nd}$ 6 bit label: $c_5 c_7 c_9 c_6 c_8 c_{10}$

. . .

nth 6 bit label: $c_{6k-6} c_{6k-4} c_{6k-2} c_{6k-5} c_{6k-3} c_{6k-1}$

The total number of bits of the LDPC block 1709 is 6k. As can be seen with respect to the LSB and MSB of the bits that are of the mapped pulled out from the rows, there is in fact a column permutation with respect to the columns into which the parts are partitioned as indicated by the reference numeral 1729.

In each of the embodiments 1600 of FIG. 16 and embodiment 1700 of FIG. 17, the entire LDPC block need not be available before performing the symbol formation and symbol mapping. When comparing this to each of the embodiments 900 of FIG. 9, embodiment 1000 of FIG. 10, embodiment 1100 of FIG. 11, embodiment 1200 of FIG. 12, and embodiment 1300 of FIG. 13. Those embodiments (900, 1000, 1100, 1200, and 1300) require a bit of memory management and incur some latency when compared to the embodiments 1600 and 1700. However, there can be a significant improvement in performance when doing those embodiments (900, 1000, 1100, 1200, and 1300) of bit to symbol interleave when compared to the embodiments 1600 and 1700. Therefore, a small price to pay in terms of latency may yield a large payoff in terms of performance.

Clearly, for each of the embodiments depicted in FIG. 16 and FIG. 17, other sized LDPC blocks (e.g., having different total numbers of bits) and symbols having other numbers of bits (e.g., labels for symbols having n bits and n corresponding columns) may also be employed herein without departing from the scope and spirit of the invention. A designer is provided wide latitude is selecting the LDPC block size and type as well as the manner of bit to symbol interleaving without departing from the scope and spirit of the invention.

With other interleaves such as those provided in FIG. 16 and FIG. 17, codes $LDPC_1$ 1210 and $LDPC_2$ 1220 out perform LDPC(b) 1205 by approximately 0.5 to 0.8 dB.

The following four diagrams show the performance of 4 different GRS-based irregular LDPC codes to each of 4 alternative LDPC codes, namely, LDPC(c) (1944, 972), LDPC(d) (1944, 1296), LDPC(e) (1944, 487), and LDPC(f) (1944, 1620). Each of these 4 different GRS-based irregular LDPC codes, designed according to the novel approach presented herein, has a corresponding low parity check matrix; these low density parity check matrices are provided in the APPENDIX.

Later in the APPENDIX, 3 additional low density parity check matrices corresponding to 3 different GRS-based irregular LDPC codes are also provided.

Figure 18:
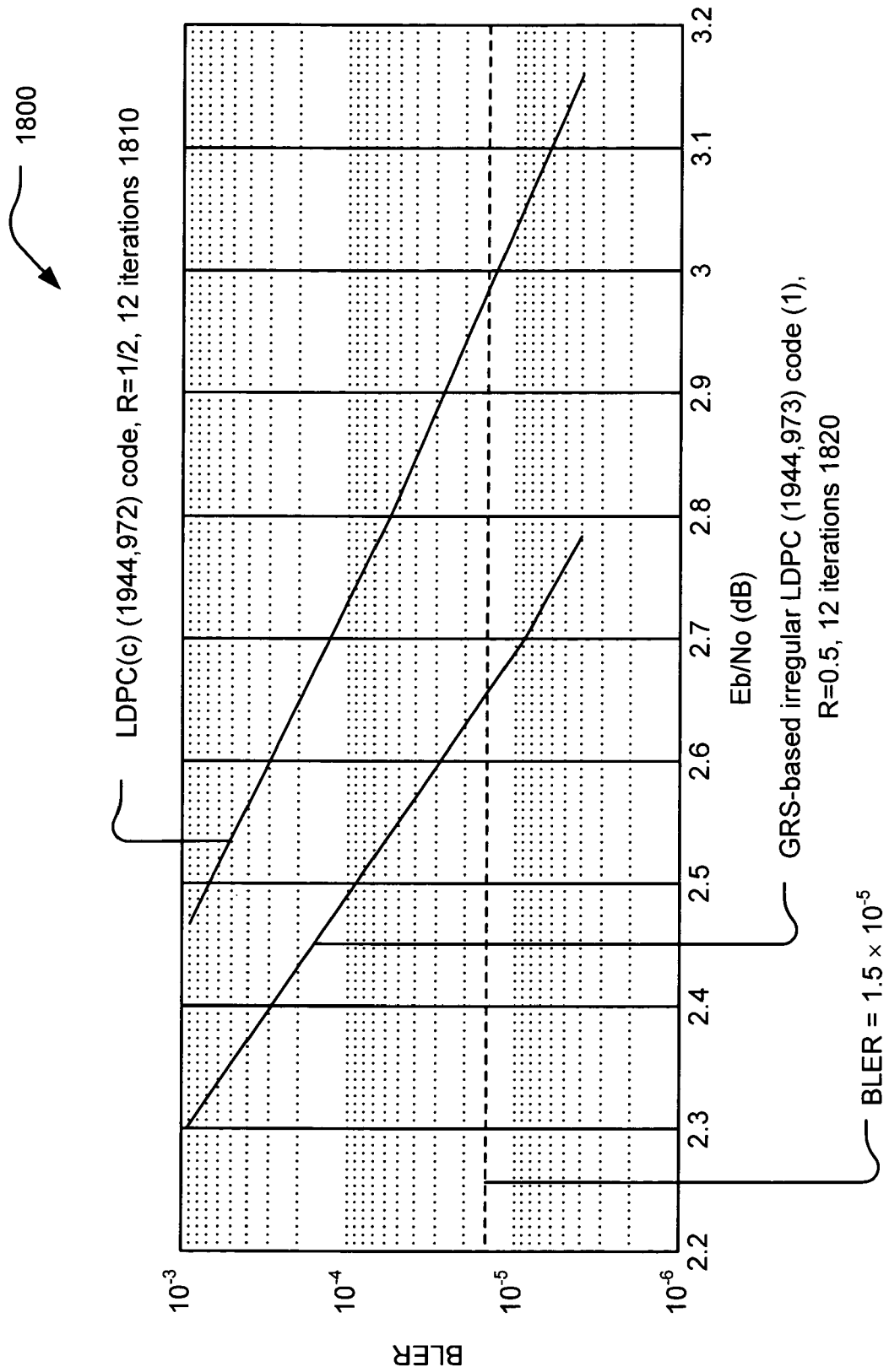
FIG. 18 illustrates an embodiment of a performance comparison between a GRS-based irregular LDPC (1944, 973) code (1) and a first code, LDPC(c) (1944, 972), on a communication channel.

FIG. 18 illustrates an embodiment of a performance comparison 1800 between a GRS-based irregular LDPC (1944, 973) code (1) (shown by reference numeral 1820) and a first code, LDPC(c) (1944, 972) (shown by reference numeral 1810), on a communication channel.

This shows the performance of these two code rate 1/2 codes on an AWGN communication channel in terms of BLER vs. SNR (or $E_b/N_o$). As can be seen, at a BLER of $1.5 \times 10^{-5}$, the GRS-based irregular LDPC (1944, 973) code (1) 1820 outperforms the LDPC(c) (1944, 972) code 1810 by approximately 0.33 dB.

Figure 19:
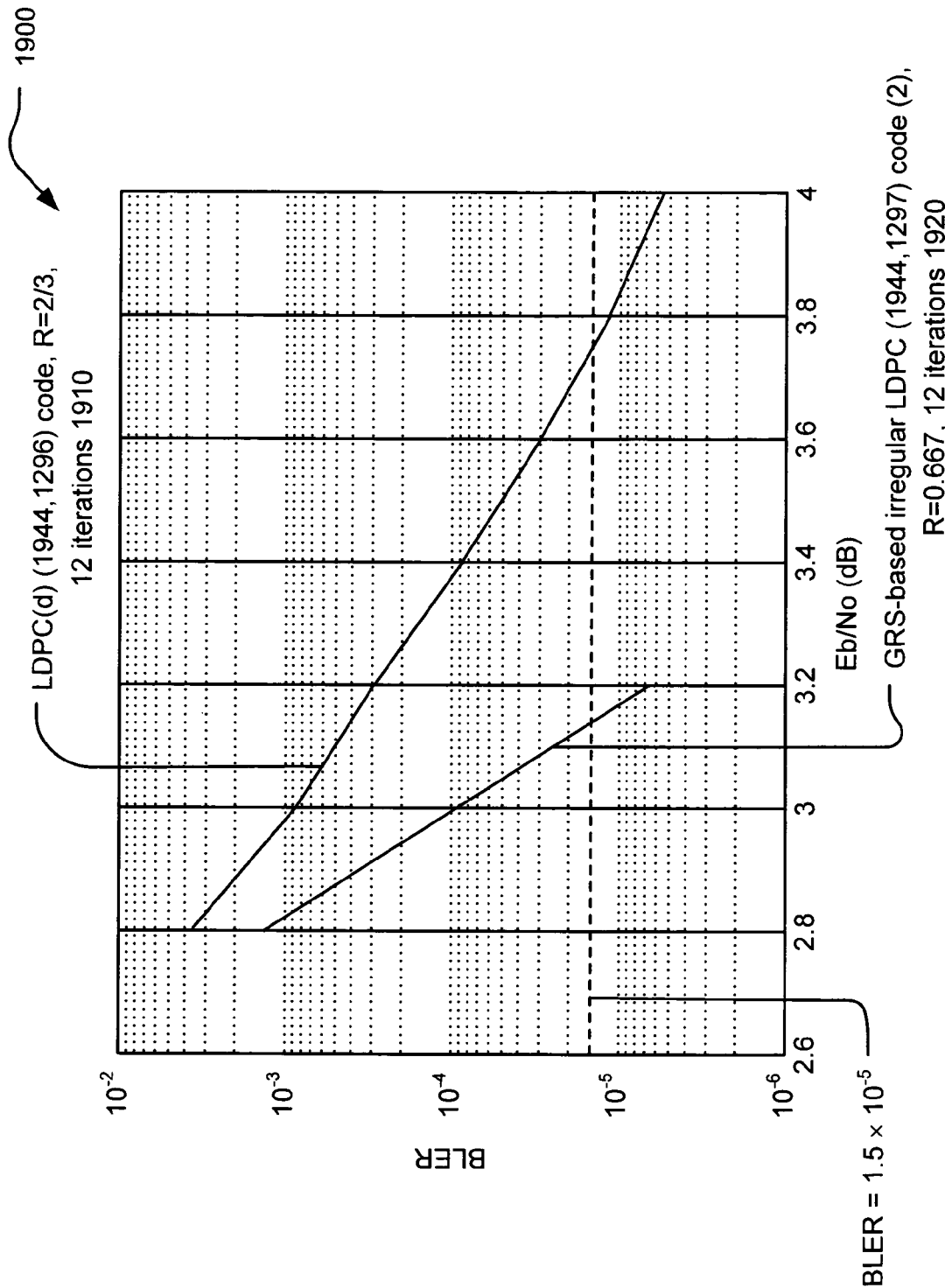
FIG. 19 illustrates an embodiment of a performance comparison between a GRS-based irregular LDPC (1944, 1297) code (2) and a second code, LDPC(d) (1944, 1296), on a communication channel.

FIG. 19 illustrates an embodiment of a performance comparison 1900 between a GRS-based irregular LDPC (1944, 1297) code (2) (shown by reference numeral 1920) and a second code, LDPC(d) (1944, 1296) (shown by reference numeral 1910), on a communication channel.

Figure 20:
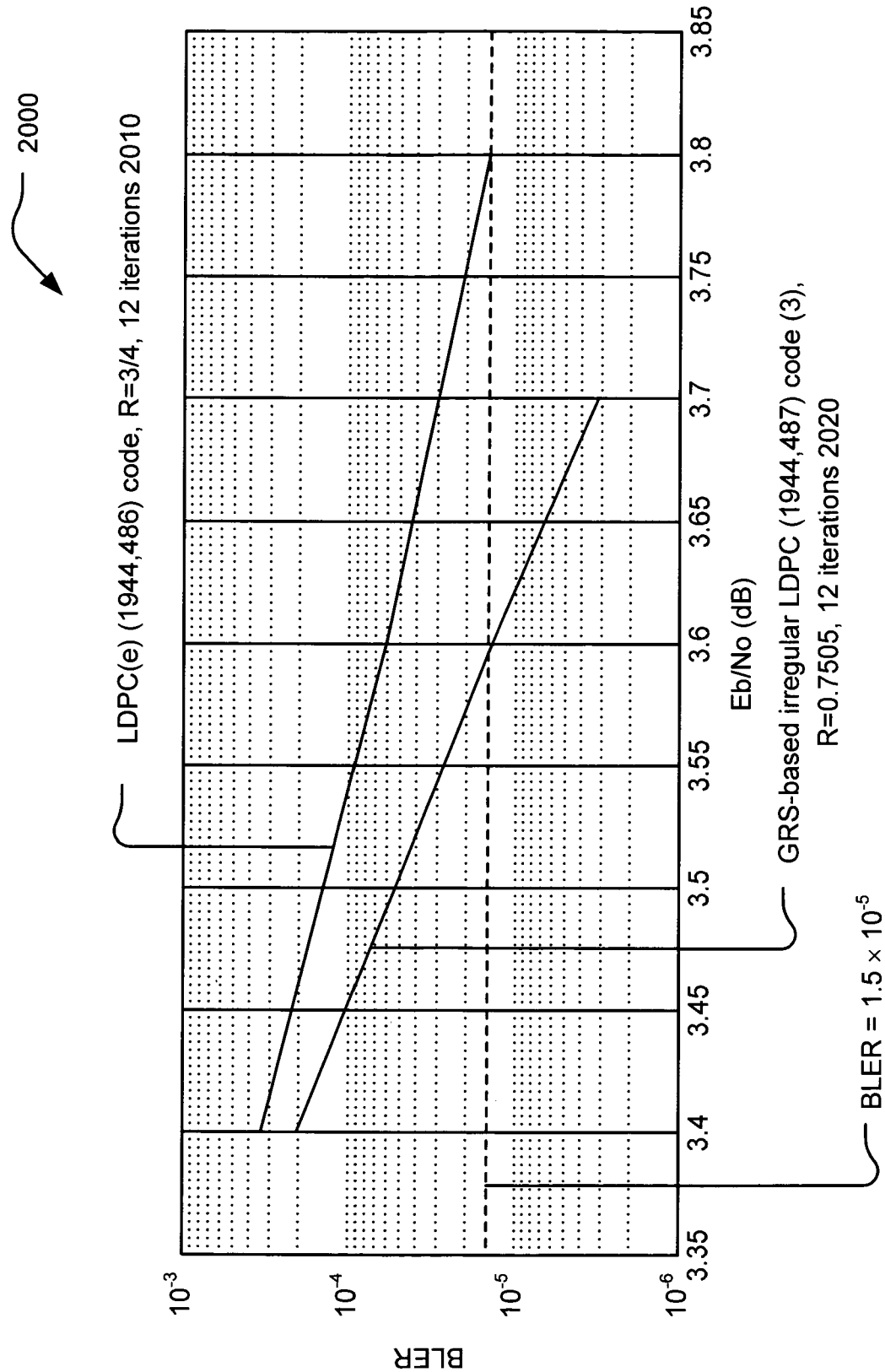
FIG. 20 illustrates an embodiment of a performance comparison between a GRS-based irregular LDPC (1944, 487) code (3) and a third code, LDPC(e) (1944, 487), on a communication channel.

FIG. 20 illustrates an embodiment of a performance comparison 2000 between a GRS-based irregular LDPC (1944, 487) code (3) (shown by reference numeral 2020) and a third code, LDPC(e) (1944, 486) (shown by reference numeral 2010), on a communication channel.

Figure 21:
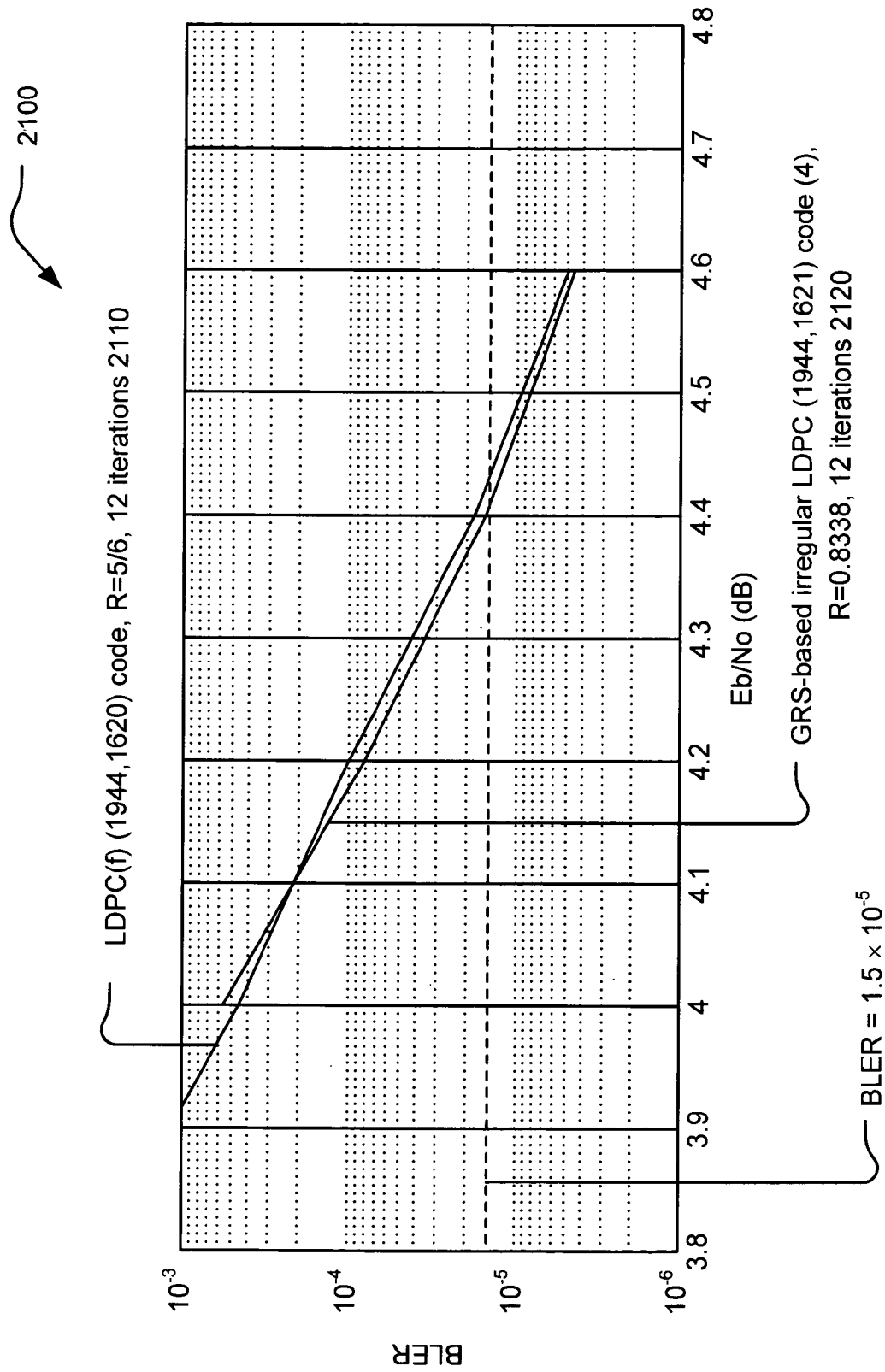
FIG. 21 illustrates an embodiment of a performance comparison between a GRS-based irregular LDPC (1944, 1621) code (4) and a fourth code, LDPC(f) (1944, 1620), on a communication channel.

FIG. 21 illustrates an embodiment of a performance comparison 2100 between a GRS-based irregular LDPC (1944, 1621) code (4) (shown by reference numeral 2120) and a fourth code, LDPC(f) (1944, 1620) (shown by reference numeral 2110), on a communication channel.

Figures 22A, 22B:
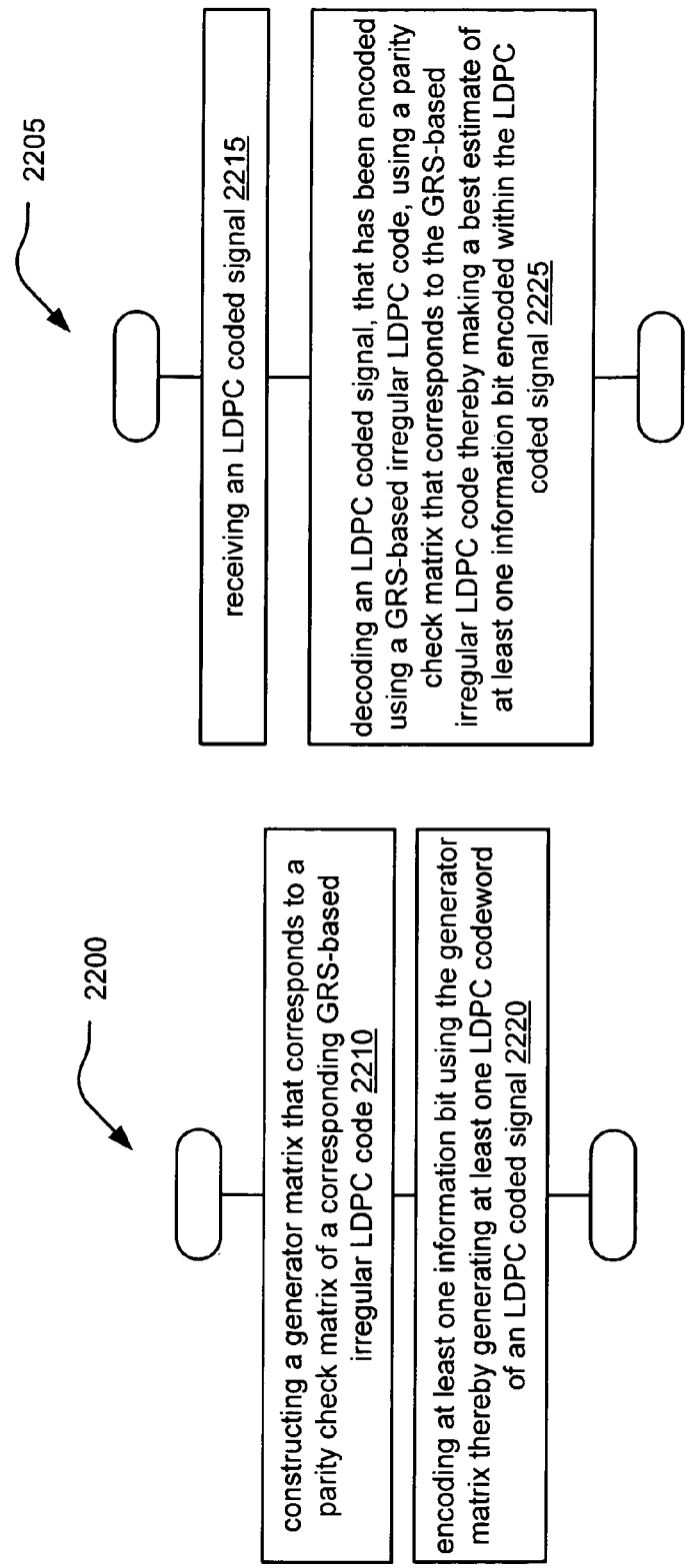
FIG. 22A illustrates an embodiment of a method for generating an LDPC coded signal.
FIG. 22B illustrates an embodiment of a method for decoding an LDPC coded signal.

FIG. 22A illustrates an embodiment of a method 2200 for generating an LDPC coded signal. This method 2200 involves constructing a generator matrix that corresponds to a parity check matrix of a corresponding GRS-based irregular LDPC code, as shown in a block 2210. When provided any parity check matrix that corresponds to an LDPC code, a corresponding generator matrix may be constructed. The method 2200 then involves encoding at least one information bit using the generator matrix thereby generating at least one LDPC codeword of an LDPC coded signal, as shown in a block 2220. This encoding operation may be viewed as taking place in an encoder at a transmitter end of a communication channel. By encoding the at least one information bit using this constructed generator matrix (that corresponds to the parity check matrix), the decoding of the LDPC coded signal may then be performed using the parity check matrix that is used to construct the generator matrix. Any of a number of hardware devices (e.g., transmitters, transceivers, encoders, etc.) that include this encoding functionality may be implemented to perform these operations in any of a wide variety of communication system types.

FIG. 22B illustrates an embodiment of a method 2205 for decoding an LDPC coded signal. This method 2205 may be viewed as receiving an LDPC coded signal, as shown in a block 2215. Then, the method 2205 may be viewed as decoding an LDPC coded signal, that has been encoded using a GRS-based irregular LDPC code, using a parity check matrix that corresponds to the GRS-based irregular LDPC code thereby making a best estimate of at least one information bit encoded within the LDPC coded signal, as shown in a block 2225. From some perspectives, this decoding operation may be viewed as being performed in a decoder located at a receiver end of a communication channel. Any of a number of hardware devices (e.g., receivers, transceivers, decoders, etc.) that include this decoding functionality may be implemented to perform these operations in any of a wide variety of communication system types.

Moreover, it is noted that the formation of a parity check matrix that corresponds to a GRS-based irregular LDPC code may take following form, where P is an n×n (e.g., 81×81 in one embodiment) permutation matrix.

Some examples of a P matrix may be provided as follows (as shown within some 3×3 embodiments):

$$P = \begin{bmatrix} 1 & 0 & 0 \\ 0 & 1 & 0 \\ 0 & 0 & 1 \end{bmatrix}, \text{ or } P = \begin{bmatrix} 1 & 0 & 0 \\ 0 & 0 & 1 \\ 0 & 1 & 0 \end{bmatrix}.$$

A zero matrix, x, may be represented as follows (as shown within various embodiments):

$$x = \begin{bmatrix} 0 & 0 & 0 \\ 0 & 0 & 0 \\ 0 & 0 & 0 \end{bmatrix}, \quad 3 \times 3 \text{ embodiment}$$

$$x = \begin{bmatrix} 0 & 0 & 0 & 0 \\ 0 & 0 & 0 & 0 \\ 0 & 0 & 0 & 0 \\ 0 & 0 & 0 & 0 \end{bmatrix}, \quad 4 \times 4 \text{ embodiment}$$

-continued $$x = \begin{bmatrix} 0 & \cdots & 0 \\ \vdots & \ddots & \vdots \\ 0 & \cdots & 0 \end{bmatrix}_{n \times n}, \quad n \times n \text{ embodiment}$$

In one embodiment, each of the permutation matrices, P, and the zero matrices, x, are 81×81 matrices when implemented within an LDPC code having a block length of 1944.

One $1^{st}$ possible code structure is based on a parity check matrix, H, that corresponds to a GRS-based irregular LDPC code, for a code rate of 973/1944 (>1/2), which may be approximated as being a code rate of 0.5. The form of the parity check matrix, H, is provided as follows: $H=[H_a, H_b]$. Because of the size of this parity check matrix, H, it is depicted using 2 paragraphs. The first paragraph depicts columns 1-12 and rows 1-12, and the second paragraph depicts columns 13-24 and rows 1-12.

$$H_a = \begin{bmatrix} P & P & P & P & x & x & P & x & x & P & x & x \\ P & P & P & x & P & x & x & P & x & x & P & x \\ P & P & P & x & x & P & x & x & P & x & x & P \\ P & P & P & P & x & x & P & x & x & P & x & x \\ P & P & P & x & P & x & x & P & x & P & x & x \\ P & P & P & x & x & P & x & x & P & x & x & P \\ P & P & P & x & x & P & x & x & P & x & x & P \\ P & P & P & x & P & x & x & P & x & x & P & x \\ P & P & P & x & x & P & x & x & P & x & x & P \\ P & P & P & P & x & x & P & x & x & P & x & x \\ P & P & P & x & P & x & x & P & x & x & P & x \\ P & P & P & x & x & P & x & x & P & x & x & P \end{bmatrix}$$

$$H_b = \begin{bmatrix} P & x & x & x & x & x & x & x & x & x & x & P \\ P & P & x & x & x & x & x & x & x & x & x & x \\ x & P & P & x & x & x & x & x & x & x & x & x \\ x & x & P & P & x & x & x & x & x & x & x & x \\ x & x & x & P & P & x & x & x & x & x & x & x \\ x & x & x & x & P & P & x & x & x & x & x & x \\ x & x & x & x & x & P & P & x & x & x & x & x \\ x & x & x & x & x & x & P & P & x & x & x & x \\ x & x & x & x & x & x & x & P & P & x & x & x \\ x & x & x & x & x & x & x & x & P & P & x & x \\ x & x & x & x & x & x & x & x & x & P & P & x \\ x & x & x & x & x & x & x & x & x & x & P & P \end{bmatrix}$$

A $2^{nd}$ possible code structure is based on a parity check matrix, H, that corresponds to a GRS-based irregular LDPC code, for a code rate of 2/3, which may be approximated as being a code rate of 0.667. The form of this parity check matrix, H, is provided as follows: $H=[H_a, H_b]$. Because of the size of this parity check matrix, H, it is depicted using 2 paragraphs. The first paragraph depicts columns 1-12 and rows 1-8, and the second paragraph depicts columns 13-24 and rows 1-8.

$$H_a = \begin{bmatrix} P & P & P & P & P & x & P & x & P & x & P & x \\ P & P & P & P & x & P & x & P & x & P & x & P \\ P & P & P & P & P & x & P & x & P & x & P & x \\ P & P & P & P & x & P & x & P & x & P & x & P \\ P & P & P & P & P & x & P & x & P & x & P & x \\ P & P & P & P & x & P & x & P & x & P & x & P \\ P & P & P & P & P & x & P & x & P & x & P & x \\ P & P & P & P & x & P & x & P & x & P & x & P \end{bmatrix}$$

$$H_b = \begin{bmatrix} P & x & P & x & P & P & x & x & x & x & x \\ x & P & x & P & x & P & P & x & x & x & x \\ P & x & P & x & x & x & P & P & x & x & x \\ x & P & x & P & x & x & x & P & P & x & x \\ P & x & P & x & x & x & x & x & P & P & x & x \\ x & P & x & P & x & x & x & x & x & P & P & x \\ P & x & P & x & x & x & x & x & x & x & P & P \\ x & P & x & P & x & x & x & x & x & x & x & P \end{bmatrix}$$

A $3^{rd}$ possible code structure is based on a parity check matrix, H, that corresponds to a GRS-based irregular LDPC code, for a code rate of 3/4. The form of the parity check matrix, H, is provided as follows: $H=[H_a, H_b]$. Because of the size of this parity check matrix, H, it is depicted using 2 paragraphs. The first paragraph depicts columns 1-12 and rows 1-6, and the second paragraph depicts columns 13-24 and rows 1-6.

$$H_a = \begin{bmatrix} P & P & P & P & P & x & P & P & P & P & x \\ P & P & P & P & P & P & x & x & P & P & P & P \\ P & P & P & P & P & P & x & x & P & P & P \\ P & P & P & P & P & P & P & x & x & P & P \\ P & P & P & P & P & P & P & P & x & x & P \\ P & P & P & P & P & P & P & P & P & x & x \end{bmatrix}$$

$$H_b = \begin{bmatrix} x & P & P & P & P & x & P & P & x & x & x & x \\ x & x & P & P & P & P & x & P & P & x & x & x \\ P & x & x & P & P & P & x & x & P & P & x & x \\ P & P & x & x & P & P & x & x & x & P & P & x \\ P & P & P & x & x & P & x & x & x & x & P & P \\ P & P & P & P & x & x & x & x & x & x & x & P \end{bmatrix}$$

A $4^{th}$ possible code structure is based on a parity check matrix, H, that corresponds to a GRS-based irregular LDPC code, for a code rate of 5/6, which may be approximated as being a code rate of 0.833. The form of the parity check matrix, H, is provided as follows: $H=[H_a, H_b]$. Because of the size of this parity check matrix, H, it is depicted using 2 paragraphs. The first paragraph depicts columns 1-12 and rows 1-4, and the second paragraph depicts columns 13-24 and rows 1-4.

$$H_a = \begin{bmatrix} P & P & P & P & P & P & P & P & P & P & P & P \\ P & P & P & P & P & P & P & P & P & P & P & P \\ P & P & P & P & P & P & P & P & P & P & P & P \\ P & P & P & P & P & P & P & P & P & P & P & P \end{bmatrix}$$

-continued $$H_b = \begin{bmatrix} P & P & P & P & P & P & P & P & P & x & x & x \\ P & P & P & P & P & P & P & P & P & P & x & x \\ P & P & P & P & P & P & P & x & P & P & x \\ P & P & P & P & P & P & P & x & x & P & P \end{bmatrix}$$

For each of these 3 embodiments, the values and forms of H and P are provided above with respect to the 81×81 embodiment for each of the permutation matrices, P, and each of the zero matrices, x.

The GRS-based irregular LDPC coded constructed according to each of these possible parity check matrices achieve better BLER performance at all rates and SNRs. In addition, these codes have lower error floors. Each of these GRS-based irregular LDPC codes is simulated down to a BLER of 1.5× $10^{-5}$, which is appropriate for aggregated frames of 8192 bytes.

The performance of the 1$^{st}$ possible code structure is described above with respect to FIG. 18.

Figure 23:
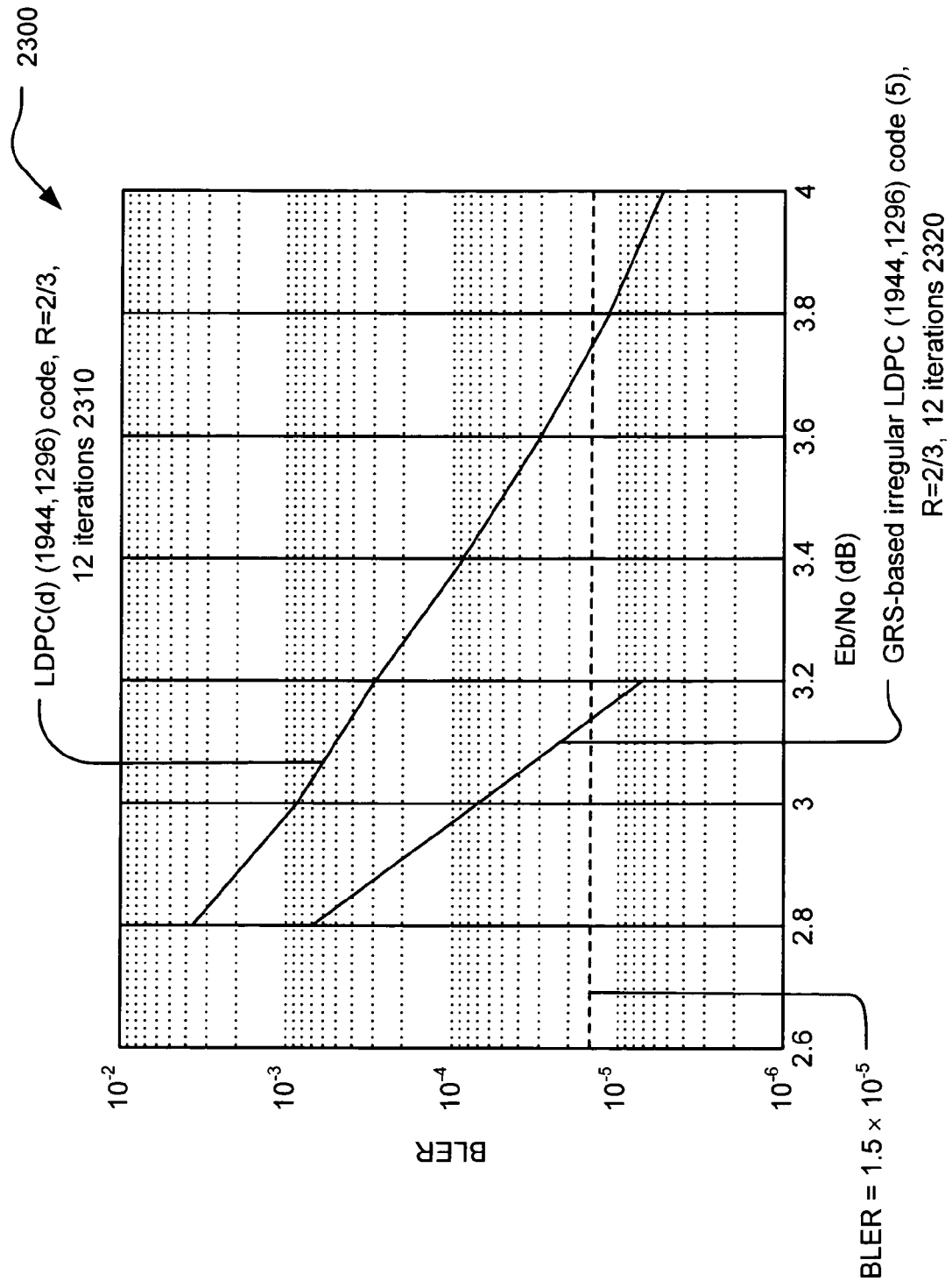
FIG. 23 illustrates an embodiment of a performance comparison between a GRS-based irregular LDPC (1944, 1296) code (5) and the second code, LDPC(d) (1944, 1296), on a communication channel.

FIG. 23 illustrates an embodiment of a performance comparison 2300 between a GRS-based irregular LDPC (1944, 1296) code (5) (shown using reference numeral 2320) and the second code, LDPC(d) (1944, 1296) (shown using reference numeral 2310), on a communication channel.

This shows the performance of these two code rate 2/3 codes on an AWGN communication channel in terms of BLER vs. SNR (or $E_b/N_o$). As can be seen, at a BLER of 1.5×10$^{-5}$, the GRS-based irregular LDPC (1944, 1296) code (5) 2320 outperforms the LDPC(d) (1944, 1296) code 2310 by approximately 0.6 dB.

Figure 24:
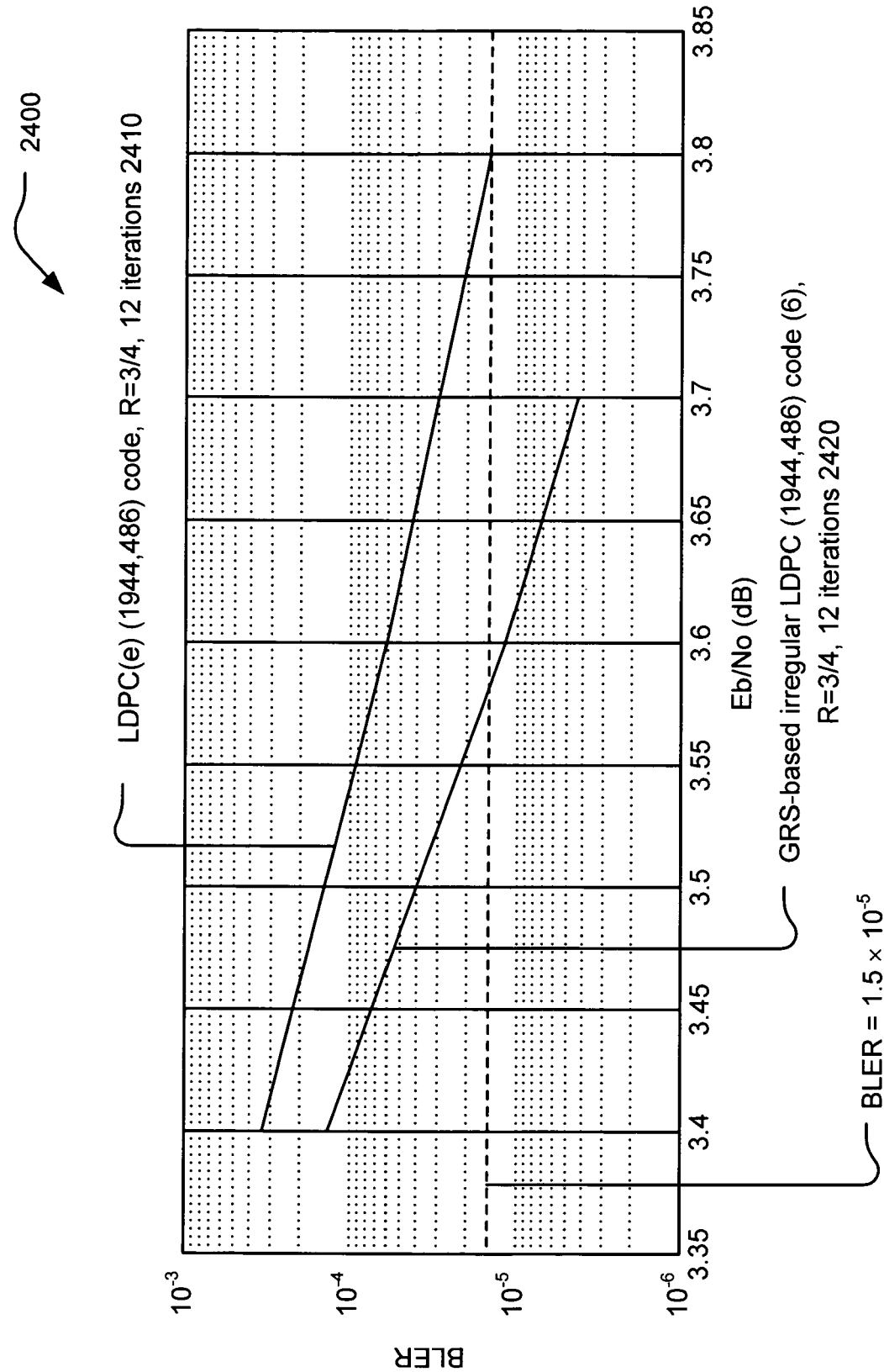
FIG. 24 illustrates an embodiment of a performance comparison between a GRS-based irregular LDPC (1944, 486) code (6) and the third code, LDPC(e) (1944, 486), on a communication channel.

FIG. 24 illustrates an embodiment of a performance comparison 2400 between a GRS-based irregular LDPC (1944, 486) code (6) (shown using reference numeral 2420) and the third code, LDPC(e) (1944, 486) (shown using reference numeral 2410), on a communication channel.

This shows the performance of these two code rate 3/4 codes on an AWGN communication channel in terms of BLER vs. SNR (or $E_b/N_o$). As can be seen, at a BLER of 1.5×10$^{-5}$, the GRS-based irregular LDPC (1944, 486) code (6) 2420 outperforms the LDPC(e) (1944, 486) code 2410 by approximately 0.22 dB.

Figure 25:
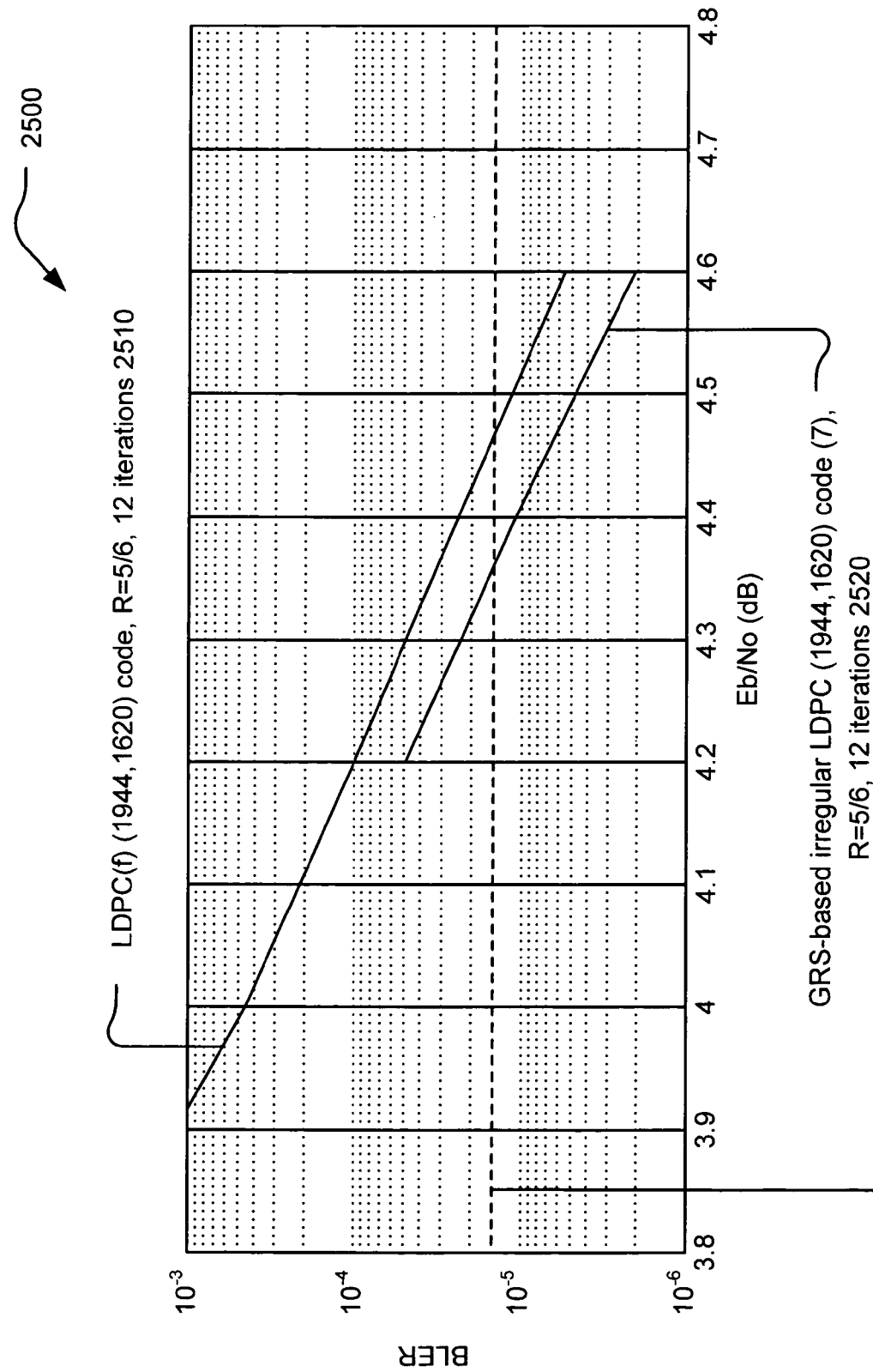
FIG. 25 illustrates an embodiment of a performance comparison between a GRS-based irregular LDPC (1944, 1620) code (7) and the fourth code, LDPC(f) (1944, 1620), on a communication channel.

FIG. 25 illustrates an embodiment of a performance comparison 2500 between a GRS-based irregular LDPC (1944, 1620) code (7) (shown using reference numeral 2520) and the fourth code, LDPC(f) (1944, 1620) (shown using reference numeral 2510), on a communication channel.

This shows the performance of these two code rate 5/6 codes on an AWGN communication channel in terms of BLER vs. SNR (or $E_b/N_o$). As can be seen, at a BLER of 1.5×10$^{-5}$, the GRS-based irregular LDPC (1944, 1620) code (7) 2520 outperforms the LDPC(f) (1944, 1620) code 2510 by approximately 0.11 dB.

The complexity of each of these possible code structures may be summarized as a function of the total number of edges within a corresponding LDPC bipartite graph; this is directly related to the mount of memory required for the messages. A worst case is 648 more that that which is shown.

TABLE 2

| Code rate = ½ | LDPC(c) (1944, 972), 6966 edges | GRS-based irregular LDPC (1944, 973) code (1), 7776 edges |
|---|---|---|

TABLE 2-continued

| Code rate = ⅔ | LDPC(d) (1944, 1296), 7128 edges | GRS-based irregular LDPC (1944, 1296) code (5), 7695 edges |
|---|---|---|
| Code rate = ¾ | LDPC(e) (1944, 486), 6803 edges | GRS-based irregular LDPC (1944, 486) code (6), 7695 edges |
| Code rate = ⅚ | LDPC(f) (1944, 1620) code, 6803 edges | GRS-based irregular LDPC (1944, 1620) code (7), 7047 edges |

Using these various design approaches provided herein, a complete family of LDPC codes having a better performance than known before is made available for designers. Also, the very low error floors provided by these codes are appropriate for the high throughput applications required in many applications. Moreover, the complexity of such a decoder implemented to decode such coded signals is relatively low while providing this improved performance.

Figure 26:
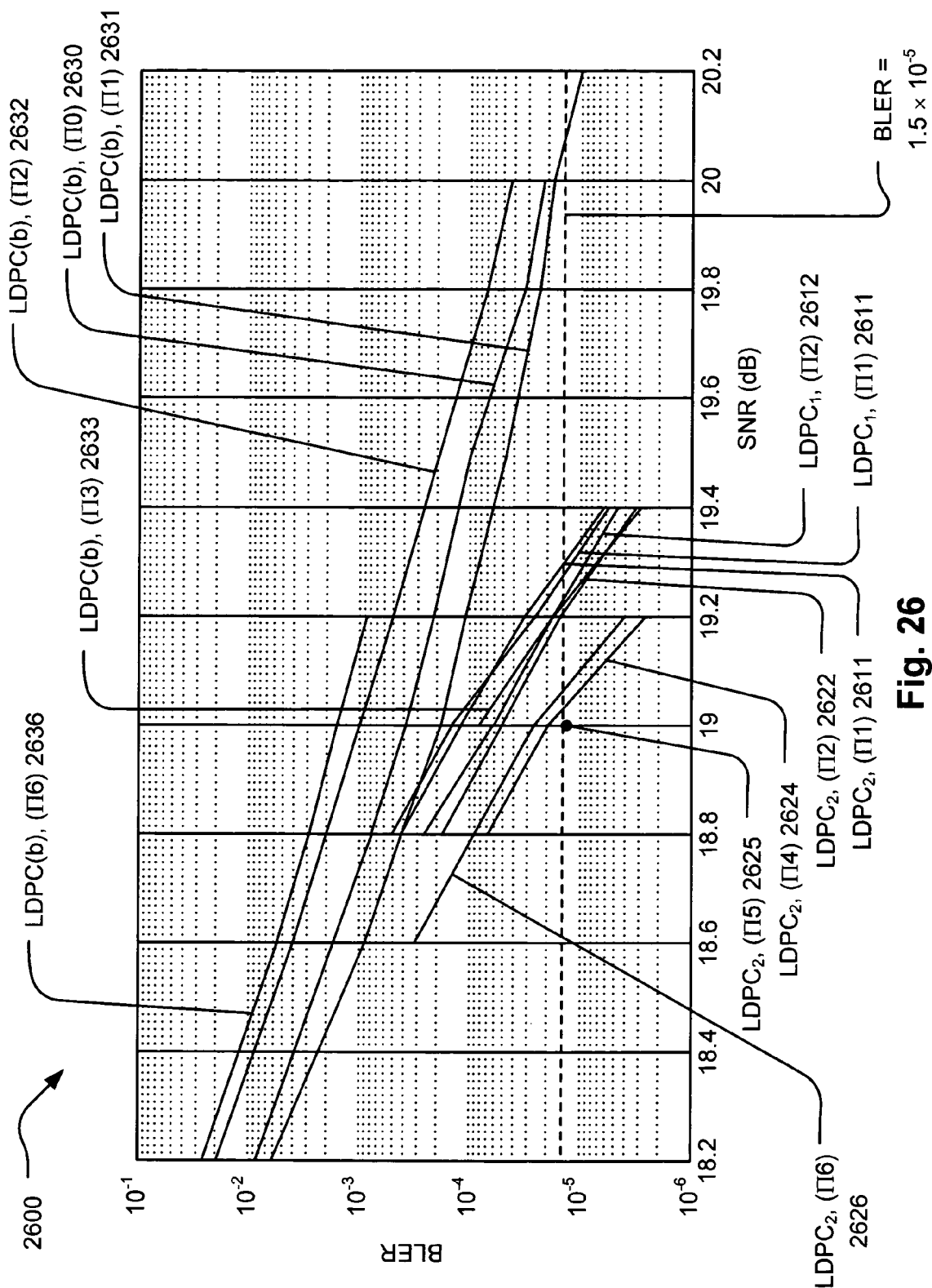
FIG. 26 illustrates an embodiment of a performance comparison between a first GRS-based irregular LDPC code ($LDPC_1$), a second GRS-based irregular LDPC code ($LDPC_2$), and an alternative LDPC code, LDPC(b), using different types of bit to symbol interleaving, on a communication channel.

FIG. 26 illustrates an embodiment of a performance comparison 2600 between a first GRS-based irregular LDPC code (LDPC$_1$), a second GRS-based irregular LDPC code (LDPC$_2$), and an alternative LDPC code, LDPC(b), using different types of bit to symbol interleaving, on a communication channel. This communication channel is a Rayleigh fading communication channel, and the modulation employed is 64 QAM. The LDPC block size of each of these codes (LDPC$_1$ and LDPC$_2$) is 1944, and the number of decoding iterations for each of these performance curves is 12. The alternative LDPC code, LDPC(b), has a code rate of 2/3, a code length of 1944 and is also an irregular LDPC code.

The parity check matrix that corresponds to the GRS-based irregular LDPC code (LDPC$_1$) is constructed using the modified partial-matrices as also provided above with respect to EQ (11) (which is provided again here for ease of the reader):

$$H(1)=[H_1,H_2^1,H_3^1]$$ (EQ 11)

This GRS-based irregular LDPC code (LDPC$_1$) has code rate 0.667.

The parity check matrix that corresponds to the GRS-based irregular LDPC code (LDPC$_2$) is constructed using the modified partial-matrices as also provided above with respect to EQ (12) (which is provided again here for ease of the reader):

$$H(3)=[H_1,H_2^2,H_3^1]$$ (EQ 12)

This GRS-based irregular LDPC code (LDPC$_2$) also has code rate 0.667.

Several different types of bit to symbol interleaving are employed; some of these bit to symbol interleaves are depicted above within the FIG. 9 (Π2), FIG. 10 (Π3), FIG. 11 (Π4), FIG. 12 (Π5), FIG. 13 (Π6), FIG. 16 (Π0), and FIG. 17 (Π1), respectively. Clearly, alternative permuting of the columns employed therein could also be performed without departing from the scope and spirit of the invention.

Specifically, the performance of GRS-based irregular LDPC code (LDPC$_1$) is depicted using bit to symbol interleaving (Π1) (shown using reference numeral 2611) and bit to symbol interleaving (Π2) (shown using reference numeral 2612).

The performance of GRS-based irregular LDPC code (LDPC$_2$) is depicted using bit to symbol interleaving (Π1) (shown using reference numeral 2621), bit to symbol interleaving (Π2) (shown using reference numeral 2622), bit to symbol interleaving (Π4) (shown using reference numeral 2624), bit to symbol interleaving (Π5) (shown using reference numeral 2625), and bit to symbol interleaving (Π6) (shown using reference numeral 2626).

The performance of alternative LDPC code, LDPC(b), is depicted using bit to symbol interleaving (Π0) (shown using reference numeral 2630), bit to symbol interleaving (Π1) (shown using reference numeral 2631), bit to symbol interleaving (Π2) (shown using reference numeral 2632), bit to symbol interleaving (Π3) (shown using reference numeral 2633), and bit to symbol interleaving (Π6) (shown using reference numeral 2636).

As can be seen, at a BLER of $1.5 \times 10^{-5}$, each of the GRS-based irregular LDPC code (LDPC$_1$) and the GRS-based irregular LDPC code (LDPC$_2$) outperforms the alternative LDPC code, LDPC(b), by approximately 0.8 dB.

As can be seen when considering these various performance diagrams, the GRS-based irregular LDPC codes that have been constructed according to the approach provided herein out perform other codes in terms of providing for lower error floors in terms of BLER as a function of SNR.

In addition, it is clear that the appropriate selection of a bit to symbol interleaving can provide for a significant increase in performance for each of the various LDPC codes whose performance is compared here. This principle may be extended to a wide variety of LDPC codes including those not specifically presented herein. There are many approaches by which the bit to symbol interleaving of an LDPC block may be performed.

One possible approach seeks to correspond those LDPC coded bits of the LDPC block that have higher coding strength (i.e., higher bit degree thereby indicating relatively more edges connected between those bit nodes and corresponding check nodes) to the LSBs of an n-bit label that is to be symbol mapped according to a modulation (having a constellation shape and corresponding mapping). This approach also seeks to correspond those LDPC coded bits of the LDPC block that have lower coding strength (i.e., lower bit degree thereby indicating relatively fewer edges connected between those bit nodes and corresponding check nodes) to the MSBs of an n-bit label that is to be symbol mapped according to a modulation (having a constellation shape and corresponding mapping). This approach seeks to align those LDPC coded bits (of the LDPC block) that have relatively higher coding strength to the relatively weak bit locations within the n-bit label (i.e., LSBs), and to align those LDPC coded bits (of the LDPC block) that have relatively lower coding strength to the relatively strong bit locations within the n-bit label (i.e., MSBs). This approach can be referred to as "strong to weak and weak to strong".

Another possible approach seeks to correspond those LDPC coded bits of the LDPC block that have higher coding strength (i.e., higher bit degree thereby indicating relatively more edges connected between those bit nodes and corresponding check nodes) to the MSBs of an n-bit label that is to be symbol mapped according to a modulation (having a constellation shape and corresponding mapping). This approach also seeks to correspond those LDPC coded bits of the LDPC block that have lower coding strength (i.e., lower bit degree thereby indicating relatively fewer edges connected between those bit nodes and corresponding check nodes) to the LSBs of an n-bit label that is to be symbol mapped according to a modulation (having a constellation shape and corresponding mapping). This approach seeks to align those LDPC coded bits (of the LDPC block) that have relatively higher coding strength to the relatively strong bit locations within the n-bit label (i.e., MSBs), and to align those LDPC coded bits (of the LDPC block) that have relatively lower coding strength to the relatively weak bit locations within the n-bit label (i.e., LSBs). This approach can be referred to as "strong to strong and weak to weak".

Also, when considering many of the 6 bit labels and interleaving presented above, the first 3 bits (starting at the MSB) can be considering as an in-phase component, and the last 3 bits (ending at the MSB) can be considering as a quadrature-phase component as in an I, Q (In-phase, Quadrature) implementation. From this perspective, each of these 3 bit groups can also be appropriately interleaved such that these 3 bit groups may also be mapped according to either of the "strong to weak and weak to strong" or the "strong to strong and weak to weak" approaches described above.

For example, both of the in-phase component (MSB and next 2 bits) and the quadrature-component (2 bits before LSB and LSB) can be mapped according to the "strong to weak and weak to strong" approach. Alternatively, both of the in-phase component (MSB and next 2 bits) and the quadrature-component (2 bits before LSB and LSB) can be mapped according to the "strong to strong and weak to weak" approach.

In even other approaches, the in-phase component (MSB and next 2 bits) can be can be mapped according to the "strong to weak and weak to strong" approach, and the quadrature-component (2 bits before LSB and LSB) can be mapped according to the "strong to strong and weak to weak" approach. In even another approach, the in-phase component (MSB and next 2 bits) can be can be mapped according to the "strong to strong and weak to weak" approach, and the quadrature-component (2 bits before LSB and LSB) can be mapped according to the "strong to weak and weak to strong" approach.

However, after considering many of the interleaves presented above that do various combinations of these approaches that are described just above, it is clear that there can be no generalization made as to which of the bit to symbol interleave approaches provides for the bext performance. For example, when considering each of the "strong to weak and weak to strong" or the "strong to strong and weak to weak" approaches described above as well as combinations thereof (e.g., when considering the in-phase component and the quadrature component separately), it is clear that there is no generalized approach which can be stated by which to select the mapping of the strength of the LDPC coded bits to bit locations within the n-bit labels that are to be symbol mapped.

Rather, the best performance is a function of both the coding selected (e.g., the GRS-based irregular LDPC code selected) as well as the bit to symbol interleave selected. At the time of this filing, there appears no generalization that can be made. Once a parituclar LDPC code is selected, it seems clear that a number of bit to symbol interleaves should be considered in an effort to find the combination that provides the best performance.

It is also noted that the methods described within the preceding figures may also be performed within any number of appropriate system and/or apparatus designs without departing from the scope and spirit of the invention.

In view of the above detailed description of the invention and associated drawings, other modifications and variations will now become apparent. It should also be apparent that such other modifications and variations may be effected without departing from the spirit and scope of the invention.

APPENDIX

Four separate parity check matrices are provided here that correspond to 4 separate and corresponding GRS-based irregular LDPC codes.

Each of the following parity check matrices has the form as follows:

$$H = \begin{bmatrix} P_{0,0} & P_{0,1} & \cdots & P_{0,23} \\ P_{1,0} & P_{1,1} & & P_{1,23} \\ \vdots & & \ddots & \vdots \\ P_{r,0} & P_{r,1} & \cdots & P_{r,23} \end{bmatrix};$$

this form allows for layered belief propagation decoding.

where each permutation matrix, $P_{i,j}$, is an 81×81 matrix that is either a zero matrix (i.e., a matrix having all 0 valued entries) or a permutation matrix having the form of the identity matrix. Each of the last (n−k) columns of the parity check matrix H has a weight of 2.

In addition, each of these permutation matrices is a column permutated matrix of the original matrices that has been constructed by the 81×81 sub-matrices (or permutation matrices) so that by doing row operations only on this matrix, a matrix [H',T]may be constructed, where T is up triangular matrix. [H',T] can be used for encoding according to the GRS-based irregular LDPC code. The following parity check matrices which are provided below may be employed for decoding purposes.

For each of the following parity check matrices that corresponds to a different GRS-based irregular LDPC code, the first two entries (on the first line) indicate the number of bit nodes (i.e., the number of columns of the parity check matrix) and the number of check nodes (i.e., the number of rows of the parity check matrix), respectively, of a corresponding LDPC bipartite graph.

The next entries, which typically carries over multiple lines, indicates the check degree for each row within the parity check matrix (these are shown as being the same for all of the rows to assist in reducing the complexity of a decoder to be implemented; however each of these check degrees can be different values if desired in a particular application).

The next rows each indicate the locations of the non-zero entries of the parity check matrix.

Looking at 1. Below as an Example of this Convention:

This parity check matrix includes 1944 columns and 972 rows.

The check degree for each row is the same, 8.

In the first row of the parity check matrix, non-zero entries are located at columns 0, 81, 162, 243, 486, 729, 951, and 1863. All of the other entries in that first row are zero valued.

---

1. GRS-based irregular LDPC (1944, 973) code (1), R = 0.5
1944 972

```
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
8888888888888888888888888888888888888888888888888888
888888888888888888888888888888888888888888
0 81 162 243 486 729 951 1863
14 102 209 303 494 783 1015 1865
15 103 210 304 495 784 1016 1866
16 104 211 305 496 785 969 1867
17 105 212 306 497 786 1017 1868
18 106 213 307 498 787 1018 1869
19 107 214 308 499 788 1019 1870
20 108 215 309 500 789 970 1871
21 109 216 310 501 790 971 1872
22 110 217 311 502 791 1020 1873
23 111 218 312 503 792 1021 1874
24 112 219 313 504 793 1022 1875
25 113 220 314 505 794 1023 1876
26 114 221 315 506 795 1024 1877
27 115 222 316 507 796 1025 1878
28 116 223 317 508 797 1026 1879
29 117 224 318 509 798 1027 1880
30 118 225 319 510 799 1028 1881
31 119 226 320 511 800 1029 1882
32 120 227 321 512 801 1030 1883
33 121 228 322 513 802 1031 1884
34 122 229 323 514 803 1032 1885
35 123 230 244 515 804 972 1886
36 124 231 245 516 805 1033 1887
37 125 232 246 517 806 1034 1888
38 126 233 247 518 807 1035 1889
39 127 234 248 519 973 1036 1890
40 128 235 249 520 974 1037 1891
```

-continued

```
41 129 236 250 521 730 1038 1892
42 130 237 251 522 731 1039 1893
43 131 238 252 523 732 1040 1894
44 132 239 253 524 733 1041 1895
45 133 240 254 525 734 1042 1896
46 134 241 255 526 735 1043 1897
47 135 242 256 527 736 1044 1898
48 136 163 257 528 737 1045 1899
49 137 164 258 529 738 1046 1900
50 138 165 259 530 739 1047 1901
51 139 166 260 531 740 1048 1902
52 140 167 261 532 741 1049 1903
53 141 168 262 533 742 1050 1904
54 142 169 263 534 743 1051 1905
55 143 170 264 535 744 1052 1906
56 144 171 265 536 745 952 1907
57 145 172 266 537 746 954 1908
58 146 173 267 538 747 955 1909
59 147 174 268 539 748 957 1910
60 148 175 269 540 749 960 1911
61 149 176 270 541 750 944 1912
62 150 177 271 542 751 945 1913
63 151 178 272 543 752 946 1914
64 152 179 273 544 753 947 1915
65 153 180 274 545 754 950 1916
66 154 181 275 546 755 953 1917
67 155 182 276 547 756 956 1918
68 156 183 277 548 757 999 1919
69 157 184 278 549 758 958 1920
70 158 185 279 550 759 959 1921
71 159 186 280 551 760 961 1922
72 160 187 281 552 761 1000 1923
73 161 188 282 553 762 1001 1924
74 82 189 283 554 763 1002 1925
75 83 190 284 555 764 963 1926
76 84 191 285 556 765 964 1927
77 85 192 286 557 766 962 1928
78 86 193 287 558 767 965 1929
79 87 194 288 559 768 1003 1930
80 88 195 289 560 769 1004 1931
1 89 196 290 561 770 1005 1932
2 90 197 291 562 771 1006 1933
3 91 198 292 563 772 1007 1934
4 92 199 293 564 773 1008 1935
5 93 200 294 565 774 966 1936
6 94 201 295 566 775 1009 1937
7 95 202 296 487 776 1010 1938
8 96 203 297 488 777 1011 1939
9 97 204 298 489 778 1012 1940
10 98 205 299 490 779 1013 1941
11 99 206 300 491 780 967 1942
12 100 207 301 492 781 1014 1943
13 101 208 302 493 782 968 1864
15 148 220 394 616 837 957 1063
67 113 241 331 574 873 1037 1090
55 129 200 337 601 857 969 1084
68 105 208 348 578 843 1026 1123
39 117 191 385 583 840 1002 1131
14 83 238 345 621 881 1020 1114
28 111 206 349 644 845 951 1081
9 81 209 364 643 835 946 1129
7 152 229 381 637 830 1033 1132
40 125 216 360 596 821 961 1072
74 160 242 330 604 870 960 1059
12 149 192 359 587 811 966 1085
5 94 180 375 634 847 959 1115
47 159 193 351 602 866 1039 1103
54 131 164 363 605 875 1001 1116
56 82 219 329 625 822 1016 1087
34 104 233 357 612 879 1003 1062
77 88 214 324 638 884 950 1076
73 154 212 398 588 842 945 1057
17 151 165 371 576 865 1021 1055
71 112 199 326 589 864 956 1088
63 156 217 395 640 858 954 1122
45 146 210 340 615 817 1049 1060
10 141 172 325 629 825 1040 1133
70 132 179 377 610 888 1014 1095
22 101 181 328 608 855 1031 1102
```

```
32 122 239 350 641 823 958 1104
38 158 202 334 595 826 1011 1082
49 97 198 400 613 846 1017 1125
6 106 222 397 606 833 1041 1121
46 133 196 358 568 859 971 1065
50 110 188 402 575 889 1024 1119
65 115 170 392 577 877 947 1111
2 153 215 387 635 890 1010 1093
61 96 195 378 598 861 1009 1058
31 95 227 347 594 836 1004 1118
60 89 237 368 618 850 1036 1070
76 128 163 404 592 831 1044 1080
52 136 174 343 584 829 1028 1086
64 119 211 352 646 862 962 1097
30 86 171 379 611 816 1042 1054
58 134 175 356 591 834 1045 1094
0 137 190 361 623 827 999 1098
19 157 207 399 633 869 1052 1113
72 144 186 342 639 876 1005 1130
27 90 236 341 570 878 1029 1109
16 120 185 335 607 856 1019 1079
41 108 201 374 647 819 1030 1108
26 121 177 382 571 815 1007 1124
78 92 189 365 586 839 955 1100
29 147 235 332 603 813 1000 1112
51 161 183 380 582 885 1050 1078
35 142 162 383 632 867 1048 1106
21 140 224 403 581 832 1008 1053
18 93 197 390 597 812 1035 1067
59 127 232 336 573 844 952 1120
23 145 221 366 585 854 1046 1075
13 138 166 354 631 860 967 1064
8 100 231 367 579 871 1018 1089
79 107 203 338 567 828 970 1074
48 109 234 393 620 868 965 1126
69 87 176 327 593 872 1038 1077
25 130 240 388 628 887 1034 1099
44 126 226 386 617 824 944 1083
53 150 223 339 642 883 972 1069
80 124 184 373 627 853 1025 1066
57 116 228 391 599 882 1012 1107
62 98 218 384 630 818 1051 1071
20 143 213 346 572 874 1032 1061
43 123 204 353 636 886 953 1056
42 155 173 355 622 852 964 1127
36 85 194 333 619 880 1006 1096
75 91 230 376 580 810 968 1117
3 102 169 372 624 841 1047 1073
66 139 178 396 614 814 1013 1092
33 99 205 370 609 849 1015 1101
1 103 182 362 600 838 1027 1128
4 118 187 344 569 863 1043 1105
24 135 225 389 590 848 1023 1110
11 114 168 369 626 820 963 1068
37 84 167 401 645 851 1022 1091
16 149 221 425 707 808 1064 1204
38 85 168 478 663 932 1092 1168
68 114 242 449 727 915 1091 1212
56 130 201 424 713 990 1085 1202
69 106 209 438 710 930 1124 1197
40 118 192 419 671 933 1132 1188
15 84 239 417 715 938 1115 1157
29 112 207 450 705 980 1082 1178
10 81 210 484 700 949 1130 1214
8 153 230 422 691 916 1133 1153
41 126 217 415 660 904 1073 1162
75 161 163 457 681 917 1060 1189
13 150 193 464 717 995 1086 1166
6 95 181 466 656 943 1116 1171
48 160 194 444 665 987 1104 1209
55 132 165 407 692 978 1117 1152
57 83 220 483 669 977 1088 1151
35 105 234 427 674 996 1063 1145
78 89 215 481 712 923 1077 1184
74 155 213 473 655 941 1058 1192
18 152 166 455 654 934 1056 1175
72 113 200 420 728 896 1089 1142
64 157 218 480 687 903 1123 1190
46 147 211 432 695 905 1061 1193
```

-continued

```
11 142 173 442 678 991 1054 1213
71 133 180 448 725 926 1096 1200
23 102 182 459 693 922 1103 1146
33 123 240 416 696 931 1105 1176
39 159 203 456 716 920 1083 1164
50 98 199 460 703 912 1126 1177
7 107 223 475 649 894 1122 1148
47 134 197 412 679 979 1066 1203
51 111 189 471 667 919 1120 1137
66 116 171 441 680 983 1112 1198
3 154 216 470 651 989 1094 1196
62 97 196 406 706 994 1059 1149
32 96 228 462 720 898 1119 1183
61 90 238 474 701 976 1071 1201
77 129 164 440 699 895 1081 1194
53 137 175 468 652 899 1087 1156
65 120 212 405 686 914 1098 1163
31 87 172 429 704 975 1055 1165
59 135 176 482 697 910 1095 1143
0 138 191 437 659 988 1099 1186
20 158 208 426 666 909 1114 1182
73 145 187 451 668 925 1131 1206
28 91 237 436 726 901 1110 1180
17 121 186 408 689 913 1080 1172
42 109 202 439 685 948 1109 1154
27 122 178 461 709 907 1125 1199
79 93 190 445 683 891 1101 1179
30 148 236 431 675 981 1113 1211
52 82 184 428 657 921 1079 1141
36 143 162 469 702 939 1107 1147
22 141 225 433 682 809 1053 1158
19 94 198 423 714 997 1068 1195
60 128 233 418 724 986 1121 1155
24 146 222 409 650 927 1076 1159
14 139 167 458 661 940 1065 1174
9 101 232 479 698 900 1090 1191
80 108 204 435 658 992 1075 1170
49 110 235 454 662 936 1127 1140
70 88 177 463 677 935 1078 1169
26 131 241 410 694 908 1100 1185
45 127 227 467 673 984 1084 1161
54 151 224 472 723 942 1070 1173
1 125 185 430 672 937 1067 1139
58 117 229 453 688 928 1108 1167
63 99 219 452 664 897 1072 1134
21 144 214 446 676 918 1062 1208
44 124 205 485 722 985 1057 1181
43 156 174 413 670 893 1128 1136
37 86 195 476 648 902 1097 1205
76 92 231 443 711 929 1118 1150
4 103 170 411 684 906 1074 1135
67 140 179 414 719 911 1093 1187
34 100 206 434 708 982 1102 1138
2 104 183 421 653 892 1129 1160
5 119 188 447 718 998 1106 1144
25 136 226 477 690 993 1111 1210
12 115 169 465 721 924 1069 1207
17 150 222 321 503 787 1205 1254
13 116 170 279 491 796 1208 1295
39 86 169 306 554 783 1169 1273
69 115 163 283 521 974 1213 1236
57 131 202 288 489 759 1203 1232
70 107 210 246 492 747 1198 1256
41 119 193 269 512 760 1189 1230
16 85 240 268 499 731 1158 1222
30 113 208 262 525 786 1179 1284
11 81 211 301 555 800 1135 1249
9 154 231 309 543 781 1154 1229
42 127 218 292 556 779 1163 1261
76 82 164 259 527 732 1190 1271
14 151 194 307 502 766 1167 1277
7 96 182 310 516 784 1172 1288
49 161 195 250 497 777 1210 1245
56 133 166 317 495 739 1153 1285
58 84 221 263 528 746 1152 1289
36 106 235 293 562 748 1146 1224
79 90 216 281 500 806 1185 1241
75 156 214 294 493 769 1193 1220
19 153 167 265 535 765 1176 1270
```

```
73 114 201 320 542 789 1143 1219
65 158 219 254 544 763 1191 1235
47 148 212 315 522 755 1194 1291
12 143 174 313 565 737 1214 1223
72 134 181 266 561 782 1201 1269
24 103 183 300 505 762 1147 1217
34 124 241 318 559 794 1177 1215
40 160 204 311 551 804 1165 1258
51 99 200 273 533 730 1178 1231
8 108 224 280 498 741 1149 1266
48 135 198 282 558 778 1204 1255
52 112 190 260 510 738 1138 1280
67 117 172 303 520 742 1199 1265
4 155 217 299 526 757 1197 1237
63 98 197 323 537 774 1150 1268
33 97 229 297 494 753 1184 1290
62 91 239 289 534 803 1202 1274
78 130 165 271 538 752 1195 1260
54 138 176 316 553 768 1157 1257
66 121 213 296 490 744 1164 1218
32 88 173 248 549 756 1166 1262
60 136 177 258 519 802 1144 1252
0 139 192 264 548 750 1187 1247
21 159 209 275 564 729 1183 1238
74 146 188 312 540 791 1207 1287
29 92 238 272 552 764 1181 1228
18 122 187 276 518 799 1173 1264
43 110 203 291 546 788 1155 1283
28 123 179 308 486 733 1200 1292
80 94 191 287 507 798 1180 1239
31 149 237 257 560 770 1212 1216
53 83 185 286 515 801 1142 1221
37 144 162 302 504 743 1148 1259
23 142 226 278 529 807 1159 1282
20 95 199 290 514 793 1196 1281
61 129 234 256 566 790 1156 1275
25 147 223 284 517 751 1160 1234
15 140 168 243 539 795 1175 1242
10 102 233 245 523 785 1192 1225
1 109 205 298 509 780 1171 1272
50 111 236 253 506 771 1141 1240
71 89 178 322 547 740 1170 1243
27 132 242 267 511 761 1186 1263
46 128 228 252 501 797 1162 1250
55 152 225 304 496 736 1174 1276
2 126 186 255 487 745 1140 1226
59 118 230 277 536 772 1168 1294
64 100 220 261 557 749 1134 1227
22 145 215 247 513 754 1209 1278
45 125 206 244 532 792 1182 1253
44 157 175 285 541 735 1137 1267
38 87 196 249 488 734 1206 1248
77 93 232 319 545 973 1151 1246
5 104 171 314 550 767 1136 1279
68 141 180 305 508 775 1188 1233
35 101 207 274 531 758 1139 1251
3 105 184 295 530 805 1161 1244
6 120 189 251 524 773 1145 1286
26 137 227 270 563 776 1211 1293
18 151 223 397 619 840 1255 1359
27 138 228 392 593 851 1294 1314
14 117 171 372 629 823 1216 1329
40 87 170 404 568 854 1274 1346
70 116 164 334 577 876 1237 1325
58 132 203 340 604 860 1233 1375
71 108 211 351 581 846 1257 1324
42 120 194 388 586 843 1231 1340
17 86 241 348 624 884 1223 1316
31 114 209 352 647 848 1285 1328
12 81 212 367 646 838 1250 1374
10 155 232 384 640 833 1230 1322
43 128 219 363 599 824 1262 1296
77 83 165 333 607 873 1272 1363
15 152 195 362 590 814 1278 1336
8 97 183 378 637 850 1289 1371
50 82 196 354 605 869 1246 1360
57 134 167 366 608 878 1286 1305
59 85 222 332 628 825 1290 1370
37 107 236 360 615 882 1225 1342
```

```
80 91 217 324 641 887 1242 1373
76 157 215 401 591 845 1221 1315
20 154 168 374 579 868 1271 1299
74 115 202 329 592 867 1220 1365
66 159 220 398 643 861 1236 1362
48 149 213 343 618 820 1292 1323
13 144 175 328 632 828 1224 1367
73 135 182 380 613 811 1270 1357
25 104 184 331 611 858 1218 1352
35 125 242 353 644 826 1215 1343
41 161 205 337 598 829 1259 1312
52 100 201 403 616 849 1232 1333
9 109 225 400 609 836 1267 1369
49 136 199 361 571 862 1256 1308
53 113 191 325 578 812 1281 1317
68 118 173 395 580 880 1266 1344
5 156 218 390 638 813 1238 1321
64 99 198 381 601 864 1269 1326
34 98 230 350 597 839 1291 1364
63 92 240 371 621 853 1275 1307
79 131 166 327 595 834 1261 1306
55 139 177 346 587 832 1258 1300
67 122 214 355 569 865 1219 1339
33 89 174 382 614 819 1263 1347
61 137 178 359 594 837 1253 1330
0 140 193 364 626 830 1248 1297
22 160 210 402 636 872 1239 1345
75 147 189 345 642 879 1288 1348
30 93 239 344 573 881 1229 1368
19 123 188 338 610 859 1265 1355
44 111 204 377 570 822 1284 1301
29 124 180 385 574 818 1293 1331
1 95 192 368 589 842 1240 1319
32 150 238 335 606 816 1217 1332
54 84 186 383 585 888 1222 1303
38 145 162 386 635 870 1260 1358
24 143 227 326 584 835 1283 1372
21 96 200 393 600 815 1282 1353
62 130 235 339 576 847 1276 1351
26 148 224 369 588 857 1235 1304
16 141 169 357 634 863 1243 1338
11 103 234 370 582 874 1226 1356
2 110 206 341 567 831 1273 1349
51 112 237 396 623 871 1241 1311
72 90 179 330 596 875 1244 1318
28 133 163 391 631 890 1264 1320
47 129 229 389 620 827 1251 1298
56 153 226 342 645 886 1277 1341
3 127 187 376 630 856 1227 1337
60 119 231 394 602 885 1295 1361
65 101 221 387 633 821 1228 1335
23 146 216 349 575 877 1279 1327
46 126 207 356 639 889 1254 1309
45 158 176 358 625 855 1268 1354
39 88 197 336 622 883 1249 1334
78 94 233 379 583 810 1247 1366
6 105 172 375 627 844 1280 1376
69 142 181 399 617 817 1234 1302
36 102 208 373 612 852 1252 1313
4 106 185 365 603 841 1245 1350
7 121 190 347 572 866 1287 1310
19 152 224 428 710 935 1360 1422
8 122 191 450 721 894 1311 1445
28 139 229 480 693 995 1315 1456
15 118 172 468 724 927 1330 1413
41 88 171 481 666 976 1347 1453
71 117 165 452 650 918 1326 1457
59 133 204 427 716 993 1376 1392
72 109 212 441 713 933 1325 1409
43 121 195 422 674 977 1341 1388
18 87 242 420 718 939 1317 1438
32 115 210 453 708 943 1329 1387
13 81 213 407 703 996 1375 1403
11 156 233 425 694 919 1323 1379
44 129 220 418 663 907 1296 1391
78 84 166 460 684 920 1364 1437
16 153 196 467 720 998 1337 1385
9 98 184 469 659 931 1372 1377
51 83 197 447 668 988 1361 1426
```

-continued

```
58 135 168 410 695 941 1306 1399
60 86 223 406 672 979 1371 1434
38 108 237 430 677 892 1343 1423
1 92 218 484 715 926 1374 1448
77 158 216 476 658 808 1316 1433
21 155 169 458 657 937 1300 1405
75 116 203 423 651 899 1366 1436
67 160 221 483 690 906 1363 1378
49 150 214 435 698 908 1324 1442
14 145 176 445 681 949 1368 1428
74 136 183 451 728 929 1358 1425
26 105 185 462 696 925 1353 1386
36 126 163 419 699 982 1344 1430
42 82 206 459 719 923 1313 1420
53 101 202 463 706 915 1334 1415
10 110 226 478 652 897 1370 1406
50 137 200 415 682 942 1309 1455
54 114 192 474 670 922 1318 1396
69 119 174 444 683 985 1345 1432
6 157 219 473 654 992 1322 1451
65 100 199 409 709 997 1327 1380
35 99 231 465 723 901 1365 1407
64 93 241 477 704 978 1308 1384
80 132 167 443 702 898 1307 1389
56 140 178 471 655 902 1301 1427
68 123 215 405 689 917 1340 1450
34 90 175 432 707 934 1348 1449
62 138 179 485 700 913 1331 1443
0 141 194 440 662 991 1298 1402
23 161 211 429 669 912 1346 1410
76 148 190 454 671 928 1349 1393
31 94 240 439 649 904 1369 1440
20 124 189 411 692 916 1356 1408
45 112 205 442 688 990 1302 1411
30 125 181 464 712 910 1332 1431
2 96 193 448 686 891 1320 1418
33 151 239 434 678 983 1333 1444
55 85 187 431 660 924 1304 1394
39 146 162 472 705 948 1359 1382
25 144 228 436 685 981 1373 1395
22 97 201 426 717 893 1354 1446
63 131 236 421 727 940 1352 1421
27 149 225 412 653 930 1305 1435
17 142 170 461 664 989 1339 1416
12 104 235 482 701 903 1357 1414
3 111 207 438 661 994 1350 1447
52 113 238 457 665 938 1312 1401
73 91 180 466 680 936 1319 1419
29 134 164 413 697 911 1321 1412
48 130 230 470 676 986 1299 1454
57 154 227 475 726 809 1342 1381
4 128 188 433 675 980 1338 1383
61 120 232 456 691 975 1362 1441
66 102 222 455 667 900 1336 1404
24 147 217 449 679 921 1328 1400
47 127 208 408 725 987 1310 1424
46 159 177 416 673 896 1355 1398
40 89 198 479 648 905 1335 1390
79 95 234 446 714 932 1367 1452
7 106 173 414 687 909 1297 1417
70 143 182 417 722 914 1303 1397
37 103 209 437 711 984 1314 1429
5 107 186 424 656 895 1351 1439
20 153 225 244 506 790 1423 1532
6 108 187 298 533 973 1440 1467
9 123 192 254 527 776 1446 1495
29 140 230 273 566 779 1457 1458
16 119 173 282 494 799 1414 1536
42 89 172 309 557 786 1454 1509
72 118 166 286 524 732 1378 1464
60 134 205 291 492 762 1393 1533
73 110 213 249 495 750 1410 1478
44 122 196 272 515 763 1389 1463
19 88 163 271 502 734 1439 1515
33 116 211 265 528 789 1388 1466
14 81 214 304 558 803 1404 1488
12 157 234 312 546 784 1380 1472
45 130 221 295 559 782 1392 1538
79 85 167 262 530 735 1438 1535
```

-continued

```
17 154 197 310 505 769 1386 1496
10 99 185 313 519 787 1377 1460
52 84 198 253 500 780 1427 1530
59 136 169 320 498 742 1400 1525
61 87 224 266 531 749 1435 1516
39 109 238 296 565 751 1424 1485
2 93 219 284 503 974 1449 1506
78 159 217 297 496 772 1434 1462
22 156 170 268 538 768 1406 1481
76 117 204 323 545 792 1437 1490
68 161 222 257 547 766 1379 1517
50 151 215 318 525 758 1443 1494
15 146 177 316 488 740 1429 1499
75 137 184 269 564 785 1426 1537
27 106 186 303 508 765 1387 1480
37 127 164 321 562 797 1431 1479
43 83 207 314 554 807 1421 1473
54 102 203 276 536 733 1416 1512
11 111 227 283 501 744 1407 1520
51 138 201 285 561 781 1456 1503
55 115 193 263 513 741 1397 1470
70 120 175 306 523 745 1433 1518
7 158 220 302 529 760 1452 1521
66 101 200 246 540 777 1381 1461
36 100 232 300 497 756 1408 1528
65 94 242 292 537 806 1385 1474
1 133 168 274 541 755 1390 1504
57 141 179 319 556 771 1428 1492
69 124 216 299 493 747 1451 1505
35 91 176 251 552 759 1450 1476
63 139 180 261 522 805 1444 1531
0 142 195 267 551 753 1403 1465
24 82 212 278 487 729 1411 1526
77 149 191 315 543 794 1394 1524
32 95 241 275 555 767 1441 1477
21 125 190 279 521 802 1409 1511
46 113 206 294 549 791 1412 1529
31 126 182 311 486 736 1432 1522
3 97 194 290 510 801 1419 1484
34 152 240 260 563 773 1445 1491
56 86 188 289 518 804 1395 1493
40 147 162 305 507 746 1383 1471
26 145 229 281 532 730 1396 1514
23 98 202 293 517 796 1447 1510
64 132 237 259 489 793 1422 1534
28 150 226 287 520 754 1436 1508
18 143 171 243 542 798 1417 1500
13 105 236 248 526 788 1415 1482
4 112 208 301 512 783 1448 1527
53 114 239 256 509 774 1402 1507
74 92 181 245 550 743 1420 1459
30 135 165 270 514 764 1413 1469
49 131 231 255 504 800 1455 1475
58 155 228 307 499 739 1382 1486
5 129 189 258 490 748 1384 1523
62 121 233 280 539 775 1442 1483
67 103 223 264 560 752 1405 1487
25 148 218 250 516 757 1401 1502
48 128 209 247 535 795 1425 1519
47 160 178 288 544 738 1399 1498
41 90 199 252 491 737 1391 1468
80 96 235 322 548 731 1453 1497
8 107 174 317 553 770 1418 1513
71 144 183 308 511 778 1398 1489
38 104 210 277 534 761 1430 1501
21 154 226 400 622 843 1533 1597
39 105 211 376 615 855 1502 1553
7 109 188 368 606 844 1468 1617
10 124 193 350 575 869 1496 1603
30 141 231 395 596 854 1458 1600
17 120 174 375 632 826 1537 1561
43 90 173 327 571 857 1510 1605
73 119 167 337 580 879 1465 1595
61 135 206 343 607 863 1534 1590
74 111 214 354 584 849 1479 1581
45 123 197 391 589 846 1464 1550
20 89 164 351 627 887 1516 1571
34 117 212 355 570 851 1467 1607
15 81 215 370 569 841 1489 1546
```

```
13 158 235 387 643 836 1473 1555
46 131 222 366 602 827 1459 1582
80 86 168 336 610 876 1536 1559
18 155 198 365 593 817 1497 1564
11 100 186 381 640 853 1461 1602
53 85 199 357 608 872 1531 1545
60 137 170 369 611 881 1526 1544
62 88 225 335 631 828 1517 1618
40 110 239 363 618 885 1486 1577
3 94 220 324 644 890 1507 1585
79 160 218 404 594 848 1463 1568
23 157 171 377 582 871 1482 1615
77 118 205 332 595 870 1491 1583
69 82 223 401 646 864 1518 1586
51 152 216 346 621 823 1495 1606
16 147 178 331 635 831 1500 1593
76 138 185 383 616 814 1538 1619
28 107 187 334 614 861 1481 1569
38 128 165 356 647 829 1480 1557
44 84 208 340 601 832 1474 1570
55 103 204 326 619 852 1513 1541
12 112 228 403 612 839 1521 1596
52 139 202 364 574 865 1504 1610
56 116 194 328 581 815 1471 1591
71 121 176 398 583 883 1519 1589
8 159 221 393 641 816 1522 1542
67 102 201 384 604 867 1462 1576
37 101 233 353 600 842 1529 1594
66 95 163 374 624 856 1475 1587
2 134 169 330 598 837 1505 1549
58 142 180 349 590 835 1493 1556
70 125 217 358 572 868 1506 1558
36 92 177 385 617 822 1477 1616
64 140 181 362 597 840 1532 1579
0 143 196 367 629 833 1466 1575
25 83 213 325 639 875 1527 1599
78 150 192 348 645 882 1525 1573
33 96 242 347 576 884 1478 1565
22 126 191 341 613 862 1512 1547
47 114 207 380 573 825 1530 1592
32 127 183 388 577 821 1523 1572
4 98 195 371 592 845 1485 1604
35 153 241 338 609 819 1492 1614
57 87 189 386 588 811 1494 1540
41 148 162 389 638 873 1472 1551
27 146 230 329 587 838 1515 1588
24 99 203 396 603 818 1511 1548
65 133 238 342 579 850 1535 1552
29 151 227 372 591 860 1509 1567
19 144 172 360 637 866 1501 1584
14 106 237 373 585 877 1483 1563
5 113 209 344 567 834 1528 1613
54 115 240 399 626 874 1508 1562
75 93 182 333 599 878 1460 1578
31 136 166 394 634 813 1470 1554
50 132 232 392 623 830 1476 1566
59 156 229 345 568 889 1487 1612
6 130 190 379 633 859 1524 1560
63 122 234 397 605 888 1484 1539
68 104 224 390 636 824 1488 1601
26 149 219 352 578 880 1503 1574
49 129 210 359 642 812 1520 1609
48 161 179 361 628 858 1499 1598
42 91 200 339 625 886 1469 1543
1 97 236 382 586 810 1498 1608
9 108 175 378 630 847 1514 1580
72 145 184 402 620 820 1490 1611
22 155 227 431 713 936 1598 1638
73 146 185 420 725 917 1612 1674
40 106 212 440 714 986 1554 1658
8 110 189 427 659 898 1618 1644
11 125 194 453 724 897 1604 1641
31 142 232 483 696 998 1601 1682
18 121 175 471 727 930 1562 1646
44 91 174 484 669 978 1606 1636
74 120 168 455 653 921 1596 1631
62 136 207 430 719 995 1591 1622
75 112 215 444 716 977 1582 1671
46 124 198 425 677 979 1551 1692
```

-continued

```
21 90 165 423 721 948 1572 1648
35 118 213 456 711 931 1608 1667
16 81 216 410 706 892 1547 1676
14 159 236 428 697 922 1556 1623
47 132 223 421 666 910 1583 1680
1 87 169 463 687 923 1560 1685
19 156 199 470 723 894 1565 1643
12 101 187 472 662 982 1603 1666
54 86 200 450 671 991 1546 1665
61 138 171 413 698 808 1545 1659
63 89 226 409 675 942 1619 1698
41 111 240 433 680 895 1578 1626
4 95 221 407 718 929 1586 1689
80 161 219 479 661 935 1569 1656
24 158 172 461 660 980 1616 1624
78 119 206 426 654 902 1584 1627
70 83 224 406 693 909 1587 1647
52 153 217 438 701 911 1607 1634
17 148 179 448 684 996 1594 1660
77 139 186 454 651 932 1540 1690
29 108 188 465 699 928 1570 1678
39 129 166 422 702 984 1558 1691
45 85 209 462 722 926 1571 1662
56 104 205 466 709 918 1542 1637
13 113 229 481 655 900 1597 1651
53 140 203 418 685 809 1611 1632
57 117 195 477 673 925 1592 1630
72 122 177 447 686 987 1590 1663
9 160 222 476 657 994 1543 1697
68 103 202 412 712 893 1577 1635
38 102 234 468 726 904 1595 1628
67 96 164 480 707 941 1588 1670
3 135 170 446 705 901 1550 1677
59 143 181 474 658 905 1557 1679
71 126 218 405 692 920 1559 1657
37 93 178 435 710 937 1617 1700
65 141 182 408 703 916 1580 1696
0 144 197 443 665 949 1576 1640
26 84 214 432 672 915 1600 1694
79 151 193 457 674 975 1574 1686
34 97 163 442 652 907 1566 1668
23 127 192 414 695 919 1548 1633
48 115 208 445 691 993 1593 1693
33 128 184 467 715 913 1573 1645
5 99 196 451 689 891 1605 1655
36 154 242 437 681 985 1615 1661
58 88 190 434 663 927 1541 1672
42 149 162 475 708 990 1552 1629
28 147 231 439 688 983 1589 1669
25 100 204 429 720 896 1549 1673
66 134 239 424 650 989 1553 1688
30 152 228 415 656 933 1568 1625
20 145 173 464 667 992 1585 1684
15 107 238 485 704 906 1564 1654
6 114 210 441 664 997 1614 1683
55 116 241 460 668 939 1563 1699
76 94 183 469 683 938 1579 1675
32 137 167 416 700 914 1555 1687
51 133 233 473 679 940 1567 1653
60 157 230 478 649 981 1613 1681
7 131 191 436 678 943 1561 1620
64 123 235 459 694 934 1539 1642
69 105 225 458 670 903 1602 1695
27 150 220 452 682 924 1575 1650
50 130 211 411 728 988 1610 1639
49 82 180 419 676 899 1599 1664
43 92 201 482 648 908 1544 1649
2 98 237 449 717 976 1609 1621
10 109 176 417 690 912 1581 1652
23 156 228 247 509 793 1639 1706
11 110 177 320 556 773 1653 1750
74 147 186 311 514 781 1675 1714
41 107 213 280 537 764 1659 1704
9 111 190 301 536 731 1645 1779
12 126 195 257 530 779 1642 1770
32 143 233 276 489 782 1683 1739
19 122 176 285 497 802 1647 1760
45 92 175 312 560 789 1637 1716
75 121 169 289 527 735 1632 1735
```

-continued 63 137 208 294 495 765 1623 1744
76 113 216 252 498 753 1672 1771
47 125 199 275 518 766 1693 1748
22 91 166 274 505 737 1649 1753
36 119 214 268 531 792 1668 1711
17 81 217 307 561 806 1677 1734
15 160 237 315 549 787 1624 1733
48 133 224 298 562 785 1681 1727
2 88 170 265 533 738 1686 1766
20 157 200 313 508 772 1644 1774
13 102 188 316 522 790 1667 1757
55 87 201 256 503 783 1666 1724
62 139 172 323 501 745 1660 1772
64 90 227 269 534 752 1699 1775
42 112 241 299 488 754 1627 1715
5 96 222 287 506 732 1690 1702
1 82 220 300 499 775 1657 1728
25 159 173 271 541 771 1625 1758
79 120 207 246 548 795 1628 1746
71 84 225 260 550 769 1648 1759
53 154 218 321 528 761 1635 1730
18 149 180 319 491 743 1661 1705
78 140 187 272 487 788 1691 1719
30 109 189 306 511 768 1679 1780
40 130 167 244 565 800 1692 1778
46 86 210 317 557 730 1663 1731
57 105 206 279 539 736 1638 1765
14 114 230 286 504 747 1652 1703
54 141 204 288 564 784 1633 1776
58 118 196 266 516 744 1631 1738
73 123 178 309 526 748 1664 1745
10 161 223 305 532 763 1698 1747
69 104 203 249 543 780 1636 1725
39 103 235 303 500 759 1629 1768
68 97 165 295 540 974 1671 1764
4 136 171 277 544 758 1678 1708
60 144 182 322 559 774 1680 1762
72 127 219 302 496 750 1658 1754
38 94 179 254 555 762 1621 1736
66 142 183 264 525 973 1697 1781
0 145 198 270 554 756 1641 1761
27 85 215 281 490 729 1695 1713
80 152 194 318 546 797 1687 1723
35 98 164 278 558 770 1669 1729
24 128 193 282 524 805 1634 1740
49 116 209 297 552 794 1694 1777
34 129 185 314 486 739 1646 1737
6 100 197 293 513 804 1656 1741
37 155 163 263 566 776 1662 1756
59 89 191 292 521 807 1673 1773
43 150 162 308 510 749 1630 1752
29 148 232 284 535 733 1670 1722
26 101 205 296 520 799 1674 1751
67 135 240 262 492 796 1689 1767
31 153 229 290 523 757 1626 1743
21 146 174 243 545 801 1685 1755
16 108 239 251 529 791 1655 1721
7 115 211 304 515 786 1684 1749
56 117 242 259 512 777 1700 1701
77 95 184 248 553 746 1676 1710
33 138 168 273 517 767 1688 1763
52 134 234 258 507 803 1654 1718
61 158 231 310 502 742 1682 1707
8 132 192 261 493 751 1620 1732
65 124 236 283 542 778 1643 1717
70 106 226 267 563 755 1696 1769
28 151 221 253 519 760 1651 1720
51 131 212 250 538 798 1640 1742
50 83 181 291 547 741 1665 1726
44 93 202 255 494 740 1650 1712
3 99 238 245 551 734 1622 1709
24 157 229 403 625 846 1707 1793
4 100 239 385 589 810 1710 1845
12 111 178 381 633 850 1751 1833
75 148 187 325 623 823 1715 1846
42 108 214 379 618 858 1705 1817
10 112 191 371 609 847 1780 1792
13 127 196 353 578 872 1771 1806
33 144 234 398 599 857 1740 1787

```
20 123 177 378 635 829 1761 1785
46 93 176 330 574 860 1717 1818
76 122 170 340 583 882 1736 1852
64 138 209 346 610 866 1745 1790
77 114 217 357 587 852 1772 1783
48 126 200 394 592 849 1749 1825
23 92 167 354 630 890 1754 1832
37 120 215 358 573 854 1712 1834
18 81 218 373 572 844 1735 1812
16 161 238 390 646 839 1734 1855
49 134 225 369 605 830 1728 1851
3 89 171 339 613 879 1767 1795
21 158 201 368 596 820 1775 1849
14 103 189 384 643 856 1758 1841
56 88 202 360 611 875 1725 1823
63 140 173 372 614 884 1773 1788
65 91 228 338 634 831 1776 1848
43 113 242 366 621 888 1716 1800
6 97 223 324 647 813 1703 1810
2 83 221 327 597 851 1729 1816
26 160 174 380 585 874 1759 1827
80 121 208 335 598 873 1747 1784
72 85 226 404 569 867 1760 1824
54 155 219 349 624 826 1731 1828
19 150 181 334 638 834 1706 1843
79 141 188 386 619 817 1720 1860
31 110 190 337 617 864 1781 1839
41 131 168 359 570 832 1779 1809
47 87 211 343 604 835 1732 1838
58 106 207 329 622 855 1766 1854
15 115 231 326 615 842 1704 1830
55 142 205 367 577 868 1777 1842
59 119 197 331 584 818 1739 1808
74 124 179 401 586 886 1746 1836
11 82 224 396 644 819 1748 1782
70 105 204 387 607 870 1726 1797
40 104 236 356 603 845 1769 1850
69 98 166 377 627 859 1765 1805
5 137 172 333 601 840 1709 1794
61 145 183 352 593 838 1763 1819
73 128 220 361 575 871 1755 1804
39 95 180 388 620 825 1737 1856
67 143 184 365 600 843 1702 1807
0 146 199 370 632 836 1762 1829
28 86 216 328 642 878 1714 1813
1 153 195 351 568 885 1724 1799
36 99 165 350 579 887 1730 1796
25 129 194 344 616 865 1741 1837
50 117 210 383 576 828 1778 1801
35 130 186 391 580 824 1738 1791
7 101 198 374 595 848 1742 1786
38 156 164 341 612 822 1757 1857
60 90 192 389 591 814 1774 1826
44 151 162 392 641 876 1753 1847
30 149 233 332 590 841 1723 1803
27 102 206 399 606 821 1752 1822
68 136 241 345 582 853 1768 1831
32 154 230 375 594 863 1744 1858
22 147 175 363 640 869 1756 1835
17 109 240 376 588 880 1722 1840
8 116 212 347 567 837 1750 1798
57 118 163 402 629 877 1701 1821
78 96 185 336 602 881 1711 1820
34 139 169 397 637 816 1764 1814
53 135 235 395 626 833 1719 1853
62 159 232 348 571 812 1708 1861
9 133 193 382 636 862 1733 1844
66 125 237 400 608 811 1718 1811
71 107 227 393 639 827 1770 1859
29 152 222 355 581 883 1721 1862
52 132 213 362 645 815 1743 1802
51 84 182 364 631 861 1727 1789
45 94 203 342 628 889 1713 1815
25 158 230 434 716 938 1794 1863
46 95 204 485 648 911 1816 1865
5 101 240 452 720 978 1846 1866
13 112 179 420 693 915 1834 1867
76 149 188 423 728 920 1847 1868
43 109 215 443 717 940 1818 1869
```

-continued

```
11 113 192 430 662 901 1793 1870
14 128 197 456 727 900 1807 1871
34 145 235 406 699 894 1788 1872
21 124 178 474 650 933 1786 1873
47 94 177 407 672 941 1819 1874
77 123 171 458 656 924 1853 1875
65 139 210 433 722 998 1791 1876
78 115 218 447 719 979 1784 1877
49 127 201 428 680 942 1826 1878
24 93 168 426 724 990 1833 1879
38 121 216 459 714 982 1835 1880
19 81 219 413 709 895 1813 1881
17 82 239 431 700 925 1856 1882
50 135 226 424 669 913 1852 1883
4 90 172 466 690 926 1796 1884
22 159 202 473 726 897 1850 1885
15 104 190 475 665 984 1842 1886
57 89 203 453 674 949 1824 1887
64 141 174 416 701 935 1789 1888
66 92 229 412 678 809 1849 1889
44 114 163 436 683 898 1801 1890
7 98 224 410 721 932 1811 1891
3 84 222 482 664 936 1817 1892
27 161 175 464 663 943 1828 1893
1 122 209 429 657 905 1785 1894
73 86 227 409 696 912 1825 1895
55 156 220 441 704 914 1829 1896
20 151 182 451 687 892 1844 1897
80 142 189 457 654 976 1861 1898
32 111 191 468 702 975 1840 1899
42 132 169 425 705 986 1810 1900
48 88 212 465 725 929 1839 1901
59 107 208 469 712 921 1855 1902
16 116 232 484 658 903 1831 1903
56 143 206 421 688 981 1843 1904
60 120 198 480 676 928 1809 1905
75 125 180 450 689 988 1837 1906
12 83 225 479 660 997 1782 1907
71 106 205 415 715 896 1798 1908
41 105 237 471 649 907 1851 1909
70 99 167 483 710 808 1806 1910
6 138 173 449 708 904 1795 1911
62 146 184 477 661 908 1820 1912
74 129 221 405 695 923 1805 1913
40 96 181 438 713 980 1857 1914
68 144 185 411 706 919 1808 1915
0 147 200 446 668 996 1830 1916
29 87 217 435 675 918 1814 1917
2 154 196 460 677 934 1800 1918
37 100 166 445 655 910 1797 1919
26 130 195 417 698 922 1838 1920
51 118 211 448 694 995 1802 1921
36 131 187 470 718 916 1792 1922
8 102 199 454 692 891 1787 1923
39 157 165 440 684 987 1858 1924
61 91 193 437 666 930 1827 1925
45 152 162 478 711 993 1848 1926
31 150 234 442 691 985 1804 1927
28 103 207 432 723 899 1823 1928
69 137 242 427 653 992 1832 1929
33 155 231 418 659 977 1859 1930
23 148 176 467 670 994 1836 1931
18 110 241 408 707 909 1841 1932
9 117 213 444 667 893 1799 1933
58 119 164 463 671 948 1822 1934
79 97 186 472 686 939 1821 1935
35 140 170 419 703 917 1815 1936
54 136 236 476 682 989 1854 1937
63 160 233 481 652 983 1862 1938
10 134 194 439 681 931 1845 1939
67 126 238 462 697 937 1812 1940
72 108 228 461 673 906 1860 1941
30 153 223 455 685 927 1783 1942
53 133 214 414 651 991 1803 1943
52 85 183 422 679 902 1790 1864
```

-continued

2. GRS-based irregular LDPC (1944, 1297) code (2), R = 0.667
1944 647

12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12 12 12 12
12 12 12 12 12 12 12 12 12 12 12 12 12 12 12 12 12
0 81 162 243 324 486 648 810 972 1134 1271 1377
14 102 209 303 338 494 676 886 1011 1177 1324 1447
15 103 210 304 339 495 677 887 1012 1178 1325 1448
16 104 211 305 340 496 678 888 1013 1179 1282 1449
17 105 212 306 341 497 679 889 1014 1180 1281 1450
18 106 213 307 342 498 680 890 1015 1181 1326 1451
19 107 214 308 343 499 681 811 1016 1182 1327 1452
20 108 215 309 344 500 682 812 1017 1183 1284 1453
21 109 216 310 345 501 683 813 1018 1184 1328 1454
22 110 217 311 346 502 684 814 1019 1185 1283 1455
23 111 218 312 347 503 685 815 1020 1186 1285 1456
24 112 219 313 348 504 686 816 1021 1187 1329 1457
25 113 220 314 349 505 687 817 1022 1188 1286 1378
26 114 221 315 350 506 688 818 1023 1189 1287 1379
27 115 222 316 351 507 689 819 1024 1190 1330 1380
28 116 223 317 352 508 690 820 1025 1191 1288 1381
29 117 224 318 353 509 691 821 1026 1192 1331 1382
30 118 225 319 354 510 692 822 1027 1193 1332 1383
31 119 226 320 355 511 693 823 1028 1194 1289 1384
32 120 227 321 356 512 694 824 1029 1195 1333 1385
33 121 228 322 357 513 695 825 1030 1196 1334 1386
34 122 229 323 358 514 696 826 1031 1197 1335 1387
35 123 230 244 359 515 697 827 1032 1198 1290 1388
36 124 231 245 360 516 698 828 1033 1199 1291 1389
37 125 232 246 361 517 699 829 1034 1299 1336 1390
38 126 233 247 362 518 700 830 1035 1201 1292 1391
39 127 234 248 363 519 701 831 1036 1202 1337 1392
40 128 235 249 364 520 702 832 1037 1203 1293 1393
41 129 236 250 365 521 703 833 1038 1204 1338 1394
42 130 237 251 366 522 704 834 1039 1205 1339 1395
43 131 238 252 367 523 705 835 1040 1300 1340 1396
44 132 239 253 368 524 706 836 1041 1207 1294 1397
45 133 240 254 369 525 707 837 1042 1208 1341 1398
46 134 241 255 370 526 708 838 1043 1301 1342 1399
47 135 242 256 371 527 709 839 1044 1210 1343 1400
48 136 163 257 372 528 710 840 1045 1211 1344 1401
49 137 164 258 373 529 711 841 1046 1302 1345 1402
50 138 165 259 374 530 712 842 1047 1303 1295 1403
51 139 166 260 375 531 713 843 1048 1304 1346 1404
52 140 167 261 376 532 714 844 1049 1135 1347 1405
53 141 168 262 377 533 715 845 1050 1136 1348 1406
54 142 169 263 378 534 716 846 1297 1137 1349 1407
55 143 170 264 379 535 717 847 1298 1138 1350 1408
56 144 171 265 380 536 718 848 973 1139 1351 1409
57 145 172 266 381 537 719 849 974 1140 1352 1410
58 146 173 267 382 538 720 850 975 1141 1353 1411
59 147 174 268 383 539 721 851 976 1142 1354 1412
60 148 175 269 384 540 722 852 977 1143 1296 1413
61 149 176 270 385 541 723 853 978 1144 1355 1414
62 150 177 271 386 542 724 854 979 1145 1356 1415
63 151 178 272 387 543 725 855 980 1146 1357 1416
64 152 179 273 388 544 726 856 981 1147 1358 1417
65 153 180 274 389 545 727 857 982 1148 1359 1418
66 154 181 275 390 546 728 858 983 1149 1360 1419
67 155 182 276 391 547 649 859 984 1150 1361 1420
68 156 183 277 392 548 650 860 985 1151 1362 1421

-continued 69 157 184 278 393 549 651 861 986 1152 1363 1422
70 158 185 279 394 550 652 862 987 1153 1364 1423
71 159 186 280 395 551 653 863 988 1154 1365 1424
72 160 187 281 396 552 654 864 989 1155 1366 1425
73 161 188 282 397 553 655 865 990 1156 1367 1426
74 82 189 283 398 554 656 866 991 1157 1368 1427
75 83 190 284 399 555 657 867 992 1158 1369 1428
76 84 191 285 400 556 658 868 993 1159 1370 1429
77 85 192 286 401 557 659 869 994 1160 1371 1430
78 86 193 287 402 558 660 870 995 1161 1372 1431
79 87 194 288 403 559 661 871 996 1162 1373 1432
80 88 195 289 404 560 662 872 997 1163 1374 1433
1 89 196 290 325 561 663 873 998 1164 1375 1434
2 90 197 291 326 562 664 874 999 1165 1376 1435
3 91 198 292 327 563 665 875 1000 1166 1273 1436
4 92 199 293 328 564 666 876 1001 1167 1274 1437
5 93 200 294 329 565 667 877 1002 1168 1276 1438
6 94 201 295 330 566 668 878 1003 1169 1277 1439
7 95 202 296 331 487 669 879 1004 1170 1279 1440
8 96 203 297 332 488 670 880 1005 1171 1280 1441
9 97 204 298 333 489 671 881 1006 1172 1323 1442
10 98 205 299 334 490 672 882 1007 1173 1267 1443
11 99 206 300 335 491 673 883 1008 1174 1272 1444
12 100 207 301 336 492 674 884 1009 1175 1275 1445
13 101 208 302 337 493 675 885 1010 1176 1278 1446
15 148 220 319 424 616 785 943 1063 1252 1418 1527
67 113 241 281 448 574 807 914 1090 1234 1453 1459
55 129 200 286 423 601 757 961 1084 1230 1388 1528
68 105 208 244 437 578 745 929 1123 1254 1405 1473
39 117 191 267 418 583 758 932 1131 1228 1384 1538
14 83 238 266 416 621 809 952 1114 1220 1434 1510
28 111 206 260 449 644 784 939 1081 1270 1383 1461
9 81 209 299 483 643 798 965 1129 1247 1399 1483
7 152 229 307 421 637 779 915 1132 1227 1455 1467
40 125 216 290 414 596 777 903 1072 1259 1387 1533
74 160 242 257 456 604 730 916 1059 1200 1433 1530
12 149 192 305 463 587 764 967 1085 1308 1381 1491
5 94 180 308 465 634 782 942 1115 1313 1377 1535
47 159 193 248 443 602 775 956 1103 1243 1422 1525
54 131 164 315 406 605 737 937 1116 1310 1395 1520
56 82 219 261 482 625 744 935 1087 1314 1430 1511
34 104 233 291 426 612 746 968 1062 1222 1419 1480
77 88 214 279 480 638 804 922 1076 1239 1444 1501
73 154 212 292 472 588 767 940 1057 1218 1429 1537
17 151 165 263 454 576 763 933 1055 1052 1401 1476
71 112 199 318 419 589 787 895 1088 1217 1432 1485
63 156 217 252 479 640 761 902 1122 1233 1454 1512
45 146 210 313 431 615 753 904 1060 1316 1438 1489
10 141 172 311 441 629 735 962 1133 1221 1424 1494
70 132 179 264 447 610 780 925 1095 1051 1421 1532
22 101 181 298 458 608 760 921 1102 1322 1382 1475
32 122 239 316 415 641 792 945 1104 1215 1426 1474
38 158 202 309 455 595 802 919 1082 1256 1416 1468
49 97 198 271 459 613 808 911 1125 1229 1411 1507
6 106 222 278 474 606 739 893 1121 1306 1402 1515
46 133 196 280 411 568 776 938 1065 1253 1451 1498
50 110 188 258 470 575 736 918 1119 1309 1392 1465
65 115 170 301 440 577 740 950 1111 1263 1428 1513
2 153 215 297 469 635 755 960 1093 1235 1447 1516
61 96 195 321 485 598 772 966 1058 1266 1456 1536
31 95 227 295 461 594 751 897 1118 1315 1403 1523
60 89 237 287 473 618 801 934 1070 1307 1380 1469
76 128 163 269 439 592 750 894 1080 1258 1385 1499
52 136 174 314 467 584 766 898 1086 1255 1423 1487
64 119 211 294 405 646 742 913 1097 1216 1446 1500
30 86 171 246 428 611 754 930 1054 1260 1445 1471
58 134 175 256 481 591 800 909 1094 1250 1439 1526
0 137 190 262 436 623 748 959 1098 1245 1398 1460
19 157 207 273 425 633 729 908 1113 1236 1406 1521
72 144 186 310 450 639 789 924 1130 1312 1389 1519
27 90 236 270 435 570 762 900 1109 1226 1436 1472
16 120 185 274 407 607 797 912 1079 1262 1404 1506
41 108 201 289 438 647 786 958 1108 1269 1407 1524
26 121 177 306 460 571 731 906 1124 1317 1427 1517
78 92 189 285 444 586 796 891 1100 1237 1414 1479
29 147 235 255 430 603 768 947 1112 1321 1440 1486
51 161 183 284 427 582 799 920 1078 1219 1390 1488
35 142 162 300 468 632 741 955 1106 1257 1378 1466
21 140 224 276 432 581 805 944 1053 1268 1391 1509

-continued

```
18 93 197 288 422 597 791 969 1067 1264 1442 1505
59 127 232 254 417 573 788 954 1120 1212 1417 1529
23 145 221 282 408 585 749 926 1075 1232 1431 1503
13 138 166 243 457 631 793 957 1064 1240 1412 1495
8 100 231 323 478 579 783 899 1089 1223 1410 1477
79 107 203 296 434 567 778 963 1074 1206 1443 1522
48 109 234 251 453 620 769 949 1126 1238 1397 1502
69 87 176 320 462 593 738 946 1077 1241 1415 1534
25 130 240 265 409 628 759 907 1099 1261 1408 1464
44 126 226 250 466 617 795 951 1083 1248 1450 1470
53 150 223 302 471 642 734 941 1069 1213 1457 1481
80 124 184 253 429 627 743 936 1066 1224 1379 1518
57 116 228 275 452 599 770 927 1107 1319 1437 1478
62 98 218 259 451 630 747 896 1071 1225 1400 1482
20 143 213 245 445 572 752 917 1061 1214 1396 1497
43 123 204 322 484 636 790 953 1056 1251 1420 1514
42 155 173 283 412 622 733 892 1127 1265 1394 1493
36 85 194 247 475 619 732 901 1096 1305 1386 1463
75 91 230 317 442 580 806 928 1117 1244 1448 1492
3 102 169 312 410 624 765 905 1073 1246 1413 1508
66 139 178 303 413 614 773 910 1092 1231 1393 1484
33 99 205 272 433 609 756 948 1101 1249 1425 1496
1 103 182 293 420 600 803 971 1128 1242 1435 1462
4 118 187 249 446 569 771 970 1105 1311 1441 1490
24 135 225 268 476 590 774 964 1110 1318 1452 1458
11 114 168 277 464 626 794 923 1068 1320 1409 1531
37 84 167 304 477 645 781 931 1091 1209 1449 1504
16 149 221 320 395 502 707 838 977 1204 1528 1592
38 85 168 305 402 553 663 852 1022 1168 1505 1600
68 114 242 282 332 520 727 874 1038 1302 1460 1590
56 130 201 287 338 488 713 858 1014 1202 1529 1585
69 106 209 245 349 491 710 844 1026 1197 1474 1576
40 118 192 268 386 511 671 841 992 1188 1459 1545
15 84 239 267 346 498 715 882 1020 1157 1511 1566
29 112 207 261 350 524 705 846 972 1178 1462 1602
10 81 210 300 365 554 700 836 981 1304 1484 1541
8 153 230 308 382 542 691 831 1034 1153 1468 1550
41 126 217 291 361 555 660 822 989 1162 1534 1577
75 161 163 258 331 526 681 871 978 1189 1531 1554
13 150 193 306 360 501 717 812 1003 1166 1492 1559
6 95 181 309 376 515 656 848 988 1171 1536 1597
48 160 194 249 352 496 665 867 1040 1301 1526 1540
55 132 165 316 364 494 692 876 991 1152 1521 1619
57 83 220 262 330 527 669 823 1013 1151 1512 1613
35 105 234 292 358 561 674 880 997 1145 1481 1572
78 89 215 280 324 499 712 885 983 1184 1502 1580
74 155 213 293 399 492 655 843 980 1192 1538 1563
18 152 166 264 372 534 654 866 1021 1175 1477 1610
72 113 200 319 327 541 728 865 985 1142 1486 1578
64 157 218 253 396 543 687 859 975 1190 1513 1581
46 147 211 314 341 521 695 818 1050 1193 1490 1601
11 142 173 312 326 564 678 826 1041 1303 1495 1588
71 133 180 265 378 560 725 889 1010 1299 1533 1614
23 102 182 299 329 504 693 856 1031 1146 1476 1564
33 123 240 317 351 558 696 824 987 1176 1475 1552
39 159 203 310 335 550 716 827 1006 1164 1469 1565
50 98 199 272 401 532 703 847 1015 1177 1508 1616
7 107 223 279 398 497 649 834 1042 1148 1516 1591
47 134 197 281 359 557 679 860 1019 1203 1499 1605
51 111 189 259 403 509 667 890 1024 1137 1466 1586
66 116 171 302 393 519 680 878 982 1198 1514 1584
3 154 216 298 388 525 651 811 1005 1196 1517 1617
62 97 196 322 379 536 706 862 1004 1149 1537 1571
32 96 228 296 348 493 720 837 998 1183 1524 1589
61 90 238 288 369 533 701 851 1037 1201 1470 1582
77 129 164 270 325 537 699 832 1045 1194 1500 1544
53 137 175 315 344 552 652 830 1028 1156 1488 1551
65 120 212 295 353 489 686 863 995 1163 1501 1553
31 87 172 247 380 548 704 817 1043 1165 1472 1611
59 135 176 257 357 518 697 835 1046 1143 1527 1574
0 138 191 263 362 547 659 828 986 1186 1461 1570
20 158 208 274 400 563 666 870 973 1182 1522 1594
73 145 187 311 343 539 668 877 999 1300 1520 1568
28 91 237 271 342 551 726 879 1029 1180 1473 1560
17 121 186 275 336 517 689 857 1017 1172 1507 1542
42 109 202 290 375 545 685 820 1030 1154 1525 1587
27 122 178 307 383 486 709 816 1001 1199 1518 1567
79 93 190 286 366 506 683 840 976 1179 1480 1599
30 148 236 256 333 559 675 814 990 1211 1487 1609
```

-continued

```
52 82 184 285 381 514 657 886 1297 1141 1489 1615
36 143 162 301 384 503 702 868 1049 1147 1467 1546
22 141 225 277 404 528 682 833 1002 1158 1510 1583
19 94 198 289 391 513 714 813 1036 1195 1506 1543
60 128 233 255 337 565 724 845 974 1155 1530 1547
24 146 222 283 367 516 650 855 1047 1159 1504 1562
14 139 167 243 355 538 661 861 1009 1174 1496 1579
9 101 232 244 368 522 698 872 1016 1191 1478 1558
80 108 204 297 339 508 658 829 1018 1170 1523 1608
49 110 235 252 394 505 662 869 996 1140 1503 1557
70 88 177 321 328 546 677 873 1039 1169 1535 1573
26 131 241 266 389 510 694 888 1035 1185 1465 1549
45 127 227 251 387 500 673 825 979 1161 1471 1561
54 151 224 303 340 495 723 884 1033 1173 1482 1607
1 125 185 254 374 566 672 854 1025 1139 1519 1555
58 117 229 276 392 535 688 883 1007 1167 1479 1539
63 99 219 260 385 556 664 819 1298 1134 1483 1596
21 144 214 246 347 512 676 875 1032 1208 1498 1569
44 124 205 323 354 531 722 887 984 1181 1515 1604
43 156 174 284 356 540 670 853 994 1136 1494 1593
37 86 195 248 334 487 648 881 1000 1205 1464 1618
76 92 231 318 377 544 711 810 1011 1150 1493 1603
4 103 170 313 373 549 684 842 1048 1135 1509 1575
67 140 179 304 397 507 719 815 1008 1187 1485 1606
34 100 206 273 371 530 708 850 1012 1138 1497 1548
2 104 183 294 363 529 653 839 1027 1160 1463 1612
5 119 188 250 345 523 718 864 1044 1144 1491 1598
25 136 226 269 390 562 690 849 1023 1210 1458 1595
12 115 169 278 370 490 721 821 993 1207 1532 1556
17 150 222 321 426 618 787 945 1065 1254 1593 1633
13 116 170 279 466 628 796 925 1070 1322 1557 1641
39 86 169 306 479 647 783 933 1093 1212 1601 1631
69 115 163 283 450 576 809 916 1092 1236 1591 1626
57 131 202 288 425 603 759 963 1086 1232 1586 1697
70 107 210 246 439 580 747 931 1125 1256 1577 1666
41 119 193 269 420 585 760 934 1133 1230 1546 1687
16 85 240 268 418 623 731 954 1116 1222 1567 1643
30 113 208 262 451 646 786 941 1083 1311 1603 1662
11 81 211 301 485 645 800 967 1131 1249 1542 1671
9 154 231 309 423 639 781 917 1054 1229 1551 1698
42 127 218 292 416 598 779 905 1074 1261 1578 1675
76 82 164 259 458 606 732 918 1061 1209 1555 1680
14 151 194 307 465 589 766 969 1087 1246 1560 1638
7 96 182 310 467 636 784 944 1117 1315 1598 1661
49 161 195 250 445 604 777 958 1105 1245 1541 1660
56 133 166 317 408 607 739 939 1118 1312 1540 1654
58 84 221 263 484 627 746 937 1089 1316 1614 1693
36 106 235 293 428 614 748 970 1064 1224 1573 1621
79 90 216 281 482 640 806 924 1078 1241 1581 1684
75 156 214 294 474 590 769 942 1059 1220 1564 1651
19 153 167 265 456 578 765 935 1057 1206 1611 1699
73 114 201 320 421 591 789 897 1090 1219 1579 1622
65 158 219 254 481 642 763 904 1124 1235 1582 1642
47 148 212 315 433 617 755 906 1062 1318 1602 1629
12 143 174 313 443 631 737 964 1055 1223 1589 1655
72 134 181 266 449 612 782 927 1097 1200 1615 1685
24 103 183 300 460 610 762 923 1104 1217 1565 1673
34 124 241 318 417 643 794 947 1106 1215 1553 1686
40 160 204 311 457 597 804 921 1084 1258 1566 1657
51 99 200 273 461 615 730 913 1127 1231 1617 1632
8 108 224 280 476 608 741 895 1123 1266 1592 1646
48 135 198 282 413 570 778 940 1067 1255 1606 1627
52 112 190 260 472 577 738 920 1121 1268 1587 1625
67 117 172 303 442 579 742 952 1113 1265 1585 1658
4 155 217 299 471 637 757 962 1095 1237 1618 1692
63 98 197 323 407 600 774 968 1060 1052 1572 1630
33 97 229 297 463 596 753 899 1120 1317 1590 1623
62 91 239 289 475 620 803 936 1072 1213 1583 1665
78 130 165 271 441 594 752 896 1082 1260 1545 1672
54 138 176 316 469 586 768 900 1088 1257 1552 1674
66 121 213 296 405 568 744 915 1099 1218 1554 1652
32 88 173 248 430 613 756 932 1056 1262 1612 1695
60 136 177 258 483 593 802 911 1096 1252 1575 1691
0 139 192 264 438 625 750 961 1100 1247 1571 1635
21 159 209 275 427 635 729 910 1115 1238 1595 1689
74 146 188 312 452 641 791 926 1132 1314 1569 1681
29 92 238 272 437 572 764 902 1111 1228 1561 1663
18 122 187 276 409 609 799 914 1081 1306 1543 1628
43 110 203 291 440 569 788 960 1110 1310 1588 1688
```

-continued

```
28 123 179 308 462 573 733 908 1126 1319 1568 1640
80 94 191 287 446 588 798 891 1102 1239 1600 1650
31 149 237 257 432 605 770 949 1114 1216 1610 1656
53 83 185 286 429 584 801 922 1080 1221 1616 1667
37 144 162 302 470 634 743 957 1108 1259 1547 1624
23 142 226 278 434 583 807 946 1053 1270 1584 1664
20 95 199 290 424 599 793 971 1069 1269 1544 1668
61 129 234 256 419 575 790 956 1122 1308 1548 1683
25 147 223 284 410 587 751 928 1077 1234 1563 1700
15 140 168 243 459 633 795 959 1066 1242 1580 1679
10 102 233 245 480 581 785 901 1091 1225 1559 1649
1 109 205 298 436 567 780 965 1076 1307 1609 1678
50 111 236 253 455 622 771 951 1128 1240 1558 1694
71 89 178 322 464 595 740 948 1079 1243 1574 1670
27 132 242 267 411 630 761 909 1101 1263 1550 1682
46 128 228 252 468 619 797 953 1085 1250 1562 1648
55 152 225 304 473 644 736 943 1071 1214 1608 1676
2 126 186 255 431 629 745 938 1068 1226 1556 1620
59 118 230 277 454 601 772 929 1109 1321 1539 1637
64 100 220 261 453 632 749 898 1073 1227 1597 1690
22 145 215 247 447 574 754 919 1063 1309 1570 1645
45 125 206 244 406 638 792 955 1058 1253 1605 1634
44 157 175 285 414 624 735 894 1129 1051 1594 1659
38 87 196 249 477 621 734 903 1098 1248 1619 1644
77 93 232 319 444 582 808 930 1119 1305 1604 1696
5 104 171 314 412 626 767 907 1075 1264 1576 1647
68 141 180 305 415 616 775 912 1094 1233 1607 1669
35 101 207 274 435 611 758 950 1103 1251 1549 1653
3 105 184 295 422 602 805 893 1130 1244 1613 1639
6 120 189 251 448 571 773 892 1107 1313 1599 1636
26 137 227 270 478 592 776 966 1112 1320 1596 1677
18 151 223 322 397 504 709 840 979 1300 1634 1781
27 138 228 271 392 564 692 851 1025 1302 1678 1734
14 117 171 280 372 492 723 823 995 1301 1642 1755
40 87 170 307 404 555 665 854 1024 1170 1632 1711
70 116 164 284 334 522 649 876 1040 1304 1627 1730
58 132 203 289 340 490 715 860 1016 1204 1698 1739
71 108 211 247 351 493 712 846 1028 1199 1667 1766
42 120 194 270 388 513 673 843 994 1190 1688 1743
17 86 241 269 348 500 717 884 1022 1159 1644 1748
31 114 209 263 352 526 707 848 972 1180 1663 1706
12 81 212 302 367 556 702 838 983 1136 1672 1729
10 155 232 310 384 544 693 833 1036 1155 1699 1728
43 128 219 293 363 557 662 824 991 1164 1676 1722
77 83 165 260 333 528 683 873 980 1191 1681 1761
15 152 195 308 362 503 719 814 1005 1168 1639 1769
8 97 183 311 378 517 658 850 990 1173 1662 1752
50 82 196 251 354 498 667 869 1042 1211 1661 1719
57 134 167 318 366 496 694 878 993 1154 1655 1767
59 85 222 264 332 529 671 825 1015 1153 1694 1770
37 107 236 294 360 563 676 882 999 1147 1622 1710
80 91 217 282 324 501 714 887 985 1186 1685 1777
76 157 215 295 401 494 657 845 982 1194 1652 1723
20 154 168 266 374 536 656 868 1023 1177 1700 1753
74 115 202 321 329 543 650 867 987 1144 1623 1741
66 159 220 255 398 545 689 861 977 1192 1643 1754
48 149 213 316 343 523 697 820 1298 1195 1630 1725
13 144 175 314 328 566 680 828 1043 1135 1656 1780
73 135 182 267 380 562 727 811 1012 1202 1686 1714
25 104 184 301 331 506 695 858 1033 1148 1674 1775
35 125 242 319 353 560 698 826 989 1178 1687 1773
41 161 205 312 337 552 718 829 1008 1166 1658 1726
52 100 201 274 403 534 705 849 1017 1179 1633 1760
9 109 225 281 400 499 651 836 1044 1150 1647 1778
49 136 199 283 361 559 681 862 1021 1205 1628 1771
53 113 191 261 325 511 669 812 1026 1139 1626 1733
68 118 173 304 395 521 682 880 984 1299 1659 1740
5 156 218 300 390 527 653 813 1007 1198 1693 1742
64 99 198 244 381 538 708 864 1006 1151 1631 1720
34 98 230 298 350 495 722 839 1000 1185 1624 1763
63 92 240 290 371 535 703 853 1039 1203 1666 1759
79 131 166 272 327 539 701 834 1047 1196 1673 1703
55 139 177 317 346 554 654 832 1030 1158 1675 1757
67 122 214 297 355 491 688 865 997 1165 1653 1749
33 89 174 249 382 550 706 819 1045 1167 1696 1731
61 137 178 259 359 520 699 837 1048 1145 1692 1776
0 140 193 265 364 549 661 830 988 1188 1636 1756
22 160 210 276 402 565 668 872 975 1184 1690 1708
75 147 189 313 345 541 670 879 1001 1208 1682 1718
```

-continued

```
30 93 239 273 344 553 728 881 1031 1182 1664 1724
19 123 188 277 338 519 691 859 1019 1174 1629 1735
44 111 204 292 377 547 687 822 1032 1156 1689 1772
29 124 180 309 385 486 711 818 1003 1201 1641 1732
1 95 192 288 368 508 685 842 978 1181 1651 1736
32 150 238 258 335 561 677 816 992 1303 1657 1751
54 84 186 287 383 516 659 888 973 1143 1668 1768
38 145 162 303 386 505 704 870 1297 1149 1625 1747
24 143 227 279 326 530 684 835 1004 1160 1665 1717
21 96 200 291 393 515 716 815 1038 1197 1669 1746
62 130 235 257 339 487 726 847 976 1157 1684 1762
26 148 224 285 369 518 652 857 1049 1161 1621 1738
16 141 169 243 357 540 663 863 1011 1176 1680 1750
11 103 234 246 370 524 700 874 1018 1193 1650 1716
2 110 206 299 341 510 660 831 1020 1172 1679 1744
51 112 237 254 396 507 664 871 998 1142 1695 1701
72 90 179 323 330 548 679 875 1041 1171 1671 1705
28 133 163 268 391 512 696 890 1037 1187 1683 1758
47 129 229 253 389 502 675 827 981 1163 1649 1713
56 153 226 305 342 497 725 886 1035 1175 1677 1702
3 127 187 256 376 488 674 856 1027 1141 1620 1727
60 119 231 278 394 537 690 885 1009 1169 1638 1712
65 101 221 262 387 558 666 821 974 1134 1691 1764
23 146 216 248 349 514 678 877 1034 1210 1646 1715
46 126 207 245 356 533 724 889 986 1183 1635 1737
45 158 176 286 358 542 672 855 996 1138 1660 1721
39 88 197 250 336 489 648 883 1002 1207 1645 1707
78 94 233 320 379 546 713 810 1013 1152 1697 1704
6 105 172 315 375 551 686 844 1050 1137 1648 1745
69 142 181 306 399 509 721 817 1010 1189 1670 1709
36 102 208 275 373 532 710 852 1014 1140 1654 1779
4 106 185 296 365 531 655 841 1029 1162 1640 1774
7 121 190 252 347 525 720 866 1046 1146 1637 1765
19 152 224 323 428 620 789 947 1067 1256 1702 1788
8 122 191 253 450 573 775 894 1109 1315 1766 1801
28 139 229 272 480 594 778 968 1114 1322 1735 1862
15 118 172 281 468 630 798 927 1072 1217 1756 1860
41 88 171 308 481 569 785 935 1095 1308 1712 1813
71 117 165 285 452 578 731 918 1094 1238 1731 1847
59 133 204 290 427 605 761 965 1088 1234 1740 1785
72 109 212 248 441 582 749 933 1127 1258 1767 1858
43 121 195 271 422 587 762 936 1055 1232 1744 1820
18 87 242 270 420 625 733 956 1118 1224 1749 1827
32 115 210 264 453 568 788 943 1085 1313 1707 1829
13 81 213 303 407 647 802 969 1133 1251 1730 1807
11 156 233 311 425 641 783 919 1056 1231 1729 1850
44 129 220 294 418 600 781 907 1076 1263 1723 1846
78 84 166 261 460 608 734 920 1063 1212 1762 1790
16 153 196 309 467 591 768 971 1089 1264 1770 1844
9 98 184 312 469 638 786 946 1119 1317 1753 1836
51 83 197 252 447 606 779 960 1107 1247 1720 1818
58 135 168 319 410 609 741 941 1120 1314 1768 1783
60 86 223 265 406 629 748 939 1091 1318 1771 1843
38 108 237 295 430 616 750 892 1066 1226 1711 1795
1 92 218 283 484 642 808 926 1080 1243 1778 1805
77 158 216 296 476 592 771 944 1061 1222 1724 1811
21 155 169 267 458 580 767 937 1059 1307 1754 1822
75 116 203 322 423 593 791 899 1092 1221 1742 1859
67 160 221 256 483 644 765 906 1126 1237 1755 1819
49 150 214 317 435 619 757 908 1064 1320 1726 1823
14 145 176 315 445 633 739 966 1057 1225 1781 1838
74 136 183 268 451 614 784 929 1099 1209 1715 1855
26 105 185 302 462 612 764 925 1106 1219 1776 1834
36 126 163 320 419 645 796 949 1108 1215 1774 1804
42 82 206 313 459 599 806 923 1086 1260 1727 1833
53 101 202 275 463 617 732 915 1129 1233 1761 1849
10 110 226 282 478 610 743 897 1125 1052 1779 1825
50 137 200 284 415 572 780 942 1069 1257 1772 1837
54 114 192 262 474 579 740 922 1123 1270 1734 1803
69 119 174 305 444 581 744 954 1115 1051 1741 1831
6 157 219 301 473 639 759 964 1097 1239 1743 1782
65 100 199 245 409 602 776 970 1062 1206 1721 1792
35 99 231 299 465 598 755 901 1122 1319 1764 1845
64 93 241 291 477 622 805 938 1074 1214 1760 1800
80 132 167 273 443 596 754 898 1084 1262 1704 1789
56 140 178 318 471 588 770 902 1090 1259 1758 1814
68 123 215 298 405 570 746 917 1101 1220 1750 1799
34 90 175 250 432 615 758 934 1058 1306 1732 1851
62 138 179 260 485 595 804 913 1098 1254 1777 1802
```

-continued

```
0 141 194 266 440 627 752 963 1102 1249 1757 1824
23 161 211 277 429 637 729 912 1117 1240 1709 1808
76 148 190 314 454 643 793 928 1054 1316 1719 1794
31 94 240 274 439 574 766 904 1113 1230 1725 1791
20 124 189 278 411 611 801 916 1083 1266 1736 1832
45 112 205 293 442 571 790 962 1112 1312 1773 1796
30 125 181 310 464 575 735 910 1128 1321 1733 1786
2 96 193 289 448 590 800 891 1104 1241 1737 1861
33 151 239 259 434 607 772 951 1116 1218 1752 1852
55 85 187 288 431 586 803 924 1082 1223 1769 1821
39 146 162 304 472 636 745 959 1110 1261 1748 1842
25 144 228 280 436 585 809 948 1053 1311 1718 1798
22 97 201 292 426 601 795 893 1071 1310 1747 1817
63 131 236 258 421 577 792 958 1124 1246 1763 1826
27 149 225 286 412 589 753 930 1079 1236 1739 1853
17 142 170 243 461 635 797 961 1068 1244 1751 1830
12 104 235 247 482 583 787 903 1093 1227 1717 1835
3 111 207 300 438 567 782 967 1078 1213 1745 1793
52 113 238 255 457 624 773 953 1130 1242 1701 1816
73 91 180 244 466 597 742 950 1081 1245 1706 1815
29 134 164 269 413 632 763 911 1103 1265 1759 1809
48 130 230 254 470 621 799 955 1087 1252 1714 1848
57 154 227 306 475 646 738 945 1073 1309 1703 1856
4 128 188 257 433 631 747 940 1070 1228 1728 1839
61 120 232 279 456 603 774 931 1111 1216 1713 1806
66 102 222 263 455 634 751 900 1075 1229 1765 1854
24 147 217 249 449 576 756 921 1065 1268 1716 1857
47 127 208 246 408 640 794 957 1060 1255 1738 1797
46 159 177 287 416 626 737 896 1131 1200 1722 1784
40 89 198 251 479 623 736 905 1100 1250 1708 1810
79 95 234 321 446 584 730 932 1121 1248 1705 1840
7 106 173 316 414 628 769 909 1077 1269 1746 1828
70 143 182 307 417 618 777 914 1096 1235 1710 1841
37 103 209 276 437 613 760 952 1105 1253 1780 1812
5 107 186 297 424 604 807 895 1132 1305 1775 1787
20 153 225 244 399 506 711 842 981 1208 1789 1863
6 108 187 298 367 533 657 843 1031 1164 1788 1865
9 123 192 254 349 527 722 868 1048 1148 1802 1866
29 140 230 273 394 566 694 853 1027 1304 1783 1867
16 119 173 282 374 494 725 825 997 1211 1861 1868
42 89 172 309 326 557 667 856 1026 1172 1814 1869
72 118 166 286 336 524 651 878 1042 1136 1848 1870
60 134 205 291 342 492 717 862 1018 1300 1786 1871
73 110 213 249 353 495 714 848 1030 1201 1859 1872
44 122 196 272 390 515 675 845 996 1192 1821 1873
19 88 163 271 350 502 719 886 1024 1161 1828 1874
33 116 211 265 354 528 709 850 972 1182 1830 1875
14 81 214 304 369 558 704 840 985 1138 1808 1876
12 157 234 312 386 546 695 835 1038 1157 1851 1877
45 130 221 295 365 559 664 826 993 1166 1847 1878
79 85 167 262 335 530 685 875 982 1193 1791 1879
17 154 197 310 364 505 721 816 1007 1170 1845 1880
10 99 185 313 380 519 660 852 992 1175 1837 1881
52 84 198 253 356 500 669 871 1044 1303 1819 1882
59 136 169 320 368 498 696 880 995 1156 1784 1883
61 87 224 266 334 531 673 827 1017 1155 1844 1884
39 109 238 296 362 565 678 884 1001 1149 1796 1885
2 93 219 284 324 503 716 889 987 1188 1806 1886
78 159 217 297 403 496 659 847 984 1196 1812 1887
22 156 170 268 376 538 658 870 1025 1179 1823 1888
76 117 204 323 331 545 652 869 989 1146 1860 1889
68 161 222 257 400 547 691 863 979 1194 1820 1890
50 151 215 318 345 525 699 822 974 1197 1824 1891
15 146 177 316 330 488 682 830 1045 1137 1839 1892
75 137 184 269 382 564 649 813 1014 1204 1856 1893
27 106 186 303 333 508 697 860 1035 1150 1835 1894
37 127 164 321 355 562 700 828 991 1180 1805 1895
43 83 207 314 339 554 720 831 1010 1168 1834 1896
54 102 203 276 325 536 707 851 1019 1181 1850 1897
11 111 227 283 402 501 653 838 1046 1152 1826 1898
51 138 201 285 363 561 683 864 1023 1207 1838 1899
55 115 193 263 327 513 671 814 1028 1141 1804 1900
70 120 175 306 397 523 684 882 986 1202 1832 1901
7 158 220 302 392 529 655 815 1009 1299 1782 1902
66 101 200 246 383 540 710 866 1008 1153 1793 1903
36 100 232 300 352 497 724 841 1002 1187 1846 1904
65 94 242 292 373 537 705 855 1041 1205 1801 1905
1 133 168 274 329 541 703 836 1049 1198 1790 1906
57 141 179 319 348 556 656 834 1032 1160 1815 1907
```

-continued

```
69 124 216 299 357 493 690 867 999 1167 1800 1908
35 91 176 251 384 552 708 821 1047 1169 1852 1909
63 139 180 261 361 522 701 839 1050 1147 1803 1910
0 142 195 267 366 551 663 832 990 1190 1825 1911
24 82 212 278 404 487 670 874 977 1186 1809 1912
77 149 191 315 347 543 672 881 1003 1210 1795 1913
32 95 241 275 346 555 650 883 1033 1184 1792 1914
21 125 190 279 340 521 693 861 1021 1176 1833 1915
46 113 206 294 379 549 689 824 1034 1158 1797 1916
31 126 182 311 387 486 713 820 1005 1203 1787 1917
3 97 194 290 370 510 687 844 980 1183 1862 1918
34 152 240 260 337 563 679 818 994 1135 1853 1919
56 86 188 289 385 518 661 890 975 1145 1822 1920
40 147 162 305 388 507 706 872 973 1151 1843 1921
26 145 229 281 328 532 686 837 1006 1162 1799 1922
23 98 202 293 395 517 718 817 1040 1199 1818 1923
64 132 237 259 341 489 728 849 978 1159 1827 1924
28 150 226 287 371 520 654 859 1297 1163 1854 1925
18 143 171 243 359 542 665 865 1013 1178 1831 1926
13 105 236 248 372 526 702 876 1020 1195 1836 1927
4 112 208 301 343 512 662 833 1022 1174 1794 1928
53 114 239 256 398 509 666 873 1000 1144 1817 1929
74 92 181 245 332 550 681 877 1043 1173 1816 1930
30 135 165 270 393 514 698 812 1039 1189 1810 1931
49 131 231 255 391 504 677 829 983 1165 1849 1932
58 155 228 307 344 499 727 888 1037 1177 1857 1933
5 129 189 258 378 490 676 858 1029 1143 1840 1934
62 121 233 280 396 539 692 887 1011 1171 1807 1935
67 103 223 264 389 560 668 823 976 1134 1855 1936
25 148 218 250 351 516 680 879 1036 1302 1858 1937
48 128 209 247 358 535 726 811 988 1185 1798 1938
47 160 178 288 360 544 674 857 998 1140 1785 1939
41 90 199 252 338 491 648 885 1004 1301 1811 1940
80 96 235 322 381 548 715 810 1015 1154 1841 1941
8 107 174 317 377 553 688 846 1298 1139 1829 1942
71 144 183 308 401 511 723 819 1012 1191 1842 1943
38 104 210 277 375 534 712 854 1016 1142 1813 1864
21 154 226 245 430 622 791 949 1069 1258 1362 1863
39 105 211 278 439 615 762 954 1107 1255 1283 1865
7 109 188 299 426 606 809 897 1054 1248 1354 1866
10 124 193 255 452 575 777 896 1111 1317 1327 1867
30 141 231 274 482 596 780 970 1116 1217 1285 1868
17 120 174 283 470 632 800 929 1074 1219 1292 1869
43 90 173 310 483 571 787 937 1097 1246 1350 1870
73 119 167 287 454 580 733 920 1096 1240 1335 1871
61 135 206 292 429 607 763 967 1090 1236 1274 1872
74 111 214 250 443 584 751 935 1129 1260 1334 1873
45 123 197 273 424 589 764 938 1057 1234 1345 1874
20 89 164 272 422 627 735 958 1120 1226 1286 1875
34 117 212 266 455 570 790 945 1087 1315 1336 1876
15 81 215 305 409 569 804 971 1055 1253 1273 1877
13 158 235 313 427 643 785 921 1058 1233 1289 1878
46 131 222 296 420 602 783 909 1078 1265 1271 1879
80 86 168 263 462 610 736 922 1065 1308 1366 1880
18 155 198 311 469 593 770 893 1091 1269 1341 1881
11 100 186 314 471 640 788 948 1121 1319 1374 1882
53 85 199 254 449 608 781 962 1109 1249 1363 1883
60 137 170 321 412 611 743 943 1122 1316 1324 1884
62 88 225 267 408 631 750 941 1093 1320 1373 1885
40 110 239 297 432 618 752 894 1068 1228 1346 1886
3 94 220 285 406 644 730 928 1082 1245 1376 1887
79 160 218 298 478 594 773 946 1063 1224 1329 1888
23 157 171 269 460 582 769 939 1061 1213 1280 1889
77 118 205 244 425 595 793 901 1094 1223 1368 1890
69 82 223 258 485 646 767 908 1128 1239 1365 1891
51 152 216 319 437 621 759 910 1066 1322 1333 1892
16 147 178 317 447 635 741 968 1059 1227 1370 1893
76 138 185 270 453 616 786 931 1101 1212 1360 1894
28 107 187 304 464 614 766 927 1108 1221 1355 1895
38 128 165 322 421 647 798 951 1110 1215 1347 1896
44 84 208 315 461 601 808 925 1088 1262 1328 1897
55 103 204 277 465 619 734 917 1131 1235 1339 1898
12 112 228 284 480 612 745 899 1127 1206 1372 1899
52 139 202 286 417 574 782 944 1071 1259 1281 1900
56 116 194 264 476 581 742 924 1125 1311 1287 1901
71 121 176 307 446 583 746 956 1117 1200 1348 1902
8 159 221 303 475 641 761 966 1099 1241 1332 1903
67 102 201 247 411 604 778 892 1064 1307 1290 1904
37 101 233 301 467 600 757 903 1124 1321 1367 1905
```

-continued

```
66 95 163 293 479 624 807 940 1076 1309 1282 1906
2 134 169 275 445 598 756 900 1086 1306 1325 1907
58 142 180 320 473 590 772 904 1092 1261 1323 1908
70 125 217 300 405 572 748 919 1103 1222 1344 1909
36 92 177 252 434 617 760 936 1060 1266 1351 1910
64 140 181 262 407 597 806 915 1100 1256 1337 1911
0 143 196 268 442 629 754 965 1104 1251 1277 1912
25 83 213 279 431 639 729 914 1119 1242 1349 1913
78 150 192 316 456 645 795 930 1056 1318 1352 1914
33 96 242 276 441 576 768 906 1115 1232 1371 1915
22 126 191 280 413 613 803 918 1085 1052 1358 1916
47 114 207 295 444 573 792 964 1114 1314 1267 1917
32 127 183 312 466 577 737 912 1130 1216 1293 1918
4 98 195 291 450 592 802 891 1106 1243 1288 1919
35 153 241 261 436 609 774 953 1118 1220 1338 1920
57 87 189 290 433 588 805 926 1084 1225 1275 1921
41 148 162 306 474 638 747 961 1112 1263 1361 1922
27 146 230 282 438 587 731 950 1053 1313 1375 1923
24 99 203 294 428 603 797 895 1073 1312 1356 1924
65 133 238 260 423 579 794 960 1126 1264 1296 1925
29 151 227 288 414 591 755 932 1081 1238 1278 1926
19 144 172 243 463 637 799 963 1070 1305 1343 1927
14 106 237 249 484 585 789 905 1095 1229 1359 1928
5 113 209 302 440 567 784 969 1080 1214 1353 1929
54 115 240 257 459 626 775 955 1132 1244 1284 1930
75 93 182 246 468 599 744 952 1083 1247 1330 1931
31 136 166 271 415 634 765 913 1105 1051 1331 1932
50 132 232 256 472 623 801 957 1089 1254 1279 1933
59 156 229 308 477 568 740 947 1075 1268 1295 1934
6 130 190 259 435 633 749 942 1072 1230 1342 1935
63 122 234 281 458 605 776 933 1113 1218 1364 1936
68 104 224 265 457 636 753 902 1077 1231 1294 1937
26 149 219 251 451 578 758 923 1067 1270 1291 1938
49 129 210 248 410 642 796 959 1062 1257 1326 1939
48 161 179 289 418 628 739 898 1133 1209 1357 1940
42 91 200 253 481 625 738 907 1102 1252 1340 1941
1 97 236 323 448 586 732 934 1123 1250 1369 1942
9 108 175 318 416 630 771 911 1079 1310 1276 1943
72 145 184 309 419 620 779 916 1098 1237 1272 1864
```

3. GRS-based irregular LDPC (1944, 487) code (3), R = 0.7505
1944 486

```
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16
0 81 162 243 324 405 567 648 729 810 1053 1134 1215 1296 1434 1539
14 102 209 303 338 426 598 676 783 886 1131 1177 1267 1308 1495 1566
15 103 210 304 339 427 599 677 784 887 1132 1178 1268 1309 1496 1567
16 104 211 305 340 428 600 678 785 888 1133 1179 1269 1310 1497 1568
17 105 212 306 341 429 601 679 786 889 1054 1180 1270 1311 1498 1569
18 106 213 307 342 430 602 680 787 890 1055 1181 1271 1312 1499 1570
19 107 214 308 343 431 603 681 788 811 1056 1182 1272 1313 1454 1571
20 108 215 309 344 432 604 682 789 812 1057 1183 1273 1314 1500 1572
21 109 216 310 345 433 605 683 790 813 1058 1184 1274 1315 1455 1573
22 110 217 311 346 434 606 684 791 814 1059 1185 1275 1316 1501 1574
23 111 218 312 347 435 607 685 792 815 1060 1186 1276 1317 1502 1575
24 112 219 313 348 436 608 686 793 816 1061 1187 1277 1318 1456 1576
25 113 220 314 349 437 609 687 794 817 1062 1188 1278 1319 1503 1577
26 114 221 315 350 438 610 688 795 818 1063 1189 1279 1320 1504 1578
27 115 222 316 351 439 611 689 796 819 1064 1190 1280 1321 1505 1579
28 116 223 317 352 440 612 690 797 820 1065 1191 1281 1322 1506 1580
29 117 224 318 353 441 613 691 798 821 1066 1192 1282 1323 1457 1581
30 118 225 319 354 442 614 692 799 822 1067 1193 1283 1324 1507 1582
31 119 226 320 355 443 615 693 800 823 1068 1194 1284 1325 1508 1583
32 120 227 321 356 444 616 694 801 824 1069 1195 1285 1326 1509 1584
33 121 228 322 357 445 617 695 802 825 1070 1196 1286 1327 1510 1585
```

-continued

```
34 122 229 323 358 446 618 696 803 826 1071 1197 1287 1328 1511 1586
35 123 230 244 359 447 619 697 804 827 1072 1198 1288 1329 1512 1587
36 124 231 245 360 448 620 698 805 828 1073 1199 1289 1330 1513 1588
37 125 232 246 361 449 621 699 806 829 1074 1200 1290 1331 1514 1589
38 126 233 247 362 450 622 700 807 830 1075 1201 1291 1332 1515 1590
39 127 234 248 363 451 623 701 808 831 1076 1202 1292 1333 1516 1591
40 128 235 249 364 452 624 702 809 832 1077 1203 1293 1334 1517 1592
41 129 236 250 365 453 625 703 730 833 1078 1204 1294 1335 1518 1593
42 130 237 251 366 454 626 704 731 834 1079 1205 1295 1336 1519 1594
43 131 238 252 367 455 627 705 732 835 1080 1206 1216 1337 1458 1595
44 132 239 253 368 456 628 706 733 836 1081 1207 1217 1338 1520 1596
45 133 240 254 369 457 629 707 734 837 1082 1208 1218 1339 1521 1597
46 134 241 255 370 458 630 708 735 838 1083 1209 1219 1340 1522 1598
47 135 242 256 371 459 631 709 736 839 1084 1210 1220 1341 1523 1599
48 136 163 257 372 460 632 710 737 840 1085 1211 1221 1342 1524 1600
49 137 164 258 373 461 633 711 738 841 1086 1212 1222 1343 1525 1601
50 138 165 259 374 462 634 712 739 842 1087 1213 1223 1344 1526 1602
51 139 166 260 375 463 635 713 740 843 1088 1214 1224 1345 1527 1603
52 140 167 261 376 464 636 714 741 844 1089 1135 1225 1346 1528 1604
53 141 168 262 377 465 637 715 742 845 1090 1136 1226 1347 1529 1605
54 142 169 263 378 466 638 716 743 846 1091 1137 1227 1348 1530 1606
55 143 170 264 379 467 639 717 744 847 1092 1138 1228 1349 1531 1607
56 144 171 265 380 468 640 718 745 848 1093 1139 1229 1350 1532 1608
57 145 172 266 381 469 641 719 746 849 1094 1140 1230 1351 1533 1609
58 146 173 267 382 470 642 720 747 850 1095 1141 1231 1352 1534 1610
59 147 174 268 383 471 643 721 748 851 1096 1142 1232 1353 1535 1611
60 148 175 269 384 472 644 722 749 852 1097 1143 1233 1354 1536 1612
61 149 176 270 385 473 645 723 750 853 1098 1144 1234 1355 1537 1613
62 150 177 271 386 474 646 724 751 854 1099 1145 1235 1356 1538 1614
63 151 178 272 387 475 647 725 752 855 1100 1146 1236 1357 1435 1615
64 152 179 273 388 476 568 726 753 856 1101 1147 1237 1358 1437 1616
65 153 180 274 389 477 569 727 754 857 1102 1148 1238 1359 1440 1617
66 154 181 275 390 478 570 728 755 858 1103 1149 1239 1360 1441 1618
67 155 182 276 391 479 571 649 756 859 1104 1150 1240 1361 1443 1619
68 156 183 277 392 480 572 650 757 860 1105 1151 1241 1362 1445 1540
69 157 184 278 393 481 573 651 758 861 1106 1152 1242 1363 1447 1541
70 158 185 279 394 482 574 652 759 862 1107 1153 1243 1364 1430 1542
71 159 186 280 395 483 575 653 760 863 1108 1154 1244 1365 1433 1543
72 160 187 281 396 484 576 654 761 864 1109 1155 1245 1366 1436 1544
73 161 188 282 397 485 577 655 762 865 1110 1156 1246 1367 1438 1545
74 82 189 283 398 406 578 656 763 866 1111 1157 1247 1368 1439 1546
75 83 190 284 399 407 579 657 764 867 1112 1158 1248 1459 1442 1547
76 84 191 285 400 408 580 658 765 868 1113 1159 1249 1370 1485 1548
77 85 192 286 401 409 581 659 766 869 1114 1160 1250 1460 1444 1549
78 86 193 287 402 410 582 660 767 870 1115 1161 1251 1461 1446 1550
79 87 194 288 403 411 583 661 768 871 1116 1162 1252 1462 1448 1551
80 88 195 289 404 412 584 662 769 872 1117 1163 1253 1374 1486 1552
1 89 196 290 325 413 585 663 770 873 1118 1164 1254 1463 1487 1553
2 90 197 291 326 414 586 664 771 874 1119 1165 1255 1464 1488 1554
3 91 198 292 327 415 587 665 772 875 1120 1166 1256 1297 1450 1555
4 92 199 293 328 416 588 666 773 876 1121 1167 1257 1298 1451 1556
5 93 200 294 329 417 589 667 774 877 1122 1168 1258 1299 1449 1557
6 94 201 295 330 418 590 668 775 878 1123 1169 1259 1300 1452 1558
7 95 202 296 331 419 591 669 776 879 1124 1170 1260 1301 1489 1559
8 96 203 297 332 420 592 670 777 880 1125 1171 1261 1302 1490 1560
9 97 204 298 333 421 593 671 778 881 1126 1172 1262 1303 1491 1561
10 98 205 299 334 422 594 672 779 882 1127 1173 1263 1304 1492 1562
11 99 206 300 335 423 595 673 780 883 1128 1174 1264 1305 1493 1563
12 100 207 301 336 424 596 674 781 884 1129 1175 1265 1306 1494 1564
13 101 208 302 337 425 597 675 782 885 1130 1176 1266 1307 1453 1565
15 148 220 319 394 424 706 785 837 943 1203 1252 1356 1418 1591 1631
67 113 241 281 331 448 726 807 873 914 1211 1234 1322 1480 1589 1624
55 129 200 286 337 423 712 757 857 961 1201 1230 1461 1388 1584 1695
68 105 208 244 348 437 709 745 843 929 1196 1254 1321 1405 1575 1664
39 117 191 267 385 418 670 758 840 932 1187 1228 1337 1384 1544 1685
14 83 238 266 345 416 714 809 881 952 1156 1220 1313 1468 1565 1641
28 111 206 260 349 449 704 784 845 939 1177 1282 1325 1383 1601 1660
9 81 209 299 364 483 699 798 835 965 1213 1247 1460 1399 1540 1669
7 152 229 307 381 421 690 779 830 915 1152 1227 1319 1482 1549 1696
40 125 216 290 360 414 659 777 821 903 1161 1259 1296 1387 1576 1673
74 160 242 257 330 456 680 730 870 916 1188 1269 1360 1371 1553 1678
12 149 192 305 359 463 716 764 811 967 1165 1275 1333 1381 1558 1636
5 94 180 308 375 465 655 782 847 942 1170 1286 1368 1377 1596 1659
47 159 193 248 351 443 664 775 866 956 1208 1243 1357 1422 1619 1658
54 131 164 315 363 406 691 737 875 937 1151 1283 1302 1395 1618 1652
56 82 219 261 329 482 668 744 822 935 1150 1287 1367 1369 1612 1691
34 104 233 291 357 426 673 746 879 968 1144 1222 1339 1419 1571 1699
77 88 214 279 324 480 711 804 884 922 1183 1239 1370 1428 1579 1682
73 154 212 292 398 472 654 767 842 940 1191 1218 1312 1429 1562 1649
```

-continued 17 151 165 263 371 454 653 763 865 933 1174 1268 1464 1401 1609 1697
71 112 199 318 326 419 727 787 864 895 1141 1217 1362 1467 1577 1700
63 156 217 252 395 479 686 761 858 902 1189 1233 1359 1481 1580 1640
45 146 210 313 340 431 694 753 817 904 1192 1289 1320 1373 1600 1627
10 141 172 311 325 441 677 735 825 962 1212 1221 1364 1424 1587 1653
70 132 179 264 377 447 724 780 888 925 1199 1267 1354 1421 1613 1683
22 101 181 298 328 458 692 760 855 921 1145 1295 1349 1382 1563 1671
32 122 239 316 350 415 695 792 823 945 1175 1215 1340 1426 1551 1684
38 158 202 309 334 455 715 802 826 919 1163 1256 1309 1416 1564 1655
49 97 198 271 400 459 702 808 846 911 1176 1229 1330 1411 1615 1630
6 106 222 278 397 474 728 739 833 893 1147 1264 1366 1402 1590 1644
46 133 196 280 358 411 678 776 859 938 1202 1253 1305 1478 1604 1625
50 110 188 258 402 470 666 736 889 918 1136 1278 1314 1392 1585 1623
65 115 170 301 392 440 679 740 877 950 1197 1263 1341 1465 1583 1656
2 153 215 297 387 469 650 755 890 960 1195 1235 1318 1475 1616 1690
61 96 195 321 378 485 705 772 861 966 1148 1266 1323 1483 1570 1628
31 95 227 295 347 461 719 751 836 897 1182 1288 1361 1403 1588 1621
60 89 237 287 368 473 700 801 850 934 1200 1272 1304 1380 1581 1663
76 128 163 269 404 439 698 750 831 894 1193 1258 1303 1385 1543 1670
52 136 174 314 343 467 651 766 829 898 1155 1255 1297 1423 1550 1672
64 119 211 294 352 405 685 742 862 913 1162 1216 1336 1431 1552 1650
30 86 171 246 379 428 703 754 816 930 1164 1260 1344 1474 1610 1693
58 134 175 256 356 481 696 800 834 909 1142 1250 1327 1375 1573 1689
0 137 190 262 361 436 658 748 827 959 1185 1245 1374 1398 1569 1633
19 157 207 273 399 425 665 729 869 908 1181 1236 1342 1406 1593 1687
72 144 186 310 342 450 667 789 876 924 1205 1285 1345 1389 1567 1679
27 90 236 270 341 435 725 762 878 900 1179 1226 1365 1372 1559 1661
16 120 185 274 335 407 688 797 856 912 1171 1262 1352 1404 1541 1626
41 108 201 289 374 438 684 786 819 958 1153 1281 1298 1407 1586 1686
26 121 177 306 382 460 708 731 815 906 1198 1290 1328 1427 1566 1638
78 92 189 285 365 444 682 796 839 891 1178 1237 1316 1414 1598 1648
29 147 235 255 332 430 674 768 813 947 1210 1294 1329 1471 1608 1654
51 161 183 284 380 427 656 799 885 920 1140 1219 1300 1390 1614 1665
35 142 162 300 383 468 701 741 867 955 1146 1257 1355 1378 1545 1622
21 140 224 276 403 432 681 805 832 944 1157 1280 1459 1391 1582 1662
18 93 197 288 390 422 713 791 812 969 1194 1279 1350 1376 1542 1666
59 127 232 254 336 417 723 788 844 954 1154 1273 1348 1417 1546 1681
23 145 221 282 366 408 649 749 854 926 1158 1232 1301 1466 1561 1698
13 138 166 243 354 457 660 793 860 957 1173 1240 1335 1412 1578 1677
8 100 231 323 367 478 697 783 871 899 1190 1223 1353 1410 1557 1647
79 107 203 296 338 434 657 778 828 963 1169 1270 1346 1473 1607 1676
48 109 234 251 393 453 661 769 868 949 1139 1238 1308 1397 1556 1692
69 87 176 320 327 462 676 738 872 946 1168 1241 1315 1415 1572 1668
25 130 240 265 388 409 693 759 887 907 1184 1261 1317 1408 1548 1680
44 126 226 250 386 466 672 795 824 951 1160 1248 1463 1477 1560 1646
53 150 223 302 339 471 722 734 883 941 1172 1274 1338 1484 1606 1674
80 124 184 253 373 429 671 743 853 936 1138 1224 1334 1379 1554 1620
57 116 228 275 391 452 687 770 882 927 1166 1292 1358 1470 1539 1635
62 98 218 259 384 451 663 747 818 896 1134 1225 1332 1400 1595 1688
20 143 213 245 346 445 675 752 874 917 1207 1276 1324 1396 1568 1643
43 123 204 322 353 484 721 790 886 953 1180 1251 1306 1420 1603 1632
42 155 173 283 355 412 669 733 852 892 1135 1265 1351 1394 1592 1657
36 85 194 247 333 475 648 732 880 901 1204 1246 1331 1386 1617 1642
75 91 230 317 376 442 710 806 810 928 1149 1244 1363 1476 1602 1694
3 102 169 312 372 410 683 765 841 905 1214 1277 1462 1413 1574 1645
66 139 178 303 396 413 718 773 814 910 1186 1231 1299 1393 1605 1667
33 99 205 272 370 433 707 756 849 948 1137 1249 1310 1425 1547 1651
1 103 182 293 362 420 652 803 838 971 1159 1242 1347 1469 1611 1637
4 118 187 249 344 446 717 771 863 970 1143 1284 1307 1472 1597 1634
24 135 225 268 389 476 689 774 848 964 1209 1291 1311 1479 1594 1675
11 114 168 277 369 464 720 794 820 923 1206 1293 1326 1409 1555 1639
37 84 167 304 401 477 662 781 851 931 1167 1271 1343 1432 1599 1629
16 149 221 320 395 425 502 786 838 944 977 1253 1357 1419 1632 1779
38 85 168 305 402 478 553 782 852 932 1022 1272 1344 1477 1630 1709
68 114 242 282 332 449 520 808 874 915 1038 1235 1323 1481 1625 1728
56 130 201 287 338 424 488 758 858 962 1014 1231 1462 1389 1696 1673
69 106 209 245 349 438 491 746 844 930 1026 1255 1322 1406 1665 1764
40 118 192 268 386 419 511 759 841 933 992 1229 1338 1385 1686 1741
15 84 239 267 346 417 498 730 882 953 1020 1221 1314 1469 1642 1746
29 112 207 261 350 450 524 785 846 940 972 1283 1326 1384 1661 1704
10 81 210 300 365 484 554 799 836 966 981 1248 1461 1400 1670 1727
8 153 230 308 382 422 542 780 831 916 1034 1228 1320 1483 1697 1726
41 126 217 291 361 415 555 778 822 904 989 1260 1296 1388 1674 1720
75 161 163 258 331 457 526 731 871 917 978 1270 1361 1468 1679 1759
13 150 193 306 360 464 501 765 812 968 1003 1276 1334 1382 1637 1767
6 95 181 309 376 466 515 783 848 943 988 1287 1459 1377 1660 1750
48 160 194 249 352 444 496 776 867 957 1040 1244 1358 1423 1659 1717
55 132 165 316 364 407 494 738 876 938 991 1284 1303 1396 1653 1765
57 83 220 262 330 483 527 745 823 936 1013 1288 1368 1466 1692 1768

-continued

```
35 105 234 292 358 427 561 747 880 969 997 1223 1340 1420 1700 1708
78 89 215 280 324 481 499 805 885 923 983 1240 1460 1474 1683 1775
74 155 213 293 399 473 492 768 843 941 980 1219 1313 1369 1650 1721
18 152 166 264 372 455 534 764 866 934 1021 1269 1297 1402 1698 1751
72 113 200 319 327 420 541 788 865 896 985 1218 1363 1371 1621 1739
64 157 218 253 396 480 543 762 859 903 975 1234 1360 1482 1641 1752
46 147 211 314 341 432 521 754 818 905 1050 1290 1321 1375 1628 1723
11 142 173 312 326 442 564 736 826 963 1041 1222 1365 1425 1654 1778
71 133 180 265 378 448 560 781 889 926 1010 1268 1355 1422 1684 1712
23 102 182 299 329 459 504 761 856 922 1031 1216 1350 1383 1672 1773
33 123 240 317 351 416 558 793 824 946 987 1215 1341 1427 1685 1771
39 159 203 310 335 456 550 803 827 920 1006 1257 1310 1417 1656 1724
50 98 199 272 401 460 532 809 847 912 1015 1230 1331 1412 1631 1758
7 107 223 279 398 475 497 740 834 894 1042 1265 1367 1403 1645 1776
47 134 197 281 359 412 557 777 860 939 1019 1254 1306 1479 1626 1769
51 111 189 259 403 471 509 737 890 919 1024 1279 1315 1393 1624 1731
66 116 171 302 393 441 519 741 878 951 982 1264 1342 1429 1657 1738
3 154 216 298 388 470 525 756 811 961 1005 1236 1319 1476 1691 1740
62 97 196 322 379 406 536 773 862 967 1004 1267 1324 1484 1629 1718
32 96 228 296 348 462 493 752 837 898 998 1289 1362 1404 1622 1761
61 90 238 288 369 474 533 802 851 935 1037 1273 1305 1381 1664 1757
77 129 164 270 325 440 537 751 832 895 1045 1259 1304 1386 1671 1781
53 137 175 315 344 468 552 767 830 899 1028 1256 1298 1424 1673 1755
65 120 212 295 353 405 489 743 863 914 995 1217 1337 1475 1651 1747
31 87 172 247 380 429 548 755 817 931 1043 1261 1345 1431 1694 1729
59 135 176 257 357 482 518 801 835 910 1046 1251 1328 1471 1690 1774
0 138 191 263 362 437 547 749 828 960 986 1246 1463 1399 1634 1754
20 158 208 274 400 426 563 729 870 909 973 1237 1343 1407 1688 1706
73 145 187 311 343 451 539 790 877 925 999 1286 1346 1390 1680 1716
28 91 237 271 342 436 551 763 879 901 1029 1227 1366 1470 1662 1722
17 121 186 275 336 408 517 798 857 913 1017 1263 1353 1405 1627 1733
42 109 202 290 375 439 545 787 820 959 1030 1282 1299 1408 1687 1770
27 122 178 307 383 461 486 732 816 907 1001 1291 1329 1465 1639 1730
79 93 190 286 366 445 506 797 840 891 976 1238 1317 1415 1649 1734
30 148 236 256 333 431 559 769 814 948 990 1295 1330 1472 1655 1749
52 82 184 285 381 428 514 800 886 921 1051 1220 1301 1391 1666 1766
36 143 162 301 384 469 503 742 868 956 1049 1258 1356 1379 1623 1745
22 141 225 277 404 433 528 806 833 945 1002 1281 1370 1392 1663 1715
19 94 198 289 391 423 513 792 813 970 1036 1280 1351 1473 1667 1744
60 128 233 255 337 418 565 789 845 955 974 1274 1349 1418 1682 1760
24 146 222 283 367 409 516 750 855 927 1047 1233 1302 1467 1699 1736
14 139 167 243 355 458 538 794 861 958 1009 1241 1336 1413 1678 1748
9 101 232 244 368 479 522 784 872 900 1016 1224 1354 1411 1648 1714
80 108 204 297 339 435 508 779 829 964 1018 1271 1347 1428 1677 1742
49 110 235 252 394 454 505 770 869 950 996 1239 1309 1398 1693 1701
70 88 177 321 328 463 546 739 873 947 1039 1242 1316 1416 1669 1703
26 131 241 266 389 410 510 760 888 908 1035 1262 1318 1409 1681 1756
45 127 227 251 387 467 500 796 825 952 979 1249 1464 1478 1647 1711
54 151 224 303 340 472 495 735 884 942 1033 1275 1339 1378 1675 1780
1 125 185 254 374 430 566 744 854 937 1025 1225 1335 1380 1620 1725
58 117 229 276 392 453 535 771 883 928 1007 1293 1359 1373 1636 1710
63 99 219 260 385 452 556 748 819 897 1052 1226 1333 1401 1689 1762
21 144 214 246 347 446 512 753 875 918 1032 1277 1325 1397 1644 1713
44 124 205 323 354 485 531 791 887 954 984 1252 1307 1421 1633 1735
43 156 174 284 356 413 540 734 853 893 994 1266 1352 1395 1658 1719
37 86 195 248 334 476 487 733 881 902 1000 1247 1332 1387 1643 1705
76 92 231 318 377 443 544 807 810 929 1011 1245 1364 1432 1695 1702
4 103 170 313 373 411 549 766 842 906 1048 1278 1374 1414 1646 1743
67 140 179 304 397 414 507 774 815 911 1008 1232 1300 1394 1668 1707
34 100 206 273 371 434 530 757 850 949 1012 1250 1311 1426 1652 1777
2 104 183 294 363 421 529 804 839 892 1027 1243 1348 1372 1638 1772
5 119 188 250 345 447 523 772 864 971 1044 1285 1308 1376 1635 1763
25 136 226 269 390 477 562 775 849 965 1023 1292 1312 1480 1676 1732
12 115 169 278 370 465 490 795 821 924 993 1294 1327 1410 1640 1753
17 150 222 321 396 426 503 618 839 945 978 1065 1358 1420 1780 1786
13 116 170 279 371 466 491 628 822 925 994 1070 1328 1411 1754 1788
39 86 169 306 403 479 554 647 853 933 1023 1093 1345 1478 1710 1811
69 115 163 283 333 450 521 576 875 916 1039 1092 1324 1482 1729 1845
57 131 202 288 339 425 489 603 859 963 1015 1086 1374 1390 1738 1783
70 107 210 246 350 439 492 580 845 931 1027 1125 1323 1407 1765 1856
41 119 193 269 387 420 512 585 842 934 993 1133 1339 1386 1742 1818
16 85 240 268 347 418 499 623 883 954 1021 1116 1315 1372 1747 1825
30 113 208 262 351 451 525 646 847 941 972 1083 1327 1385 1705 1827
11 81 211 301 366 485 555 645 837 967 982 1131 1462 1401 1728 1805
9 154 231 309 383 423 543 639 832 917 1035 1054 1321 1484 1727 1848
42 127 218 292 362 416 556 598 823 905 990 1074 1296 1389 1721 1844
76 82 164 259 332 458 527 606 872 918 979 1061 1362 1469 1760 1788
14 151 194 307 361 465 502 589 813 969 1004 1087 1335 1383 1768 1842
7 96 182 310 377 467 516 636 849 944 989 1117 1370 1377 1751 1834
```

-continued

```
49 161 195 250 353 445 497 604 868 958 1041 1105 1359 1424 1718 1816
56 133 166 317 365 408 495 607 877 939 992 1118 1304 1397 1766 1861
58 84 221 263 331 484 528 627 824 937 1014 1089 1459 1467 1769 1841
36 106 235 293 359 428 562 614 881 970 998 1064 1341 1421 1709 1793
79 90 216 281 324 482 500 640 886 924 984 1078 1461 1431 1776 1803
75 156 214 294 400 474 493 590 844 942 981 1059 1314 1466 1722 1809
19 153 167 265 373 456 535 578 867 935 1022 1057 1298 1403 1752 1820
73 114 201 320 328 421 542 591 866 897 986 1090 1364 1468 1857
65 158 219 254 397 481 544 642 860 904 976 1124 1361 1483 1753 1817
47 148 212 315 342 433 522 617 819 906 1051 1062 1322 1471 1724 1821
12 143 174 313 327 443 565 631 827 964 1042 1055 1366 1426 1779 1836
72 134 181 266 379 449 561 612 890 927 1011 1097 1356 1423 1713 1853
24 103 183 300 330 460 505 610 857 923 1032 1104 1351 1384 1774 1832
34 124 241 318 352 417 559 643 825 947 988 1106 1342 1465 1772 1802
40 160 204 311 336 457 551 597 828 921 1007 1084 1311 1418 1725 1831
51 99 200 273 402 461 533 615 848 913 1016 1127 1332 1413 1759 1847
8 108 224 280 399 476 498 608 835 895 1043 1123 1368 1404 1777 1823
48 135 198 282 360 413 558 570 861 940 1020 1067 1307 1480 1770 1835
52 112 190 260 404 472 510 577 811 920 1025 1121 1316 1394 1732 1801
67 117 172 303 394 442 520 579 879 952 983 1113 1343 1369 1739 1829
4 155 217 299 389 471 526 637 812 962 1006 1095 1320 1432 1741 1782
63 98 197 323 380 407 537 600 863 968 1005 1060 1325 1378 1719 1790
33 97 229 297 349 463 494 596 838 899 999 1120 1363 1405 1762 1843
62 91 239 289 370 475 534 620 852 936 1038 1072 1306 1382 1758 1798
78 130 165 271 326 441 538 594 833 896 1046 1082 1305 1387 1702 1787
54 138 176 316 345 469 553 586 831 900 1029 1088 1299 1425 1756 1812
66 121 213 296 354 405 490 568 864 915 996 1099 1338 1476 1748 1797
32 88 173 248 381 430 549 613 818 932 1044 1056 1346 1475 1730 1849
60 136 177 258 358 483 519 593 836 911 1047 1096 1329 1472 1775 1800
0 139 192 264 363 438 548 625 829 961 987 1100 1464 1400 1755 1822
21 159 209 275 401 427 564 635 871 910 974 1115 1344 1408 1707 1806
74 146 188 312 344 452 540 641 878 926 1000 1132 1347 1391 1717 1792
29 92 238 272 343 437 552 572 880 902 1030 1111 1367 1373 1723 1789
18 122 187 276 337 409 518 609 858 914 1018 1081 1354 1406 1734 1830
43 110 203 291 376 440 546 569 821 960 1031 1110 1300 1409 1771 1794
28 123 179 308 384 462 486 573 817 908 1002 1126 1330 1429 1731 1784
80 94 191 287 367 446 507 588 841 891 977 1102 1318 1416 1735 1859
31 149 237 257 334 432 560 605 815 949 991 1114 1331 1376 1750 1850
53 83 185 286 382 429 515 584 887 922 1052 1080 1302 1392 1767 1819
37 144 162 302 385 470 504 634 869 957 1050 1108 1357 1380 1746 1840
23 142 226 278 325 434 529 583 834 946 1003 1053 1460 1393 1716 1796
20 95 199 290 392 424 514 599 814 971 1037 1069 1352 1428 1745 1815
61 129 234 256 338 419 566 575 846 956 975 1122 1350 1419 1761 1824
25 147 223 284 368 410 517 587 856 928 1048 1077 1303 1371 1737 1851
15 140 168 243 356 459 539 633 862 959 1010 1066 1337 1414 1749 1828
10 102 233 245 369 480 523 581 873 901 1017 1091 1355 1412 1715 1833
1 109 205 298 340 436 509 567 830 965 1019 1076 1348 1474 1743 1791
50 111 236 253 395 455 506 622 870 951 997 1128 1310 1399 1701 1814
71 89 178 322 329 464 547 595 874 948 1040 1079 1317 1417 1704 1813
27 132 242 267 390 411 511 630 889 909 1036 1101 1319 1410 1757 1807
46 128 228 252 388 468 501 619 826 953 980 1085 1297 1479 1712 1846
55 152 225 304 341 473 496 644 885 943 1034 1071 1340 1379 1781 1854
2 126 186 255 375 431 487 629 855 938 1026 1068 1336 1381 1726 1837
59 118 230 277 393 454 536 601 884 929 1008 1109 1360 1375 1711 1804
64 100 220 261 386 453 557 632 820 898 973 1073 1334 1402 1763 1852
22 145 215 247 348 447 513 574 876 919 1033 1063 1326 1398 1714 1855
45 125 206 244 355 406 532 638 888 955 985 1058 1308 1422 1736 1795
44 157 175 285 357 414 541 624 854 894 995 1129 1353 1396 1720 1862
38 87 196 249 335 477 488 621 882 903 1001 1098 1333 1388 1706 1808
77 93 232 319 378 444 545 582 810 930 1012 1119 1365 1477 1703 1838
5 104 171 314 374 412 550 626 843 907 1049 1075 1463 1415 1744 1826
68 141 180 305 398 415 508 616 816 912 1009 1094 1301 1395 1708 1839
35 101 207 274 372 435 531 611 851 950 1013 1103 1312 1427 1778 1810
3 105 184 295 364 422 530 602 840 893 1028 1130 1349 1470 1773 1785
6 120 189 251 346 448 524 571 865 892 1045 1107 1309 1473 1764 1799
26 137 227 270 391 478 563 592 850 966 1024 1112 1313 1481 1733 1860
18 151 223 322 397 427 504 619 709 946 979 1066 1206 1421 1787 1863
27 138 228 271 392 479 564 593 692 967 1025 1113 1212 1482 1861 1865
14 117 171 280 372 467 492 629 723 926 995 1071 1209 1412 1859 1866
40 87 170 307 404 480 555 568 665 934 1024 1094 1170 1479 1812 1867
70 116 164 284 334 451 522 577 649 917 1040 1093 1214 1483 1846 1868
58 132 203 289 340 426 490 604 715 964 1016 1087 1204 1391 1784 1869
71 108 211 247 351 440 493 581 712 932 1028 1126 1199 1408 1857 1870
42 120 194 270 388 421 513 586 673 935 994 1054 1190 1387 1819 1871
17 86 241 269 348 419 500 624 717 955 1022 1117 1159 1470 1826 1872
31 114 209 263 352 452 526 647 707 942 972 1084 1180 1386 1828 1873
12 81 212 302 367 406 556 646 702 968 983 1132 1136 1402 1806 1874
10 155 232 310 384 424 544 640 693 918 1036 1055 1155 1378 1849 1875
43 128 219 293 363 417 557 599 662 906 991 1075 1164 1390 1845 1876
```

-continued

```
77 83 165 260 333 459 528 607 683 919 980 1062 1191 1372 1789 1877
15 152 195 308 362 466 503 590 719 970 1005 1088 1168 1384 1843 1878
8 97 183 311 378 468 517 637 658 945 990 1118 1173 1377 1835 1879
50 82 196 251 354 446 498 605 667 959 1042 1106 1211 1425 1817 1880
57 134 167 318 366 409 496 608 694 940 993 1119 1154 1398 1862 1881
59 85 222 264 332 485 529 628 671 938 1015 1090 1153 1371 1842 1882
37 107 236 294 360 429 563 615 676 971 999 1065 1147 1422 1794 1883
80 91 217 282 324 483 501 641 714 925 985 1079 1186 1475 1804 1884
76 157 215 295 401 475 494 591 657 943 982 1060 1194 1467 1810 1885
20 154 168 266 374 457 536 579 656 936 1023 1058 1177 1404 1821 1886
74 115 202 321 329 422 543 592 650 898 987 1091 1144 1469 1858 1887
66 159 220 255 398 482 545 643 689 905 977 1125 1192 1484 1818 1888
48 149 213 316 343 434 523 618 697 907 1052 1063 1195 1472 1822 1889
13 144 175 314 328 444 566 632 680 965 1043 1056 1135 1427 1837 1890
73 135 182 267 380 450 562 613 727 928 1012 1098 1202 1424 1854 1891
25 104 184 301 331 461 506 611 695 924 1033 1105 1148 1385 1833 1892
35 125 242 319 353 418 560 644 698 948 989 1107 1178 1429 1803 1893
41 161 205 312 337 458 552 598 718 922 1008 1085 1166 1419 1832 1894
52 100 201 274 403 462 534 616 705 914 1017 1128 1179 1414 1848 1895
9 109 225 281 400 477 499 609 651 896 1044 1124 1150 1405 1824 1896
49 136 199 283 361 414 559 571 681 941 1021 1068 1205 1481 1836 1897
53 113 191 261 325 473 511 578 669 921 1026 1122 1139 1395 1802 1898
68 118 173 304 395 443 521 580 682 953 984 1114 1200 1466 1830 1899
5 156 218 300 390 472 527 638 653 963 1007 1096 1198 1477 1782 1900
64 99 198 244 381 408 538 601 708 969 1006 1061 1151 1379 1791 1901
34 98 230 298 350 464 495 597 722 900 1000 1121 1185 1406 1844 1902
63 92 240 290 371 476 535 621 703 937 1039 1073 1203 1383 1799 1903
79 131 166 272 327 442 539 595 701 897 1047 1083 1196 1388 1788 1904
55 139 177 317 346 470 554 587 654 901 1030 1089 1158 1426 1813 1905
67 122 214 297 355 405 491 569 688 916 997 1100 1165 1432 1798 1906
33 89 174 249 382 431 550 614 706 933 1045 1057 1167 1476 1850 1907
61 137 178 259 359 484 520 594 699 912 1048 1097 1145 1376 1801 1908
0 140 193 265 364 439 549 626 661 962 988 1101 1188 1401 1823 1909
22 160 210 276 402 428 565 636 668 911 975 1116 1184 1409 1807 1910
75 147 189 313 345 453 541 642 670 927 1001 1133 1208 1392 1793 1911
30 93 239 273 344 438 553 573 728 903 1031 1112 1182 1375 1790 1912
19 123 188 277 338 410 519 610 691 915 1019 1082 1174 1407 1831 1913
44 111 204 292 377 441 547 570 687 961 1032 1111 1156 1410 1795 1914
29 124 180 309 385 463 486 574 711 909 1003 1127 1201 1369 1785 1915
1 95 192 288 368 447 508 589 685 891 978 1103 1181 1417 1860 1916
32 150 238 258 335 433 561 606 677 950 992 1115 1213 1473 1851 1917
54 84 186 287 383 430 516 585 659 923 973 1081 1143 1393 1820 1918
38 145 162 303 386 471 505 635 704 958 1051 1109 1149 1381 1841 1919
24 143 227 279 326 435 530 584 684 947 1004 1053 1160 1394 1797 1920
21 96 200 291 393 425 515 600 716 892 1038 1070 1197 1474 1816 1921
62 130 235 257 339 420 487 576 726 957 976 1123 1157 1420 1825 1922
26 148 224 285 369 411 518 588 652 929 1049 1078 1161 1468 1852 1923
16 141 169 243 357 460 540 634 663 960 1011 1067 1176 1415 1829 1924
11 103 234 246 370 481 524 582 700 902 1018 1092 1193 1413 1834 1925
2 110 206 299 341 437 510 567 660 966 1020 1077 1172 1431 1792 1926
51 112 237 254 396 456 507 623 664 952 998 1129 1142 1400 1815 1927
72 90 179 323 330 465 548 596 679 949 1041 1080 1171 1418 1814 1928
28 133 163 268 391 412 512 631 696 910 1037 1102 1187 1411 1808 1929
47 129 229 253 389 469 502 620 675 954 981 1086 1163 1480 1847 1930
56 153 226 305 342 474 497 645 725 944 1035 1072 1175 1380 1855 1931
3 127 187 256 376 432 488 630 674 939 1027 1069 1141 1382 1838 1932
60 119 231 278 394 455 537 602 690 930 1009 1110 1169 1471 1805 1933
65 101 221 262 387 454 558 633 666 899 974 1074 1134 1403 1853 1934
23 146 216 248 349 448 514 575 678 920 1034 1064 1210 1399 1856 1935
46 126 207 245 356 407 533 639 724 956 986 1059 1183 1423 1796 1936
45 158 176 286 358 415 542 625 672 895 996 1130 1138 1397 1783 1937
39 88 197 250 336 478 489 622 648 904 1002 1099 1207 1389 1809 1938
78 94 233 320 379 445 546 583 713 931 1013 1120 1152 1478 1839 1939
6 105 172 315 375 413 551 627 686 908 1050 1076 1137 1416 1827 1940
69 142 181 306 399 416 509 617 721 913 1010 1095 1189 1396 1840 1941
36 102 208 275 373 436 532 612 710 951 1014 1104 1140 1465 1811 1942
4 106 185 296 365 423 531 603 655 894 1029 1131 1162 1373 1786 1943
7 121 190 252 347 449 525 572 720 893 1046 1108 1146 1428 1800 1864
19 152 224 323 398 428 505 620 710 789 980 1067 1207 1256 1531 1863
8 122 191 253 348 450 526 573 721 775 1047 1109 1147 1288 1499 1865
28 139 229 272 393 480 565 594 693 778 1026 1114 1213 1295 1434 1866
15 118 172 281 373 468 493 630 724 798 996 1072 1210 1217 1535 1867
41 88 171 308 325 481 556 569 666 785 1025 1095 1171 1275 1509 1868
71 117 165 285 335 452 523 578 650 731 1041 1094 1135 1238 1443 1869
59 133 204 290 341 427 491 605 716 761 1017 1088 1205 1234 1532 1870
72 109 212 248 352 441 494 582 713 749 1029 1127 1200 1258 1487 1871
43 121 195 271 389 422 514 587 674 762 995 1055 1191 1232 1441 1872
18 87 242 270 349 420 501 625 718 733 1023 1118 1160 1224 1515 1873
32 115 210 264 353 453 527 568 708 788 972 1085 1181 1286 1447 1874
```

-continued

```
13 81 213 303 368 407 557 647 703 802 984 1133 1137 1251 1493 1875
11 156 233 311 385 425 545 641 694 783 1037 1056 1156 1231 1442 1876
44 129 220 294 364 418 558 600 663 781 992 1076 1165 1263 1537 1877
78 84 166 261 334 460 529 608 684 734 981 1063 1192 1273 1534 1878
16 153 196 309 363 467 504 591 720 768 1006 1089 1169 1279 1454 1879
9 98 184 312 379 469 518 638 659 786 991 1119 1174 1290 1435 1880
51 83 197 252 355 447 499 606 668 779 1043 1107 1212 1247 1529 1881
58 135 168 319 367 410 497 609 695 741 994 1120 1155 1287 1524 1882
60 86 223 265 333 406 530 629 672 748 1016 1091 1154 1291 1516 1883
38 108 237 295 361 430 564 616 677 750 1000 1066 1148 1226 1490 1884
1 92 218 283 324 484 502 642 715 808 986 1080 1187 1243 1457 1885
77 158 216 296 402 476 495 592 658 771 983 1061 1195 1222 1440 1886
21 155 169 267 375 458 537 580 657 767 1024 1059 1178 1272 1451 1887
75 116 203 322 330 423 544 593 651 791 988 1092 1145 1221 1453 1888
67 160 221 256 399 483 546 644 690 765 978 1126 1193 1237 1517 1889
49 150 214 317 344 435 524 619 698 757 973 1064 1196 1293 1498 1890
14 145 176 315 329 445 487 633 681 739 1044 1057 1136 1225 1501 1891
74 136 183 268 381 451 563 614 728 784 1013 1099 1203 1271 1536 1892
26 105 185 302 332 462 507 612 696 764 1034 1106 1149 1219 1450 1893
36 126 163 320 354 419 561 645 699 796 990 1108 1179 1215 1488 1894
42 82 206 313 338 459 553 599 719 806 1009 1086 1167 1260 1485 1895
53 101 202 275 404 463 535 617 706 732 1018 1129 1180 1233 1512 1896
10 110 226 282 401 478 500 610 652 743 1045 1125 1151 1268 1458 1897
50 137 200 284 362 415 560 572 682 780 1022 1069 1206 1257 1504 1898
54 114 192 262 326 474 512 579 670 740 1027 1123 1140 1282 1438 1899
69 119 174 305 396 444 522 581 683 744 985 1115 1201 1267 1518 1900
6 157 219 301 391 473 528 639 654 759 1008 1097 1199 1239 1520 1901
65 100 199 245 382 409 539 602 709 776 1007 1062 1152 1270 1437 1902
35 99 231 299 351 465 496 598 723 755 1001 1122 1186 1292 1527 1903
64 93 241 291 372 477 536 622 704 805 1040 1074 1204 1276 1444 1904
80 132 167 273 328 443 540 596 702 754 1048 1084 1197 1262 1505 1905
56 140 178 318 347 471 555 588 655 770 1031 1090 1159 1259 1496 1906
68 123 215 298 356 405 492 570 689 746 998 1101 1166 1220 1506 1907
34 90 175 250 383 432 551 615 707 758 1046 1058 1168 1264 1448 1908
62 138 179 260 360 485 521 595 700 804 1049 1098 1146 1254 1530 1909
0 141 194 266 365 440 550 627 662 752 989 1102 1189 1249 1445 1910
23 161 211 277 403 429 566 637 669 729 976 1117 1185 1240 1525 1911
76 148 190 314 346 454 542 643 671 793 1002 1054 1209 1289 1523 1912
31 94 240 274 345 439 554 574 649 766 1032 1113 1183 1230 1486 1913
20 124 189 278 339 411 520 611 692 801 1020 1083 1175 1266 1511 1914
45 112 205 293 378 442 548 571 688 790 1033 1112 1157 1285 1528 1915
30 125 181 310 386 464 486 575 712 735 1004 1128 1202 1294 1521 1916
2 96 193 289 369 448 509 590 686 800 979 1104 1182 1241 1489 1917
33 151 239 259 336 434 562 607 678 772 993 1116 1214 1218 1495 1918
55 85 187 288 384 431 517 586 660 803 974 1082 1144 1223 1497 1919
39 146 162 304 387 472 506 636 705 745 1052 1110 1150 1261 1439 1920
25 144 228 280 327 436 531 585 685 809 1005 1053 1161 1284 1514 1921
22 97 201 292 394 426 516 601 717 795 1039 1071 1198 1283 1510 1922
63 131 236 258 340 421 488 577 727 792 977 1124 1158 1277 1533 1923
27 149 225 286 370 412 519 589 653 753 1050 1079 1162 1236 1508 1924
17 142 170 243 358 461 541 635 664 797 1012 1068 1177 1244 1502 1925
12 104 235 247 371 482 525 583 701 787 1019 1093 1194 1227 1449 1926
3 111 207 300 342 438 511 567 661 782 1021 1078 1173 1274 1526 1927
52 113 238 255 397 457 508 624 665 773 999 1130 1143 1242 1507 1928
73 91 180 244 331 466 549 597 680 742 1042 1081 1172 1245 1538 1929
29 134 164 269 392 413 513 632 697 763 1038 1103 1188 1265 1436 1930
48 130 230 254 390 470 503 621 676 799 982 1087 1164 1252 1446 1931
57 154 227 306 343 475 498 646 726 738 1036 1073 1176 1278 1491 1932
4 128 188 257 377 433 489 631 675 747 1028 1070 1142 1228 1522 1933
61 120 232 279 395 456 538 603 691 774 1010 1111 1170 1216 1452 1934
66 102 222 263 388 455 559 634 667 751 975 1075 1134 1229 1492 1935
24 147 217 249 350 449 515 576 679 756 1035 1065 1211 1280 1503 1936
47 127 208 246 357 408 534 640 725 794 987 1060 1184 1255 1519 1937
46 159 177 287 359 416 543 626 673 737 997 1131 1139 1269 1455 1938
40 89 198 251 337 479 490 623 648 736 1003 1100 1208 1250 1433 1939
79 95 234 321 380 446 547 584 714 730 1014 1121 1153 1248 1500 1940
7 106 173 316 376 414 552 628 687 769 1051 1077 1138 1281 1513 1941
70 143 182 307 400 417 510 618 722 777 1011 1096 1190 1235 1494 1942
37 103 209 276 374 437 533 613 711 760 1015 1105 1141 1253 1456 1943
5 107 186 297 366 424 532 604 656 807 1030 1132 1163 1246 1430 1864
```

4. GRS-based irregular LDPC (1944, 1621) code (4), R = 0.8338
1944 324

```
22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22
```

-continued

```
22 22 22 22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22
 0  81 162 243 324 405 486 567 648 729 810 891 972 1053 1134 1215 1296 1377 1458 1539 1597 1863
14 102 209 303 338 426 494 598 676 783 886 935 1011 1131 1177 1267 1308 1447 1490 1566 1687 1865
15 103 210 304 339 427 495 599 677 784 887 936 1012 1132 1178 1268 1309 1448 1491 1567 1688 1866
16 104 211 305 340 428 496 600 678 785 888 937 1013 1133 1179 1269 1310 1449 1492 1568 1689 1867
17 105 212 306 341 429 497 601 679 786 889 938 1014 1054 1180 1270 1311 1450 1493 1569 1690 1868
18 106 213 307 342 430 498 602 680 787 890 939 1015 1055 1181 1271 1312 1451 1494 1570 1691 1869
19 107 214 308 343 431 499 603 681 788 811 940 1016 1056 1182 1272 1313 1621 1495 1571 1692 1870
20 108 215 309 344 432 500 604 682 789 812 941 1017 1057 1183 1273 1314 1453 1496 1572 1693 1871
21 109 216 310 345 433 501 605 683 790 813 942 1018 1058 1184 1274 1315 1622 1497 1573 1694 1872
22 110 217 311 346 434 502 606 684 791 814 943 1019 1059 1185 1275 1316 1455 1498 1574 1695 1873
23 111 218 312 347 435 503 607 685 792 815 944 1020 1060 1186 1276 1317 1623 1499 1575 1696 1874
24 112 219 313 348 436 504 608 686 793 816 945 1021 1061 1187 1277 1318 1624 1500 1576 1697 1875
25 113 220 314 349 437 505 609 687 794 817 946 1022 1062 1188 1278 1319 1378 1501 1577 1698 1876
26 114 221 315 350 438 506 610 688 795 818 947 1023 1063 1189 1279 1320 1379 1502 1578 1699 1877
27 115 222 316 351 439 507 611 689 796 819 948 1024 1064 1190 1280 1321 1380 1503 1579 1700 1878
28 116 223 317 352 440 508 612 690 797 820 949 1025 1065 1191 1281 1322 1381 1504 1580 1598 1879
29 117 224 318 353 441 509 613 691 798 821 950 1026 1066 1192 1282 1323 1382 1505 1581 1600 1880
30 118 225 319 354 442 510 614 692 799 822 951 1027 1067 1193 1283 1324 1383 1506 1627 1603 1881
31 119 226 320 355 443 511 615 693 800 823 952 1028 1068 1194 1284 1325 1384 1507 1583 1604 1882
32 120 227 321 356 444 512 616 694 801 824 953 1029 1069 1195 1285 1326 1385 1508 1584 1606 1883
33 121 228 322 357 445 513 617 695 802 825 954 1030 1070 1196 1286 1327 1386 1509 1585 1591 1884
34 122 229 323 358 446 514 618 696 803 826 955 1031 1071 1197 1287 1328 1387 1510 1586 1593 1885
35 123 230 244 359 447 515 619 697 804 827 956 1032 1072 1198 1288 1329 1388 1511 1587 1596 1886
36 124 231 245 360 448 516 620 698 805 828 957 1033 1073 1199 1289 1330 1389 1512 1588 1599 1887
37 125 232 246 361 449 517 621 699 806 829 958 1034 1074 1200 1290 1331 1390 1513 1589 1601 1888
38 126 233 247 362 450 518 622 700 807 830 959 1035 1075 1201 1291 1332 1391 1514 1590 1602 1889
39 127 234 248 363 451 519 623 701 808 831 960 1036 1076 1202 1292 1333 1392 1515 1452 1605 1890
40 128 235 249 364 452 520 624 702 809 832 961 1037 1077 1203 1293 1334 1393 1516 1628 1647 1891
41 129 236 250 365 453 521 625 703 730 833 962 1038 1078 1204 1294 1335 1394 1517 1454 1607 1892
42 130 237 251 366 454 522 626 704 731 834 963 1039 1079 1205 1295 1336 1395 1518 1629 1608 1893
43 131 238 252 367 455 523 627 705 732 835 964 1040 1080 1206 1216 1337 1396 1519 1630 1609 1894
44 132 239 253 368 456 524 628 706 733 836 965 1041 1081 1207 1217 1338 1397 1520 1456 1648 1895
45 133 240 254 369 457 525 629 707 734 837 966 1042 1082 1218 1218 1339 1398 1521 1631 1649 1896
46 134 241 255 370 458 526 630 708 735 838 967 1043 1083 1209 1219 1340 1399 1522 1632 1650 1897
47 135 242 256 371 459 527 631 709 736 839 968 1044 1084 1210 1220 1341 1400 1523 1457 1611 1898
48 136 163 257 372 460 528 632 710 737 840 969 1045 1085 1211 1221 1342 1401 1524 1633 1612 1899
49 137 164 258 373 461 529 633 711 738 841 970 1046 1086 1212 1222 1343 1402 1525 1537 1610 1900
50 138 165 259 374 462 530 634 712 739 842 971 1047 1087 1213 1223 1344 1403 1526 1538 1613 1901
51 139 166 260 375 463 531 635 713 740 843 892 1048 1088 1214 1224 1345 1404 1527 1634 1651 1902
52 140 167 261 376 464 532 636 714 741 844 893 1049 1089 1135 1225 1346 1405 1528 1635 1652 1903
53 141 168 262 377 465 533 637 715 742 845 894 1050 1090 1136 1226 1347 1406 1529 1582 1653 1904
54 142 169 263 378 466 534 638 716 743 846 895 1051 1091 1137 1227 1348 1407 1530 1636 1654 1905
55 143 170 264 379 467 535 639 717 744 847 896 1052 1092 1138 1228 1349 1408 1531 1592 1655 1906
56 144 171 265 380 468 536 640 718 745 848 897 973 1093 1139 1229 1350 1409 1532 1637 1656 1907
57 145 172 266 381 469 537 641 719 746 849 898 974 1094 1140 1230 1351 1410 1533 1594 1614 1908
58 146 173 267 382 470 538 642 720 747 850 899 975 1095 1141 1231 1352 1411 1534 1638 1657 1909
59 147 174 268 383 471 539 643 721 748 851 900 976 1096 1142 1232 1353 1412 1535 1639 1658 1910
60 148 175 269 384 472 540 644 722 749 852 901 977 1097 1143 1233 1354 1413 1536 1595 1659 1911
61 149 176 270 385 473 541 645 723 750 853 902 978 1098 1144 1234 1355 1414 1625 1640 1660 1912
62 150 177 271 386 474 542 646 724 751 854 903 979 1099 1145 1235 1356 1415 1626 1641 1661 1913
63 151 178 272 387 475 543 647 725 752 855 904 980 1100 1146 1236 1357 1416 1459 1642 1615 1914
64 152 179 273 388 476 544 568 726 753 856 905 981 1101 1147 1237 1358 1417 1460 1643 1662 1915
65 153 180 274 389 477 545 569 727 754 857 906 982 1102 1148 1238 1359 1418 1461 1644 1616 1916
66 154 181 275 390 478 546 570 728 755 858 907 983 1103 1149 1239 1360 1419 1462 1645 1663 1917
67 155 182 276 391 479 547 571 649 756 859 908 984 1104 1150 1240 1361 1420 1463 1646 1664 1918
68 156 183 277 392 480 548 572 650 757 860 909 985 1105 1151 1241 1362 1421 1464 1540 1617 1919
69 157 184 278 393 481 549 573 651 758 861 910 986 1106 1152 1242 1363 1422 1465 1541 1665 1920
70 158 185 279 394 482 550 574 652 759 862 911 987 1107 1153 1243 1364 1423 1466 1542 1666 1921
71 159 186 280 395 483 551 575 653 760 863 912 988 1108 1154 1244 1365 1424 1467 1543 1667 1922
72 160 187 281 396 484 552 576 654 761 864 913 989 1109 1155 1245 1366 1425 1468 1544 1618 1923
73 161 188 282 397 485 553 577 655 762 865 914 990 1110 1156 1246 1367 1426 1469 1545 1619 1924
74  82 189 283 398 406 554 578 656 763 866 915 991 1111 1157 1247 1368 1427 1470 1546 1668 1925
75  83 190 284 399 407 555 579 657 764 867 916 992 1112 1158 1248 1369 1428 1471 1547 1669 1926
76  84 191 285 400 408 556 580 658 765 868 917 993 1113 1159 1249 1370 1429 1472 1548 1670 1927
77  85 192 286 401 409 557 581 659 766 869 918 994 1114 1160 1250 1371 1430 1473 1549 1671 1928
78  86 193 287 402 410 558 582 660 767 870 919 995 1115 1161 1251 1372 1431 1474 1550 1672 1929
79  87 194 288 403 411 559 583 661 768 871 920 996 1116 1162 1252 1373 1432 1475 1551 1673 1930
80  88 195 289 404 412 560 584 662 769 872 921 997 1117 1163 1253 1374 1433 1476 1552 1674 1931
 1  89 196 290 325 413 561 585 663 770 873 922 998 1118 1164 1254 1375 1434 1477 1553 1675 1932
 2  90 197 291 326 414 562 586 664 771 874 923 999 1119 1165 1255 1376 1435 1478 1554 1676 1933
 3  91 198 292 327 415 563 587 665 772 875 924 1000 1120 1166 1256 1297 1436 1479 1555 1677 1934
 4  92 199 293 328 416 564 588 666 773 876 925 1001 1121 1167 1257 1298 1437 1480 1556 1678 1935
 5  93 200 294 329 417 565 589 667 774 877 926 1002 1122 1168 1258 1299 1438 1481 1557 1679 1936
 6  94 201 295 330 418 566 590 668 775 878 927 1003 1123 1169 1259 1300 1439 1482 1558 1680 1937
```

-continued 7 95 202 296 331 419 487 591 669 776 879 928 1004 1124 1170 1260 1301 1440 1483 1559 1620 1938
8 96 203 297 332 420 488 592 670 777 880 929 1005 1125 1171 1261 1302 1441 1484 1560 1681 1939
9 97 204 298 333 421 489 593 671 778 881 930 1006 1126 1172 1262 1303 1442 1485 1561 1682 1940
10 98 205 299 334 422 490 594 672 779 882 931 1007 1127 1173 1263 1304 1443 1486 1562 1683 1941
11 99 206 300 335 423 491 595 673 780 883 932 1008 1128 1174 1264 1305 1444 1487 1563 1684 1942
12 100 207 301 336 424 492 596 674 781 884 933 1009 1129 1175 1265 1306 1445 1488 1564 1685 1943
13 101 208 302 337 425 493 597 675 782 885 934 1010 1130 1176 1266 1307 1446 1489 1565 1686 1864
15 148 220 319 394 424 501 616 706 785 837 943 976 1063 1203 1252 1356 1418 1527 1452 1602 1778
67 113 241 281 331 448 519 574 726 807 873 914 1037 1090 1211 1234 1322 1453 1459 1589 1604 1727
55 129 200 286 337 423 487 601 712 757 857 961 1013 1084 1201 1230 1372 1388 1528 1584 1695 1736
68 105 208 244 348 437 490 578 709 745 843 929 1025 1123 1196 1254 1321 1405 1473 1575 1667 1763
39 117 191 267 385 418 510 583 670 758 840 932 991 1131 1187 1228 1337 1384 1626 1544 1685 1740
14 83 238 266 345 416 497 621 714 809 881 952 1019 1114 1156 1220 1313 1434 1510 1565 1612 1745
28 111 206 260 349 449 523 644 704 784 845 939 972 1081 1177 1282 1325 1383 1461 1537 1664 1703
9 81 209 299 364 483 553 643 699 798 835 965 980 1129 1213 1247 1371 1399 1483 1540 1670 1726
7 152 229 307 381 421 541 637 690 779 830 915 1033 1132 1152 1227 1319 1455 1467 1549 1696 1725
40 125 216 290 360 414 554 596 659 777 821 903 988 1072 1161 1259 1296 1387 1533 1576 1674 1719
74 160 242 257 330 456 525 604 680 730 870 916 977 1059 1188 1269 1360 1433 1530 1553 1679 1758
12 149 192 305 359 463 500 587 716 764 811 967 1002 1085 1165 1275 1333 1381 1491 1558 1609 1766
5 94 180 308 375 465 514 634 655 782 847 942 987 1115 1170 1286 1368 1377 1535 1456 1663 1749
47 159 193 248 351 443 495 602 664 775 866 956 1039 1103 1208 1243 1357 1422 1525 1646 1616 1716
54 131 164 315 363 406 493 605 691 737 875 937 990 1116 1151 1283 1302 1395 1520 1645 1658 1764
56 82 219 261 329 482 526 625 668 744 822 935 1012 1087 1150 1287 1367 1430 1511 1595 1691 1767
34 104 233 291 357 426 560 612 673 746 879 968 996 1062 1144 1232 1339 1419 1480 1571 1699 1707
77 88 214 279 324 480 498 638 711 804 884 922 982 1076 1183 1239 1370 1444 1501 1579 1682 1774
73 154 212 292 398 472 491 588 654 767 842 940 979 1057 1191 1218 1312 1429 1625 1562 1656 1720
17 151 165 263 371 454 533 576 653 763 865 933 1020 1055 1174 1268 1376 1401 1476 1594 1697 1750
71 112 199 318 326 419 540 589 727 787 864 895 984 1088 1141 1217 1362 1432 1485 1577 1700 1738
63 156 217 252 395 479 542 640 686 761 858 902 974 1122 1189 1233 1359 1622 1512 1580 1611 1751
45 146 210 313 340 431 520 615 694 753 817 904 1049 1060 1192 1289 1320 1438 1489 1633 1593 1722
10 141 172 311 325 441 563 629 677 735 825 962 1040 1133 1212 1221 1364 1424 1494 1587 1659 1777
70 132 179 264 377 447 559 610 724 780 888 925 1009 1095 1199 1267 1354 1421 1532 1640 1683 1711
22 101 181 298 328 458 503 608 692 760 855 921 1030 1102 1145 1259 1349 1382 1475 1563 1672 1772
32 122 239 316 350 415 557 641 695 792 823 945 986 1104 1175 1215 1340 1426 1474 1551 1684 1770
38 158 202 309 334 455 549 595 715 802 826 919 1005 1082 1163 1256 1309 1416 1468 1564 1661 1723
49 97 198 271 400 459 531 613 702 808 846 911 1014 1125 1176 1229 1330 1411 1507 1642 1601 1757
6 106 222 278 397 474 496 606 728 739 833 893 1041 1121 1147 1244 1366 1402 1515 1590 1651 1775
46 133 196 280 358 411 556 568 678 776 859 938 1018 1065 1202 1253 1305 1451 1498 1635 1606 1768
50 110 188 258 402 470 508 575 666 736 889 918 1023 1119 1136 1278 1314 1392 1465 1585 1603 1730
65 115 170 301 392 440 518 577 679 740 877 950 981 1111 1197 1263 1341 1428 1513 1583 1615 1737
2 153 215 297 387 469 524 635 650 755 890 960 1004 1093 1195 1235 1318 1447 1516 1643 1690 1739
61 96 195 321 378 485 535 598 705 772 861 966 1003 1058 1148 1266 1323 1623 1536 1570 1596 1717
31 95 227 295 347 461 492 594 719 751 836 897 997 1118 1182 1288 1361 1403 1523 1588 1598 1760
60 89 237 287 368 473 532 618 700 801 850 934 1036 1070 1200 1272 1304 1380 1469 1581 1666 1756
76 128 163 269 404 439 536 592 698 750 831 894 1044 1080 1193 1228 1303 1385 1499 1543 1671 1780
52 136 174 314 343 467 551 584 651 766 829 898 1027 1086 1155 1255 1297 1423 1487 1550 1673 1754
64 119 211 294 352 405 488 646 685 742 862 913 994 1097 1162 1216 1336 1446 1500 1552 1614 1746
30 86 171 246 379 428 547 611 703 754 816 930 1042 1054 1164 1260 1344 1445 1471 1638 1693 1728
58 134 175 256 356 481 517 591 696 800 834 909 1045 1094 1142 1250 1327 1439 1526 1573 1689 1753
0 137 190 262 361 436 546 623 658 748 827 959 985 1098 1185 1245 1374 1398 1460 1569 1647 1753
19 157 207 273 399 425 562 633 665 729 869 908 1052 1113 1181 1236 1342 1406 1521 1454 1687 1705
72 144 186 310 342 450 538 639 667 789 876 924 998 1130 1205 1285 1345 1389 1519 1567 1680 1715
27 90 236 270 341 435 550 570 725 762 878 900 1028 1109 1179 1226 1365 1436 1472 1559 1617 1721
16 120 185 274 335 407 516 607 688 797 856 912 1016 1079 1171 1262 1352 1404 1506 1541 1591 1732
41 108 201 289 374 438 544 647 684 786 819 958 1029 1108 1153 1281 1298 1407 1524 1586 1686 1769
26 121 177 306 382 460 486 571 708 731 815 906 1000 1124 1198 1290 1328 1427 1517 1566 1649 1729
78 92 189 285 365 444 505 586 682 796 839 891 975 1100 1178 1237 1316 1414 1479 1632 1655 1733
29 147 235 255 332 430 558 603 674 768 813 947 989 1112 1210 1294 1329 1440 1486 1637 1660 1748
51 161 183 284 380 427 513 582 656 799 885 920 1050 1078 1140 1219 1300 1390 1488 1641 1618 1765
35 142 162 300 383 468 502 632 701 741 867 955 1048 1106 1146 1257 1355 1378 1466 1545 1600 1744
21 140 224 276 403 432 527 581 681 805 832 944 1001 1053 1157 1280 1369 1391 1509 1627 1665 1714
18 93 197 288 390 422 512 597 713 791 812 969 1035 1067 1194 1279 1350 1442 1505 1542 1619 1743
59 127 232 254 336 417 564 573 723 788 844 954 973 1120 1154 1273 1348 1417 1529 1546 1681 1759
23 145 221 282 366 408 515 585 649 749 854 926 1046 1075 1158 1232 1301 1431 1503 1561 1698 1735
13 138 166 243 354 457 537 631 660 793 860 957 1008 1064 1173 1240 1335 1412 1495 1578 1678 1747
8 100 231 323 367 478 521 579 697 783 871 899 1015 1089 1190 1223 1353 1410 1477 1557 1654 1713
79 107 203 296 338 434 507 567 657 778 828 963 1017 1074 1169 1270 1346 1443 1522 1592 1677 1741
48 109 234 251 393 453 504 620 661 769 868 949 995 1126 1139 1238 1308 1397 1502 1556 1692 1701
69 87 176 320 327 462 545 593 676 738 872 946 1038 1077 1168 1241 1315 1415 1534 1572 1669 1702
25 130 240 265 388 409 509 628 693 759 887 907 1034 1099 1184 1261 1317 1408 1464 1548 1620 1755
44 126 226 250 386 466 499 617 672 795 824 951 978 1083 1160 1248 1375 1450 1470 1560 1653 1710
53 150 223 302 339 471 494 642 722 734 883 941 1032 1069 1172 1274 1338 1624 1481 1636 1675 1779
80 124 184 253 373 429 565 627 671 743 853 936 1024 1066 1138 1224 1334 1379 1518 1554 1597 1724
57 116 228 275 391 452 534 599 687 770 882 927 1006 1107 1158 1437 1478 1539 1608 1709
62 98 218 259 384 451 555 630 663 747 818 896 1051 1071 1134 1225 1332 1400 1482 1630 1688 1761
20 143 213 245 346 445 511 572 675 752 874 917 1031 1061 1207 1276 1324 1396 1497 1568 1613 1712
43 123 204 322 353 484 530 636 721 790 886 953 983 1056 1180 1251 1306 1420 1514 1634 1605 1734
42 155 173 283 355 412 539 622 669 733 852 892 993 1127 1135 1265 1351 1394 1493 1628 1662 1718
36 85 194 247 333 475 566 619 648 732 880 901 999 1096 1204 1246 1331 1386 1463 1644 1610 1704

-continued

```
75 91 230 317 376 442 543 580 710 806 810 928 1010 1117 1149 1244 1363 1448 1492 1538 1694 1781
3 102 169 312 372 410 548 624 683 765 841 905 1047 1073 1214 1277 1373 1413 1508 1574 1652 1742
66 139 178 303 396 413 506 614 718 773 814 910 1007 1092 1186 1231 1299 1393 1484 1582 1668 1706
33 99 205 272 370 433 529 609 707 756 849 948 1011 1101 1137 1249 1310 1425 1496 1547 1657 1776
1 103 182 293 362 420 528 600 652 803 838 971 1026 1128 1159 1242 1347 1435 1462 1639 1648 1771
4 118 187 249 344 446 522 569 717 771 863 970 1043 1105 1143 1284 1307 1441 1490 1631 1607 1762
24 135 225 268 389 476 561 590 689 774 848 964 1022 1110 1209 1291 1311 1621 1458 1629 1676 1731
11 114 168 277 369 464 489 626 720 794 820 923 992 1068 1206 1293 1326 1409 1531 1555 1650 1752
37 84 167 304 401 477 552 645 662 781 851 931 1021 1091 1167 1271 1343 1449 1504 1457 1599 1708
16 149 221 320 395 425 502 617 707 786 838 944 977 1064 1204 1253 1357 1419 1528 1628 1779 1785
38 85 168 305 402 478 553 646 663 782 852 932 1022 1092 1168 1272 1344 1450 1505 1633 1709 1810
68 114 242 282 332 449 520 575 727 808 874 915 1038 1091 1152 1235 1323 1622 1460 1590 1728 1844
56 130 201 287 338 424 488 602 713 758 858 962 1014 1085 1202 1231 1373 1389 1529 1585 1737 1862
69 106 209 245 349 438 491 579 710 746 844 930 1026 1124 1197 1255 1322 1406 1474 1576 1764 1855
40 118 192 268 386 419 511 584 671 759 841 933 992 1132 1188 1229 1338 1385 1459 1545 1741 1817
15 84 239 267 346 417 498 622 715 730 882 953 1020 1115 1157 1221 1314 1435 1511 1566 1746 1824
29 112 207 261 350 450 524 645 705 785 846 940 972 1082 1178 1283 1326 1384 1462 1538 1704 1826
10 81 210 300 365 484 554 644 700 799 836 966 981 1130 1214 1248 1372 1400 1484 1541 1727 1804
8 153 230 308 382 422 542 638 691 780 831 916 1034 1133 1153 1228 1320 1623 1468 1550 1726 1847
41 126 217 291 361 415 555 597 660 778 822 904 989 1073 1162 1260 1296 1388 1534 1577 1720 1843
75 161 163 258 331 457 526 605 681 731 871 917 978 1060 1189 1270 1361 1434 1531 1554 1759 1787
13 150 193 306 360 464 501 588 717 765 812 968 1003 1086 1166 1276 1334 1382 1492 1559 1767 1841
6 95 181 309 376 466 515 635 656 783 848 943 988 1116 1171 1287 1369 1377 1536 1631 1750 1833
48 160 194 249 352 444 496 603 665 776 867 957 1040 1104 1209 1244 1358 1423 1526 1540 1717 1815
55 132 165 316 364 407 494 606 692 738 876 938 991 1117 1152 1284 1303 1396 1521 1646 1765 1860
57 83 220 262 330 483 527 626 669 745 823 936 1013 1088 1151 1288 1368 1431 1512 1640 1768 1840
35 105 234 292 358 427 561 613 674 747 880 969 997 1063 1145 1223 1340 1420 1481 1572 1708 1792
78 89 215 280 324 481 499 639 712 805 885 923 983 1077 1184 1240 1371 1445 1502 1580 1775 1802
74 155 213 293 399 473 492 589 655 768 843 941 980 1058 1192 1219 1313 1430 1626 1563 1721 1808
18 152 166 264 372 455 534 577 654 764 866 934 1021 1056 1175 1269 1297 1402 1477 1638 1751 1819
72 113 200 319 327 420 541 590 728 788 865 896 985 1089 1142 1218 1363 1433 1486 1578 1739 1856
64 157 218 253 396 480 543 641 687 762 859 903 975 1123 1190 1234 1360 1455 1513 1581 1752 1816
46 147 211 314 341 432 521 616 695 754 818 905 1050 1061 1193 1290 1321 1439 1490 1537 1723 1820
11 142 173 312 326 442 564 630 678 736 826 963 1041 1054 1213 1222 1365 1425 1495 1588 1778 1835
71 133 180 265 378 448 560 611 725 781 889 926 1010 1096 1200 1268 1355 1422 1533 1641 1712 1852
23 102 182 299 329 459 504 609 693 761 856 922 1031 1103 1146 1216 1350 1383 1476 1564 1773 1831
33 123 240 317 351 416 558 642 696 793 824 946 987 1105 1176 1215 1341 1427 1475 1552 1771 1801
39 159 203 310 335 456 550 596 716 803 827 920 1006 1083 1164 1257 1310 1417 1469 1565 1724 1830
50 98 199 272 401 460 532 614 703 809 847 912 1015 1126 1177 1230 1331 1412 1508 1643 1758 1846
7 107 223 279 398 475 497 607 649 740 834 894 1042 1122 1148 1265 1367 1403 1516 1452 1776 1822
47 134 197 281 359 412 557 569 679 777 860 939 1019 1066 1203 1234 1306 1621 1499 1582 1769 1834
51 111 189 259 403 471 509 576 667 737 890 919 1024 1120 1137 1279 1315 1393 1466 1586 1731 1800
66 116 171 302 393 441 519 578 680 741 878 951 982 1112 1198 1264 1342 1429 1514 1584 1738 1828
3 154 216 298 388 470 525 636 651 756 811 961 1005 1094 1196 1236 1319 1448 1517 1644 1740 1782
62 97 196 322 379 406 536 599 706 773 862 967 1004 1059 1149 1267 1324 1624 1625 1571 1718 1789
32 96 228 296 348 462 493 595 720 752 837 898 998 1119 1183 1289 1362 1404 1524 1589 1761 1842
61 90 238 288 369 474 533 619 701 802 851 935 1037 1071 1201 1273 1305 1381 1470 1627 1757 1797
77 129 164 270 325 440 537 593 699 751 832 895 1045 1081 1194 1259 1304 1386 1500 1544 1781 1786
53 137 175 315 344 468 552 585 652 767 830 899 1028 1087 1156 1256 1298 1424 1488 1551 1755 1811
65 120 212 295 353 405 489 647 686 743 863 914 995 1098 1163 1217 1337 1447 1501 1553 1747 1796
31 87 172 247 380 429 548 612 704 755 817 931 1043 1055 1165 1261 1345 1446 1472 1639 1729 1848
59 135 176 257 357 482 518 592 697 801 835 910 1046 1095 1143 1251 1328 1440 1527 1574 1774 1799
0 138 191 263 362 437 547 624 659 749 828 960 986 1099 1186 1246 1375 1399 1461 1570 1754 1821
20 158 208 274 400 426 563 634 666 729 870 909 973 1114 1182 1237 1343 1407 1522 1629 1706 1805
73 145 187 311 343 451 539 640 668 790 877 925 999 1131 1206 1286 1346 1390 1520 1568 1716 1791
28 91 237 271 342 436 551 571 726 763 879 901 1029 1110 1180 1227 1366 1437 1473 1560 1722 1788
17 121 186 275 336 408 517 608 689 798 857 913 1017 1080 1172 1263 1353 1405 1507 1542 1733 1829
42 109 202 290 375 439 545 568 685 787 820 959 1030 1109 1154 1282 1299 1408 1525 1587 1770 1793
27 122 178 307 383 461 486 572 709 732 816 907 1001 1125 1199 1291 1329 1428 1518 1567 1730 1783
79 93 190 286 366 445 506 587 683 797 840 891 976 1101 1179 1238 1317 1415 1480 1457 1734 1858
30 148 236 256 333 431 559 604 675 769 814 948 990 1113 1211 1295 1330 1441 1487 1594 1749 1849
52 82 184 285 381 428 514 583 657 800 886 921 1051 1079 1141 1201 1301 1391 1489 1642 1766 1818
36 143 162 301 384 469 503 633 702 742 868 956 1049 1107 1147 1258 1356 1379 1467 1546 1745 1839
22 141 225 277 404 433 528 582 682 806 833 945 1002 1053 1158 1281 1370 1392 1510 1583 1715 1795
19 94 198 289 391 423 513 598 714 792 813 970 1036 1068 1195 1280 1351 1443 1506 1543 1744 1814
60 128 233 255 337 418 565 574 724 789 845 955 974 1121 1155 1242 1349 1418 1530 1547 1736 1823
24 146 222 283 367 409 516 586 650 750 855 927 1047 1076 1159 1233 1302 1432 1504 1562 1736 1850
14 139 167 243 355 458 538 632 661 794 861 958 1009 1065 1174 1241 1336 1413 1496 1579 1748 1827
9 101 232 244 368 479 522 580 698 784 872 900 1016 1090 1191 1224 1354 1411 1478 1558 1714 1832
80 108 204 297 339 435 508 567 658 779 829 964 1018 1075 1170 1271 1347 1444 1523 1578 1742 1790
49 110 235 252 394 454 505 621 662 770 869 950 996 1127 1140 1239 1309 1398 1503 1557 1701 1813
70 88 177 321 328 463 546 594 677 739 873 947 1039 1078 1169 1242 1316 1416 1535 1573 1703 1812
26 131 241 266 389 410 510 629 694 760 888 908 1035 1100 1185 1262 1318 1409 1465 1549 1756 1806
45 127 227 251 387 467 500 618 673 796 825 952 979 1084 1161 1376 1451 1471 1561 1711 1845
54 151 224 303 340 472 495 643 723 735 884 942 1033 1070 1173 1275 1339 1378 1482 1592 1780 1853
1 125 185 254 374 430 566 628 672 744 854 937 1025 1067 1139 1225 1335 1380 1519 1555 1725 1836
58 117 229 276 392 453 535 600 688 771 883 928 1007 1108 1167 1293 1359 1438 1479 1539 1710 1803
63 99 219 260 385 452 556 631 664 748 819 897 1052 1072 1134 1226 1333 1401 1483 1456 1762 1851
21 144 214 246 347 446 512 573 676 753 875 918 1032 1062 1208 1277 1325 1397 1498 1569 1713 1854
```

-continued

```
44 124 205 323 354 485 531 637 722 791 887 954 984 1057 1181 1252 1307 1421 1515 1635 1735 1794
43 156 174 284 356 413 540 623 670 734 853 893 994 1128 1136 1266 1352 1395 1494 1454 1719 1861
37 86 195 248 334 476 487 620 648 733 881 902 1000 1097 1205 1247 1312 1387 1464 1645 1705 1807
76 92 231 318 377 443 544 581 711 807 810 929 1011 1118 1150 1245 1364 1449 1493 1634 1702 1837
4 103 170 313 373 411 549 625 684 766 842 906 1048 1074 1135 1278 1374 1414 1509 1575 1743 1825
67 140 179 304 397 414 507 615 719 774 815 911 1008 1093 1187 1232 1300 1394 1485 1636 1707 1838
34 100 206 273 371 434 530 610 708 757 850 949 1012 1102 1138 1250 1311 1426 1497 1548 1777 1809
2 104 183 294 363 421 529 601 653 804 839 892 1027 1129 1160 1243 1348 1436 1463 1595 1772 1784
5 119 188 250 345 447 523 570 718 772 864 971 1044 1106 1144 1285 1308 1442 1491 1632 1763 1798
25 136 226 269 390 477 562 591 690 775 849 965 1023 1111 1210 1292 1312 1453 1458 1630 1732 1859
12 115 169 278 370 465 490 627 721 795 821 924 993 1069 1207 1294 1327 1410 1532 1556 1753 1857
17 150 222 321 396 426 503 618 708 787 839 945 978 1065 1205 1254 1358 1420 1529 1454 1786 1863
13 116 170 279 371 466 491 628 722 796 822 925 994 1070 1208 1295 1328 1411 1533 1557 1858 1865
39 86 169 306 403 479 554 647 664 783 853 933 1023 1093 1169 1273 1345 1451 1506 1537 1811 1866
69 115 163 283 333 450 521 576 728 809 875 916 1039 1092 1213 1236 1324 1455 1461 1452 1845 1867
57 131 202 288 339 425 489 603 714 759 859 963 1015 1086 1203 1274 1390 1530 1586 1783 1868
70 107 210 246 350 439 492 580 711 747 845 931 1027 1125 1198 1256 1323 1407 1475 1577 1856 1869
41 119 193 269 387 420 512 585 672 760 842 934 993 1133 1189 1230 1339 1386 1460 1546 1818 1870
16 85 240 268 347 418 499 623 716 731 883 954 1021 1116 1158 1222 1315 1436 1512 1567 1825 1871
30 113 208 262 351 451 525 646 706 786 847 941 972 1083 1179 1284 1327 1385 1463 1634 1827 1872
11 81 211 301 366 485 555 645 701 800 837 967 982 1131 1135 1249 1373 1401 1485 1542 1805 1873
9 154 231 309 383 423 543 639 692 781 832 917 1035 1054 1154 1229 1321 1624 1469 1551 1848 1874
42 127 218 292 362 416 556 598 661 779 823 905 990 1074 1163 1261 1296 1389 1535 1578 1844 1875
76 82 164 259 332 458 527 606 682 732 872 918 979 1061 1190 1271 1362 1435 1532 1555 1788 1876
14 151 194 307 361 465 502 589 718 766 813 969 1004 1087 1167 1277 1335 1383 1493 1560 1842 1877
7 96 182 310 377 467 516 636 657 784 849 944 989 1117 1172 1288 1370 1377 1625 1632 1834 1878
49 161 195 250 353 445 497 604 666 777 868 958 1041 1105 1210 1245 1359 1424 1527 1541 1816 1879
56 133 166 317 365 408 495 607 693 739 877 939 992 1118 1153 1285 1304 1397 1522 1540 1861 1880
58 84 221 263 331 484 528 627 670 746 824 937 1014 1089 1152 1289 1369 1432 1513 1641 1841 1881
36 106 235 293 359 428 562 614 675 748 881 970 998 1064 1146 1224 1341 1421 1482 1573 1793 1882
79 90 216 281 324 482 500 640 713 806 886 924 984 1078 1185 1241 1372 1446 1503 1581 1803 1883
75 156 214 294 400 474 493 590 656 769 844 942 981 1059 1193 1220 1314 1431 1459 1564 1809 1884
19 153 167 265 373 456 535 578 655 765 867 935 1022 1057 1176 1270 1298 1403 1478 1639 1820 1885
73 114 201 320 328 421 542 591 649 789 866 897 986 1090 1143 1219 1364 1434 1487 1579 1857 1886
65 158 219 254 397 481 544 642 688 763 860 904 976 1124 1191 1235 1361 1623 1514 1627 1817 1887
47 148 212 315 342 433 522 617 696 755 819 906 1051 1062 1194 1291 1322 1440 1491 1538 1821 1888
12 143 174 313 327 443 565 631 679 737 827 964 1042 1055 1214 1223 1366 1426 1496 1589 1836 1889
72 134 181 266 379 449 561 612 726 782 890 927 1011 1097 1201 1269 1356 1423 1534 1642 1853 1890
24 103 183 300 330 460 505 610 694 762 857 923 1032 1104 1147 1217 1351 1384 1477 1565 1832 1891
34 124 241 318 352 417 559 643 697 794 825 947 988 1106 1177 1215 1342 1428 1476 1553 1802 1892
40 160 204 311 336 457 551 597 717 804 828 921 1007 1084 1155 1258 1311 1418 1470 1566 1831 1893
51 99 200 273 402 461 533 615 704 730 848 913 1016 1127 1178 1231 1332 1413 1509 1644 1847 1894
8 108 224 280 399 476 498 608 650 741 835 895 1043 1123 1149 1266 1368 1404 1517 1628 1823 1895
48 135 198 282 360 413 558 570 680 778 861 940 1020 1067 1204 1255 1307 1453 1500 1636 1835 1896
52 112 190 260 404 472 510 577 668 738 811 920 1025 1121 1138 1280 1316 1394 1467 1587 1801 1897
67 117 172 303 394 442 520 579 681 742 879 952 983 1113 1199 1265 1343 1430 1515 1585 1829 1898
4 155 217 299 389 471 526 637 652 757 812 962 1006 1095 1197 1237 1320 1449 1518 1645 1782 1899
63 98 197 323 380 407 537 600 707 774 863 968 1005 1060 1150 1268 1325 1378 1626 1572 1790 1900
33 97 229 297 349 463 494 596 721 753 838 899 999 1120 1184 1290 1363 1405 1525 1590 1843 1901
62 91 239 289 370 475 534 620 702 803 852 936 1038 1072 1202 1274 1306 1382 1471 1583 1798 1902
78 130 165 271 326 441 538 594 700 752 833 896 1046 1082 1195 1260 1305 1387 1501 1545 1787 1903
54 138 176 316 345 469 553 586 653 768 831 900 1029 1088 1157 1257 1299 1425 1489 1552 1812 1904
66 121 213 296 354 405 490 568 687 744 864 915 996 1099 1146 1218 1338 1448 1502 1554 1797 1905
32 88 173 248 381 430 549 613 705 756 818 932 1044 1056 1166 1262 1346 1447 1473 1595 1849 1906
60 136 177 258 358 483 519 593 698 802 836 911 1047 1096 1144 1252 1329 1441 1528 1575 1800 1907
0 139 192 264 363 438 548 625 660 750 829 961 987 1100 1187 1247 1376 1400 1462 1571 1822 1908
21 159 209 275 401 427 564 635 667 729 871 910 974 1115 1183 1238 1344 1408 1523 1630 1806 1909
74 146 188 312 344 452 540 641 669 791 878 926 1000 1132 1207 1287 1344 1391 1521 1569 1792 1910
29 92 238 272 343 437 552 572 727 764 880 902 1030 1111 1181 1228 1367 1438 1474 1561 1789 1911
18 122 187 276 337 409 518 609 690 799 858 914 1018 1081 1173 1264 1354 1406 1508 1543 1830 1912
43 110 203 291 376 440 546 569 686 788 821 960 1031 1110 1155 1283 1300 1409 1526 1588 1794 1913
28 123 179 308 384 462 486 573 710 733 817 908 1002 1126 1200 1292 1330 1429 1519 1568 1784 1914
80 94 191 287 367 446 507 588 684 798 841 891 977 1102 1180 1239 1318 1416 1481 1633 1859 1915
31 149 237 257 334 432 560 605 676 770 815 949 991 1114 1212 1216 1331 1442 1488 1638 1850 1916
53 83 185 286 382 429 515 584 658 801 887 922 1052 1080 1142 1221 1302 1392 1490 1643 1819 1917
37 114 162 302 385 470 504 634 703 743 869 957 1050 1108 1148 1237 1357 1380 1468 1547 1840 1918
23 142 226 278 325 434 529 583 683 807 834 946 1003 1053 1159 1282 1371 1393 1511 1584 1796 1919
20 95 199 290 392 424 514 599 715 793 814 971 1037 1069 1196 1281 1352 1444 1507 1544 1815 1920
61 129 234 256 338 419 566 575 725 790 846 956 975 1122 1156 1275 1350 1419 1531 1548 1824 1921
25 147 223 284 368 410 517 587 651 751 856 928 1048 1077 1160 1234 1303 1433 1505 1563 1851 1922
15 140 168 243 356 459 539 633 662 795 862 959 1010 1066 1175 1242 1337 1414 1497 1580 1828 1923
10 102 233 245 369 480 523 581 699 785 873 901 1017 1091 1192 1225 1355 1412 1479 1559 1833 1924
1 109 205 298 340 436 509 567 659 780 830 965 1019 1076 1171 1272 1348 1445 1524 1594 1791 1925
50 111 236 253 395 455 506 622 663 771 870 951 997 1128 1141 1240 1310 1399 1504 1558 1814 1926
71 89 178 322 329 464 547 595 678 740 874 948 1040 1079 1170 1243 1317 1417 1536 1574 1813 1927
27 132 242 267 390 411 511 630 695 761 889 909 1036 1101 1186 1263 1319 1410 1466 1550 1807 1928
46 128 228 252 388 468 501 619 674 797 826 953 980 1085 1162 1250 1297 1621 1472 1562 1846 1929
55 152 225 304 341 473 496 644 724 736 885 943 1034 1071 1174 1276 1340 1379 1483 1637 1854 1930
2 126 186 255 375 431 487 629 673 745 855 938 1026 1068 1140 1226 1336 1381 1520 1556 1837 1931
```

-continued 59 118 230 277 393 454 536 601 689 772 884 929 1008 1109 1168 1294 1360 1439 1480 1539 1804 1932
64 100 220 261 386 453 557 632 665 749 820 898 973 1073 1134 1227 1334 1402 1484 1631 1852 1933
22 145 215 247 348 447 513 574 677 754 876 919 1033 1063 1209 1278 1326 1398 1499 1570 1855 1934
45 125 206 244 355 406 532 638 723 792 888 955 985 1058 1182 1253 1308 1422 1516 1582 1795 1935
44 157 175 285 357 414 541 624 671 735 854 894 995 1129 1137 1267 1353 1396 1495 1629 1862 1936
38 87 196 249 335 477 488 621 648 734 882 903 1001 1098 1206 1248 1333 1388 1465 1646 1808 1937
77 93 232 319 378 444 545 582 712 808 810 930 1012 1119 1151 1246 1365 1450 1494 1635 1838 1938
5 104 171 314 374 412 550 626 685 767 843 907 1049 1075 1136 1279 1375 1415 1510 1576 1826 1939
68 141 180 305 398 415 508 616 720 775 816 912 1009 1094 1188 1233 1301 1395 1486 1592 1839 1940
35 101 207 274 372 435 531 611 709 758 851 950 1013 1103 1139 1251 1312 1427 1498 1549 1810 1941
3 105 184 295 364 422 530 602 654 805 840 893 1028 1130 1161 1244 1349 1437 1464 1640 1785 1942
6 120 189 251 346 448 524 571 719 773 865 892 1045 1107 1145 1286 1309 1443 1492 1457 1799 1943
26 137 227 270 391 478 563 592 691 776 850 966 1024 1112 1211 1293 1313 1622 1458 1456 1860 1864

5. GRS-based irregular LDPC (1944, 1296) code (5), R = 2/3
1944 648

12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 12 12 12 12 12 12 12 12 12 12 12 12 12 12 12 12 12 12
12 12 12 12 12 12 12 12 12 11 11 11 11 11 11 11 11 11 11 11 11 11 11 11 11 11 11 11 11
11 11 11 11 11 11 11 11 11 11 11 11 11 11 11 11 11 11 11 11 11 11 11 11 11 11 11 11 11
11 11 11 11 11 11 11 11 11 11 11 11 11 11 11 11 11 11 11 11 11 11 11 12
0 81 162 243 324 486 648 810 972 1134 1296 1377
14 102 209 303 338 494 676 886 1011 1177 1308 1447
15 103 210 304 339 495 677 887 1012 1178 1309 1448
16 104 211 305 340 496 678 888 1013 1179 1310 1449
17 105 212 306 341 497 679 889 1014 1180 1311 1450
18 106 213 307 342 498 680 890 1015 1181 1312 1451
19 107 214 308 343 499 681 811 1016 1182 1313 1452
20 108 215 309 344 500 682 812 1017 1183 1314 1453
21 109 216 310 345 501 683 813 1018 1184 1315 1454
22 110 217 311 346 502 684 814 1019 1185 1316 1455
23 111 218 312 347 503 685 815 1020 1186 1317 1456
24 112 219 313 348 504 686 816 1021 1187 1318 1457
25 113 220 314 349 505 687 817 1022 1188 1319 1378
26 114 221 315 350 506 688 818 1023 1189 1320 1379
27 115 222 316 351 507 689 819 1024 1190 1321 1380
28 116 223 317 352 508 690 820 1025 1191 1322 1381
29 117 224 318 353 509 691 821 1026 1192 1323 1382
30 118 225 319 354 510 692 822 1027 1193 1324 1383
31 119 226 320 355 511 693 823 1028 1194 1325 1384
32 120 227 321 356 512 694 824 1029 1195 1326 1385
33 121 228 322 357 513 695 825 1030 1196 1327 1386
34 122 229 323 358 514 696 826 1031 1197 1328 1387
35 123 230 244 359 515 697 827 1032 1198 1329 1388
36 124 231 245 360 516 698 828 1033 1199 1330 1389
37 125 232 246 361 517 699 829 1034 1200 1331 1390
38 126 233 247 362 518 700 830 1035 1201 1332 1391
39 127 234 248 363 519 701 831 1036 1202 1333 1392
40 128 235 249 364 520 702 832 1037 1203 1334 1393
41 129 236 250 365 521 703 833 1038 1204 1335 1394
42 130 237 251 366 522 704 834 1039 1205 1336 1395
43 131 238 252 367 523 705 835 1040 1206 1337 1396
44 132 239 253 368 524 706 836 1041 1207 1338 1397
45 133 240 254 369 525 707 837 1042 1208 1339 1398
46 134 241 255 370 526 708 838 1043 1209 1340 1399
47 135 242 256 371 527 709 839 1044 1210 1341 1400
48 136 163 257 372 528 710 840 1045 1211 1342 1401
49 137 164 258 373 529 711 841 1046 1212 1343 1402
50 138 165 259 374 530 712 842 1047 1213 1344 1403
51 139 166 260 375 531 713 843 1048 1214 1345 1404
52 140 167 261 376 532 714 844 1049 1135 1346 1405
53 141 168 262 377 533 715 845 1050 1136 1347 1406
54 142 169 263 378 534 716 846 1051 1137 1348 1407

-continued

```
55 143 170 264 379 535 717 847 1052 1138 1349 1408
56 144 171 265 380 536 718 848 973 1139 1350 1409
57 145 172 266 381 537 719 849 974 1140 1351 1410
58 146 173 267 382 538 720 850 975 1141 1352 1411
59 147 174 268 383 539 721 851 976 1142 1353 1412
60 148 175 269 384 540 722 852 977 1143 1354 1413
61 149 176 270 385 541 723 853 978 1144 1355 1414
62 150 177 271 386 542 724 854 979 1145 1356 1415
63 151 178 272 387 543 725 855 980 1146 1357 1416
64 152 179 273 388 544 726 856 981 1147 1358 1417
65 153 180 274 389 545 727 857 982 1148 1359 1418
66 154 181 275 390 546 728 858 983 1149 1360 1419
67 155 182 276 391 547 649 859 984 1150 1361 1420
68 156 183 277 392 548 650 860 985 1151 1362 1421
69 157 184 278 393 549 651 861 986 1152 1363 1422
70 158 185 279 394 550 652 862 987 1153 1364 1423
71 159 186 280 395 551 653 863 988 1154 1365 1424
72 160 187 281 396 552 654 864 989 1155 1366 1425
73 161 188 282 397 553 655 865 990 1156 1367 1426
74 82 189 283 398 554 656 866 991 1157 1368 1427
75 83 190 284 399 555 657 867 992 1158 1369 1428
76 84 191 285 400 556 658 868 993 1159 1370 1429
77 85 192 286 401 557 659 869 994 1160 1371 1430
78 86 193 287 402 558 660 870 995 1161 1372 1431
79 87 194 288 403 559 661 871 996 1162 1373 1432
80 88 195 289 404 560 662 872 997 1163 1374 1433
1 89 196 290 325 561 663 873 998 1164 1375 1434
2 90 197 291 326 562 664 874 999 1165 1376 1435
3 91 198 292 327 563 665 875 1000 1166 1297 1436
4 92 199 293 328 564 666 876 1001 1167 1298 1437
5 93 200 294 329 565 667 877 1002 1168 1299 1438
6 94 201 295 330 566 668 878 1003 1169 1300 1439
7 95 202 296 331 487 669 879 1004 1170 1301 1440
8 96 203 297 332 488 670 880 1005 1171 1302 1441
9 97 204 298 333 489 671 881 1006 1172 1303 1442
10 98 205 299 334 490 672 882 1007 1173 1304 1443
11 99 206 300 335 491 673 883 1008 1174 1305 1444
12 100 207 301 336 492 674 884 1009 1175 1306 1445
13 101 208 302 337 493 675 885 1010 1176 1307 1446
15 148 220 319 424 616 785 943 1063 1252 1418 1527
67 113 241 281 448 574 807 914 1090 1234 1453 1459
55 129 200 286 423 601 757 961 1084 1230 1388 1528
68 105 208 244 437 578 745 929 1123 1254 1405 1473
39 117 191 267 418 583 758 932 1131 1228 1384 1538
14 83 238 266 416 621 809 952 1114 1220 1434 1510
28 111 206 260 449 644 784 939 1081 1282 1383 1461
9 81 209 299 483 643 798 965 1129 1247 1399 1483
7 152 229 307 421 637 779 915 1132 1227 1455 1467
40 125 216 290 414 596 777 903 1072 1259 1387 1533
74 160 242 257 456 604 730 916 1059 1269 1433 1530
12 149 192 305 463 587 764 967 1085 1275 1381 1491
5 94 180 308 465 634 782 942 1115 1286 1377 1535
47 159 193 248 443 602 775 956 1103 1243 1422 1525
54 131 164 315 406 605 737 937 1116 1283 1395 1520
56 82 219 261 482 625 744 935 1087 1287 1430 1511
34 104 233 291 426 612 746 968 1062 1222 1419 1480
77 88 214 279 480 638 804 922 1076 1239 1444 1501
73 154 212 292 472 588 767 940 1057 1218 1429 1537
17 151 165 263 454 576 763 933 1055 1268 1401 1476
71 112 199 318 419 589 787 895 1088 1217 1432 1485
63 156 217 252 479 640 761 902 1122 1233 1454 1512
45 146 210 313 431 615 753 904 1060 1289 1438 1489
10 141 172 311 441 629 735 962 1133 1221 1424 1494
70 132 179 264 447 610 780 925 1095 1267 1421 1532
22 101 181 298 458 608 760 921 1102 1295 1382 1475
32 122 239 316 415 641 792 945 1104 1215 1426 1474
38 158 202 309 455 595 802 919 1082 1256 1416 1468
49 97 198 271 459 613 808 911 1125 1229 1411 1507
6 106 222 278 474 606 739 893 1121 1264 1402 1515
46 133 196 280 411 568 776 938 1065 1253 1451 1498
50 110 188 258 470 575 736 918 1119 1278 1392 1465
65 115 170 301 440 577 740 950 1111 1263 1428 1513
2 153 215 297 469 635 755 960 1093 1235 1447 1516
61 96 195 321 485 598 772 966 1058 1266 1456 1536
31 95 227 295 461 594 751 897 1118 1288 1403 1523
60 89 237 287 473 618 801 934 1070 1272 1380 1469
76 128 163 269 439 592 750 894 1080 1258 1385 1499
52 136 174 314 467 584 766 898 1086 1255 1423 1487
64 119 211 294 405 646 742 913 1097 1216 1446 1500
```

-continued

```
30 86 171 246 428 611 754 930 1054 1260 1445 1471
58 134 175 256 481 591 800 909 1094 1250 1439 1526
0 137 190 262 436 623 748 959 1098 1245 1398 1460
19 157 207 273 425 633 729 908 1113 1236 1406 1521
72 144 186 310 450 639 789 924 1130 1285 1389 1519
27 90 236 270 435 570 762 900 1109 1226 1436 1472
16 120 185 274 407 607 797 912 1079 1262 1404 1506
41 108 201 289 438 647 786 958 1108 1281 1407 1524
26 121 177 306 460 571 731 906 1124 1290 1427 1517
78 92 189 285 444 586 796 891 1100 1237 1414 1479
29 147 235 255 430 603 768 947 1112 1294 1440 1486
51 161 183 284 427 582 799 920 1078 1219 1390 1488
35 142 162 300 468 632 741 955 1106 1257 1378 1466
21 140 224 276 432 581 805 944 1053 1280 1391 1509
18 93 197 288 422 597 791 969 1067 1279 1442 1505
59 127 232 254 417 573 788 954 1120 1273 1417 1529
23 145 221 282 408 585 749 926 1075 1232 1431 1503
13 138 166 243 457 631 793 957 1064 1240 1412 1495
8 100 231 323 478 579 783 899 1089 1223 1410 1477
79 107 203 296 434 567 778 963 1074 1270 1443 1522
48 109 234 251 453 620 769 949 1126 1238 1397 1502
69 87 176 320 462 593 738 946 1077 1241 1415 1534
25 130 240 265 409 628 759 907 1099 1261 1408 1464
44 126 226 250 466 617 795 951 1083 1248 1450 1470
53 150 223 302 471 642 734 941 1069 1274 1457 1481
80 124 184 253 429 627 743 936 1066 1224 1379 1518
57 116 228 275 452 599 770 927 1107 1292 1437 1478
62 98 218 259 451 630 747 896 1071 1225 1400 1482
20 143 213 245 445 572 752 917 1061 1276 1396 1497
43 123 204 322 484 636 790 953 1056 1251 1420 1514
42 155 173 283 412 622 733 892 1127 1265 1394 1493
36 85 194 247 475 619 732 901 1096 1246 1386 1463
75 91 230 317 442 580 806 928 1117 1244 1448 1492
3 102 169 312 410 624 765 905 1073 1277 1413 1508
66 139 178 303 413 614 773 910 1092 1231 1393 1484
33 99 205 272 433 609 756 948 1101 1249 1425 1496
1 103 182 293 420 600 803 971 1128 1242 1435 1462
4 118 187 249 446 569 771 970 1105 1284 1441 1490
24 135 225 268 476 590 774 964 1110 1291 1452 1458
11 114 168 277 464 626 794 923 1068 1293 1409 1531
37 84 167 304 477 645 781 931 1091 1271 1449 1504
16 149 221 320 395 502 707 838 977 1204 1528 1592
38 85 168 305 402 553 663 852 1022 1168 1505 1600
68 114 242 282 332 520 727 874 1038 1212 1460 1590
56 130 201 287 338 488 713 858 1014 1202 1529 1585
69 106 209 245 349 491 710 844 1026 1197 1474 1576
40 118 192 268 386 511 671 841 992 1188 1459 1545
15 84 239 267 346 498 715 882 1020 1157 1511 1566
29 112 207 261 350 524 705 846 972 1178 1462 1602
10 81 210 300 365 554 700 836 981 1214 1484 1541
8 153 230 308 382 542 691 831 1034 1153 1468 1550
41 126 217 291 361 555 660 822 989 1162 1534 1577
75 161 163 258 331 526 681 871 978 1189 1531 1554
13 150 193 306 360 501 717 812 1003 1166 1492 1559
6 95 181 309 376 515 656 848 988 1171 1536 1597
48 160 194 249 352 496 665 867 1040 1209 1526 1540
55 132 165 316 364 494 692 876 991 1152 1521 1619
57 83 220 262 330 527 669 823 1013 1151 1512 1613
35 105 234 292 358 561 674 880 997 1145 1481 1572
78 89 215 280 324 499 712 885 983 1184 1502 1580
74 155 213 293 399 492 655 843 980 1192 1538 1563
18 152 166 264 372 534 654 866 1021 1175 1477 1610
72 113 200 319 327 541 728 865 985 1142 1486 1578
64 157 218 253 396 543 687 859 975 1190 1513 1581
46 147 211 314 341 521 695 818 1050 1193 1490 1601
11 142 173 312 326 564 678 826 1041 1213 1495 1588
71 133 180 265 378 560 725 889 1010 1200 1533 1614
23 102 182 299 329 504 693 856 1031 1146 1476 1564
33 123 240 317 351 558 696 824 987 1176 1475 1552
39 159 203 310 335 550 716 827 1006 1164 1469 1565
50 98 199 272 401 532 703 847 1015 1177 1508 1616
7 107 223 279 398 497 649 834 1042 1148 1516 1591
47 134 197 281 359 557 679 860 1019 1203 1499 1605
51 111 189 259 403 509 667 890 1024 1137 1466 1586
66 116 171 302 393 519 680 878 982 1198 1514 1584
3 154 216 298 388 525 651 811 1005 1196 1517 1617
62 97 196 322 379 536 706 862 1004 1149 1537 1571
32 96 228 296 348 493 720 837 998 1183 1524 1589
61 90 238 288 369 533 701 851 1037 1201 1470 1582
```

```
77 129 164 270 325 537 699 832 1045 1194 1500 1544
53 137 175 315 344 552 652 830 1028 1156 1488 1551
65 120 212 295 353 489 686 863 995 1163 1501 1553
31 87 172 247 380 548 704 817 1043 1165 1472 1611
59 135 176 257 357 518 697 835 1046 1143 1527 1574
0 138 191 263 362 547 659 828 986 1186 1461 1570
20 158 208 274 400 563 666 870 973 1182 1522 1594
73 145 187 311 343 539 668 877 999 1206 1520 1568
28 91 237 271 342 551 726 879 1029 1180 1473 1560
17 121 186 275 336 517 689 857 1017 1172 1507 1542
42 109 202 290 375 545 685 820 1030 1154 1525 1587
27 122 178 307 383 486 709 816 1001 1199 1518 1567
79 93 190 286 366 506 683 840 976 1179 1480 1599
30 148 236 256 333 559 675 814 990 1211 1487 1609
52 82 184 285 381 514 657 886 1051 1141 1489 1615
36 143 162 301 384 503 702 868 1049 1147 1467 1546
22 141 225 277 404 528 682 833 1002 1158 1510 1583
19 94 198 289 391 513 714 813 1036 1195 1506 1543
60 128 233 255 337 565 724 845 974 1155 1530 1547
24 146 222 283 367 516 650 855 1047 1159 1504 1562
14 139 167 243 355 538 661 861 1009 1174 1496 1579
9 101 232 244 368 522 698 872 1016 1191 1478 1558
80 108 204 297 339 508 658 829 1018 1170 1523 1608
49 110 235 252 394 505 662 869 996 1140 1503 1557
70 88 177 321 328 546 677 873 1039 1169 1535 1573
26 131 241 266 389 510 694 888 1035 1185 1465 1549
45 127 227 251 387 500 673 825 979 1161 1471 1561
54 151 224 303 340 495 723 884 1033 1173 1482 1607
1 125 185 254 374 566 672 854 1025 1139 1519 1555
58 117 229 276 392 535 688 883 1007 1167 1479 1539
63 99 219 260 385 556 664 819 1052 1134 1483 1596
21 144 214 246 347 512 676 875 1032 1208 1498 1569
44 124 205 323 354 531 722 887 984 1181 1515 1604
43 156 174 284 356 540 670 853 994 1136 1494 1593
37 86 195 248 334 487 648 881 1000 1205 1464 1618
76 92 231 318 377 544 711 810 1011 1150 1493 1603
4 103 170 313 373 549 684 842 1048 1135 1509 1575
67 140 179 304 397 507 719 815 1008 1187 1485 1606
34 100 206 273 371 530 708 850 1012 1138 1497 1548
2 104 183 294 363 529 653 839 1027 1160 1463 1612
5 119 188 250 345 523 718 864 1044 1144 1491 1598
25 136 226 269 390 562 690 849 1023 1210 1458 1595
12 115 169 278 370 490 721 821 993 1207 1532 1556
17 150 222 321 426 618 787 945 1065 1254 1593 1633
13 116 170 279 466 628 796 925 1070 1295 1557 1641
39 86 169 306 479 647 783 933 1093 1273 1601 1631
69 115 163 283 450 576 809 916 1092 1236 1591 1626
57 131 202 288 425 603 759 963 1086 1232 1586 1697
70 107 210 246 439 580 747 931 1125 1256 1577 1666
41 119 193 269 420 585 760 934 1133 1230 1546 1687
16 85 240 268 418 623 731 954 1116 1222 1567 1643
30 113 208 262 451 646 786 941 1083 1284 1603 1662
11 81 211 301 485 645 800 967 1131 1249 1542 1671
9 154 231 309 423 639 781 917 1054 1229 1551 1698
42 127 218 292 416 598 779 905 1074 1261 1578 1675
76 82 164 259 458 606 732 918 1061 1271 1555 1680
14 151 194 307 465 589 766 969 1087 1277 1560 1638
7 96 182 310 467 636 784 944 1117 1288 1598 1661
49 161 195 250 445 604 777 958 1105 1245 1541 1660
56 133 166 317 408 607 739 939 1118 1285 1540 1654
58 84 221 263 484 627 746 937 1089 1289 1614 1693
36 106 235 293 428 614 748 970 1064 1224 1573 1621
79 90 216 281 482 640 806 924 1078 1241 1581 1684
75 156 214 294 474 590 769 942 1059 1220 1564 1651
19 153 167 265 456 578 765 935 1057 1270 1611 1699
73 114 201 320 421 591 789 897 1090 1219 1579 1622
65 158 219 254 481 642 763 904 1124 1235 1582 1642
47 148 212 315 433 617 755 906 1062 1291 1602 1629
12 143 174 313 443 631 737 964 1055 1223 1589 1655
72 134 181 266 449 612 782 927 1097 1269 1615 1685
24 103 183 300 460 610 762 923 1104 1217 1565 1673
34 124 241 318 417 643 794 947 1106 1215 1553 1686
40 160 204 311 457 597 804 921 1084 1258 1566 1657
51 99 200 273 461 615 730 913 1127 1231 1617 1632
8 108 224 280 476 608 741 895 1123 1266 1592 1646
48 135 198 282 413 570 778 940 1067 1255 1606 1627
52 112 190 260 472 577 738 920 1121 1280 1587 1625
67 117 172 303 442 579 742 952 1113 1265 1585 1658
4 155 217 299 471 637 757 962 1095 1237 1618 1692
```

-continued

```
63 98 197 323 407 600 774 968 1060 1268 1572 1630
33 97 229 297 463 596 753 899 1120 1290 1590 1623
62 91 239 289 475 620 803 936 1072 1274 1583 1665
78 130 165 271 441 594 752 896 1082 1260 1545 1672
54 138 176 316 469 586 768 900 1088 1257 1552 1674
66 121 213 296 405 568 744 915 1099 1218 1554 1652
32 88 173 248 430 613 756 932 1056 1262 1612 1695
60 136 177 258 483 593 802 911 1096 1252 1575 1691
0 139 192 264 438 625 750 961 1100 1247 1571 1635
21 159 209 275 427 635 729 910 1115 1238 1595 1689
74 146 188 312 452 641 791 926 1132 1287 1569 1681
29 92 238 272 437 572 764 902 1111 1228 1561 1663
18 122 187 276 409 609 799 914 1081 1264 1543 1628
43 110 203 291 440 569 788 960 1110 1283 1588 1688
28 123 179 308 462 573 733 908 1126 1292 1568 1640
80 94 191 287 446 588 798 891 1102 1239 1600 1650
31 149 237 257 432 605 770 949 1114 1216 1610 1656
53 83 185 286 429 584 801 922 1080 1221 1616 1667
37 144 162 302 470 634 743 957 1108 1259 1547 1624
23 142 226 278 434 583 807 946 1053 1282 1584 1664
20 95 199 290 424 599 793 971 1069 1281 1544 1668
61 129 234 256 419 575 790 956 1122 1275 1548 1683
25 147 223 284 410 587 751 928 1077 1234 1563 1700
15 140 168 243 459 633 795 959 1066 1242 1580 1679
10 102 233 245 480 581 785 901 1091 1225 1559 1649
1 109 205 298 436 567 780 965 1076 1272 1609 1678
50 111 236 253 455 622 771 951 1128 1240 1558 1694
71 89 178 322 464 595 740 948 1079 1243 1574 1670
27 132 242 267 411 630 761 909 1101 1263 1550 1682
46 128 228 252 468 619 797 953 1085 1250 1562 1648
55 152 225 304 473 644 736 943 1071 1276 1608 1676
2 126 186 255 431 629 745 938 1068 1226 1556 1620
59 118 230 277 454 601 772 929 1109 1294 1539 1637
64 100 220 261 453 632 749 898 1073 1227 1597 1690
22 145 215 247 447 574 754 919 1063 1278 1570 1645
45 125 206 244 406 638 792 955 1058 1253 1605 1634
44 157 175 285 414 624 735 894 1129 1267 1594 1659
38 87 196 249 477 621 734 903 1098 1248 1619 1644
77 93 232 319 444 582 808 930 1119 1246 1604 1696
5 104 171 314 412 626 767 907 1075 1279 1576 1647
68 141 180 305 415 616 775 912 1094 1233 1607 1669
35 101 207 274 435 611 758 950 1103 1251 1549 1653
3 105 184 295 422 602 805 893 1130 1244 1613 1639
6 120 189 251 448 571 773 892 1107 1286 1599 1636
26 137 227 270 478 592 776 966 1112 1293 1596 1677
18 151 223 322 397 504 709 840 979 1206 1634 1781
27 138 228 271 392 564 692 851 1025 1212 1678 1734
14 117 171 280 372 492 723 823 995 1209 1642 1755
40 87 170 307 404 555 665 854 1024 1170 1632 1711
70 116 164 284 334 522 649 876 1040 1214 1627 1730
58 132 203 289 340 490 715 860 1016 1204 1698 1739
71 108 211 247 351 493 712 846 1028 1199 1667 1766
42 120 194 270 388 513 673 843 994 1190 1688 1743
17 86 241 269 348 500 717 884 1022 1159 1644 1748
31 114 209 263 352 526 707 848 972 1180 1663 1706
12 81 212 302 367 556 702 838 983 1136 1672 1729
10 155 232 310 384 544 693 833 1036 1155 1699 1728
43 128 219 293 363 557 662 824 991 1164 1676 1722
77 83 165 260 333 528 683 873 980 1191 1681 1761
15 152 195 308 362 503 719 814 1005 1168 1639 1769
8 97 183 311 378 517 658 850 990 1173 1662 1752
50 82 196 251 354 498 667 869 1042 1211 1661 1719
57 134 167 318 366 496 694 878 993 1154 1655 1767
59 85 222 264 332 529 671 825 1015 1153 1694 1770
37 107 236 294 360 563 676 882 999 1147 1622 1710
80 91 217 282 324 501 714 887 985 1186 1685 1777
76 157 215 295 401 494 657 845 982 1194 1652 1723
20 154 168 266 374 536 656 868 1023 1177 1700 1753
74 115 202 321 329 543 650 867 987 1144 1623 1741
66 159 220 255 398 545 689 861 977 1192 1643 1754
48 149 213 316 343 523 697 820 1052 1195 1630 1725
13 144 175 314 328 566 680 828 1043 1135 1656 1780
73 135 182 267 380 562 727 811 1012 1202 1686 1714
25 104 184 301 331 506 695 858 1033 1148 1674 1775
35 125 242 319 353 560 698 826 989 1178 1687 1773
41 161 205 312 337 552 718 829 1008 1166 1658 1726
52 100 201 274 403 534 705 849 1017 1179 1633 1760
9 109 225 281 400 499 651 836 1044 1150 1647 1778
49 136 199 283 361 559 681 862 1021 1205 1628 1771
```

```
53 113 191 261 325 511 669 812 1026 1139 1626 1733
68 118 173 304 395 521 682 880 984 1200 1659 1740
5 156 218 300 390 527 653 813 1007 1198 1693 1742
64 99 198 244 381 538 708 864 1006 1151 1631 1720
34 98 230 298 350 495 722 839 1000 1185 1624 1763
63 92 240 290 371 535 703 853 1039 1203 1666 1759
79 131 166 272 327 539 701 834 1047 1196 1673 1703
55 139 177 317 346 554 654 832 1030 1158 1675 1757
67 122 214 297 355 491 688 865 997 1165 1653 1749
33 89 174 249 382 550 706 819 1045 1167 1696 1731
61 137 178 259 359 520 699 837 1048 1145 1692 1776
0 140 193 265 364 549 661 830 988 1188 1636 1756
22 160 210 276 402 565 668 872 975 1184 1690 1708
75 147 189 313 345 541 670 879 1001 1208 1682 1718
30 93 239 273 344 553 728 881 1031 1182 1664 1724
19 123 188 277 338 519 691 859 1019 1174 1629 1735
44 111 204 292 377 547 687 822 1032 1156 1689 1772
29 124 180 309 385 486 711 818 1003 1201 1641 1732
1 95 192 288 368 508 685 842 978 1181 1651 1736
32 150 238 258 335 561 677 816 992 1213 1657 1751
54 84 186 287 383 516 659 888 973 1143 1668 1768
38 145 162 303 386 505 704 870 1051 1149 1625 1747
24 143 227 279 326 530 684 835 1004 1160 1665 1717
21 96 200 291 393 515 716 815 1038 1197 1669 1746
62 130 235 257 339 487 726 847 976 1157 1684 1762
26 148 224 285 369 518 652 857 1049 1161 1621 1738
16 141 169 243 357 540 663 863 1011 1176 1680 1750
11 103 234 246 370 524 700 874 1018 1193 1650 1716
2 110 206 299 341 510 660 831 1020 1172 1679 1744
51 112 237 254 396 507 664 871 998 1142 1695 1701
72 90 179 323 330 548 679 875 1041 1171 1671 1705
28 133 163 268 391 512 696 890 1037 1187 1683 1758
47 129 229 253 389 502 675 827 981 1163 1649 1713
56 153 226 305 342 497 725 886 1035 1175 1677 1702
3 127 187 256 376 488 674 856 1027 1141 1620 1727
60 119 231 278 394 537 690 885 1009 1169 1638 1712
65 101 221 262 387 558 666 821 974 1134 1691 1764
23 146 216 248 349 514 678 877 1034 1210 1646 1715
46 126 207 245 356 533 724 889 986 1183 1635 1737
45 158 176 286 358 542 672 855 996 1138 1660 1721
39 88 197 250 336 489 648 883 1002 1207 1645 1707
78 94 233 320 379 546 713 810 1013 1152 1697 1704
6 105 172 315 375 551 686 844 1050 1137 1648 1745
69 142 181 306 399 509 721 817 1010 1189 1670 1709
36 102 208 275 373 532 710 852 1014 1140 1654 1779
4 106 185 296 365 531 655 841 1029 1162 1640 1774
7 121 190 252 347 525 720 866 1046 1146 1637 1765
19 152 224 323 428 620 789 947 1067 1256 1702 1788
8 122 191 253 450 573 775 894 1109 1288 1766 1801
28 139 229 272 480 594 778 968 1114 1295 1735 1862
15 118 172 281 468 630 798 927 1072 1217 1756 1860
41 88 171 308 481 569 785 935 1095 1275 1712 1813
71 117 165 285 452 578 731 918 1094 1238 1731 1847
59 133 204 290 427 605 761 965 1088 1234 1740 1785
72 109 212 248 441 582 749 933 1127 1258 1767 1858
43 121 195 271 422 587 762 936 1055 1232 1744 1820
18 87 242 270 420 625 733 956 1118 1224 1749 1827
32 115 210 264 453 568 788 943 1085 1286 1707 1829
13 81 213 303 407 647 802 969 1133 1251 1730 1807
11 156 233 311 425 641 783 919 1056 1231 1729 1850
44 129 220 294 418 600 781 907 1076 1263 1723 1846
78 84 166 261 460 608 734 920 1063 1273 1762 1790
16 153 196 309 467 591 768 971 1089 1279 1770 1844
9 98 184 312 469 638 786 946 1119 1290 1753 1836
51 83 197 252 447 606 779 960 1107 1247 1720 1818
58 135 168 319 410 609 741 941 1120 1287 1768 1783
60 86 223 265 406 629 748 939 1091 1291 1771 1843
38 108 237 295 430 616 750 892 1066 1226 1711 1795
1 92 218 283 484 642 808 926 1080 1243 1778 1805
77 158 216 296 476 592 771 944 1061 1222 1724 1811
21 155 169 267 458 580 767 937 1059 1272 1754 1822
75 116 203 322 423 593 791 899 1092 1221 1742 1859
67 160 221 256 483 644 765 906 1126 1237 1755 1819
49 150 214 317 435 619 757 908 1064 1293 1726 1823
14 145 176 315 445 633 739 966 1057 1225 1781 1838
74 136 183 268 451 614 784 929 1099 1271 1715 1855
26 105 185 302 462 612 764 925 1106 1219 1776 1834
36 126 163 320 419 645 796 949 1108 1215 1774 1804
42 82 206 313 459 599 806 923 1086 1260 1727 1833
```

-continued

```
53 101 202 275 463 617 732 915 1129 1233 1761 1849
10 110 226 282 478 610 743 897 1125 1268 1779 1825
50 137 200 284 415 572 780 942 1069 1257 1772 1837
54 114 192 262 474 579 740 922 1123 1282 1734 1803
69 119 174 305 444 581 744 954 1115 1267 1741 1831
6 157 219 301 473 639 759 964 1097 1239 1743 1782
65 100 199 245 409 602 776 970 1062 1270 1721 1792
35 99 231 299 465 598 755 901 1122 1292 1764 1845
64 93 241 291 477 622 805 938 1074 1276 1760 1800
80 132 167 273 443 596 754 898 1084 1262 1704 1789
56 140 178 318 471 588 770 902 1090 1259 1758 1814
68 123 215 298 405 570 746 917 1101 1220 1750 1799
34 90 175 250 432 615 758 934 1058 1264 1732 1851
62 138 179 260 485 595 804 913 1098 1254 1777 1802
0 141 194 266 440 627 752 963 1102 1249 1757 1824
23 161 211 277 429 637 729 912 1117 1240 1709 1808
76 148 190 314 454 643 793 928 1054 1289 1719 1794
31 94 240 274 439 574 766 904 1113 1230 1725 1791
20 124 189 278 411 611 801 916 1083 1266 1736 1832
45 112 205 293 442 571 790 962 1112 1285 1773 1796
30 125 181 310 464 575 735 910 1128 1294 1733 1786
2 96 193 289 448 590 800 891 1104 1241 1737 1861
33 151 239 259 434 607 772 951 1116 1218 1752 1852
55 85 187 288 431 586 803 924 1082 1223 1769 1821
39 146 162 304 472 636 745 959 1110 1261 1748 1842
25 144 228 280 436 585 809 948 1053 1284 1718 1798
22 97 201 292 426 601 795 893 1071 1283 1747 1817
63 131 236 258 421 577 792 958 1124 1277 1763 1826
27 149 225 286 412 589 753 930 1079 1236 1739 1853
17 142 170 243 461 635 797 961 1068 1244 1751 1830
12 104 235 247 482 583 787 903 1093 1227 1717 1835
3 111 207 300 438 567 782 967 1078 1274 1745 1793
52 113 238 255 457 624 773 953 1130 1242 1701 1816
73 91 180 244 466 597 742 950 1081 1245 1706 1815
29 134 164 269 413 632 763 911 1103 1265 1759 1809
48 130 230 254 470 621 799 955 1087 1252 1714 1848
57 154 227 306 475 646 738 945 1073 1278 1703 1856
4 128 188 257 433 631 747 940 1070 1228 1728 1839
61 120 232 279 456 603 774 931 1111 1216 1713 1806
66 102 222 263 455 634 751 900 1075 1229 1765 1854
24 147 217 249 449 576 756 921 1065 1280 1716 1857
47 127 208 246 408 640 794 957 1060 1255 1738 1797
46 159 177 287 416 626 737 896 1131 1269 1722 1784
40 89 198 251 479 623 736 905 1100 1250 1708 1810
79 95 234 321 446 584 730 932 1121 1248 1705 1840
7 106 173 316 414 628 769 909 1077 1281 1746 1828
70 143 182 307 417 618 777 914 1096 1235 1710 1841
37 103 209 276 437 613 760 952 1105 1253 1780 1812
5 107 186 297 424 604 807 895 1132 1246 1775 1787
20 153 225 244 399 506 711 842 981 1208 1789 1863
6 108 187 298 367 533 657 843 1031 1164 1788 1865
9 123 192 254 349 527 722 868 1048 1148 1802 1866
29 140 230 273 394 566 694 853 1027 1214 1783 1867
16 119 173 282 374 494 725 825 997 1211 1861 1868
42 89 172 309 326 557 667 856 1026 1172 1814 1869
72 118 166 286 336 524 651 878 1042 1136 1848 1870
60 134 205 291 342 492 717 862 1018 1206 1786 1871
73 110 213 249 353 495 714 848 1030 1201 1859 1872
44 122 196 272 390 515 675 845 996 1192 1821 1873
19 88 163 271 350 502 719 886 1024 1161 1828 1874
33 116 211 265 354 528 709 850 972 1182 1830 1875
14 81 214 304 369 558 704 840 985 1138 1808 1876
12 157 234 312 386 546 695 835 1038 1157 1851 1877
45 130 221 295 365 559 664 826 993 1166 1847 1878
79 85 167 262 335 530 685 875 982 1193 1791 1879
17 154 197 310 364 505 721 816 1007 1170 1845 1880
10 99 185 313 380 519 660 852 992 1175 1837 1881
52 84 198 253 356 500 669 871 1044 1213 1819 1882
59 136 169 320 368 498 696 880 995 1156 1784 1883
61 87 224 266 334 531 673 827 1017 1155 1844 1884
39 109 238 296 362 565 678 884 1001 1149 1796 1885
2 93 219 284 324 503 716 889 987 1188 1806 1886
78 159 217 297 403 496 659 847 984 1196 1812 1887
22 156 170 268 376 538 658 870 1025 1179 1823 1888
76 117 204 323 331 545 652 869 989 1146 1860 1889
68 161 222 257 400 547 691 863 979 1194 1820 1890
50 151 215 318 345 525 699 822 974 1197 1824 1891
15 146 177 316 330 488 682 830 1045 1137 1839 1892
75 137 184 269 382 564 649 813 1014 1204 1856 1893
```

-continued

```
27 106 186 303 333 508 697 860 1035 1150 1835 1894
37 127 164 321 355 562 700 828 991 1180 1805 1895
43 83 207 314 339 554 720 831 1010 1168 1834 1896
54 102 203 276 325 536 707 851 1019 1181 1850 1897
11 111 227 283 402 501 653 838 1046 1152 1826 1898
51 138 201 285 363 561 683 864 1023 1207 1838 1899
55 115 193 263 327 513 671 814 1028 1141 1804 1900
70 120 175 306 397 523 684 882 986 1202 1832 1901
7 158 220 302 392 529 655 815 1009 1200 1782 1902
66 101 200 246 383 540 710 866 1008 1153 1793 1903
36 100 232 300 352 497 724 841 1002 1187 1846 1904
65 94 242 292 373 537 705 855 1041 1205 1801 1905
1 133 168 274 329 541 703 836 1049 1198 1790 1906
57 141 179 319 348 556 656 834 1032 1160 1815 1907
69 124 216 299 357 493 690 867 999 1167 1800 1908
35 91 176 251 384 552 708 821 1047 1169 1852 1909
63 139 180 261 361 522 701 839 1050 1147 1803 1910
0 142 195 267 366 551 663 832 990 1190 1825 1911
24 82 212 278 404 487 670 874 977 1186 1809 1912
77 149 191 315 347 543 672 881 1003 1210 1795 1913
32 95 241 275 346 555 650 883 1033 1184 1792 1914
21 125 190 279 340 521 693 861 1021 1176 1833 1915
46 113 206 294 379 549 689 824 1034 1158 1797 1916
31 126 182 311 387 486 713 820 1005 1203 1787 1917
3 97 194 290 370 510 687 844 980 1183 1862 1918
34 152 240 260 337 563 679 818 994 1135 1853 1919
56 86 188 289 385 518 661 890 975 1145 1822 1920
40 147 162 305 388 507 706 872 973 1151 1843 1921
26 145 229 281 328 532 686 837 1006 1162 1799 1922
23 98 202 293 395 517 718 817 1040 1199 1818 1923
64 132 237 259 341 489 728 849 978 1159 1827 1924
28 150 226 287 371 520 654 859 1051 1163 1854 1925
18 143 171 243 359 542 665 865 1013 1178 1831 1926
13 105 236 248 372 526 702 876 1020 1195 1836 1927
4 112 208 301 343 512 662 833 1022 1174 1794 1928
53 114 239 256 398 509 666 873 1000 1144 1817 1929
74 92 181 245 332 550 681 877 1043 1173 1816 1930
30 135 165 270 393 514 698 812 1039 1189 1810 1931
49 131 231 255 391 504 677 829 983 1165 1849 1932
58 155 228 307 344 499 727 888 1037 1177 1857 1933
5 129 189 258 378 490 676 858 1029 1143 1840 1934
62 121 233 280 396 539 692 887 1011 1171 1807 1935
67 103 223 264 389 560 668 823 976 1134 1855 1936
25 148 218 250 351 516 680 879 1036 1212 1858 1937
48 128 209 247 358 535 726 811 988 1185 1798 1938
47 160 178 288 360 544 674 857 998 1140 1785 1939
41 90 199 252 338 491 648 885 1004 1209 1811 1940
80 96 235 322 381 548 715 810 1015 1154 1841 1941
8 107 174 317 377 553 688 846 1052 1139 1829 1942
71 144 183 308 401 511 723 819 1012 1191 1842 1943
38 104 210 277 375 534 712 854 1016 1142 1813 1864
21 154 226 245 430 622 791 949 1069 1258 1863
39 105 211 278 439 615 762 954 1107 1255 1865
7 109 188 299 426 606 809 897 1054 1248 1866
10 124 193 255 452 575 777 896 1111 1290 1867
30 141 231 274 482 596 780 970 1116 1217 1868
17 120 174 283 470 632 800 929 1074 1219 1869
43 90 173 310 483 571 787 937 1097 1277 1870
73 119 167 287 454 580 733 920 1096 1240 1871
61 135 206 292 429 607 763 967 1090 1236 1872
74 111 214 250 443 584 751 935 1129 1260 1873
45 123 197 273 424 589 764 938 1057 1234 1874
20 89 164 272 422 627 735 958 1120 1226 1875
34 117 212 266 455 570 790 945 1087 1288 1876
15 81 215 305 409 569 804 971 1055 1253 1877
13 158 235 313 427 643 785 921 1058 1233 1878
46 131 222 296 420 602 783 909 1078 1265 1879
80 86 168 263 462 610 736 922 1065 1275 1880
18 155 198 311 469 593 770 893 1091 1281 1881
11 100 186 314 471 640 788 948 1121 1292 1882
53 85 199 254 449 608 781 962 1109 1249 1883
60 137 170 321 412 611 743 943 1122 1289 1884
62 88 225 267 408 631 750 941 1093 1293 1885
40 110 239 297 432 618 752 894 1068 1228 1886
3 94 220 285 406 644 730 928 1082 1245 1887
79 160 218 298 478 594 773 946 1063 1224 1888
23 157 171 269 460 582 769 939 1061 1274 1889
77 118 205 244 425 595 793 901 1094 1223 1890
69 82 223 258 485 646 767 908 1128 1239 1891
```

-continued

```
51 152 216 319 437 621 759 910 1066 1295 1892
16 147 178 317 447 635 741 968 1059 1227 1893
76 138 185 270 453 616 786 931 1101 1273 1894
28 107 187 304 464 614 766 927 1108 1221 1895
38 128 165 322 421 647 798 951 1110 1215 1896
44 84 208 315 461 601 808 925 1088 1262 1897
55 103 204 277 465 619 734 917 1131 1235 1898
12 112 228 284 480 612 745 899 1127 1270 1899
52 139 202 286 417 574 782 944 1071 1259 1900
56 116 194 264 476 581 742 924 1125 1284 1901
71 121 176 307 446 583 746 956 1117 1269 1902
8 159 221 303 475 641 761 966 1099 1241 1903
67 102 201 247 411 604 778 892 1064 1272 1904
37 101 233 301 467 600 757 903 1124 1294 1905
66 95 163 293 479 624 807 940 1076 1278 1906
2 134 169 275 445 598 756 900 1086 1264 1907
58 142 180 320 473 590 772 904 1092 1261 1908
70 125 217 300 405 572 748 919 1103 1222 1909
36 92 177 252 434 617 760 936 1060 1266 1910
64 140 181 262 407 597 806 915 1100 1256 1911
0 143 196 268 442 629 754 965 1104 1251 1912
25 83 213 279 431 639 729 914 1119 1242 1913
78 150 192 316 456 645 795 930 1056 1291 1914
33 96 242 276 441 576 768 906 1115 1232 1915
22 126 191 280 413 613 803 918 1085 1268 1916
47 114 207 295 444 573 792 964 1114 1287 1917
32 127 183 312 466 577 737 912 1130 1216 1918
4 98 195 291 450 592 802 891 1106 1243 1919
35 153 241 261 436 609 774 953 1118 1220 1920
57 87 189 290 433 588 805 926 1084 1225 1921
41 148 162 306 474 638 747 961 1112 1263 1922
27 146 230 282 438 587 731 950 1053 1286 1923
24 99 203 294 428 603 797 895 1073 1285 1924
65 133 238 260 423 579 794 960 1126 1279 1925
29 151 227 288 414 591 755 932 1081 1238 1926
19 144 172 243 463 637 799 963 1070 1246 1927
14 106 237 249 484 585 789 905 1095 1229 1928
5 113 209 302 440 567 784 969 1080 1276 1929
54 115 240 257 459 626 775 955 1132 1244 1930
75 93 182 246 468 599 744 952 1083 1247 1931
31 136 166 271 415 634 765 913 1105 1267 1932
50 132 232 256 472 623 801 957 1089 1254 1933
59 156 229 308 477 568 740 947 1075 1280 1934
6 130 190 259 435 633 749 942 1072 1230 1935
63 122 234 281 458 605 776 933 1113 1218 1936
68 104 224 265 457 636 753 902 1077 1231 1937
26 149 219 251 451 578 758 923 1067 1282 1938
49 129 210 248 410 642 796 959 1062 1257 1939
48 161 179 289 418 628 739 898 1133 1271 1940
42 91 200 253 481 625 738 907 1102 1252 1941
1 97 236 323 448 586 732 934 1123 1250 1942
9 108 175 318 416 630 771 911 1079 1283 1943
72 145 184 309 419 620 779 916 1098 1237 1864
```

6. GRS-based irregular LDPC (1944, 486) code (6), R = ¾
1944 486

```
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 16 16 16 16 16 16 16 16 16 16 16 16 16 16 16 16 16 16
16 16 16 16 16 16 16 16 16 15 15 15 15 15 15 15 15 15 15 15 15 15 15 15 15 15 15
15 15 15 15 15 15 15 15 15 15 15 15 15 15 15 15 15 15 15 15 15 15 15 15 15 15 15
15 15 15 15 15 15 15 15 15 15 15 15 15 15 15 15 15 15 15 16
0 81 162 243 324 405 567 648 729 810 1053 1134 1215 1296 1458 1539
14 102 209 303 338 426 598 676 783 886 1131 1177 1267 1308 1490 1566
15 103 210 304 339 427 599 677 784 887 1132 1178 1268 1309 1491 1567
16 104 211 305 340 428 600 678 785 888 1133 1179 1269 1310 1492 1568
17 105 212 306 341 429 601 679 786 889 1054 1180 1270 1311 1493 1569
18 106 213 307 342 430 602 680 787 890 1055 1181 1271 1312 1494 1570
19 107 214 308 343 431 603 681 788 811 1056 1182 1272 1313 1495 1571
```

-continued

```
20 108 215 309 344 432 604 682 789 812 1057 1183 1273 1314 1496 1572
21 109 216 310 345 433 605 683 790 813 1058 1184 1274 1315 1497 1573
22 110 217 311 346 434 606 684 791 814 1059 1185 1275 1316 1498 1574
23 111 218 312 347 435 607 685 792 815 1060 1186 1276 1317 1499 1575
24 112 219 313 348 436 608 686 793 816 1061 1187 1277 1318 1500 1576
25 113 220 314 349 437 609 687 794 817 1062 1188 1278 1319 1501 1577
26 114 221 315 350 438 610 688 795 818 1063 1189 1279 1320 1502 1578
27 115 222 316 351 439 611 689 796 819 1064 1190 1280 1321 1503 1579
28 116 223 317 352 440 612 690 797 820 1065 1191 1281 1322 1504 1580
29 117 224 318 353 441 613 691 798 821 1066 1192 1282 1323 1505 1581
30 118 225 319 354 442 614 692 799 822 1067 1193 1283 1324 1506 1582
31 119 226 320 355 443 615 693 800 823 1068 1194 1284 1325 1507 1583
32 120 227 321 356 444 616 694 801 824 1069 1195 1285 1326 1508 1584
33 121 228 322 357 445 617 695 802 825 1070 1196 1286 1327 1509 1585
34 122 229 323 358 446 618 696 803 826 1071 1197 1287 1328 1510 1586
35 123 230 244 359 447 619 697 804 827 1072 1198 1288 1329 1511 1587
36 124 231 245 360 448 620 698 805 828 1073 1199 1289 1330 1512 1588
37 125 232 246 361 449 621 699 806 829 1074 1200 1290 1331 1513 1589
38 126 233 247 362 450 622 700 807 830 1075 1201 1291 1332 1514 1590
39 127 234 248 363 451 623 701 808 831 1076 1202 1292 1333 1515 1591
40 128 235 249 364 452 624 702 809 832 1077 1203 1293 1334 1516 1592
41 129 236 250 365 453 625 703 730 833 1078 1204 1294 1335 1517 1593
42 130 237 251 366 454 626 704 731 834 1079 1205 1295 1336 1518 1594
43 131 238 252 367 455 627 705 732 835 1080 1206 1216 1337 1519 1595
44 132 239 253 368 456 628 706 733 836 1081 1207 1217 1338 1520 1596
45 133 240 254 369 457 629 707 734 837 1082 1208 1218 1339 1521 1597
46 134 241 255 370 458 630 708 735 838 1083 1209 1219 1340 1522 1598
47 135 242 256 371 459 631 709 736 839 1084 1210 1220 1341 1523 1599
48 136 163 257 372 460 632 710 737 840 1085 1211 1221 1342 1524 1600
49 137 164 258 373 461 633 711 738 841 1086 1212 1222 1343 1525 1601
50 138 165 259 374 462 634 712 739 842 1087 1213 1223 1344 1526 1602
51 139 166 260 375 463 635 713 740 843 1088 1214 1224 1345 1527 1603
52 140 167 261 376 464 636 714 741 844 1089 1135 1225 1346 1528 1604
53 141 168 262 377 465 637 715 742 845 1090 1136 1226 1347 1529 1605
54 142 169 263 378 466 638 716 743 846 1091 1137 1227 1348 1530 1606
55 143 170 264 379 467 639 717 744 847 1092 1138 1228 1349 1531 1607
56 144 171 265 380 468 640 718 745 848 1093 1139 1229 1350 1532 1608
57 145 172 266 381 469 641 719 746 849 1094 1140 1230 1351 1533 1609
58 146 173 267 382 470 642 720 747 850 1095 1141 1231 1352 1534 1610
59 147 174 268 383 471 643 721 748 851 1096 1142 1232 1353 1535 1611
60 148 175 269 384 472 644 722 749 852 1097 1143 1233 1354 1536 1612
61 149 176 270 385 473 645 723 750 853 1098 1144 1234 1355 1537 1613
62 150 177 271 386 474 646 724 751 854 1099 1145 1235 1356 1538 1614
63 151 178 272 387 475 647 725 752 855 1100 1146 1236 1357 1459 1615
64 152 179 273 388 476 568 726 753 856 1101 1147 1237 1358 1460 1616
65 153 180 274 389 477 569 727 754 857 1102 1148 1238 1359 1461 1617
66 154 181 275 390 478 570 728 755 858 1103 1149 1239 1360 1462 1618
67 155 182 276 391 479 571 649 756 859 1104 1150 1240 1361 1463 1619
68 156 183 277 392 480 572 650 757 860 1105 1151 1241 1362 1464 1540
69 157 184 278 393 481 573 651 758 861 1106 1152 1242 1363 1465 1541
70 158 185 279 394 482 574 652 759 862 1107 1153 1243 1364 1466 1542
71 159 186 280 395 483 575 653 760 863 1108 1154 1244 1365 1467 1543
72 160 187 281 396 484 576 654 761 864 1109 1155 1245 1366 1468 1544
73 161 188 282 397 485 577 655 762 865 1110 1156 1246 1367 1469 1545
74 82 189 283 398 406 578 656 763 866 1111 1157 1247 1368 1470 1546
75 83 190 284 399 407 579 657 764 867 1112 1158 1248 1369 1471 1547
76 84 191 285 400 408 580 658 765 868 1113 1159 1249 1370 1472 1548
77 85 192 286 401 409 581 659 766 869 1114 1160 1250 1371 1473 1549
78 86 193 287 402 410 582 660 767 870 1115 1161 1251 1372 1474 1550
79 87 194 288 403 411 583 661 768 871 1116 1162 1252 1373 1475 1551
80 88 195 289 404 412 584 662 769 872 1117 1163 1253 1374 1476 1552
 1 89 196 290 325 413 585 663 770 873 1118 1164 1254 1375 1477 1553
 2 90 197 291 326 414 586 664 771 874 1119 1165 1255 1376 1478 1554
 3 91 198 292 327 415 587 665 772 875 1120 1166 1256 1297 1479 1555
 4 92 199 293 328 416 588 666 773 876 1121 1167 1257 1298 1480 1556
 5 93 200 294 329 417 589 667 774 877 1122 1168 1258 1299 1481 1557
 6 94 201 295 330 418 590 668 775 878 1123 1169 1259 1300 1482 1558
 7 95 202 296 331 419 591 669 776 879 1124 1170 1260 1301 1483 1559
 8 96 203 297 332 420 592 670 777 880 1125 1171 1261 1302 1484 1560
 9 97 204 298 333 421 593 671 778 881 1126 1172 1262 1303 1485 1561
10 98 205 299 334 422 594 672 779 882 1127 1173 1263 1304 1486 1562
11 99 206 300 335 423 595 673 780 883 1128 1174 1264 1305 1487 1563
12 100 207 301 336 424 596 674 781 884 1129 1175 1265 1306 1488 1564
13 101 208 302 337 425 597 675 782 885 1130 1176 1266 1307 1489 1565
15 148 220 319 394 424 706 785 837 943 1203 1252 1356 1418 1591 1631
67 113 241 281 331 448 726 807 873 914 1211 1234 1322 1453 1589 1624
55 129 200 286 337 423 712 757 857 961 1201 1230 1372 1388 1584 1695
68 105 208 244 348 437 709 745 843 929 1196 1254 1321 1405 1575 1664
39 117 191 267 385 418 670 758 840 932 1187 1228 1337 1384 1544 1685
```

-continued

```
14 83 238 266 345 416 714 809 881 952 1156 1220 1313 1434 1565 1641
28 111 206 260 349 449 704 784 845 939 1177 1282 1325 1383 1601 1660
9 81 209 299 364 483 699 798 835 965 1213 1247 1371 1399 1540 1669
7 152 229 307 381 421 690 779 830 915 1152 1227 1319 1455 1549 1696
40 125 216 290 360 414 659 777 821 903 1161 1259 1296 1387 1576 1673
74 160 242 257 330 456 680 730 870 916 1188 1269 1360 1433 1553 1678
12 149 192 305 359 463 716 764 811 967 1165 1275 1333 1381 1558 1636
5 94 180 308 375 465 655 782 847 942 1170 1286 1368 1377 1596 1659
47 159 193 248 351 443 664 775 866 956 1208 1243 1357 1422 1619 1658
54 131 164 315 363 406 691 737 875 937 1151 1283 1302 1395 1618 1652
56 82 219 261 329 482 668 744 822 935 1150 1287 1367 1430 1612 1691
34 104 233 291 357 426 673 746 879 968 1144 1222 1339 1419 1571 1699
77 88 214 279 324 480 711 804 884 922 1183 1239 1370 1444 1579 1682
73 154 212 292 398 472 654 767 842 940 1191 1218 1312 1429 1562 1649
17 151 165 263 371 454 653 763 865 933 1174 1268 1376 1401 1609 1697
71 112 199 318 326 419 727 787 864 895 1141 1217 1362 1432 1577 1700
63 156 217 252 395 479 686 761 858 902 1189 1233 1359 1454 1580 1640
45 146 210 313 340 431 694 753 817 904 1192 1289 1320 1438 1600 1627
10 141 172 311 325 441 677 735 825 962 1212 1221 1364 1424 1587 1653
70 132 179 264 377 447 724 780 888 925 1199 1267 1354 1421 1613 1683
22 101 181 298 328 458 692 760 855 921 1145 1295 1349 1382 1563 1671
32 122 239 316 350 415 695 792 823 945 1175 1215 1340 1426 1551 1684
38 158 202 309 334 455 715 802 826 919 1163 1256 1309 1416 1564 1655
49 97 198 271 400 459 702 808 846 911 1176 1229 1330 1411 1615 1630
6 106 222 278 397 474 728 739 833 893 1147 1264 1366 1402 1590 1644
46 133 196 280 358 411 678 776 859 938 1202 1253 1305 1451 1604 1625
50 110 188 258 402 470 666 736 889 918 1136 1278 1314 1392 1585 1623
65 115 170 301 392 440 679 740 877 950 1197 1263 1341 1428 1583 1656
2 153 215 297 387 469 650 755 890 960 1195 1235 1318 1447 1616 1690
61 96 195 321 378 485 705 772 861 966 1148 1266 1323 1456 1570 1628
31 95 227 295 347 461 719 751 836 897 1182 1288 1361 1403 1588 1621
60 89 237 287 368 473 700 801 850 934 1200 1272 1304 1380 1581 1663
76 128 163 269 404 439 698 750 831 894 1193 1258 1303 1385 1543 1670
52 136 174 314 343 467 651 766 829 898 1155 1255 1297 1423 1550 1672
64 119 211 294 352 405 685 742 862 913 1162 1216 1336 1446 1552 1650
30 86 171 246 379 428 703 754 816 930 1164 1260 1344 1445 1610 1693
58 134 175 256 356 481 696 800 834 909 1142 1250 1327 1439 1573 1689
0 137 190 262 361 436 658 748 827 959 1185 1245 1374 1398 1569 1633
19 157 207 273 399 425 665 729 869 908 1181 1236 1342 1406 1593 1687
72 144 186 310 342 450 667 789 876 924 1205 1285 1345 1389 1567 1679
27 90 236 270 341 435 725 762 878 900 1179 1226 1365 1436 1559 1661
16 120 185 274 335 407 688 797 856 912 1171 1262 1352 1404 1541 1626
41 108 201 289 374 438 684 786 819 958 1153 1281 1298 1407 1586 1686
26 121 177 306 382 460 708 731 815 906 1198 1290 1328 1427 1566 1638
78 92 189 285 365 444 682 796 839 891 1178 1237 1316 1414 1598 1648
29 147 235 255 332 430 674 768 813 947 1210 1294 1329 1440 1608 1654
51 161 183 284 380 427 656 799 885 920 1140 1219 1300 1390 1614 1665
35 142 162 300 383 468 701 741 867 955 1146 1257 1355 1378 1545 1622
21 140 224 276 403 432 681 805 832 944 1157 1280 1369 1391 1582 1662
18 93 197 288 390 422 713 791 812 969 1194 1279 1350 1442 1542 1666
59 127 232 254 336 417 723 788 844 954 1154 1273 1348 1417 1546 1681
23 145 221 282 366 408 649 749 854 926 1158 1232 1301 1431 1561 1698
13 138 166 243 354 457 660 793 860 957 1173 1240 1335 1412 1578 1677
8 100 231 323 367 478 697 783 871 899 1190 1223 1353 1410 1557 1667
79 107 203 296 338 434 657 778 828 963 1169 1270 1346 1443 1607 1676
48 109 234 251 393 453 661 769 868 949 1139 1238 1308 1397 1556 1692
69 87 176 320 327 462 676 738 872 946 1168 1241 1315 1415 1572 1668
25 130 240 265 388 409 693 759 887 907 1184 1261 1317 1408 1548 1680
44 126 226 250 386 466 672 795 824 951 1160 1248 1375 1450 1560 1646
53 150 223 302 339 471 722 734 883 941 1172 1274 1338 1457 1606 1674
80 124 184 253 373 429 671 743 853 936 1138 1224 1334 1379 1554 1620
57 116 228 275 391 452 687 770 882 927 1166 1292 1358 1437 1539 1635
62 98 218 259 384 451 663 747 818 896 1134 1225 1332 1400 1595 1688
20 143 213 245 346 445 675 752 874 917 1207 1276 1324 1396 1568 1643
43 123 204 322 353 484 721 790 886 953 1180 1251 1306 1420 1603 1632
42 155 173 283 355 412 669 733 852 892 1135 1265 1351 1394 1592 1657
36 85 194 247 333 475 648 732 880 901 1204 1246 1331 1386 1617 1642
75 91 230 317 376 442 710 806 810 928 1149 1244 1363 1448 1602 1694
3 102 169 312 372 410 683 765 841 905 1214 1277 1373 1413 1574 1645
66 139 178 303 396 413 718 773 814 910 1186 1231 1299 1393 1605 1667
33 99 205 272 370 433 707 756 849 948 1137 1249 1310 1425 1547 1651
1 103 182 293 362 420 652 803 838 971 1159 1242 1347 1435 1611 1637
4 118 187 249 344 446 717 771 863 970 1143 1284 1307 1441 1597 1634
24 135 225 268 389 476 689 774 848 964 1209 1291 1311 1452 1594 1675
11 114 168 277 369 464 720 794 820 923 1206 1293 1326 1409 1555 1639
37 84 167 304 401 477 662 781 851 931 1167 1271 1343 1449 1599 1629
16 149 221 320 395 425 502 786 838 944 977 1253 1357 1419 1632 1779
38 85 168 305 402 478 553 782 852 932 1022 1272 1344 1450 1630 1709
68 114 242 282 332 449 520 808 874 915 1038 1235 1323 1454 1625 1728
```

-continued

```
56 130 201 287 338 424 488 758 858 962 1014 1231 1373 1389 1696 1737
69 106 209 245 349 438 491 746 844 930 1026 1255 1322 1406 1665 1764
40 118 192 268 386 419 511 759 841 933 992 1229 1338 1385 1686 1741
15 84 239 267 346 417 498 730 882 953 1020 1221 1314 1435 1642 1746
29 112 207 261 350 450 524 785 846 940 972 1283 1326 1384 1661 1704
10 81 210 300 365 484 554 799 836 966 981 1248 1372 1400 1670 1727
8 153 230 308 382 422 542 780 831 916 1034 1228 1320 1456 1697 1726
41 126 217 291 361 415 555 778 822 904 989 1260 1296 1388 1674 1720
75 161 163 258 331 457 526 731 871 917 978 1270 1361 1434 1679 1759
13 150 193 306 360 464 501 765 812 968 1003 1276 1334 1382 1637 1767
6 95 181 309 376 466 515 783 848 943 988 1287 1369 1377 1660 1750
48 160 194 249 352 444 496 776 867 957 1040 1244 1358 1423 1659 1717
55 132 165 316 364 407 494 738 876 938 991 1284 1303 1396 1653 1765
57 83 220 262 330 483 527 745 823 936 1013 1288 1368 1431 1692 1768
35 105 234 292 358 427 561 747 880 969 997 1223 1340 1420 1700 1708
78 89 215 280 324 481 499 805 885 923 983 1240 1371 1445 1683 1775
74 155 213 293 399 473 492 768 843 941 980 1219 1313 1430 1650 1721
18 152 166 264 372 455 534 764 866 934 1021 1269 1297 1402 1698 1751
72 113 200 319 327 420 541 788 865 896 985 1218 1363 1433 1621 1739
64 157 218 253 396 480 543 762 859 903 975 1234 1360 1455 1641 1752
46 147 211 314 341 432 521 754 818 905 1050 1290 1321 1439 1628 1723
11 142 173 312 326 442 564 736 826 963 1041 1222 1365 1425 1654 1778
71 133 180 265 378 448 560 781 889 926 1010 1268 1355 1422 1684 1712
23 102 182 299 329 459 504 761 856 922 1031 1216 1350 1383 1672 1773
33 123 240 317 351 416 558 793 824 946 987 1215 1341 1427 1685 1771
39 159 203 310 335 456 550 803 827 920 1006 1257 1310 1417 1656 1724
50 98 199 272 401 460 532 809 847 912 1015 1230 1331 1412 1631 1758
7 107 223 279 398 475 497 740 834 894 1042 1265 1367 1403 1645 1776
47 134 197 281 359 412 557 777 860 939 1019 1254 1306 1452 1626 1769
51 111 189 259 403 471 509 737 890 919 1024 1279 1315 1393 1624 1731
66 116 171 302 393 441 519 741 878 951 982 1264 1342 1429 1657 1738
3 154 216 298 388 470 525 756 811 961 1005 1236 1319 1448 1691 1740
62 97 196 322 379 406 536 773 862 967 1004 1267 1324 1457 1629 1718
32 96 228 296 348 462 493 752 837 898 998 1289 1362 1404 1622 1761
61 90 238 288 369 474 533 802 851 935 1037 1273 1305 1381 1664 1757
77 129 164 270 325 440 537 751 832 895 1045 1259 1304 1386 1671 1781
53 137 175 315 344 468 552 767 830 899 1028 1256 1298 1424 1673 1755
65 120 212 295 353 405 489 743 863 914 995 1217 1337 1447 1651 1747
31 87 172 247 380 429 548 755 817 931 1043 1261 1345 1446 1694 1729
59 135 176 257 357 482 518 801 835 910 1046 1251 1328 1440 1690 1774
0 138 191 263 362 437 547 749 828 960 986 1246 1375 1399 1634 1754
20 158 208 274 400 426 563 729 870 909 973 1237 1343 1407 1688 1706
73 145 187 311 343 451 539 790 877 925 999 1286 1346 1390 1680 1716
28 91 237 271 342 436 551 763 879 901 1029 1227 1366 1437 1662 1722
17 121 186 275 336 408 517 798 857 913 1017 1263 1353 1405 1627 1733
42 109 202 290 375 439 545 787 820 959 1030 1282 1299 1408 1687 1770
27 122 178 307 383 461 486 732 816 907 1001 1291 1329 1428 1639 1730
79 93 190 286 366 445 506 797 840 891 976 1238 1317 1415 1649 1734
30 148 236 256 333 431 559 769 814 948 990 1295 1330 1441 1655 1749
52 82 184 285 381 428 514 800 886 921 1051 1220 1301 1391 1666 1766
36 143 162 301 384 469 503 742 868 956 1049 1258 1356 1379 1623 1745
22 141 225 277 404 433 528 806 833 945 1002 1281 1370 1392 1663 1715
19 94 198 289 391 423 513 792 813 970 1036 1280 1351 1443 1667 1744
60 128 233 255 337 418 565 789 845 955 974 1274 1349 1418 1682 1760
24 146 222 283 367 409 516 750 855 927 1047 1233 1302 1432 1699 1736
14 139 167 243 355 458 538 794 861 958 1009 1241 1336 1413 1678 1748
9 101 232 244 368 479 522 784 872 900 1016 1224 1354 1411 1648 1714
80 108 204 297 339 435 508 779 829 964 1018 1271 1347 1444 1677 1742
49 110 235 252 394 454 505 770 869 950 996 1239 1309 1398 1693 1701
70 88 177 321 328 463 546 739 873 947 1039 1242 1316 1416 1669 1703
26 131 241 266 389 410 510 760 888 908 1035 1262 1318 1409 1681 1756
45 127 227 251 387 467 500 796 825 952 979 1249 1376 1451 1647 1711
54 151 224 303 340 472 495 735 884 942 1033 1275 1339 1378 1675 1780
1 125 185 254 374 430 566 744 854 937 1025 1225 1335 1380 1620 1725
58 117 229 276 392 453 535 771 883 928 1007 1293 1359 1438 1636 1710
63 99 219 260 385 452 556 748 819 897 1052 1226 1333 1401 1689 1762
21 144 214 246 347 446 512 753 875 918 1032 1277 1325 1397 1644 1713
44 124 205 323 354 485 531 791 887 954 984 1252 1307 1421 1633 1735
43 156 174 284 356 413 540 734 853 893 994 1266 1352 1395 1658 1719
37 86 195 248 334 476 487 733 881 902 1000 1247 1332 1387 1643 1705
76 92 231 318 377 443 544 807 810 929 1011 1245 1364 1449 1695 1702
4 103 170 313 373 411 549 766 842 906 1048 1278 1374 1414 1646 1743
67 140 179 304 397 414 507 774 815 911 1008 1232 1300 1394 1668 1707
34 100 206 273 371 434 530 757 850 949 1012 1250 1311 1426 1652 1777
2 104 183 294 363 421 529 804 839 892 1027 1243 1348 1436 1638 1772
5 119 188 250 345 447 523 772 864 971 1044 1285 1308 1442 1635 1763
25 136 226 269 390 477 562 775 849 965 1023 1292 1312 1453 1676 1732
12 115 169 278 370 465 490 795 821 924 993 1294 1327 1410 1640 1753
17 150 222 321 396 426 503 618 839 945 978 1065 1358 1420 1780 1786
```

-continued

```
13 116 170 279 371 466 491 628 822 925 994 1070 1328 1411 1754 1858
39 86 169 306 403 479 554 647 853 933 1023 1093 1345 1451 1710 1811
69 115 163 283 333 450 521 576 875 916 1039 1092 1324 1455 1729 1845
57 131 202 288 339 425 489 603 859 963 1015 1086 1374 1390 1738 1783
70 107 210 246 350 439 492 580 845 931 1027 1125 1323 1407 1765 1856
41 119 193 269 387 420 512 585 842 934 993 1133 1339 1386 1742 1818
16 85 240 268 347 418 499 623 883 954 1021 1116 1315 1436 1747 1825
30 113 208 262 351 451 525 646 847 941 972 1083 1327 1385 1705 1827
11 81 211 301 366 485 555 645 837 967 982 1131 1373 1401 1728 1805
9 154 231 309 383 423 543 639 832 917 1035 1054 1321 1457 1727 1848
42 127 218 292 362 416 556 598 823 905 990 1074 1296 1389 1721 1844
76 82 164 259 332 458 527 606 872 918 979 1061 1362 1435 1760 1788
14 151 194 307 361 465 502 589 813 969 1004 1087 1335 1383 1768 1842
7 96 182 310 377 467 516 636 849 944 989 1117 1370 1377 1751 1834
49 161 195 250 353 445 497 604 868 958 1041 1105 1359 1424 1718 1816
56 133 166 317 365 408 495 607 877 939 992 1118 1304 1397 1766 1861
58 84 221 263 331 484 528 627 824 937 1014 1089 1369 1432 1769 1841
36 106 235 293 359 428 562 614 881 970 998 1064 1341 1421 1709 1793
79 90 216 281 324 482 500 640 886 924 984 1078 1372 1446 1776 1803
75 156 214 294 400 474 493 590 844 942 981 1059 1314 1431 1722 1809
19 153 167 265 373 456 535 578 867 935 1022 1057 1298 1403 1752 1820
73 114 201 320 328 421 542 591 866 897 986 1090 1364 1434 1740 1857
65 158 219 254 397 481 544 642 860 904 976 1124 1361 1456 1753 1817
47 148 212 315 342 433 522 617 819 906 1051 1062 1322 1440 1724 1821
12 143 174 313 327 443 565 631 827 964 1042 1055 1366 1426 1779 1836
72 134 181 266 379 449 561 612 890 927 1011 1097 1356 1423 1713 1853
24 103 183 300 330 460 505 610 857 923 1032 1104 1351 1384 1774 1832
34 124 241 318 352 417 559 643 825 947 988 1106 1342 1428 1772 1802
40 160 204 311 336 457 551 597 828 921 1007 1084 1311 1418 1725 1831
51 99 200 273 402 461 533 615 848 913 1016 1127 1332 1413 1759 1847
8 108 224 280 399 476 498 608 835 895 1043 1123 1368 1404 1777 1823
48 135 198 282 360 413 558 570 861 940 1020 1067 1307 1453 1770 1835
52 112 190 260 404 472 510 577 811 920 1025 1121 1316 1394 1732 1801
67 117 172 303 394 442 520 579 879 952 983 1113 1343 1430 1739 1829
4 155 217 299 389 471 526 637 812 962 1006 1095 1320 1449 1741 1782
63 98 197 323 380 407 537 600 863 968 1005 1060 1325 1378 1719 1790
33 97 229 297 349 463 494 596 838 899 999 1120 1363 1405 1762 1843
62 91 239 289 370 475 534 620 852 936 1038 1072 1306 1382 1758 1798
78 130 165 271 326 441 538 594 833 896 1046 1082 1305 1387 1702 1787
54 138 176 316 345 469 553 586 831 900 1029 1088 1299 1425 1756 1812
66 121 213 296 354 405 490 568 864 915 996 1099 1338 1448 1748 1797
32 88 173 248 381 430 549 613 818 932 1044 1056 1346 1447 1730 1849
60 136 177 258 358 483 519 593 836 911 1047 1096 1329 1441 1775 1800
0 139 192 264 363 438 548 625 829 961 987 1100 1376 1400 1755 1822
21 159 209 275 401 427 564 635 871 910 974 1115 1344 1408 1707 1806
74 146 188 312 344 452 540 641 878 926 1000 1132 1347 1391 1717 1792
29 92 238 272 343 437 552 572 880 902 1030 1111 1367 1438 1723 1789
18 122 187 276 337 409 518 609 858 914 1018 1081 1354 1406 1734 1830
43 110 203 291 376 440 546 569 821 960 1031 1110 1300 1409 1771 1794
28 123 179 308 384 462 486 573 817 908 1002 1126 1330 1429 1731 1784
80 94 191 287 367 446 507 588 841 891 977 1102 1318 1416 1735 1859
31 149 237 257 334 432 560 605 815 949 991 1114 1331 1442 1750 1850
53 83 185 286 382 429 515 584 887 922 1052 1080 1302 1392 1767 1819
37 144 162 302 385 470 504 634 869 957 1050 1108 1357 1380 1746 1840
23 142 226 278 325 434 529 583 834 946 1003 1053 1371 1393 1716 1796
20 95 199 290 392 424 514 599 814 971 1037 1069 1352 1444 1745 1815
61 129 234 256 338 419 566 575 846 956 975 1122 1350 1419 1761 1824
25 147 223 284 368 410 517 587 856 928 1048 1077 1303 1433 1751 1851
15 140 168 243 356 459 539 633 862 959 1010 1066 1337 1414 1749 1828
10 102 233 245 369 480 523 581 873 901 1017 1091 1355 1412 1715 1833
1 109 205 298 340 436 509 567 830 965 1019 1076 1348 1445 1743 1791
50 111 236 253 395 455 506 622 870 951 997 1128 1310 1399 1701 1853
71 89 178 322 329 464 547 595 874 948 1040 1079 1317 1417 1704 1813
27 132 242 267 390 411 511 630 889 909 1036 1101 1319 1410 1757 1807
46 128 228 252 388 468 501 619 826 953 980 1085 1297 1452 1712 1846
55 152 225 304 341 473 496 644 885 943 1034 1071 1340 1379 1781 1854
2 126 186 255 375 431 487 629 855 938 1026 1068 1336 1381 1726 1837
59 118 230 277 393 454 536 601 884 929 1008 1109 1360 1439 1711 1804
64 100 220 261 386 453 557 632 820 898 973 1073 1334 1402 1763 1852
22 145 215 247 348 447 513 574 876 919 1033 1063 1326 1398 1714 1855
45 125 206 244 355 406 532 638 888 955 985 1058 1308 1422 1736 1795
44 157 175 285 357 414 541 624 854 894 995 1129 1353 1396 1720 1862
38 87 196 249 335 477 488 621 882 903 1001 1098 1333 1388 1706 1808
77 93 232 319 378 444 545 582 810 930 1012 1119 1365 1450 1703 1838
5 104 171 314 374 412 550 626 843 907 1049 1075 1375 1415 1744 1826
68 141 180 305 398 415 508 616 816 912 1009 1094 1301 1395 1708 1839
35 101 207 274 372 435 531 611 851 950 1013 1103 1312 1427 1778 1810
3 105 184 295 364 422 530 602 840 893 1028 1130 1349 1437 1773 1785
6 120 189 251 346 448 524 571 865 892 1045 1107 1309 1443 1764 1799
```

-continued

```
26 137 227 270 391 478 563 592 850 966 1024 1112 1313 1454 1733 1860
18 151 223 322 397 427 504 619 709 946 979 1066 1206 1421 1787 1863
27 138 228 271 392 479 564 593 692 967 1025 1113 1212 1455 1861 1865
14 117 171 280 372 467 492 629 723 926 995 1071 1209 1412 1859 1866
40 87 170 307 404 480 555 568 665 934 1024 1094 1170 1452 1812 1867
70 116 164 284 334 451 522 577 649 917 1040 1093 1214 1456 1846 1868
58 132 203 289 340 426 490 604 715 964 1016 1087 1204 1391 1784 1869
71 108 211 247 351 440 493 581 712 932 1028 1126 1199 1408 1857 1870
42 120 194 270 388 421 513 586 673 935 994 1054 1190 1387 1819 1871
17 86 241 269 348 419 500 624 717 955 1022 1117 1159 1437 1826 1872
31 114 209 263 352 452 526 647 707 942 972 1084 1180 1386 1828 1873
12 81 212 302 367 406 556 646 702 968 983 1132 1136 1402 1806 1874
10 155 232 310 384 424 544 640 693 918 1036 1055 1155 1378 1849 1875
43 128 219 293 363 417 557 599 662 906 991 1075 1164 1390 1845 1876
77 83 165 260 333 459 528 607 683 919 980 1062 1191 1436 1789 1877
15 152 195 308 362 466 503 590 719 970 1005 1088 1168 1384 1843 1878
8 97 183 311 378 468 517 637 658 945 990 1118 1173 1377 1835 1879
50 82 196 251 354 446 498 605 667 959 1042 1106 1211 1425 1817 1880
57 134 167 318 366 409 496 608 694 940 993 1119 1154 1398 1862 1881
59 85 222 264 332 485 529 628 671 938 1015 1090 1153 1433 1842 1882
37 107 236 294 360 429 563 615 676 971 999 1065 1147 1422 1794 1883
80 91 217 282 324 483 501 641 714 925 985 1079 1186 1447 1804 1884
76 157 215 295 401 475 494 591 657 943 982 1060 1194 1432 1810 1885
20 154 168 266 374 457 536 579 656 936 1023 1058 1177 1404 1821 1886
74 115 202 321 329 422 543 592 650 898 987 1091 1144 1435 1858 1887
66 159 220 255 398 482 545 643 689 905 977 1125 1192 1457 1818 1888
48 149 213 316 343 434 523 618 697 907 1052 1063 1195 1441 1822 1889
13 144 175 314 328 444 566 632 680 965 1043 1056 1135 1427 1837 1890
73 135 182 267 380 450 562 613 727 928 1012 1098 1202 1424 1854 1891
25 104 184 301 331 461 506 611 695 924 1033 1105 1148 1385 1833 1892
35 125 242 319 353 418 560 644 698 948 989 1107 1178 1429 1803 1893
41 161 205 312 337 458 552 598 718 922 1008 1085 1166 1419 1832 1894
52 100 201 274 403 462 534 616 705 914 1017 1128 1179 1414 1848 1895
9 109 225 281 400 477 499 609 651 896 1044 1124 1150 1405 1824 1896
49 136 199 283 361 414 559 571 681 941 1021 1068 1205 1454 1836 1897
53 113 191 261 325 473 511 578 669 921 1026 1122 1139 1395 1802 1898
68 118 173 304 395 443 521 580 682 953 984 1114 1200 1431 1830 1899
5 156 218 300 390 472 527 638 653 963 1007 1096 1198 1450 1782 1900
64 99 198 244 381 408 538 601 708 969 1006 1061 1151 1379 1791 1901
34 98 230 298 350 464 495 597 722 900 1000 1121 1185 1406 1844 1902
63 92 240 290 371 476 535 621 703 937 1039 1073 1203 1383 1799 1903
79 131 166 272 327 442 539 595 701 897 1047 1083 1196 1388 1788 1904
55 139 177 317 346 470 554 587 654 901 1030 1089 1158 1426 1813 1905
67 122 214 297 355 405 491 569 688 916 997 1100 1165 1449 1798 1906
33 89 174 249 382 431 550 614 706 933 1045 1057 1167 1448 1850 1907
61 137 178 259 359 484 520 594 699 912 1048 1097 1145 1442 1801 1908
0 140 193 265 364 439 549 626 661 962 988 1101 1188 1401 1823 1909
22 160 210 276 402 428 565 636 668 911 975 1116 1184 1409 1807 1910
75 147 189 313 345 453 541 642 670 927 1001 1133 1208 1392 1793 1911
30 93 239 273 344 438 553 573 728 903 1031 1112 1182 1439 1790 1912
19 123 188 277 338 410 519 610 691 915 1019 1082 1174 1407 1831 1913
44 111 204 292 377 441 547 570 687 961 1032 1111 1156 1410 1795 1914
29 124 180 309 385 463 486 574 711 909 1003 1127 1201 1430 1785 1915
1 95 192 288 368 447 508 589 685 891 978 1103 1181 1417 1860 1916
32 150 238 258 335 433 561 606 677 950 992 1115 1213 1443 1851 1917
54 84 186 287 383 430 516 585 659 923 973 1081 1143 1393 1820 1918
38 145 162 303 386 471 505 635 704 958 1051 1109 1149 1381 1841 1919
24 143 227 279 326 435 530 584 684 947 1004 1053 1160 1394 1797 1920
21 96 200 291 393 425 515 600 716 892 1038 1070 1197 1445 1816 1921
62 130 235 257 339 420 487 576 726 957 976 1123 1157 1420 1825 1922
26 148 224 285 369 411 518 588 652 929 1049 1078 1161 1434 1852 1923
16 141 169 243 357 460 540 634 663 960 1011 1067 1176 1415 1829 1924
11 103 234 246 370 481 524 582 700 902 1018 1092 1193 1413 1834 1925
2 110 206 299 341 437 510 567 660 966 1020 1077 1172 1446 1792 1926
51 112 237 254 396 456 507 623 664 952 998 1129 1142 1400 1815 1927
72 90 179 323 330 465 548 596 679 949 1041 1080 1171 1418 1814 1928
28 133 163 268 391 412 512 631 696 910 1037 1102 1187 1411 1808 1929
47 129 229 253 389 469 502 620 675 954 981 1086 1163 1453 1847 1930
56 153 226 305 342 474 497 645 725 944 1035 1072 1175 1380 1855 1931
3 127 187 256 376 432 488 630 674 939 1027 1069 1141 1382 1838 1932
60 119 231 278 394 455 537 602 690 930 1009 1110 1169 1440 1805 1933
65 101 221 262 387 454 558 633 666 899 974 1074 1134 1403 1853 1934
23 146 216 248 349 448 514 575 678 920 1034 1064 1210 1399 1856 1935
46 126 207 245 356 407 533 639 724 956 986 1059 1183 1423 1796 1936
45 158 176 286 358 415 542 625 672 895 996 1130 1138 1397 1783 1937
39 88 197 250 336 478 489 622 648 904 1002 1099 1207 1389 1809 1938
78 94 233 320 379 445 546 583 713 931 1013 1120 1152 1451 1839 1939
6 105 172 315 375 413 551 627 686 908 1050 1076 1137 1416 1827 1940
69 142 181 306 399 416 509 617 721 913 1010 1095 1189 1396 1840 1941
```

-continued

```
36 102 208 275 373 436 532 612 710 951 1014 1104 1140 1428 1811 1942
4 106 185 296 365 423 531 603 655 894 1029 1131 1162 1438 1786 1943
7 121 190 252 347 449 525 572 720 893 1046 1108 1146 1444 1800 1864
19 152 224 323 398 428 505 620 710 789 980 1067 1207 1256 1863
8 122 191 253 348 450 526 573 721 775 1047 1109 1147 1288 1865
28 139 229 272 393 480 565 594 693 778 1026 1114 1213 1295 1866
15 118 172 281 373 468 493 630 724 798 996 1072 1210 1217 1867
41 88 171 308 325 481 556 569 666 785 1025 1095 1171 1275 1868
71 117 165 285 335 452 523 578 650 731 1041 1094 1135 1238 1869
59 133 204 290 341 427 491 605 716 761 1017 1088 1205 1234 1870
72 109 212 248 352 441 494 582 713 749 1029 1127 1200 1258 1871
43 121 195 271 389 422 514 587 674 762 995 1055 1191 1232 1872
18 87 242 270 349 420 501 625 718 733 1023 1118 1160 1224 1873
32 115 210 264 353 453 527 568 708 788 972 1085 1181 1286 1874
13 81 213 303 368 407 557 647 703 802 984 1133 1137 1251 1875
11 156 233 311 385 425 545 641 694 783 1037 1056 1156 1231 1876
44 129 220 294 364 418 558 600 663 781 992 1076 1165 1263 1877
78 84 166 261 334 460 529 608 684 734 981 1063 1192 1273 1878
16 153 196 309 363 467 504 591 720 768 1006 1089 1169 1279 1879
9 98 184 312 379 469 518 638 659 786 991 1119 1174 1290 1880
51 83 197 252 355 447 499 606 668 779 1043 1107 1212 1247 1881
58 135 168 319 367 410 497 609 695 741 994 1120 1155 1287 1882
60 86 223 265 333 406 530 629 672 748 1016 1091 1154 1291 1883
38 108 237 295 361 430 564 616 677 750 1000 1066 1148 1226 1884
1 92 218 283 324 484 502 642 715 808 986 1080 1187 1243 1885
77 158 216 296 402 476 495 592 658 771 983 1061 1195 1222 1886
21 155 169 267 375 458 537 580 657 767 1024 1059 1178 1272 1887
75 116 203 322 330 423 544 593 651 791 988 1092 1145 1221 1888
67 160 221 256 399 483 546 644 690 765 978 1126 1193 1237 1889
49 150 214 317 344 435 524 619 698 757 973 1064 1196 1293 1890
14 145 176 315 329 445 487 633 681 739 1044 1057 1136 1225 1891
74 136 183 268 381 451 563 614 728 784 1013 1099 1203 1271 1892
26 105 185 302 332 462 507 612 696 764 1034 1106 1149 1219 1893
36 126 163 320 354 419 561 645 699 796 990 1108 1179 1215 1894
42 82 206 313 338 459 553 599 719 806 1009 1086 1167 1260 1895
53 101 202 275 404 463 535 617 706 732 1018 1129 1180 1233 1896
10 110 226 282 401 478 500 610 652 743 1045 1125 1151 1268 1897
50 137 200 284 362 415 560 572 682 780 1022 1069 1206 1257 1898
54 114 192 262 326 474 512 579 670 740 1027 1123 1140 1282 1899
69 119 174 305 396 444 522 581 683 744 985 1115 1201 1267 1900
6 157 219 301 391 473 528 639 654 759 1008 1097 1199 1239 1901
65 100 199 245 382 409 539 602 709 776 1007 1062 1152 1270 1902
35 99 231 299 351 465 496 598 723 755 1001 1122 1186 1292 1903
64 93 241 291 372 477 536 622 704 805 1040 1074 1204 1276 1904
80 132 167 273 328 443 540 596 702 754 1048 1084 1197 1262 1905
56 140 178 318 347 471 555 588 655 770 1031 1090 1159 1259 1906
68 123 215 298 356 405 492 570 689 746 998 1101 1166 1220 1907
34 90 175 250 383 432 551 615 707 758 1046 1058 1168 1264 1908
62 138 179 260 360 485 521 595 700 804 1049 1098 1146 1254 1909
0 141 194 266 365 440 550 627 662 752 989 1102 1189 1249 1910
23 161 211 277 403 429 566 637 669 729 976 1117 1185 1240 1911
76 148 190 314 346 454 542 643 671 793 1002 1054 1209 1289 1912
31 94 240 274 345 439 554 574 649 766 1032 1113 1183 1230 1913
20 124 189 278 339 411 520 611 692 801 1020 1083 1175 1266 1914
45 112 205 293 378 442 548 571 688 790 1033 1112 1157 1285 1915
30 125 181 310 386 464 486 575 712 735 1004 1128 1202 1294 1916
2 96 193 289 369 448 509 590 686 800 979 1104 1182 1241 1917
33 151 239 259 336 434 562 607 678 772 993 1116 1214 1218 1918
55 85 187 288 384 431 517 586 660 803 974 1082 1144 1223 1919
39 146 162 304 387 472 506 636 705 745 1052 1110 1150 1261 1920
25 144 228 280 327 436 531 585 685 809 1005 1053 1161 1284 1921
22 97 201 292 394 426 516 601 717 795 1039 1071 1198 1283 1922
63 131 236 258 340 421 488 577 727 792 977 1124 1158 1277 1923
27 149 225 286 370 412 519 589 653 753 1050 1079 1162 1236 1924
17 142 170 243 358 461 541 635 664 797 1012 1068 1177 1244 1925
12 104 235 247 371 482 525 583 701 787 1019 1093 1194 1227 1926
3 111 207 300 342 438 511 567 661 782 1021 1078 1173 1274 1927
52 113 238 255 397 457 508 624 665 773 999 1130 1143 1242 1928
73 91 180 244 331 466 549 597 680 742 1042 1081 1172 1245 1929
29 134 164 269 392 413 513 632 697 763 1038 1103 1188 1265 1930
48 130 230 254 390 470 503 621 676 799 982 1087 1164 1252 1931
57 154 227 306 343 475 498 646 726 738 1036 1073 1176 1278 1932
4 128 188 257 377 433 489 631 675 747 1028 1070 1142 1228 1933
61 120 232 279 395 456 538 603 691 774 1010 1111 1170 1216 1934
66 102 222 263 388 455 559 634 667 751 975 1075 1134 1229 1935
24 147 217 249 350 449 515 576 679 756 1035 1065 1211 1280 1936
47 127 208 246 357 408 534 640 725 794 987 1060 1184 1255 1937
46 159 177 287 359 416 543 626 673 737 997 1131 1139 1269 1938
40 89 198 251 337 479 490 623 648 736 1003 1100 1208 1250 1939
```

-continued

```
79 95 234 321 380 446 547 584 714 730 1014 1121 1153 1248 1940
7 106 173 316 376 414 552 628 687 769 1051 1077 1138 1281 1941
70 143 182 307 400 417 510 618 722 777 1011 1096 1190 1235 1942
37 103 209 276 374 437 533 613 711 760 1015 1105 1141 1253 1943
5 107 186 297 366 424 532 604 656 807 1030 1132 1163 1246 1864
```

7. GRS-based irregular LDPC (1944, 1620) code (7), R = ⅚

```
21 21 21 21 21 21 21 21 21 21 21 21 21 21 21 21 21 21 21 21 21 21 21 21 21 21 21
21 21 21 21 21 21 21 21 21 21 21 21 21 21 21 21 21 21 21 21 21 21 21 21 21 21 21
21 21 21 21 21 21 21 21 21 21 21 21 21 21 21 22 22 22 22 22 22 22 22 22 22 22 22
22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22
22 22 22 22 22 22 22 22 22 22 22 22 22 22 22 22 22 22 22 22 22 22 22 22 22 22 22
0 81 162 243 324 405 486 567 648 729 810 891 972 1053 1134 1215 1296 1377 1458 1539 1620
14 88 239 245 376 462 526 640 671 796 816 920 1052 1123 1269 1331 1427 1487 1543 1654
15 89 240 246 377 463 527 641 672 797 817 921 973 1124 1161 1270 1332 1428 1488 1544 1655
16 90 241 247 378 464 528 642 673 798 818 922 974 1125 1162 1271 1333 1429 1489 1545 1656
17 91 242 248 379 465 529 643 674 799 819 923 975 1126 1163 1272 1334 1430 1490 1546 1657
18 92 163 249 380 466 530 644 675 800 820 924 976 1127 1164 1273 1335 1431 1491 1547 1658
19 93 164 250 381 467 531 645 676 801 821 925 977 1128 1165 1274 1336 1432 1492 1548 1659
20 94 165 251 382 468 532 646 677 802 822 926 978 1129 1166 1275 1337 1433 1493 1549 1660
21 95 166 252 383 469 533 647 678 803 823 927 979 1130 1167 1276 1338 1434 1494 1550 1661
22 96 167 253 384 470 534 568 679 804 824 928 980 1131 1168 1277 1339 1435 1495 1551 1662
23 97 168 254 385 471 535 569 680 805 825 929 981 1132 1169 1278 1340 1436 1496 1552 1663
24 98 169 255 386 472 536 570 681 806 826 930 982 1133 1170 1279 1341 1437 1497 1553 1664
25 99 170 256 387 473 537 571 682 807 827 931 983 1054 1171 1280 1342 1438 1498 1554 1665
26 100 171 257 388 474 538 572 683 808 828 932 984 1055 1172 1281 1343 1439 1499 1555 1666
27 101 172 258 389 475 539 573 684 809 829 933 985 1056 1173 1282 1344 1440 1500 1556 1667
28 102 173 259 390 476 540 574 685 730 830 934 986 1057 1174 1283 1345 1441 1501 1557 1668
29 103 174 260 391 477 541 575 686 731 831 935 987 1058 1175 1284 1346 1442 1502 1558 1669
30 104 175 261 392 478 542 576 687 732 832 936 988 1059 1176 1285 1347 1443 1503 1559 1670
31 105 176 262 393 479 543 577 688 733 833 937 989 1060 1177 1286 1348 1444 1504 1560 1671
32 106 177 263 394 480 544 578 689 734 834 938 990 1061 1178 1287 1349 1445 1505 1561 1672
33 107 178 264 395 481 545 579 690 735 835 939 991 1062 1179 1288 1350 1446 1506 1562 1673
34 108 179 265 396 482 546 580 691 736 836 940 992 1063 1180 1289 1351 1447 1507 1563 1674
35 109 180 266 397 483 547 581 692 737 837 941 993 1064 1181 1290 1352 1448 1508 1564 1675
36 110 181 267 398 484 548 582 693 738 838 942 994 1065 1182 1291 1353 1449 1509 1565 1676
37 111 182 268 399 485 549 583 694 739 839 943 995 1066 1183 1292 1354 1450 1510 1566 1677
38 112 183 269 400 406 550 584 695 740 840 944 996 1067 1184 1293 1355 1451 1511 1567 1678
39 113 184 270 401 407 551 585 696 741 841 945 997 1068 1185 1294 1356 1452 1512 1568 1679
40 114 185 271 402 408 552 586 697 742 842 946 998 1069 1186 1295 1357 1453 1513 1569 1680
41 115 186 272 403 409 553 587 698 743 843 947 999 1070 1187 1216 1358 1454 1514 1570 1681
42 116 187 273 404 410 554 588 699 744 844 948 1000 1071 188 1217 1359 1455 1515 1571 1682
43 117 188 274 325 411 555 589 700 745 845 949 1001 1072 1189 1218 1360 1456 1516 1572 1683
44 118 189 275 326 412 556 590 701 746 846 950 1002 1073 1190 1219 1361 1457 1517 1573 1684
45 119 190 276 327 413 557 591 702 747 847 951 1003 1074 1191 1220 1362 1378 1518 1574 1685
46 120 191 277 328 414 558 592 703 748 848 952 1004 1075 1192 1221 1363 1379 1519 1575 1686
47 121 192 278 329 415 559 593 704 749 849 953 1005 1076 1193 1222 1364 1380 1520 1576 1687
48 122 193 279 330 416 560 594 705 750 850 954 1006 1077 1194 1223 1365 1381 1521 1577 1688
49 123 194 280 331 417 561 595 706 751 851 955 1007 1078 1195 1224 1366 1382 1522 1578 1689
50 124 195 281 332 418 562 596 707 752 852 956 1008 1079 1196 1225 1367 1383 1523 1579 1690
51 125 196 282 333 419 563 597 708 753 853 957 1009 1080 1197 1226 1368 1384 1524 1580 1691
52 126 197 283 334 420 564 598 709 754 854 958 1010 1081 1198 1227 1369 1385 1525 1581 1692
53 127 198 284 335 421 565 599 710 755 855 959 1011 1082 1199 1228 1370 1386 1526 1582 1693
54 128 199 285 336 422 566 600 711 756 856 960 1012 1083 1200 1229 1371 1387 1527 1583 1694
55 129 200 286 337 423 487 601 712 757 857 961 1013 1084 1201 1230 1372 1388 1528 1584 1695
56 130 201 287 338 424 488 602 713 758 858 962 1014 1085 1202 1231 1373 1389 1529 1585 1696
57 131 202 288 339 425 489 603 714 759 859 963 1015 1086 1203 1232 1374 1390 1530 1586 1697
58 132 203 289 340 426 490 604 715 760 860 964 1016 1087 1204 1233 1375 1391 1531 1587 1698
59 133 204 290 341 427 491 605 716 761 861 965 1017 1088 1205 1234 1376 1392 1532 1588 1699
60 134 205 291 342 428 492 606 717 762 862 966 1018 1089 1206 1235 1297 1393 1533 1589 1700
61 135 206 292 343 429 493 607 718 763 863 967 1019 1090 1207 1236 1298 1394 1534 1590 1621
62 136 207 293 344 430 494 608 719 764 864 968 1020 1091 1208 1237 1299 1395 1535 1591 1622
63 137 208 294 345 431 495 609 720 765 865 969 1021 1092 1209 1238 1300 1396 1536 1592 1623
64 138 209 295 346 432 496 610 721 766 866 970 1022 1093 1210 1239 1301 1397 1537 1593 1624
65 139 210 296 347 433 497 611 722 767 867 971 1023 1094 1211 1240 1302 1398 1538 1594 1625
66 140 211 297 348 434 498 612 723 768 868 892 1024 1095 1212 1241 1303 1399 1459 1595 1626
67 141 212 298 349 435 499 613 724 769 869 893 1025 1096 1213 1242 1304 1400 1460 1596 1627
68 142 213 299 350 436 500 614 725 770 870 894 1026 1097 1214 1243 1305 1401 1461 1597 1628
69 143 214 300 351 437 501 615 726 771 871 895 1027 1098 1135 1244 1306 1402 1462 1598 1629
70 144 215 301 352 438 502 616 727 772 872 896 1028 1099 1136 1245 1307 1403 1463 1599 1630
71 145 216 302 353 439 503 617 728 773 873 897 1029 1100 1137 1246 1308 1404 1464 1600 1631
72 146 217 303 354 440 504 618 649 774 874 898 1030 1101 1138 1247 1309 1405 1465 1601 1632
73 147 218 304 355 441 505 619 650 775 875 899 1031 1102 1139 1248 1310 1406 1466 1602 1633
```

-continued

```
74 148 219 305 356 442 506 620 651 776 876 900 1032 1103 1140 1249 1311 1407 1467 1603 1634
75 149 220 306 357 443 507 621 652 777 877 901 1033 1104 1141 1250 1312 1408 1468 1604 1635
76 150 221 307 358 444 508 622 653 778 878 902 1034 1105 1142 1251 1313 1409 1469 1605 1636
77 151 222 308 359 445 509 623 654 779 879 903 1035 1106 1143 1252 1314 1410 1470 1606 1637
78 152 223 309 360 446 510 624 655 780 880 904 1036 1107 1144 1253 1315 1411 1471 1607 1638
79 153 224 310 361 447 511 625 656 781 881 905 1037 1108 1145 1254 1316 1412 1472 1608 1639
80 154 225 311 362 448 512 626 657 782 882 906 1038 1109 1146 1255 1317 1413 1473 1609 1640
1 155 226 312 363 449 513 627 658 783 883 907 1039 1110 1147 1256 1318 1414 1474 1610 1641
2 156 227 313 364 450 514 628 659 784 884 908 1040 1111 1148 1257 1319 1415 1475 1611 1642
3 157 228 314 365 451 515 629 660 785 885 909 1041 1112 1149 1258 1320 1416 1476 1612 1643
4 158 229 315 366 452 516 630 661 786 886 910 1042 1113 1150 1259 1321 1417 1477 1613 1644
5 159 230 316 367 453 517 631 662 787 887 911 1043 1114 1151 1260 1322 1418 1478 1614 1645
6 160 231 317 368 454 518 632 663 788 888 912 1044 1115 1152 1261 1323 1419 1479 1615 1646
7 161 232 318 369 455 519 633 664 789 889 913 1045 1116 1153 1262 1324 1420 1480 1616 1647
8 82 233 319 370 456 520 634 665 790 890 914 1046 1117 1154 1263 1325 1421 1481 1617 1648
9 83 234 320 371 457 521 635 666 791 811 915 1047 1118 1155 1264 1326 1422 1482 1618 1649
10 84 235 321 372 458 522 636 667 792 812 916 1048 1119 1156 1265 1327 1423 1483 1619 1650
11 85 236 322 373 459 523 637 668 793 813 917 1049 1120 1157 1266 1328 1424 1484 1540 1651
12 86 237 323 374 460 524 638 669 794 814 918 1050 1121 1158 1267 1329 1425 1485 1541 1652
13 87 238 344 375 461 525 639 670 795 815 919 1051 1122 1159 1268 1330 1426 1486 1542 1653
21 154 226 245 400 430 507 622 712 791 843 949 982 1069 1209 1258 1362 1424 1533 1597 1637 1704
39 93 187 285 393 476 555 598 675 785 887 955 1042 1077 1196 1290 1318 1423 1498 1551 1639 1772
7 136 165 298 384 446 537 590 648 783 851 952 1050 1067 1175 1217 1302 1437 1514 1588 1693 1755
10 132 208 269 353 475 502 572 716 736 841 913 1033 1062 1145 1219 1368 1418 1490 1548 1685 1722
30 156 204 244 374 411 562 617 689 770 836 957 1000 1133 1174 1277 1365 1416 1502 1552 1667 1770
17 130 228 258 330 467 514 597 724 788 827 947 1048 1102 1190 1240 1326 1449 1468 1567 1632 1773
43 122 202 319 349 479 524 629 713 781 876 942 1051 1123 1166 1236 1370 1403 1496 1584 1692 1713
73 104 194 317 358 445 530 639 658 743 817 933 991 1079 1178 1260 1360 1421 1458 1563 1644 1780
61 149 176 270 385 473 541 645 723 750 853 902 978 1098 1144 1234 1355 1414 1537 1613 1654 1726
74 129 221 304 362 405 498 576 695 752 872 923 1004 1107 1172 1226 1346 1456 1510 1562 1660 1756
45 161 201 322 367 434 538 613 726 730 881 959 1034 1054 1134 1288 1315 1383 1465 1578 1671 1744
20 91 233 315 325 407 542 573 668 773 828 898 1022 1111 1213 1253 1336 1385 1534 1554 1628 1757
34 97 163 277 348 442 557 577 652 769 885 907 1035 1116 1186 1213 1372 1443 1479 1566 1668 1728
15 108 169 284 347 431 494 592 718 793 890 934 1006 1074 1141 1265 1311 1406 1464 1612 1672 1703
13 145 180 286 341 456 553 609 715 767 848 911 981 1097 1210 1275 1320 1402 1516 1560 1687 1717
46 105 217 264 380 441 523 588 676 759 871 916 995 1096 1155 1281 1347 1426 1467 1539 1624 1778
80 109 177 307 388 413 552 638 720 741 870 954 976 1090 1140 1292 1324 1400 1489 1601 1683 1776
18 124 181 303 371 444 488 587 710 786 864 897 974 1129 1192 1249 1329 1392 1473 1574 1653 1729
11 141 196 247 338 466 544 603 705 766 823 896 1007 1057 1143 1289 1367 1454 1459 1609 1682 1763
53 120 213 301 386 450 556 579 696 798 831 970 1041 1120 1165 1293 1310 1419 1536 1598 1698 1781
60 90 192 293 389 436 522 591 665 808 814 929 979 1087 1149 1228 1309 1399 1497 1543 1674 1773
62 119 242 275 329 433 550 637 686 734 861 937 1052 1055 1135 1245 1303 1431 1461 1608 1686 1736
40 135 191 320 396 474 486 585 722 745 829 920 1014 1058 1212 1224 1342 1441 1531 1580 1652 1743
3 111 207 300 342 438 511 567 661 782 832 967 1021 1078 1173 1274 1350 1447 1526 1611 1680 1745
79 123 183 252 372 428 564 626 670 742 852 935 1023 1065 1137 1223 1333 1378 1517 1553 1620 1723
23 89 195 262 360 423 519 599 697 746 839 938 1001 1091 1207 1239 1300 1415 1486 1617 1641 1766
77 117 241 268 373 414 508 634 674 761 865 958 1044 1121 1202 1295 1348 1455 1507 1603 1694 1762
69 81 189 279 344 463 533 623 679 778 815 945 1040 1109 1193 1227 1351 1379 1463 1600 1649 1706
51 158 162 316 399 484 518 568 717 757 883 971 984 1122 1162 1273 1371 1394 1482 1561 1638 1760
16 131 230 276 333 440 490 633 660 807 816 921 1038 1093 1183 1221 1358 1411 1491 1605 1663 1752
76 86 203 280 394 459 521 605 659 756 867 909 1030 1068 1139 1215 1304 1390 1518 1595 1648 1734
28 155 238 295 392 468 543 636 653 772 842 922 1012 1082 1158 1262 1334 1440 1495 1590 1700 1779
38 100 227 312 345 415 527 578 692 748 856 893 977 1061 1194 1235 1322 1389 1500 1581 1651 1759
44 85 172 291 379 472 513 642 700 760 837 948 1037 1061 1194 1270 1335 1405 1538 1550 1673 1711
55 137 237 261 397 477 510 628 683 806 835 962 989 1094 1171 1259 1306 1381 1481 1571 1657 1721
12 88 209 290 390 435 551 625 650 754 868 943 999 1128 1176 1284 1361 1393 1480 1607 1643 1727
52 110 240 306 352 458 515 586 698 729 822 941 1005 1066 1214 1269 1375 1439 1474 1546 1640 1738
56 94 182 282 359 457 505 630 701 795 840 894 1016 1059 1157 1241 1356 1387 1513 1555 1681 1775
71 160 166 294 361 451 500 620 721 768 833 928 973 1101 1156 1272 1354 1377 1521 1582 1645 1735
8 157 232 260 339 410 491 615 708 803 875 946 1013 1108 1150 1294 1307 1428 1504 1559 1635 1739
67 118 229 288 382 418 540 606 654 792 882 939 1017 1110 1189 1278 1341 1401 1471 1564 1630 1754
37 82 190 243 378 481 561 575 684 737 884 901 1032 1088 1197 1264 1359 1436 1519 1602 1621 1771
66 152 234 249 402 448 517 596 672 802 862 908 1049 1131 1180 1261 1352 1425 1522 1545 1670 1750
2 147 224 302 376 416 536 632 685 774 825 910 1028 1127 1147 1222 1314 1450 1462 1544 1691 1720
58 138 219 257 368 419 545 571 656 805 821 968 998 1071 1195 1266 1321 1435 1529 1618 1647 1749
70 107 210 246 350 439 492 580 711 747 845 931 1027 1125 1196 1264 1323 1407 1475 1577 1666 1765
36 128 179 271 395 426 549 607 725 731 819 927 1043 1117 1138 1251 1301 1438 1505 1585 1675 1741
64 84 200 256 375 452 554 584 706 797 811 951 1019 1099 1205 1242 1344 1380 1493 1568 1622 1753
0 103 236 308 327 482 512 589 704 794 873 925 1031 1064 1151 1291 1340 1444 1506 1615 1679 1719
25 112 175 259 337 470 535 627 657 755 838 917 997 1124 1181 1232 1364 1430 1477 1583 1684 1725
78 139 184 281 343 483 534 570 691 799 818 899 1025 1076 1169 1268 1338 1427 1532 1586 1642 1701
33 116 211 265 354 454 528 569 709 789 850 944 972 1086 1182 1287 1330 1388 1466 1606 1665 1708
22 121 188 251 391 429 487 643 702 784 860 924 986 1092 1153 1216 1312 1432 1527 1593 1664 1761
47 159 193 248 351 443 495 602 664 775 866 956 1039 1103 1208 1243 1357 1422 1525 1619 1658 1716
32 102 231 289 355 424 558 610 671 744 877 966 994 1060 1142 1220 1337 1417 1478 1569 1697 1705
4 101 174 253 370 422 525 593 673 765 834 892 983 1100 1203 1225 1369 1408 1512 1557 1625 1730
35 95 173 323 387 455 493 640 651 801 874 903 1008 1104 1201 1263 1299 1457 1530 1570 1688 1715
57 134 167 318 366 409 496 608 694 740 878 940 993 1119 1154 1286 1305 1398 1523 1541 1655 1767
41 142 206 309 336 427 516 611 690 749 813 900 1045 1056 1188 1285 1316 1434 1485 1596 1623 1718
```

-continued

```
27 125 214 278 365 420 503 631 714 776 830 904 996 1115 1206 1279 1353 1453 1492 1610 1626 1740
24 92 197 299 381 462 529 618 688 753 889 919 1018 1085 1199 1238 1313 1382 1494 1591 1646 1724
65 140 164 255 357 469 559 644 680 758 859 936 1002 1114 1161 1246 1317 1409 1472 1589 1633 1710
29 143 212 274 369 471 547 594 662 796 888 915 988 1130 1168 1229 1332 1386 1515 1542 1659 1707
19 83 215 283 335 449 560 582 707 739 824 965 985 1106 1170 1276 1349 1391 1511 1576 1689 1748
14 150 235 310 363 412 531 595 687 738 880 914 1026 1118 1148 1244 1328 1429 1535 1594 1677 1712
5 96 222 287 324 408 506 646 719 732 812 930 990 1084 1191 1247 1298 1452 1509 1587 1690 1702
54 126 168 292 404 432 520 621 649 771 858 906 980 1112 1187 1267 1327 1451 1501 1549 1661 1777
75 114 198 250 377 406 501 635 655 779 886 918 975 1053 1211 1254 1343 1445 1483 1556 1636 1768
31 127 186 273 332 478 499 616 666 762 810 964 1046 1073 1185 1280 1319 1404 1528 1558 1650 1737
50 98 199 272 401 460 532 614 703 809 847 912 1015 1126 1177 1230 1331 1412 1508 1616 1631 1758
59 153 170 266 346 425 566 647 663 777 820 891 1036 1081 1159 1218 1271 1297 1395 1460 1579 1629 1714
6 87 225 305 331 485 504 601 667 780 855 953 992 1070 1204 1231 1325 1442 1470 1575 1662 1733
63 148 239 313 383 437 497 619 682 800 844 926 1011 1095 1184 1282 1296 1410 1476 1599 1696 1742
68 146 220 296 334 447 539 612 699 787 869 961 1020 1080 1136 1257 1366 1413 1487 1573 1634 1769
26 99 218 263 356 453 546 574 678 733 854 950 1047 1132 1164 1271 1339 1433 1524 1565 1627 1746
49 133 171 311 340 464 548 581 728 763 826 895 1024 1083 1152 1252 1374 1420 1484 1547 1669 1751
48 151 205 314 326 421 526 583 677 751 857 960 1029 1105 1163 1250 1363 1446 1488 1592 1676 1709
42 144 223 254 403 461 489 641 693 764 879 932 987 1089 1200 1283 1308 1396 1503 1572 1678 1732
1 106 216 321 364 465 565 604 669 735 863 963 1010 1075 1160 1237 1373 1384 1520 1604 1656 1731
9 113 178 267 328 480 509 600 681 790 849 905 1009 1072 1164 1255 1345 1397 1499 1614 1699 1725
72 115 185 297 398 417 563 624 727 804 846 969 1003 1113 1179 1248 1376 1448 1469 1540 1695 1764
23 156 228 247 402 432 509 624 714 793 845 951 984 1071 1211 1260 1364 1426 1535 1599 1706 1792
11 115 180 269 330 482 511 602 683 792 851 907 1011 1074 1126 1257 1347 1399 1501 1616 1727 1823
74 117 187 299 400 419 565 626 649 806 848 971 1005 1115 1181 1250 1298 1450 1471 1542 1766 1827
41 95 189 287 395 478 557 600 677 787 889 957 1044 1079 1198 1292 1320 1425 1500 1553 1774 1842
9 138 167 300 386 448 539 592 648 785 853 954 1052 1069 1177 1219 1304 1439 1516 1590 1757 1859
12 134 210 271 355 477 504 574 718 738 843 915 1035 1064 1147 1221 1370 1420 1492 1550 1724 1838
32 158 206 246 376 413 564 619 691 772 838 959 1002 1055 1176 1279 1367 1418 1504 1554 1772 1808
19 132 230 260 332 469 516 599 726 790 829 949 1050 1104 1192 1242 1328 1451 1470 1569 1775 1837
45 124 204 321 351 481 526 631 715 783 878 944 973 1125 1168 1238 1372 1405 1498 1586 1715 1853
75 106 196 319 360 447 532 641 660 745 819 935 993 1081 1180 1262 1362 1423 1458 1565 1702 1829
63 151 178 272 387 475 543 647 725 752 855 904 980 1100 1146 1357 1416 1459 1615 1728 1841
76 131 223 306 364 405 500 578 697 754 874 925 1006 1109 1174 1228 1348 1378 1512 1564 1758 1807
47 83 203 244 369 436 540 615 728 732 883 961 1036 1056 1134 1290 1317 1385 1467 1580 1746 1835
22 93 235 317 327 409 544 575 670 775 830 900 1024 1113 1135 1255 1338 1387 1536 1556 1759 1782
36 99 165 279 350 444 559 579 654 771 887 909 1037 1118 1188 1215 1374 1445 1481 1568 1730 1796
17 110 171 286 349 433 496 594 720 795 812 936 1008 1076 1143 1267 1313 1408 1466 1614 1705 1849
15 147 182 288 343 458 555 611 717 769 850 913 983 1099 1212 1277 1322 1404 1518 1562 1719 1804
48 107 219 266 382 443 525 590 678 761 873 918 997 1098 1157 1283 1349 1428 1469 1539 1780 1793
2 111 179 309 390 415 554 640 722 743 872 956 978 1092 1142 1294 1326 1402 1491 1603 1778 1818
20 126 183 305 373 446 490 589 712 788 866 899 976 1131 1194 1251 1331 1394 1475 1576 1731 1803
13 143 198 249 340 468 546 605 707 768 825 898 1009 1059 1145 1291 1369 1456 1461 1611 1765 1855
55 122 215 303 388 452 558 581 698 800 833 892 1043 1122 1167 1295 1312 1421 1538 1600 1703 1806
62 92 194 295 391 438 524 593 667 730 816 931 981 1089 1151 1230 1311 1401 1499 1545 1776 1828
64 121 164 277 331 435 552 639 688 736 863 939 974 1057 1137 1247 1305 1433 1463 1610 1738 1812
42 137 193 322 398 476 486 587 724 747 831 922 1016 1060 1214 1226 1344 1443 1533 1582 1745 1798
5 113 209 302 344 440 513 567 663 784 834 969 1023 1080 1175 1276 1352 1449 1528 1613 1747 1795
1 125 185 254 374 430 566 628 672 744 854 937 1025 1067 1139 1225 1335 1380 1519 1555 1725 1836
25 91 197 264 362 425 521 601 699 748 841 940 1003 1093 1209 1241 1302 1417 1488 1619 1768 1800
79 119 163 270 375 416 510 636 676 763 867 960 1046 1123 1204 1217 1350 1457 1509 1605 1764 1790
71 81 191 281 346 465 535 625 681 780 817 947 1042 1111 1195 1229 1353 1381 1465 1602 1708 1785
53 160 162 318 401 406 520 570 719 759 885 893 986 1124 1164 1275 1373 1396 1484 1563 1762 1856
18 133 232 278 335 442 492 635 662 809 818 923 1040 1095 1185 1220 1360 1413 1493 1607 1754 1825
78 88 205 282 396 461 523 607 661 758 869 911 1032 1070 1141 1215 1306 1392 1520 1597 1736 1846
30 157 240 297 394 470 545 638 655 774 844 924 1014 1084 1160 1264 1336 1442 1497 1592 1781 1802
40 102 229 314 347 417 529 580 694 750 858 895 979 1065 1169 1237 1324 1391 1502 1583 1761 1821
46 87 174 293 381 474 515 644 702 762 839 950 1039 1063 1196 1272 1337 1407 1460 1552 1713 1830
57 139 239 263 399 479 512 630 685 808 837 964 991 1096 1173 1261 1308 1383 1483 1573 1723 1857
14 90 211 292 392 437 553 627 652 756 870 945 1001 1130 1178 1286 1363 1395 1482 1609 1729 1834
54 112 242 308 354 460 517 588 700 729 824 943 1007 1068 1136 1271 1297 1441 1476 1548 1740 1839
58 96 184 284 361 459 507 632 703 797 842 896 1018 1061 1159 1224 1358 1389 1515 1557 1777 1797
73 82 168 296 363 453 502 622 723 770 835 930 975 1103 1158 1274 1356 1377 1523 1584 1737 1820
10 159 234 262 341 412 493 617 710 805 877 948 1015 1110 1152 1216 1309 1430 1506 1561 1741 1819
69 120 231 290 384 420 542 608 656 794 884 941 1019 1112 1191 1280 1343 1403 1473 1566 1756 1813
39 84 192 243 380 483 563 577 686 739 886 903 1034 1090 1149 1183 1521 1604 1773 1852
68 154 236 251 404 450 519 598 674 804 864 910 1051 1133 1182 1263 1354 1427 1524 1547 1752 1860
4 149 226 304 378 418 538 634 687 776 827 912 1030 1129 1149 1224 1316 1452 1464 1546 1722 1843
60 140 221 259 370 421 547 573 658 807 823 970 1000 1073 1197 1268 1323 1437 1531 1540 1751 1810
72 109 212 248 352 441 494 582 713 749 847 933 1029 1127 1200 1287 1325 1409 1477 1579 1767 1858
38 130 181 273 397 428 551 609 727 733 821 929 1045 1119 1140 1253 1303 1440 1507 1587 1743 1861
66 86 202 258 377 454 556 586 708 799 813 953 1021 1101 1207 1244 1346 1382 1495 1570 1755 1801
0 105 238 310 329 484 514 591 706 796 875 927 1033 1066 1153 1293 1342 1446 1508 1617 1721 1788
27 114 177 261 339 472 537 629 659 757 840 919 999 1126 1192 1432 1479 1585 1749 1814
80 141 186 283 345 485 536 572 693 801 820 901 1027 1078 1171 1270 1340 1429 1534 1588 1701 1844
35 118 213 267 356 456 530 571 711 791 852 946 972 1088 1184 1289 1332 1390 1468 1608 1710 1832
24 123 190 253 393 431 489 645 704 786 862 926 988 1094 1155 1218 1314 1434 1529 1595 1763 1845
49 161 195 250 353 445 497 604 666 777 868 958 1041 1105 1210 1245 1359 1424 1527 1541 1718 1816
34 104 233 291 357 426 560 612 673 746 879 968 996 1062 1144 1222 1339 1419 1480 1571 1707 1791
```

-continued

```
 6 103 176 255 372 424 527 595 675 767 836 894 985 1102 1205 1227 1371 1410 1514 1559 1732 1805
37 97 175 245 389 457 495 642 653 803 876 905 1010 1106 1203 1265 1301 1379 1532 1572 1717 1786
59 136 169 320 368 411 498 610 696 742 880 942 995 1121 1156 1288 1307 1400 1525 1543 1769 1784
43 144 208 311 338 429 518 613 692 751 815 902 1047 1058 1190 1287 1318 1436 1487 1598 1720 1817
29 127 216 280 367 422 505 633 716 778 832 906 998 1117 1208 1281 1355 1455 1494 1612 1742 1851
26 94 199 301 383 464 531 620 690 755 811 921 1020 1087 1201 1240 1315 1384 1496 1593 1726 1789
67 142 166 257 359 471 561 646 682 760 861 938 1004 1116 1163 1248 1319 1411 1474 1591 1712 1862
31 145 214 276 371 473 549 596 664 798 890 917 990 1132 1170 1231 1334 1388 1517 1544 1709 1824
21 85 217 285 337 451 562 584 709 741 826 967 987 1108 1172 1278 1351 1393 1513 1578 1750 1831
16 152 237 312 365 414 533 597 689 740 882 916 1028 1120 1150 1246 1330 1431 1537 1596 1714 1833
 7 98 224 289 324 410 508 568 721 734 814 932 992 1086 1193 1249 1300 1454 1511 1589 1704 1811
56 128 170 294 326 434 522 623 651 773 860 908 982 1114 1189 1269 1329 1453 1503 1551 1779 1854
77 116 200 252 379 408 503 637 657 781 888 920 977 1053 1213 1256 1345 1447 1485 1558 1770 1850
33 129 188 275 334 480 501 618 668 764 810 966 1048 1075 1187 1282 1321 1406 1530 1560 1739 1794
52 100 201 274 403 462 534 616 705 731 849 914 1017 1128 1179 1232 1333 1414 1510 1618 1760 1848
61 155 172 268 348 427 488 569 665 779 822 891 1038 1083 1161 1220 1299 1397 1462 1581 1716 1840
 8 89 227 307 333 407 506 603 669 782 857 955 994 1072 1206 1233 1327 1444 1472 1577 1735 1822
65 150 241 315 385 439 499 621 684 802 846 928 1013 1097 1186 1284 1296 1412 1478 1601 1744 1787
70 148 222 298 336 449 541 614 701 789 871 963 1022 1082 1138 1259 1368 1415 1489 1575 1771 1847
28 101 220 265 358 455 548 576 680 735 856 952 1049 1054 1148 1251 1341 1453 1526 1567 1748 1799
51 135 173 313 342 466 550 583 650 765 828 897 1026 1085 1154 1254 1376 1422 1486 1549 1753 1809
50 153 207 316 328 423 528 585 679 753 859 962 1031 1107 1165 1252 1365 1448 1490 1594 1711 1815
44 146 225 256 325 463 491 643 695 766 881 934 989 1091 1202 1285 1310 1398 1505 1574 1734 1826
 3 108 218 323 366 467 487 606 671 737 865 965 1012 1077 1162 1239 1375 1386 1522 1606 1733 1783
25 158 230 249 404 434 511 626 716 795 847 953 986 1073 1213 1262 1366 1428 1537 1601 1794 1863
46 148 227 258 327 465 493 645 697 768 883 936 991 1093 1204 1287 1312 1400 1507 1576 1828 1905
 5 110 220 245 368 469 489 608 673 739 867 967 1014 1079 1164 1241 1297 1388 1524 1608 1785 1906
13 117 182 271 332 484 513 604 685 794 853 909 1013 1076 1168 1259 1349 1401 1503 1618 1825 1907
76 119 189 301 402 421 487 628 651 808 850 893 1007 1117 1183 1252 1300 1452 1473 1544 1829 1908
43 97 191 289 397 480 559 602 679 789 811 959 1046 1081 1200 1294 1322 1427 1502 1555 1844 1909
11 140 169 302 388 450 541 594 648 787 855 956 974 1071 1179 1221 1306 1441 1518 1592 1861 1910
14 136 212 273 357 479 506 576 720 740 845 917 1037 1066 1149 1223 1372 1422 1494 1552 1840 1911
34 160 208 248 378 415 566 621 693 774 840 961 1004 1057 1178 1281 1369 1420 1506 1556 1810 1912
21 134 232 262 334 471 518 601 728 792 831 951 1052 1106 1194 1244 1330 1453 1472 1571 1874 1913
47 126 206 323 353 483 528 633 717 785 880 946 975 1127 1170 1240 1374 1407 1500 1588 1855 1914
77 108 198 321 362 449 534 643 662 747 821 937 995 1083 1182 1264 1364 1425 1458 1567 1831 1915
65 153 180 274 389 477 545 569 727 754 857 906 982 1102 1148 1238 1359 1418 1461 1617 1843 1916
78 133 225 308 366 405 502 580 699 756 876 927 1008 1111 1176 1230 1350 1380 1514 1566 1809 1917
49 85 205 246 371 438 542 617 650 734 885 963 1038 1058 1134 1292 1319 1387 1469 1582 1837 1918
24 95 237 319 329 411 546 577 672 777 832 902 1026 1115 1137 1257 1340 1389 1538 1558 1782 1919
38 101 167 281 352 446 561 581 656 773 889 911 1039 1120 1190 1237 1376 1447 1483 1570 1798 1920
19 112 173 288 351 435 498 596 722 797 814 938 1010 1078 1145 1269 1315 1410 1468 1616 1851 1921
17 149 184 290 345 460 557 613 719 771 852 915 985 1101 1214 1279 1324 1406 1520 1564 1806 1922
50 109 221 268 384 445 527 592 680 763 875 920 999 1100 1159 1285 1351 1430 1471 1539 1795 1923
 4 113 181 311 392 417 556 642 724 745 874 958 980 1094 1144 1216 1328 1404 1493 1605 1820 1924
22 128 185 307 375 448 492 591 714 790 868 901 978 1133 1196 1253 1333 1396 1477 1578 1805 1925
15 145 200 251 342 470 548 607 709 770 827 900 1011 1061 1147 1293 1371 1378 1463 1613 1857 1926
57 124 217 305 390 454 560 583 700 802 835 894 1045 1124 1169 1217 1314 1423 1460 1602 1808 1927
64 94 196 297 393 440 526 595 669 732 818 933 983 1091 1153 1232 1313 1403 1501 1547 1830 1928
66 123 166 279 333 437 554 641 690 738 865 941 976 1059 1139 1249 1307 1435 1465 1612 1814 1929
44 139 195 244 400 478 486 589 726 749 833 924 1018 1062 1136 1228 1346 1445 1535 1584 1800 1930
 7 115 211 304 346 442 515 567 665 786 836 971 1025 1082 1177 1278 1354 1451 1530 1615 1797 1931
 3 127 187 256 376 432 488 630 674 746 856 939 1001 1141 1227 1337 1382 1521 1557 1838 1932
27 93 199 266 364 427 523 603 701 750 843 942 1005 1095 1211 1243 1304 1419 1490 1541 1802 1933
 1 121 165 272 377 418 512 638 678 765 869 962 1048 1125 1206 1219 1352 1379 1511 1607 1792 1934
73 81 193 283 348 467 537 627 683 782 819 949 1044 1113 1197 1231 1355 1383 1467 1604 1787 1935
55 82 162 320 403 408 522 572 721 761 887 895 988 1126 1166 1277 1375 1398 1486 1565 1858 1936
20 135 234 280 337 444 494 637 664 731 820 925 1042 1097 1187 1225 1362 1415 1495 1609 1827 1937
80 90 207 284 398 463 525 609 663 760 871 913 1034 1072 1143 1215 1308 1394 1522 1599 1848 1938
32 159 242 299 396 472 547 640 657 776 846 926 1016 1086 1162 1266 1338 1444 1499 1594 1804 1939
42 104 231 316 349 419 531 582 696 752 860 897 981 1067 1171 1239 1326 1393 1504 1585 1823 1940
48 89 176 295 383 476 517 646 704 764 841 952 1041 1065 1198 1274 1339 1409 1462 1554 1832 1941
59 141 241 265 401 481 514 632 687 730 839 966 993 1098 1175 1263 1310 1385 1485 1575 1859 1942
16 92 213 294 394 439 555 629 654 758 872 947 1003 1132 1180 1288 1365 1397 1484 1611 1836 1943
56 114 164 310 356 462 519 590 702 729 826 945 1009 1070 1138 1273 1299 1443 1478 1550 1841 1864
60 98 186 286 363 461 509 634 705 799 844 898 1020 1063 1161 1245 1360 1391 1517 1559 1798 1865
75 84 170 298 365 455 504 624 725 772 837 932 977 1105 1160 1276 1358 1377 1525 1586 1822 1866
12 161 236 264 343 414 495 619 712 807 879 950 1017 1112 1154 1218 1311 1432 1508 1563 1821 1867
71 122 233 292 386 422 544 610 658 796 886 943 1021 1114 1193 1282 1345 1405 1475 1568 1815 1868
41 86 194 243 382 485 565 579 688 741 888 905 1036 1092 1201 1268 1363 1440 1523 1606 1854 1869
70 156 238 253 326 452 521 600 676 806 866 912 973 1055 1184 1265 1356 1429 1526 1549 1862 1870
 6 151 228 306 380 420 540 636 689 778 829 914 1032 1131 1151 1226 1318 1454 1466 1548 1845 1871
62 142 223 261 372 423 549 575 660 809 825 892 1002 1075 1199 1270 1325 1439 1533 1542 1812 1872
74 111 214 250 354 443 496 584 715 751 849 935 1031 1129 1202 1260 1327 1411 1479 1581 1860 1873
40 132 183 275 399 430 553 611 649 735 823 931 1047 1121 1142 1255 1305 1442 1509 1589 1783 1874
68 88 204 260 379 456 558 588 710 801 815 955 1023 1103 1209 1246 1348 1384 1497 1572 1803 1875
 0 107 240 312 331 406 516 593 708 798 877 929 1035 1068 1155 1295 1344 1448 1510 1619 1790 1876
29 116 179 263 341 474 539 631 661 759 842 921 1001 1128 1185 1236 1368 1434 1481 1587 1816 1877
 2 143 188 285 347 407 538 574 695 803 822 903 1029 1080 1173 1272 1342 1431 1536 1590 1846 1878
```

-continued

```
37 120 215 269 358 458 532 573 713 793 854 948 972 1090 1186 1291 1334 1392 1470 1610 1834 1879
26 125 192 255 395 433 491 647 706 788 864 928 990 1096 1157 1220 1316 1436 1531 1597 1847 1880
51 83 197 252 355 447 499 606 668 779 870 960 1043 1107 1212 1247 1361 1426 1529 1543 1818 1881
36 106 235 293 359 428 562 614 675 748 881 970 998 1064 1146 1224 1341 1421 1482 1573 1793 1882
8 105 178 257 374 426 529 597 677 769 838 896 987 1104 1207 1229 1373 1412 1516 1561 1807 1883
39 99 177 247 391 459 497 644 655 805 878 907 1012 1108 1205 1267 1303 1381 1534 1574 1788 1884
61 138 171 322 370 413 500 612 698 744 882 944 997 1123 1158 1290 1309 1402 1527 1545 1786 1885
45 146 210 313 340 431 520 615 694 753 817 904 1049 1060 1192 1289 1320 1438 1489 1600 1819 1886
31 129 218 282 369 424 507 635 718 780 834 908 1000 1119 1210 1283 1357 1457 1496 1614 1853 1887
28 96 201 303 385 466 533 622 692 757 813 923 1022 1089 1203 1242 1317 1386 1498 1595 1791 1888
69 144 168 259 361 473 563 568 684 762 863 940 1006 1118 1165 1250 1321 1413 1476 1593 1784 1889
33 147 216 278 373 475 551 598 666 800 812 919 992 1054 1172 1233 1336 1390 1519 1546 1826 1890
23 87 219 287 339 453 564 586 711 743 828 969 989 1110 1174 1280 1353 1395 1515 1580 1833 1891
18 154 239 314 367 416 535 599 691 742 884 918 1030 1122 1152 1248 1332 1433 1459 1598 1835 1892
9 100 226 291 324 412 510 570 723 736 816 934 994 1088 1195 1251 1302 1456 1513 1591 1813 1893
58 130 172 296 328 436 524 625 653 775 862 910 984 1116 1191 1271 1331 1455 1505 1553 1856 1894
79 118 202 254 381 410 505 639 659 783 890 922 979 1053 1135 1258 1347 1449 1487 1560 1852 1895
35 131 190 277 336 482 503 620 670 766 810 968 1050 1077 1189 1284 1323 1408 1532 1562 1796 1896
54 102 203 276 325 464 536 618 707 733 851 916 1019 1130 1181 1234 1335 1416 1512 1540 1850 1897
63 157 174 270 350 429 490 571 667 781 824 891 1040 1085 1163 1222 1301 1399 1464 1583 1842 1898
10 91 229 309 335 409 508 605 671 784 859 957 996 1074 1208 1235 1329 1446 1474 1579 1824 1899
67 152 163 317 387 441 501 623 686 804 848 930 1015 1099 1188 1286 1296 1414 1480 1603 1789 1900
72 150 224 300 338 451 543 616 703 791 873 965 1024 1084 1140 1261 1370 1417 1491 1577 1849 1901
30 103 222 267 360 457 550 578 682 737 858 954 1051 1056 1150 1275 1343 1437 1528 1569 1801 1902
53 137 175 315 344 468 552 585 652 767 830 899 1028 1087 1156 1256 1298 1424 1488 1551 1811 1903
52 155 209 318 330 425 530 587 681 755 861 964 1033 1109 1167 1254 1367 1450 1492 1596 1817 1904
```

What is claimed is:

1. A computer implemented method for constructing a parity check matrix that corresponds to a GRS (Generalized Reed-Solomon)-based irregular LDPC (Low Density Parity Check) code, the method comprising:
choosing a plurality of possible bit degree distributions for an LDPC code block;
selecting a bit degree distribution from among the plurality of possible bit degree distributions, wherein the selected bit degree distribution has a best performance threshold among the plurality of possible bit degree distributions;
decomposing a parity check matrix that corresponds to a GRS-based regular LDPC code into a plurality of partial-matrices based on the selected bit degree distribution, wherein each partial-matrix of the plurality of partial-matrices has a corresponding bit degree and each partial-matrix of the plurality of partial-matrices has a corresponding plurality of permutation matrices; and
replacing at least one permutation matrix within at least one partial-matrix of the plurality of partial-matrices with a zero matrix thereby generating a parity check matrix that corresponds to a GRS-based irregular LDPC code; and
decoding an LDPC coded signal, that has been encoded using the GRS-based irregular LDPC code, using the parity check matrix that corresponds to the GRS-based irregular LDPC code, thereby making a best estimate of at least one information bit encoded within the LDPC coded signal.

2. The method of claim 1, further comprising:
performing a density evolution method analysis to each bit degree distribution of the plurality of possible bit degree distributions thereby generating a plurality of corresponding density evolution method analysis resultants; and
selecting the bit degree distribution from among the plurality of possible bit degree distributions by comparing the density evolution method analysis resultants.

3. The method of claim 1, wherein:
the plurality of partial-matrices comprises three partial-matrices.

4. The method of claim 1, further comprising:
replacing at least one permutation matrix within a first partial-matrix of the three partial-matrices with a zero matrix; and
replacing at least one permutation matrix within a second partial-matrix of the three partial-matrices with a zero matrix.

5. The method of claim 1, further comprising:
generating at least one additional parity check matrix that corresponds to at least one additional GRS-based irregular LDPC code;
determining a first performance, in terms of BLER (Block Error Rate) as a function of SNR (Signal to Noise Ratio), corresponding to the GRS-based irregular LDPC code as applied to a communication channel;
determining a second performance, in terms of BLER as a function of SNR, corresponding to the at least one additional GRS-based irregular LDPC code as applied to the communication channel; and
selecting the GRS-based irregular LDPC code when the first performance has a lower error floor than the second performance; and
selecting the at least one additional GRS-based irregular LDPC code when the second performance has a lower error floor than the first performance.

6. The method of claim 1, wherein:
the selected bit degree distribution from among the plurality of possible bit degree distributions comprises three bit degrees.

7. The method of claim 1, wherein:
each permutation matrix of each corresponding plurality of permutation matrices is an 81×81 matrix.

8. The method of claim 1, wherein:
the zero matrix is an 81×81 matrix having all 0 valued entries.

9. The method of claim 1, wherein:
the GRS-based regular LDPC code has a minimum distance; and
the GRS-based irregular LDPC code also has the minimum distance.

10. The method of claim 1, wherein:
each loop of an LDPC bipartite graph that corresponds to the GRS-based irregular LDPC code is at least a size of 6.

11. The method of claim 1, further comprising:
constructing a generator matrix that corresponds to the parity check matrix that corresponds to the GRS-based irregular LDPC code; and
encoding at least one information bit using the generator matrix thereby generating at least one LDPC codeword of at least one additional LDPC coded signal.

12. The method of claim 1, wherein:
the method is performed within a communication device; and
the communication device is implemented within at least one of a satellite communication system, a wireless communication system, a wired communication system, and a fiber-optic communication system.

13. A computer implemented method for selecting a GRS (Generalized Reed-Solomon)-based irregular LDPC (Low Density Parity Check) code, the method comprising:
constructing a plurality of parity check matrices that corresponds to a plurality of GRS-based irregular LDPC codes;
determining a plurality of performances, in terms of BLER (Block Error Rate) as a function of SNR (Signal to Noise Ratio), that corresponds to each GRS-based irregular LDPC code of the plurality of GRS-based irregular LDPC codes as applied to a communication channel; and
selecting a GRS-based irregular LDPC code, having a corresponding parity check matrix, from among the plurality of GRS-based irregular LDPC codes having a lowest error floor as determined from the plurality of performances.

14. The method of claim 13, further comprising:
considering a complexity of a first decoder to be implemented to decode signals coded according to a first GRS-based irregular LDPC code of the plurality of GRS-based irregular LDPC codes;
considering a complexity of a second decoder to be implemented to decode signals coded according to a second GRS-based irregular LDPC code of the plurality of GRS-based irregular LDPC codes
selecting the first GRS-based irregular LDPC code when the complexity of the first decoder is less than the complexity of the second decoder; and
selecting the second GRS-based irregular LDPC code when the complexity of the second decoder is less than the complexity of the first decoder.

15. The method of claim 13, wherein:
a parity check matrix of the plurality of parity check matrices comprises a first partial-matrix and a second partial-matrix; and
at least one permutation matrix within the second partial-matrix is replaced with a zero matrix.

16. The method of claim 13, wherein:
a first parity check matrix of the plurality of parity check matrices is formed from a parity check matrix that corresponds to GRS-based regular LDPC code,
a second parity check matrix of the plurality of parity check matrices is also formed from the parity check matrix that corresponds to GRS-based regular LDPC code,
the parity check matrix that corresponds to GRS-based regular LDPC code comprises a first partial-matrix and a second partial-matrix, and each of the first partial-matrix and the second partial-matrix comprises a corresponding plurality of permutation matrices;
at least one permutation matrix within the first partial-matrix is replaced with a zero matrix thereby generating the first parity check matrix of the plurality of parity check matrices; and
at least one permutation matrix within the second partial-matrix is replaced with a zero matrix thereby generating the second parity check matrix of the plurality of parity check matrices.

17. The method of claim 13, wherein:
each parity check matrix of the plurality of parity check matrices is formed from a parity check matrix that corresponds to GRS-based regular LDPC code;
the GRS-based regular LDPC code has a minimum distance;
each GRS-based irregular LDPC code of the plurality of GRS-based irregular LDPC codes also has the minimum distance.

18. The method of claim 13, wherein:
each loop of an LDPC bipartite graph that corresponds to a GRS-based irregular LDPC code of the plurality of GRS-based irregular LDPC codes is at least a size of 6.

19. The method of claim 13, further comprising:
constructing a generator matrix that corresponds to the parity check matrix that corresponds to the selected GRS-based irregular LDPC code; and
encoding at least one information bit using the generator matrix thereby generating at least one LDPC codeword of at least one additional LDPC coded signal.

20. The method of claim 13, further comprising:
the method is performed within a communication device; and
the communication device is implemented within at least one of a satellite communication system, a wireless communication system, a wired communication system, and a fiber-optic communication system.

21. A computer implemented method for constructing a parity check matrix that corresponds to a GRS (Generalized Reed-Solomon)-based irregular LDPC (Low Density Parity Check) code, the method comprising:
decomposing a parity check matrix that corresponds to a GRS-based regular LDPC code into a plurality of partial-matrices based on a bit degree distribution, wherein each partial-matrix of the plurality of partial-matrices has a corresponding bit degree and each partial-matrix of the plurality of partial-matrices has a corresponding plurality of permutation matrices; and
replacing at least one permutation matrix within at least one partial-matrix of the plurality of partial-matrices with a zero matrix thereby generating a parity check matrix that corresponds to a GRS-based irregular LDPC code; and
decoding an LDPC coded signal, that has been encoded using the GRS- based irregular LDPC code, using the parity check matrix that corresponds to the GRS-based irregular LDPC code, thereby making a best estimate of at least one information bit encoded within the LDPC coded signal.

22. The method of claim 21, further comprising:
choosing a plurality of possible bit degree distributions for an LDPC code block;
selecting the bit degree distribution from among the plurality of possible bit degree distributions, wherein the selected bit degree distribution has a best performance threshold among the plurality of possible bit degree distributions; and wherein:

the GRS-based regular LDPC code has a minimum distance; and the GRS-based irregular LDPC code also has the minimum distance.

23. The method of claim 21, wherein:

each loop of an LDPC bipartite graph that corresponds to the GRS-based irregular LDPC code is at least a size of 6.

24. The method of claim 21, further comprising:

generating at least one additional parity check matrix that corresponds to at least one additional GRS-based irregular LDPC code;

determining a first performance, in terms of BLER (Block Error Rate) as a function of SNR (Signal to Noise Ratio), corresponding to the GRS-based irregular LDPC code as applied to a communication channel;

determining a second performance, in terms of BLER as a function of SNR, corresponding to the at least one additional GRS-based irregular LDPC code as applied to the communication channel; and selecting the GRS-based irregular LDPC code when the first performance has a lower error floor than the second performance; and selecting the at least one additional GRS-based irregular LDPC code when the second performance has a lower error floor than the first performance.

25. The method of claim 21, further comprising:

constructing a generator matrix that corresponds to the parity check matrix that corresponds to the GRS-based irregular LDPC code; and encoding at least one information bit using the generator matrix thereby generating at least one LDPC codeword of at least one additional LDPC coded signal.

26. The method of claim 21, wherein:

the method is performed within a communication device; and the communication device is implemented within at least one of a satellite communication system, a wireless communcation system, a wired communication system, and a fiber-optic communication system.

* * * * *

UNITED STATES PATENT AND TRADEMARK OFFICE
CERTIFICATE OF CORRECTION

PATENT NO. : 7,549,105 B2
APPLICATION NO. : 11/264997
DATED : June 16, 2009
INVENTOR(S) : Ba-Zhong Shen et al.

It is certified that error appears in the above-identified patent and that said Letters Patent is hereby corrected as shown below:

Column 133, lines 34-35, in Claim 13: replace "plurality of performances." with
--plurality of performances; and
    decoding an LDPC coded signal, that has been encoded using the selected GRS-based irregular LDPC code, using the parity check matrix that corresponds to the selected GRS-based irregular LDPC code, thereby making a best estimate of at least one information bit encoded within the LDPC coded signal.--

Signed and Sealed this

Twenty-eighth Day of July, 2009

JOHN DOLL
*Acting Director of the United States Patent and Trademark Office*